US012538640B2

(12) United States Patent
Niikura et al.

(10) Patent No.: US 12,538,640 B2
(45) Date of Patent: Jan. 27, 2026

(54) LIGHT-RECEIVING DEVICE WITH BUFFER LAYER AND LIGHT-EMITTING AND LIGHT-RECEIVING APPARATUS WITH BUFFER LAYER

(71) Applicant: SEMICONDUCTOR ENERGY LABORATORY CO., LTD., Atsugi (JP)

(72) Inventors: Yasuhiro Niikura, Tokyo (JP); Daisuke Kubota, Kanagawa (JP); Taisuke Kamada, Saitama (JP); Sachiko Kawakami, Kanagawa (JP); Anna Tada, Kanagawa (JP); Satoshi Seo, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 883 days.

(21) Appl. No.: 17/841,930

(22) Filed: Jun. 16, 2022

(65) Prior Publication Data

US 2023/0062265 A1 Mar. 2, 2023

(30) Foreign Application Priority Data

Jun. 25, 2021 (JP) ................................ 2021-105667
Jun. 25, 2021 (JP) ................................ 2021-105668

(51) Int. Cl.
*H10K 50/16* (2023.01)
*C07C 15/20* (2006.01)
(Continued)

(52) U.S. Cl.
CPC ............ *H10K 50/16* (2023.02); *C07C 15/20* (2013.01); *C07C 15/28* (2013.01); *C07C 15/38* (2013.01);
(Continued)

(58) Field of Classification Search
CPC ......... C07C 15/20; C07C 15/28; C07C 15/38; C07C 211/54; C07D 209/82;
(Continued)

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

JP 2000-036385 A 2/2000
JP 2003-059663 A 2/2003
(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.
Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.
(Continued)

*Primary Examiner* — Caleb E Henry
(74) *Attorney, Agent, or Firm* — Fish & Richardson P.C.

(57) ABSTRACT

A light-receiving device in which an increase in driving voltage is inhibited is provided. Any of the following light-receiving devices is provided: a light-receiving device that includes a light-receiving layer between a pair of electrodes and in which the light-receiving layer includes an active layer, a buffer layer, and an electron-transport layer, the buffer layer is between the active layer and the electron-transport layer and is in contact with the active layer, and the buffer layer includes an organic compound having an electron-withdrawing group; a light-receiving device that includes a light-receiving layer between a pair of electrodes and in which the light-receiving layer includes an active layer, a buffer layer, and an electron-transport layer, the buffer layer is between the active layer and the electron-
(Continued)

transport layer and is in contact with the active layer, and the buffer layer includes a heteroaromatic compound having an electron-withdrawing group.

12 Claims, 25 Drawing Sheets

(51) Int. Cl.

| | |
|---|---|
| ***C07C 15/28*** | (2006.01) |
| ***C07C 15/38*** | (2006.01) |
| ***C07C 211/54*** | (2006.01) |
| ***C07D 209/82*** | (2006.01) |
| ***C07D 219/16*** | (2006.01) |
| ***C07D 221/20*** | (2006.01) |
| ***C07D 235/08*** | (2006.01) |
| ***C07D 251/24*** | (2006.01) |
| ***C07D 307/91*** | (2006.01) |
| ***C07D 333/18*** | (2006.01) |
| ***C07D 333/76*** | (2006.01) |
| ***C07D 401/10*** | (2006.01) |
| ***C07D 403/10*** | (2006.01) |
| ***C07D 403/14*** | (2006.01) |
| ***C07D 405/04*** | (2006.01) |
| ***C07D 405/12*** | (2006.01) |
| ***C07D 409/10*** | (2006.01) |
| ***C07D 409/12*** | (2006.01) |
| ***C07D 409/14*** | (2006.01) |
| ***C07D 413/10*** | (2006.01) |
| ***C07D 471/06*** | (2006.01) |
| ***C07D 471/14*** | (2006.01) |
| ***C07D 491/048*** | (2006.01) |
| ***C07D 495/04*** | (2006.01) |
| ***C07D 495/14*** | (2006.01) |
| ***C07D 495/22*** | (2006.01) |
| ***C07D 519/00*** | (2006.01) |
| ***C07F 7/22*** | (2006.01) |
| ***C07F 15/00*** | (2006.01) |
| ***H10K 30/20*** | (2023.01) |
| ***H10K 65/00*** | (2023.01) |
| ***H10K 85/30*** | (2023.01) |
| ***H10K 85/60*** | (2023.01) |
| *H10K 30/50* | (2023.01) |

(52) U.S. Cl.

CPC .......... *C07C 211/54* (2013.01); *C07D 209/82* (2013.01); *C07D 219/16* (2013.01); *C07D 221/20* (2013.01); *C07D 235/08* (2013.01); *C07D 251/24* (2013.01); *C07D 307/91* (2013.01); *C07D 333/18* (2013.01); *C07D 333/76* (2013.01); *C07D 401/10* (2013.01); *C07D 403/10* (2013.01); *C07D 403/14* (2013.01); *C07D 405/04* (2013.01); *C07D 405/12* (2013.01); *C07D 409/10* (2013.01); *C07D 409/12* (2013.01); *C07D 409/14* (2013.01); *C07D 413/10* (2013.01); *C07D 471/06* (2013.01); *C07D 471/14* (2013.01); *C07D 491/048* (2013.01); *C07D 495/04* (2013.01); *C07D 495/14* (2013.01); *C07D 495/22* (2013.01); *C07D 519/00* (2013.01); *C07F 7/2284* (2013.01); *C07F 15/0093* (2013.01); *H10K 30/20* (2023.02); *H10K 65/00* (2023.02); *H10K 85/30* (2023.02); *H10K 85/346* (2023.02); *H10K 85/615* (2023.02); *H10K 85/622* (2023.02); *H10K 85/623* (2023.02); *H10K 85/624* (2023.02); *H10K 85/631* (2023.02); *H10K 85/652* (2023.02); *H10K 85/654* (2023.02); *H10K 85/656* (2023.02); *H10K 85/657* (2023.02); *H10K 85/6572* (2023.02); *H10K 85/6574* (2023.02); *H10K 85/6576* (2023.02); *H10K 30/50* (2023.02)

(58) Field of Classification Search

CPC .. C07D 219/16; C07D 221/20; C07D 235/08; C07D 251/24; C07D 307/91; C07D 333/18; C07D 333/76; C07D 401/10; C07D 403/10; C07D 403/14; C07D 405/04; C07D 405/12; C07D 409/10; C07D 409/12; C07D 409/14; C07D 413/10; C07D 471/06; C07D 471/14; C07D 491/048; C07D 495/04; C07D 495/14; C07D 495/22; C07D 519/00; C07F 7/2284; C07F 15/0093; H10K 30/20; H10K 65/00; H10K 85/30; H10K 85/346; H10K 85/615; H10K 85/622; H10K 85/623; H10K 85/624; H10K 85/631; H10K 85/652; H10K 85/654; H10K 85/656; H10K 85/657; H10K 85/6572; H10K 85/6574; H10K 85/6576; H10K 30/50; H10K 30/353; H10K 85/626; H10K 50/16; Y02E 10/549

See application file for complete search history.

(56) References Cited

U.S. PATENT DOCUMENTS 10,075,704 B2* 9/2018 Hoekstra .............. H04N 17/002
10,193,079 B2* 1/2019 Stoessel ............... C07D 241/46
10,217,947 B2* 2/2019 Chen .................. H10K 85/6572
10,644,060 B2* 5/2020 Cheng ................... H10F 39/024
10,784,447 B2* 9/2020 Han ..................... H10K 85/654
11,177,441 B2* 11/2021 Han ....................... C09K 11/06
2002/0072139 A1 6/2002 Kashiwabara
2012/0147237 A1* 6/2012 Xu ........................ H10F 39/803 348/301
2012/0205685 A1 8/2012 Seo et al.
2012/0217374 A1* 8/2012 Nishizawa ............ H10F 39/811 257/E23.141
2012/0241895 A1* 9/2012 Kurogi .................. H10F 39/199 257/431
2012/0256204 A1 10/2012 Yoshizumi et al.
2012/0273804 A1 11/2012 Hatano
2012/0276484 A1 11/2012 Izumi et al.
2013/0037900 A1* 2/2013 Abe ...................... H10F 39/802 438/57
2013/0084531 A1 4/2013 Hamaguchi et al.
2013/0084664 A1 4/2013 Yoshitoku et al.
2013/0084666 A1 4/2013 Oshige
2013/0280839 A1 10/2013 Sonoda et al.
2013/0285180 A1* 10/2013 Wang .................... H10F 39/011 257/E31.127
2013/0295705 A1 11/2013 Sonoda et al.
2014/0004640 A1 1/2014 Hamaguchi et al.
2014/0004642 A1 1/2014 Otsuka et al.
2014/0117429 A1* 5/2014 Nomoto .............. H10F 39/8023 257/292
2015/0035028 A1* 2/2015 Fan ...................... H04N 25/616 257/292
2015/0055002 A1* 2/2015 Beck ...................... H04N 25/59 348/308
2015/0060826 A1 3/2015 Matsumoto et al.
2015/0069360 A1 3/2015 Sato
2015/0076476 A1 3/2015 Odaka et al.
2016/0172595 A1 6/2016 Malinowski et al.
2016/0301012 A1* 10/2016 Han .................... C07D 213/16
2016/0315133 A1 10/2016 Sato
2017/0005129 A1* 1/2017 Roy ....................... H04N 25/78

(56) References Cited

U.S. PATENT DOCUMENTS

| | | | | |
|---|---|---|---|---|
| 2017/0005130 | A1* | 1/2017 | Roy | H10F 39/18 |
| 2017/0141167 | A1 | 5/2017 | Naganuma | |
| 2017/0256754 | A1 | 9/2017 | Defranco et al. | |
| 2018/0033809 | A1* | 2/2018 | Tayanaka | H10F 39/80373 |
| 2018/0040831 | A1* | 2/2018 | Chen | H10K 85/40 |
| 2018/0114918 | A1* | 4/2018 | Han | C07D 251/24 |
| 2018/0190908 | A1 | 7/2018 | Ke et al. | |
| 2018/0220092 | A1* | 8/2018 | Takaya | H04N 25/62 |
| 2019/0016666 | A1* | 1/2019 | Jeong | C09K 11/06 |
| 2019/0124286 | A1* | 4/2019 | Huang | H10F 39/807 |
| 2019/0149758 | A1* | 5/2019 | Nakamura | H04N 25/79 348/187 |
| 2020/0035722 | A1* | 1/2020 | Toyoguchi | G06T 7/55 |
| 2020/0135667 | A1* | 4/2020 | Lin | H01L 24/17 |
| 2020/0203662 | A1 | 6/2020 | Mollard et al. | |
| 2020/0252603 | A1* | 8/2020 | Steadman | H04N 25/79 |
| 2021/0273071 | A1* | 9/2021 | Lee | H01L 21/302 |
| 2021/0296378 | A1* | 9/2021 | Fukui | H04N 25/70 |
| 2021/0366953 | A1* | 11/2021 | Hsu | H10F 39/811 |
| 2021/0366954 | A1* | 11/2021 | Chen | H10F 39/807 |
| 2021/0400225 | A1* | 12/2021 | Manda | H10F 39/80373 |
| 2022/0068181 | A1 | 3/2022 | Watanabe et al. | |
| 2022/0320156 | A1* | 10/2022 | Kawamura | H10F 39/18 |

FOREIGN PATENT DOCUMENTS

| | | | |
|---|---|---|---|
| JP | 2008-098106 | A | 4/2008 |
| JP | 2008-147072 | A | 6/2008 |
| JP | 2008-251270 | A | 10/2008 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2019-179696 | A | 10/2019 |
| JP | 2020-160305 | A | 10/2020 |
| WO | WO-2020/152556 | | 7/2020 |

OTHER PUBLICATIONS

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

FIG. 11A
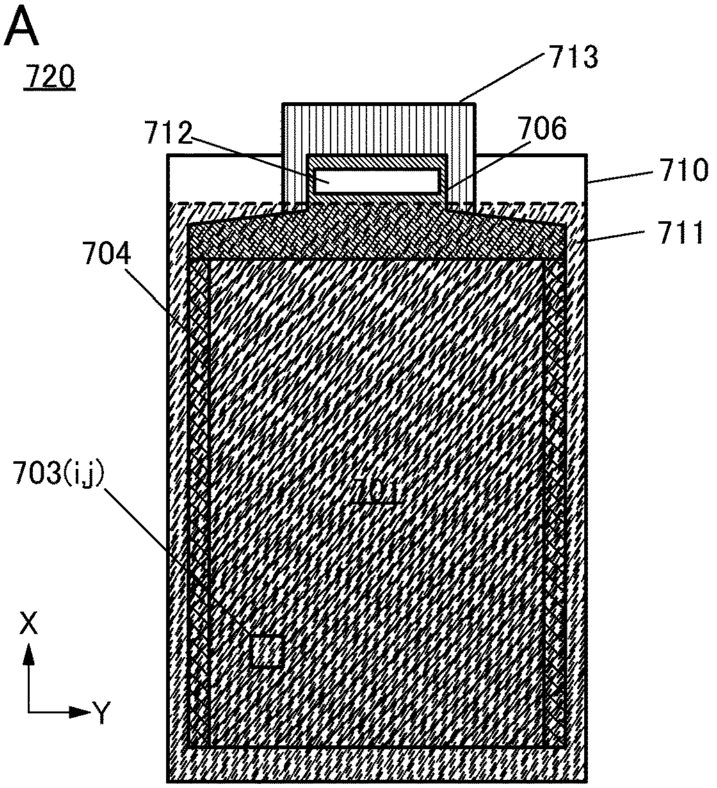
FIG. 11B
FIG. 11C
FIG. 11D
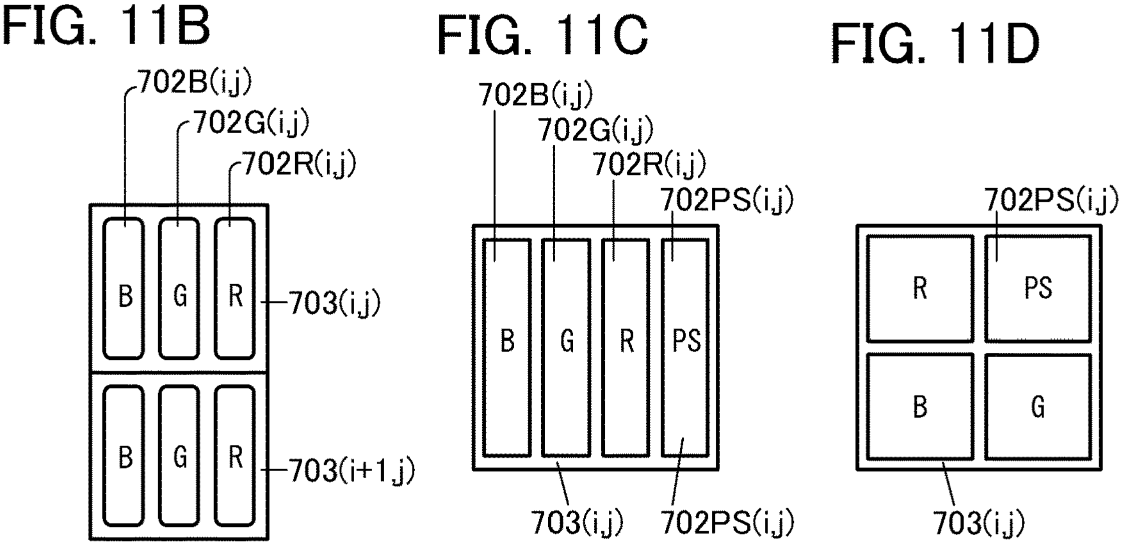
FIG. 11E
FIG. 11F
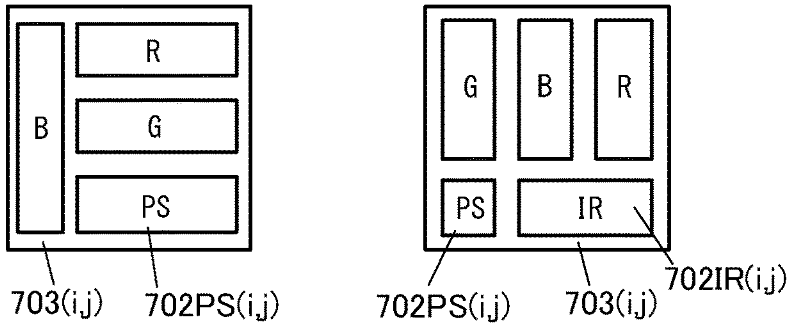

LIGHT-RECEIVING DEVICE WITH BUFFER LAYER AND LIGHT-EMITTING AND LIGHT-RECEIVING APPARATUS WITH BUFFER LAYER

BACKGROUND OF THE INVENTION

1. Field of the Invention

One embodiment of the present invention relates to a light-receiving device, a light-emitting and light-receiving apparatus, an electronic device, or a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specific examples of the technical field of one embodiment of the present invention disclosed in this specification include a semiconductor device, a display apparatus, a light-emitting apparatus, a power storage device, a memory device, a method for driving any of them, and a method for manufacturing any of them.

2. Description of the Related Art

A functional panel in which a pixel provided in a display region includes a light-emitting element and a photoelectric conversion element is known (Patent Document 1). For example, the functional panel includes a first driver circuit, a second driver circuit, and a region. The first driver circuit supplies a first selection signal, the second driver circuit supplies a second selection signal and third selection signal, and the region includes a pixel. The pixel includes a first pixel circuit, a light-emitting element, a second pixel circuit, and a photoelectric conversion element. The first pixel circuit is supplied with the first selection signal, the first pixel circuit obtains an image signal on the basis of the first selection signal, the light-emitting element is electrically connected to the first pixel circuit, and the light-emitting element emits light on the basis of the image signal. The second pixel circuit is supplied with the second selection signal and the third selection signal in a period during which the first selection signal is not supplied, the second pixel circuit obtains an imaging signal on the basis of the second selection signal and supplies the imaging signal on the basis of the third selection signal, and the photoelectric conversion element is electrically connected to the second pixel circuit and generates the imaging signal.

REFERENCE

[Patent Document 1] PCT International Publication No. WO2020/152556

SUMMARY OF THE INVENTION

An object of one embodiment of the present invention is to provide a light-receiving device in which an increase in the driving voltage is inhibited. Another object of one embodiment of the present invention is to provide a light-emitting and light-receiving apparatus in which an increase in the driving voltage is inhibited. Another object of one embodiment of the present invention is to provide an electronic device in which an increase in the driving voltage is inhibited. Another object of one embodiment of the present invention is to provide a novel light-receiving device, a novel light-emitting and light-receiving apparatus, or a novel electronic device.

Note that the descriptions of these objects do not preclude the existence of other objects. One embodiment of the present invention does not need to achieve all these objects. Other objects will be apparent from and can be derived from the descriptions of the specification, the drawings, the claims, and the like.

One embodiment of the present invention is a light-receiving device including a light-receiving layer between a pair of electrodes, in which the light-receiving layer includes an active layer, a buffer layer, and an electron-transport layer; the buffer layer is between the active layer and the electron-transport layer and is in contact with the active layer; and the buffer layer includes an organic compound having an electron-withdrawing group.

Another embodiment of the present invention is a light-receiving device including a light-receiving layer between a pair of electrodes, in which the light-receiving layer includes an active layer, a buffer layer, and an electron-transport layer; the buffer layer is between the active layer and the electron-transport layer and is in contact with the active layer; and the buffer layer includes a heteroaromatic compound having an electron-withdrawing group.

Another embodiment of the present invention is a light-receiving device including a light-receiving layer between a pair of electrodes, in which the light-receiving layer includes an active layer, a buffer layer, and an electron-transport layer; the buffer layer is between the active layer and the electron-transport layer and is in contact with the active layer; and the buffer layer includes a heteroaromatic compound having a plurality of cyano groups.

Another embodiment of the present invention is a light-receiving device with the above structure, in which the heteroaromatic compound has a fused heteroaromatic ring.

In each of the above structures, it is preferable that the electron-transport layer include a first organic compound and the first organic compound be a π-electron deficient heteroaromatic compound.

In each of the above structures, it is preferable that the electron-transport layer include a first organic compound, and the first organic compound be any one of a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, and a pyrimidine derivative.

In each of the above structures, it is preferable that the electron-transport layer include a first organic compound, and the first organic compound be a compound having a triazine ring.

In each of the above structures, it is preferable that the electron-transport layer include a first organic compound, and the first organic compound be an organic compound represented by General Formula (Ge-1).

[Chemical Formula 1]

(Ge-1)

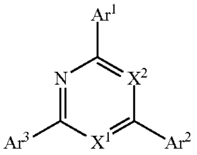

In General Formula (Ge-1), $Ar^1$ to $Ar^3$ each independently represent hydrogen, a substituted or unsubstituted aryl group having 6 to 30 carbon atoms, or a substituted or unsubstituted heteroaryl group having 2 to 30 carbon atoms, $X^1$ and $X^2$ each independently represent carbon or nitrogen, and in the case where one or both of $X^1$ and $X^2$ is carbon, the carbon is bonded to hydrogen, a substituted or unsubstituted aryl group having 6 to 30 carbon atoms, a substituted or unsubstituted heteroaryl group having 2 to 30 carbon atoms, a substituted or unsubstituted alkyl group having 1 to 20 carbon atoms, or a substituted or unsubstituted cycloalkyl group having 1 to 20 carbon atoms.

In each of the above structures, it is preferable that the electron-transport layer include a first organic compound, and the first organic compound be an organic compound represented by General Formula (Ge-2).

[Chemical Formula 2]

(Ge-1)

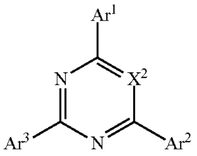

In General Formula (Ge-2), $Ar^1$ to $Ar^3$ each independently represent a substituted or unsubstituted aryl group having 6 to 30 carbon atoms or a substituted or unsubstituted heteroaryl group having 2 to 30 carbon atoms, $X^2$ represents carbon or nitrogen, and in the case where $X^2$ is carbon, the carbon is bonded to hydrogen, a substituted or unsubstituted aryl group having 6 to 30 carbon atoms, a substituted or unsubstituted heteroaryl group having 2 to 30 carbon atoms, a substituted or unsubstituted alkyl group having 1 to 20 carbon atoms, or a substituted or unsubstituted cycloalkyl group having 1 to 20 carbon atoms.

In each of the above structures, it is preferable that the electron-transport layer include a first organic compound, and the first organic compound be an organic compound represented by General Formula (Ge-3).

[Chemical Formula 3]

(Ge-3)

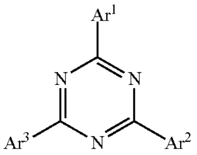

In General Formula (Ge-3), $Ar^1$ to $Ar^3$ each independently represent a substituted or unsubstituted aryl group having 6 to 30 carbon atoms or a substituted or unsubstituted heteroaryl group having 2 to 30 carbon atoms.

In each of the above structures, it is preferable that the electron-transport layer include a first organic compound, and the first organic compound be an organic compound represented by General Formula (Ge-4).

[Chemical Formula 4]

(Ge-4)

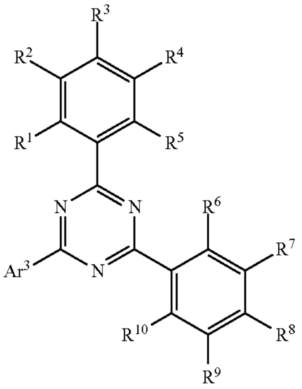

In General Formula (Ge-4), $Ar^3$ represents a substituted or unsubstituted aryl group having 6 to 30 carbon atoms or a substituted or unsubstituted heteroaryl group having 2 to 30 carbon atoms, and $R^1$ to $R^{10}$ each independently represent hydrogen, a substituted or unsubstituted alkyl group having 1 to 20 carbon atoms, a substituted or unsubstituted cycloalkyl group having 3 to 20 carbon atoms, a substituted or unsubstituted aryl group having 6 to 30 carbon atoms, or a substituted or unsubstituted heteroaryl group having 2 to 30 carbon atoms.

Another embodiment of the present invention is a light-receiving device including a light-receiving layer between a pair of electrodes, in which the light-receiving layer includes an active layer, a buffer layer, and an electron-transport layer; the buffer layer is between the active layer and the electron-transport layer and is in contact with the active layer; the active layer includes a first organic compound; the buffer layer includes a second organic compound; the electron-transport layer includes a third organic compound; and the LUMO level of the second organic compound is higher than the LUMO level of the first organic compound and is lower than the LUMO level of the third organic compound.

Another embodiment of the present invention is a light-receiving device with the above structure, in which a difference between the LUMO level of the second organic compound and the LUMO level of the first organic compound is less than or equal to 0.5 eV.

Another embodiment of the present invention is a light-receiving device with the above structure, in which a difference between the LUMO level of the second organic compound and the LUMO level of the third organic compound is less than or equal to 1.0 eV.

Another embodiment of the present invention is a light-receiving device with the above structure, in which the LUMO level of the second organic compound is higher than or equal to −4.5 eV and lower than or equal to −3.0 eV.

Another embodiment of the present invention is a light-emitting and light-receiving apparatus including any of the above-described light-receiving devices and a light-emitting device.

Another embodiment of the present invention is an electronic device including any of the above-described light-emitting and light-receiving apparatuses, and a sensor portion, an input portion, or a communication portion.

Although the block diagram in drawings attached to this specification shows components classified based on their functions in independent blocks, it is difficult to classify actual components based on their functions completely, and one component can have a plurality of functions.

According to one embodiment of the present invention, a light-receiving device in which an increase in the driving voltage is inhibited can be provided. According to one embodiment of the present invention, a light-emitting and light-receiving apparatus in which an increase in the driving voltage is inhibited can be provided. According to one embodiment of the present invention, an electronic device in which an increase in the driving voltage is inhibited can be provided. According to one embodiment of the present invention, a novel light-receiving device, a novel light-emitting and light-receiving apparatus, or a novel electronic device can be provided.

Note that the descriptions of these effects do not preclude the existence of other effects. One embodiment of the present invention does not necessarily have all the effects. Other effects will be apparent from and can be derived from the descriptions of the specification, the drawings, the claims, and the like.

BRIEF DESCRIPTION OF THE DRAWINGS

In the accompanying drawings:

FIGS. 11A to 11F illustrate an apparatus of an embodiment and pixel arrangements;

DETAILED DESCRIPTION OF THE INVENTION

Figure 1A:
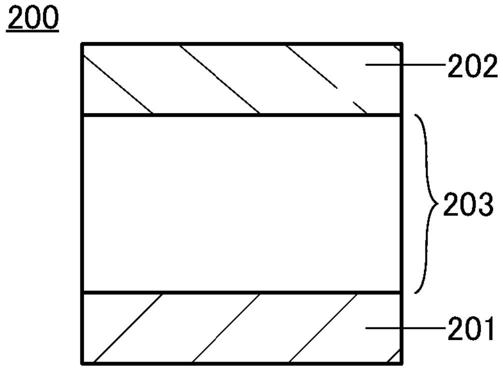
FIGS. 1A to 1D illustrate a light-receiving device of one embodiment of the present invention.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments. Note that in structures of the invention described below, the same portions or portions having similar functions are denoted by the same reference numerals in different drawings, and the description thereof is not repeated.

Embodiment 1

In this embodiment, a light-receiving device of one embodiment of the present invention will be described.

The light-receiving device of one embodiment of the present invention has a function of sensing light (hereinafter, also referred to as a light-receiving function).

FIGS. 1A to 1D are each a schematic cross-sectional view of a light-receiving device 200 of one embodiment of the present invention.

<<Basic Structure of Light-Receiving Device>>

Basic structures of the light-receiving device will be described. FIG. TA illustrates the light-receiving device 200 including a light-receiving layer 203 between a pair of electrodes. Specifically, the light-receiving device 200 has a structure in which the light-receiving layer 203 is interposed between a first electrode 201 and a second electrode 202.

The light-receiving layer 203 includes at least an active layer, a buffer layer, and a carrier-transport layer. The buffer layer is positioned between the active layer and the carrier-transport layer and is in contact with the active layer.

Figure 1B:
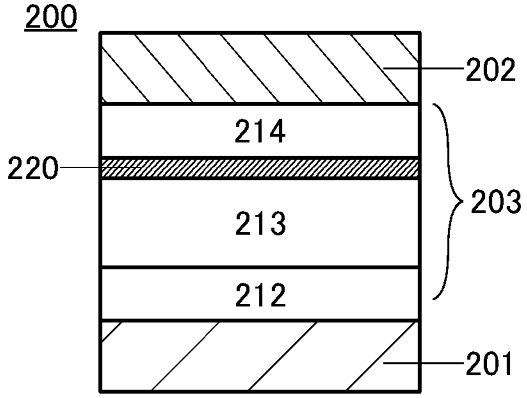

FIG. 1B illustrates an example of a stacked-layer structure of the light-receiving layer 203 in the light-receiving device 200 of one embodiment of the present invention. The light-receiving layer 203 has a structure in which a first carrier-transport layer 212, an active layer 213, a buffer layer 220, and a second carrier-transport layer 214 are sequentially stacked over the first electrode 201. That is, the buffer layer 220 is positioned between the active layer 213 and the second carrier-transport layer 214 and is in contact with the active layer 213.

Figure 1C:
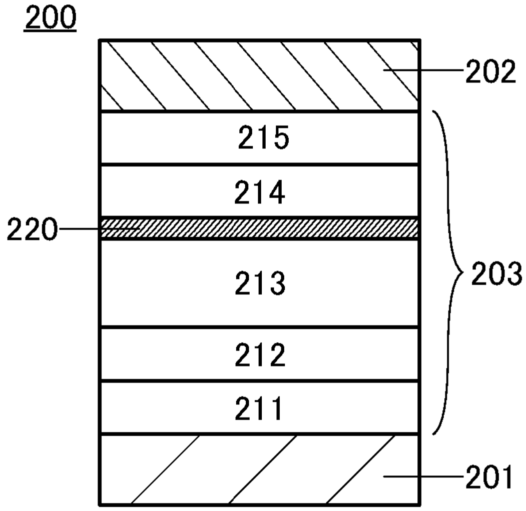

FIG. 1C illustrates another example of a stacked-layer structure of the light-receiving layer 203 in the light-receiving device 200 of one embodiment of the present invention. The light-receiving layer 203 has a structure in which a first carrier-injection layer 211, the first carrier-transport layer 212, the active layer 213, the buffer layer 220, the second carrier-transport layer 214, and a second carrier-injection layer 215 are sequentially stacked over the first electrode 201. That is, the buffer layer 220 is positioned between the active layer 213 and the second carrier-transport layer 214 and is in contact with the active layer 213.

Providing the buffer layer 220 in the light-receiving device 200 of one embodiment of the present invention can inhibit an increase in the driving voltage of the light-receiving device 200.

<<Specific Structure of Light-Receiving Device>>

Next, a specific structure of the light-receiving device 200 of one embodiment of the present invention will be described. Here, description is made with reference to FIG. 1C.

<First Electrode and Second Electrode>

The first electrode 201 and the second electrode 202 can be formed using materials that can be used for a first electrode 101 and a second electrode 102 of a light-emitting device, which will be described in Embodiment 2.

Note that a microcavity structure can be obtained when the first electrode 201 is a reflective electrode and the second electrode 202 is a semi-transmissive and semi-reflective electrode, for example. The microcavity structure can intensify light with a specific wavelength to be sensed, thereby achieving a light-receiving device with high sensitivity.

<First Carrier-Injection Layer>

The first carrier-injection layer 211 injects holes from the light-receiving layer 203 to the first electrode 201, and includes a material with a high hole-injection property. Examples of the material with a high hole-injection property include an aromatic amine compound and a composite material including a hole-transport material and an acceptor material (electron-accepting material). In this specification and the like, the first carrier-injection layer is sometimes referred to as a hole-injection layer.

The first carrier-injection layer 211 can be formed using a material that can be used for a hole-injection layer 111 of the light-emitting device, which will be described in Embodiment 2.

<First Carrier-Transport Layer>

The first carrier-transport layer 212 transports holes generated in the active layer 213 on the basis of incident light to the first electrode 201, and includes a hole-transport material. The hole-transport material preferably has a hole mobility of $10^{-6}$ $cm^2/Vs$ or higher. Note that other substances can also be used as long as the substances have a hole-transport property higher than an electron-transport property.

As the hole-transport material, a π-electron rich heteroaromatic compound or an aromatic amine (a compound having an aromatic amine skeleton) can be used.

Alternatively, a carbazole derivative, a thiophene derivative, or a furan derivative can be used as the hole-transport material.

The hole-transport material is an aromatic monoamine compound or a heteroaromatic monoamine compound having at least one skeleton of biphenylamine, carbazolylamine, dibenzofuranylamine, dibenzothiophenylamine, fluorenylamine, and spirofluorenylamine.

Alternatively, the hole-transport material is an aromatic amine compound or a heteroaromatic amine compound having two or more skeletons selected from biphenylamine, carbazolylamine, dibenzofuranylamine, dibenzothiophenylamine, fluorenylamine, and spirofluorenylamine.

In the case where the hole-transport material is an aromatic amine compound or a heteroaromatic amine compound having two or more skeletons selected from biphenylamine, carbazolylamine, dibenzofuranylamine, dibenzothiophenylamine, fluorenylamine, and spirofluorenylamine, one nitrogen atom may be shared by two or more skeletons. For example, in the case where a fluorenyl group and a biphenyl group are bonded to a nitrogen atom in an aromatic amine compound, the compound can be regarded as an aromatic monoamine compound having a fluorenylamine skeleton and a biphenylamine skeleton.

Note that each of biphenylamine, carbazolylamine, dibenzofuranylamine, dibenzothiophenylamine, fluorenylamine, and spirofluorenylamine listed above as the skeleton included in the hole-transport material may include a substituent. Examples of the substituent include a substituted or unsubstituted aryl group having 6 to 30 carbon atoms, a substituted or unsubstituted alkyl group having 1 to 20 carbon atoms, a substituted or unsubstituted cycloalkyl group having 1 to 20 carbon atoms, and a substituted or unsubstituted heteroaryl group having 4 to 30 carbon atoms.

The hole-transport material is preferably a monoamine compound having a triarylamine skeleton (a heteroaryl group is also included as an aryl group in a triarylamine compound). For example, the hole-transport material is an organic compound represented by General Formula (Gh-1) below.

[Chemical Formula 5]

(Gh-1)

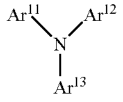

In General Formula (Gh-1), each of $Ar^{11}$ to $Ar^{13}$ independently represent hydrogen, a substituted or unsubstituted aryl group having 6 to 30 carbon atoms, or a substituted or unsubstituted heteroaryl group having 4 to 30 carbon atoms.

Alternatively, the hole-transport material is an organic compound represented by General Formula (Gh-2) below.

[Chemical Formula 6]

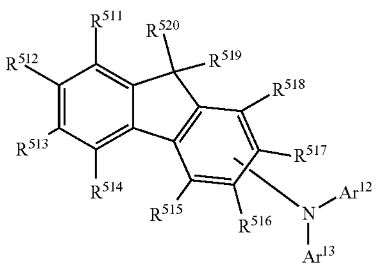

(Gh-2)

In General Formula (Gh-2), each of $Ar^{12}$ and $Ar^{13}$ independently represents hydrogen, a substituted or unsubstituted aryl group having 6 to 30 carbon atoms, or a substituted or unsubstituted heteroaryl group having 4 to 30 carbon atoms. Each of $R^{511}$ to $R^{520}$ independently represents hydrogen, a substituted or unsubstituted aryl group having 6 to 30 carbon atoms, a substituted or unsubstituted alkyl group having 1 to 20 carbon atoms, a substituted or unsubstituted cycloalkyl group having 1 to 20 carbon atoms, or a substituted or unsubstituted heteroaryl group having 4 to 30 carbon atoms. $R^{519}$ and $R^{520}$ may be bonded to each other to form a ring.

Alternatively, the hole-transport material is an organic compound represented by General Formula (Gh-3) below.

[Chemical Formula 7]

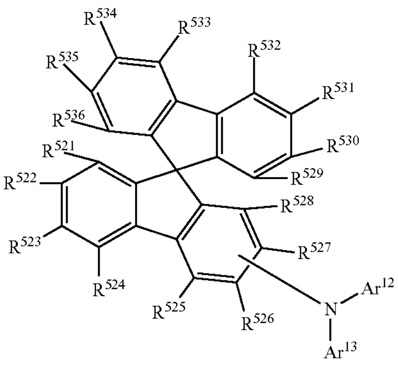

(Gh-3)

In General Formula (Gh-3), each of $Ar^{12}$ and $Ar^{13}$ independently represents a substituted or unsubstituted aryl group having 6 to 30 carbon atoms or a substituted or unsubstituted heteroaryl group having 4 to 30 carbon atoms. Each of $R^{521}$ to $R^{536}$ independently represents hydrogen, a substituted or unsubstituted aryl group having 6 to 30 carbon atoms, a substituted or unsubstituted alkyl group having 1 to 20 carbon atoms, a substituted or unsubstituted cycloalkyl group having 1 to 20 carbon atoms, or a substituted or unsubstituted heteroaryl group having 4 to 30 carbon atoms.

Alternatively, the hole-transport material is an organic compound represented by General Formula (Gh-4) below.

[Chemical Formula 8]

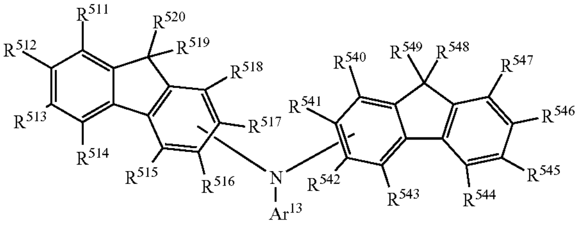

(Gh-4)

In General Formula (Gh-4), $Ar^{13}$ represents a substituted or unsubstituted aryl group having 6 to 30 carbon atoms or a substituted or unsubstituted heteroaryl group having 4 to 30 carbon atoms. Each of $R^{511}$ to $R^{520}$ and $R^{140}$ to $R^{149}$ independently represents hydrogen, a substituted or unsubstituted aryl group having 6 to 30 carbon atoms, a substituted or unsubstituted alkyl group having 1 to 20 carbon atoms, a substituted or unsubstituted cycloalkyl group having 1 to 20 carbon atoms, or a substituted or unsubstituted heteroaryl group having 4 to 30 carbon atoms. $R^{519}$ and $R^{520}$ may be bonded to each other to form a ring, and $R^{548}$ and $R^{549}$ may be bonded to each other to form a ring.

Alternatively, the hole-transport material is an organic compound represented by General Formula (Gh-5) below.

[Chemical Formula 9]

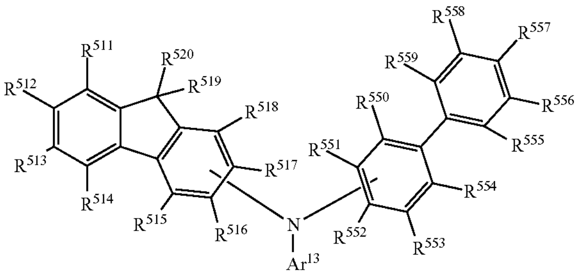

(Gh-5)

In General Formula (Gh-5), $Ar^{13}$ represents a substituted or unsubstituted aryl group having 6 to 30 carbon atoms or a substituted or unsubstituted heteroaryl group having 4 to 30 carbon atoms. Each of $R^{511}$ to $R^{520}$ and $R^{550}$ to $R^{559}$ independently represents hydrogen, a substituted or unsubstituted aryl group having 6 to 30 carbon atoms, a substituted or unsubstituted alkyl group having 1 to 20 carbon atoms, a substituted or unsubstituted cycloalkyl group having 1 to 20 carbon atoms, or a substituted or unsubstituted heteroaryl group having 4 to 30 carbon atoms. $R^{519}$ and $R^{520}$ may be bonded to each other to form a ring.

Alternatively, the hole-transport material is an organic compound represented by General Formula (Gh-6) below.

[Chemical Formula 10]

(Gh-6)

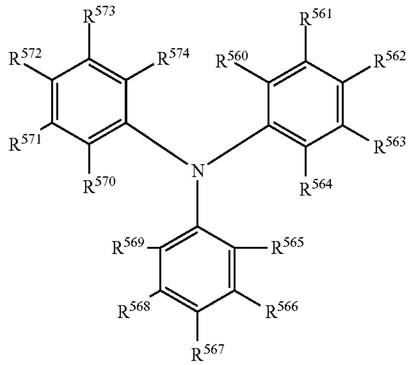

In General Formula (Gh-6), each of $R^{160}$ to $R^{574}$ independently represents hydrogen, a substituted or unsubstituted aryl group having 6 to 30 carbon atoms, a substituted or unsubstituted alkyl group having 1 to 20 carbon atoms, a substituted or unsubstituted cycloalkyl group having 1 to 20 carbon atoms, or a substituted or unsubstituted heteroaryl group having 4 to 30 carbon atoms.

Each of $R^{511}$ to $R^{520}$ in General Formula (Gh-2), $R^{521}$ to $R^{536}$ in General Formula (Gh-3), $R^{511}$ to $R^{520}$ and $R^{540}$ to $R^{549}$ in General Formula (Gh-4), $R^{511}$ to $R^{520}$ and $R^{550}$ to $R^{559}$ in General Formula (Gh-5), and $R^{560}$ to $R^{574}$ in General Formula (Gh-6) independently represents, other than the above-described substituents, halogen, a substituted or unsubstituted alkyl halide group having 1 to 13 carbon atoms, a cyano group, or a substituted or unsubstituted alkoxy group having 1 to 13 carbon atoms.

Specifically, it is preferable that each of $R^{511}$ to $R^{520}$ in General Formula (Gh-2), $R^{521}$ to $R^{536}$ in General Formula (Gh-3), $R^{511}$ to $R^{520}$ and $R^{540}$ to $R^{549}$ in General Formula (Gh-4), $R^{511}$ to $R^{520}$ and $R^{550}$ to $R^{559}$ in General Formula (Gh-5), and $R^{560}$ to $R^{574}$ in General Formula (Gh-6) be a substituent represented by any of Formulae (R-1) to (R-38) and Formulae (R-41) to (R-117) below. Note that * in the formula represents a bond.

It is also preferable that each of $Ar^{11}$ to $Ar^{13}$ in General Formula (Gh-1), $Ar^{12}$ and $Ar^{13}$ in General Formulae (Gh-2) and (Gh-3), and $Ar^{13}$ in General Formulae (Gh-4) and (Gh-5) be a substituent represented by any of Formulae (R-41) to (R-117) below. Note that * in the formula represents a bond.

[Chemical Formulae 11]

(R-1)

(R-2)

(R-3)

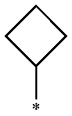

-continued (R-4)

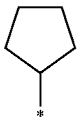

(R-5)

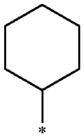

(R-6)

(R-7)

(R-8)

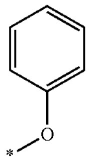

(R-9)

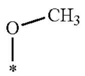

(R-10)

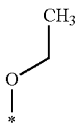

(R-11)

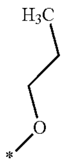

(R-12)

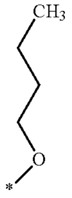

(R-13)

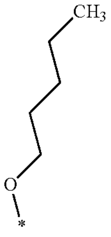

-continued
(R-14)
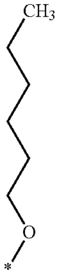
(R-15)
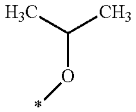
(R-16)
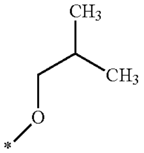
(R-17)
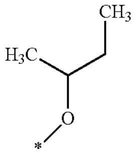
(R-18)
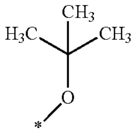
(R-19)
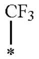
(R-20)
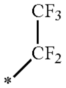
(R-21)
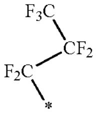
(R-22)
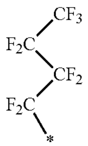
(R-23)
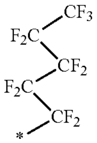
-continued
(R-24)
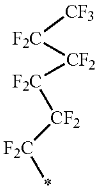
(R-25)
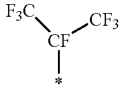
(R-26)
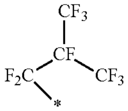
(R-27)
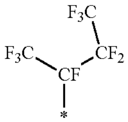
(R-28)
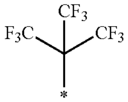
(R-29)
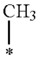
(R-30)
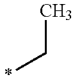
(R-31)
(R-32)
(R-33)
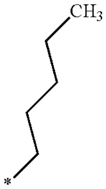
(R-34)
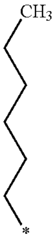

-continued
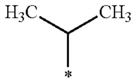
(R-35)
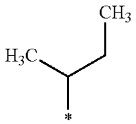
(R-36)
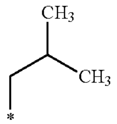
(R-37)
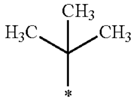
(R-38)
[Chemical Formulae 12]
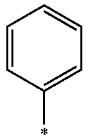
(R-41)
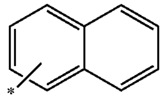
(R-42)
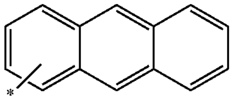
(R-43)
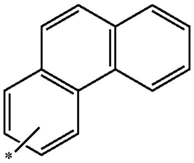
(R-44)
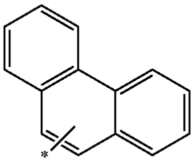
(R-45)
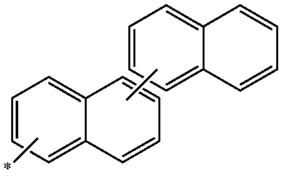
(R-46)
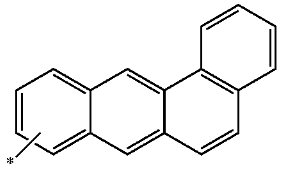
(R-47)
-continued
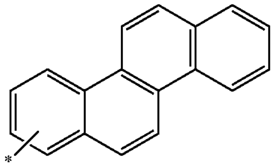
(R-48)
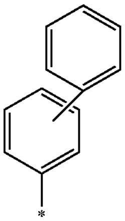
(R-49)
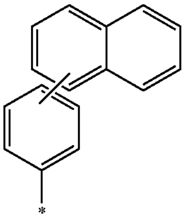
(R-50)
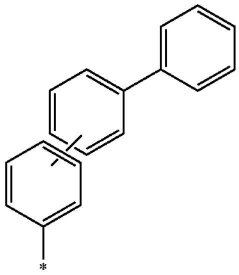
(R-51)
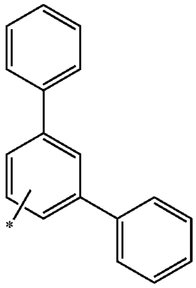
(R-52)
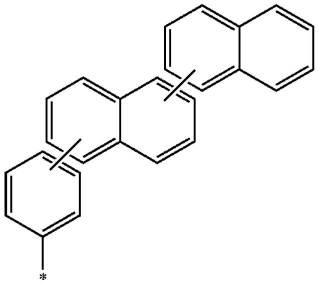
(R-53)

-continued
(R-54)
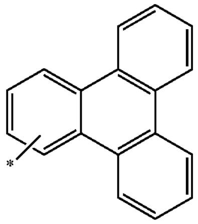
(R-55)
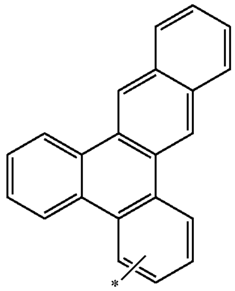
(R-56)
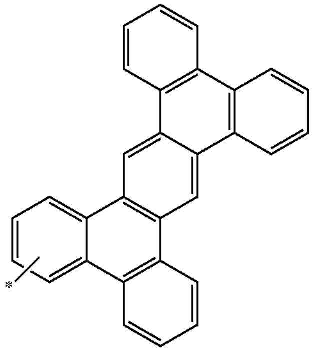
(R-57)
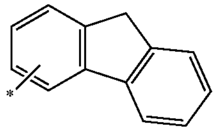
(R-58)
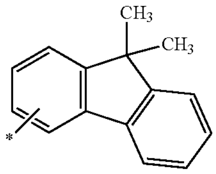
(R-59)
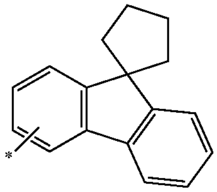
-continued
(R-60)
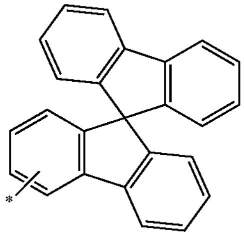
(R-61)
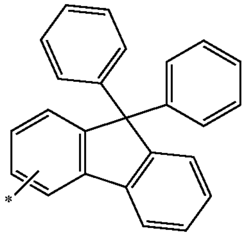
(R-62)
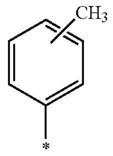
(R-63)
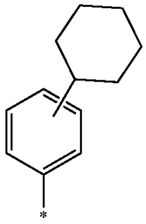
[Chemical Formulae 13]
(R-64)
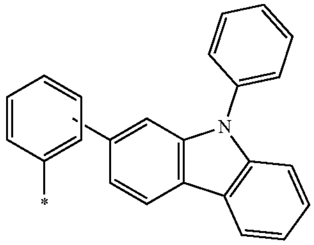
(R-65)
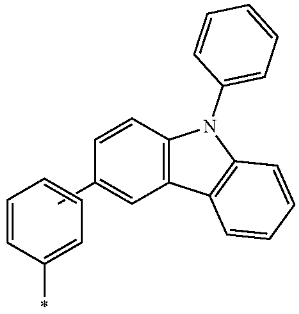

-continued
(R-66)
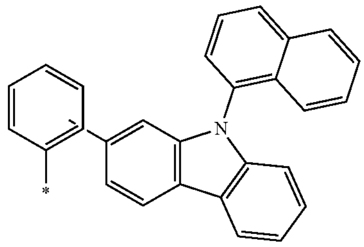
(R-67)
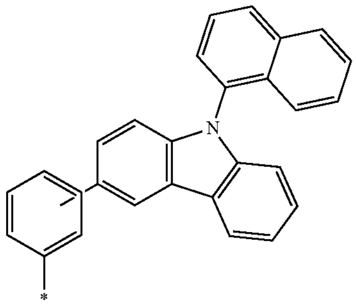
(R-68)
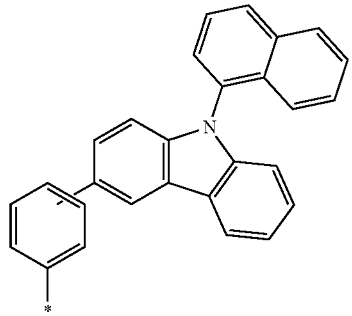
(R-69)
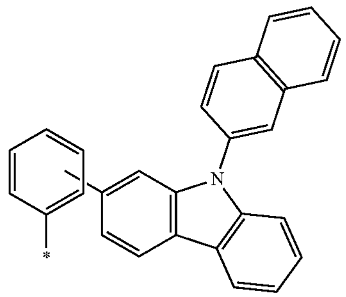
(R-70)
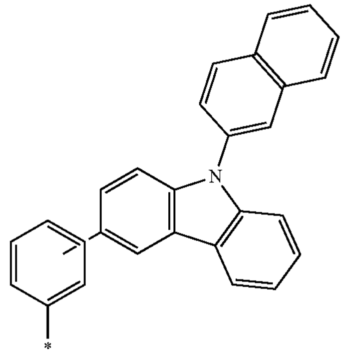
-continued
(R-71)
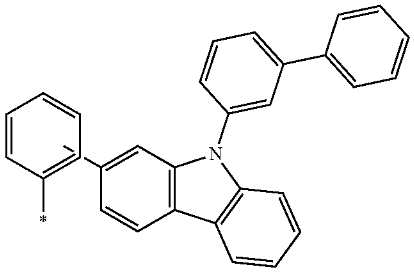
(R-72)
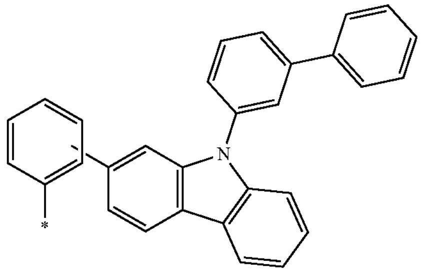
(R-72)
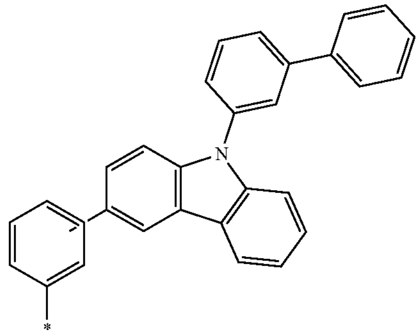
(R-73)
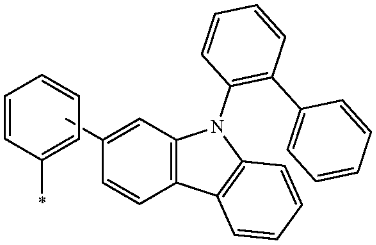
(R-74)
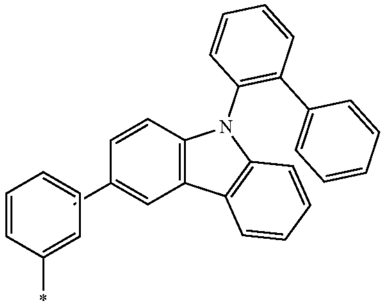

-continued
(R-75)
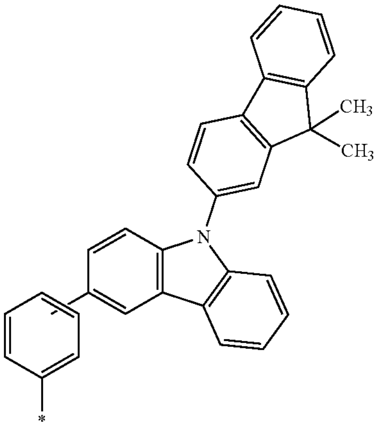
(R-76)
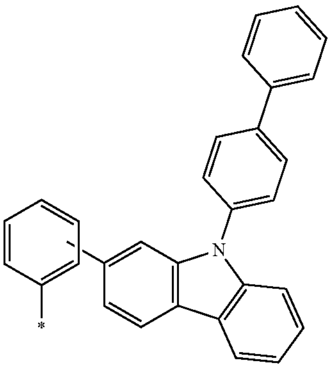
(R-77)
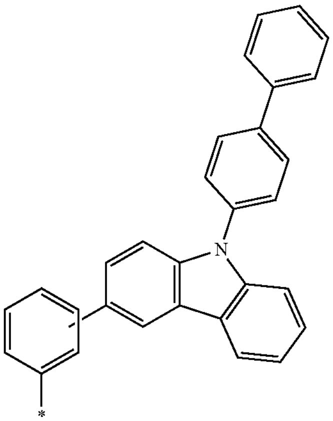
(R-78)
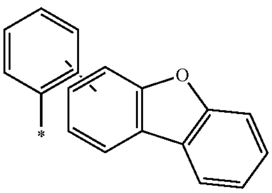
(R-79)
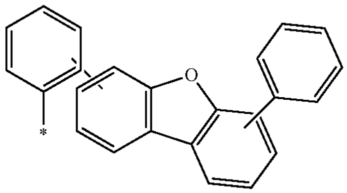
-continued
(R-80)
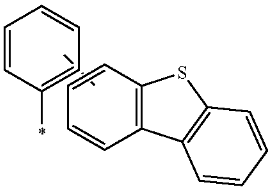
(R-81)
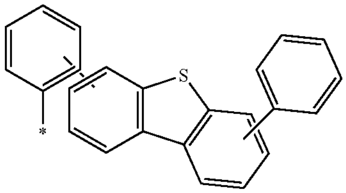
(R-82)
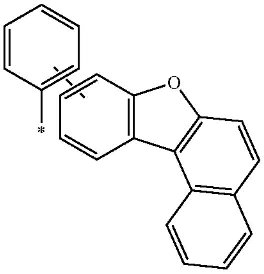
(R-83)
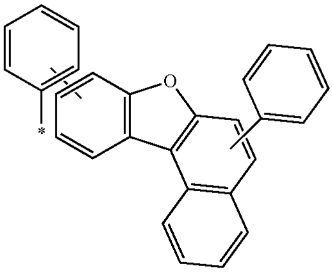
[Chemical Formulae 14]
(R-84)
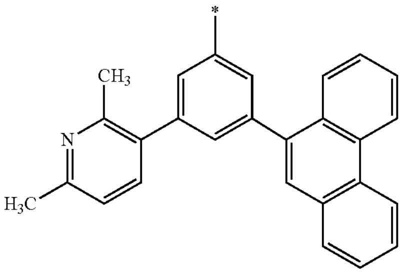
(R-85)
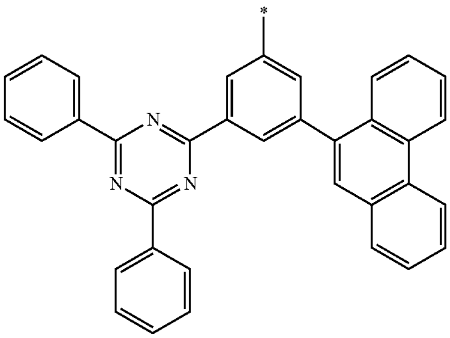

-continued
(R-86)
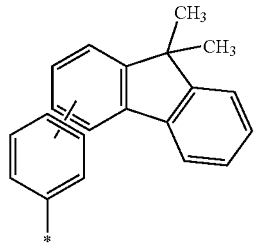
(R-87)
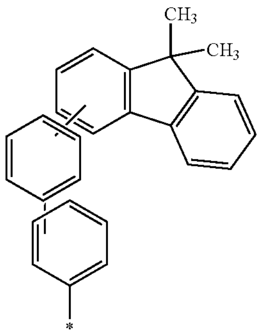
(R-88)
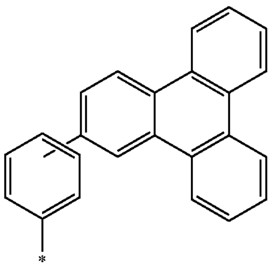
(R-89)
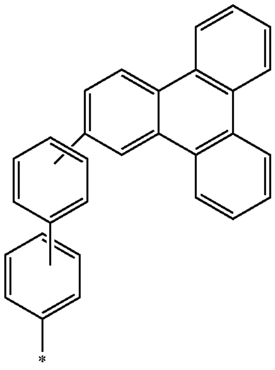
(R-90)
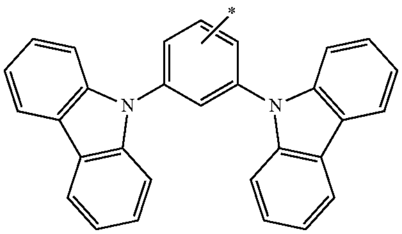
-continued
(R-91)
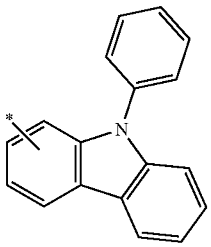
(R-92)
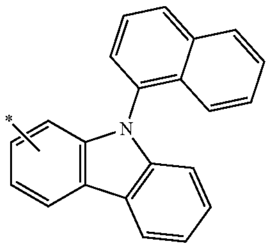
(R-93)
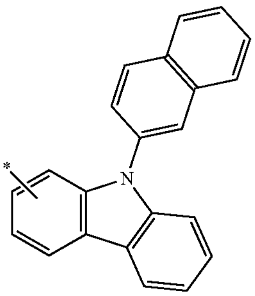
(R-94)
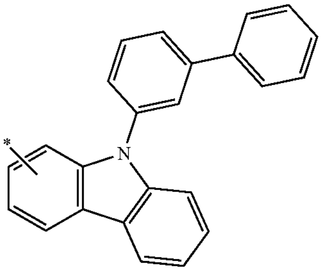
(R-95)
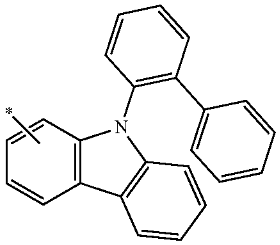

-continued
(R-96)
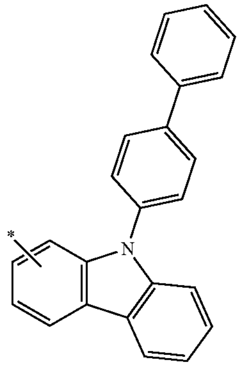
(R-97)
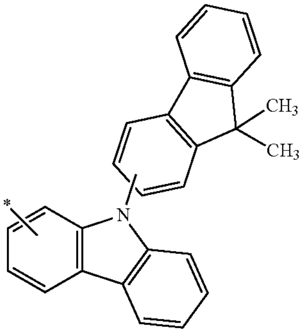
(R-98)
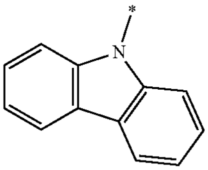
(R-99)
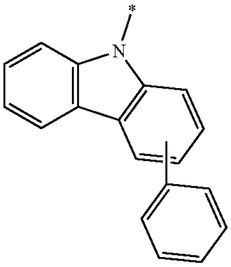
(R-100)
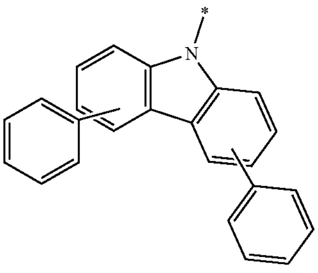
-continued
(R-101)
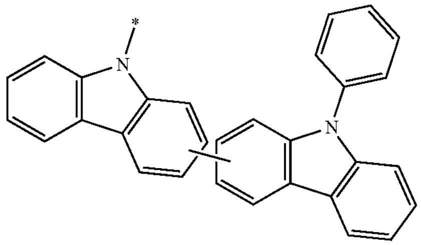
[Chemical Formulae 15]
(R-102)
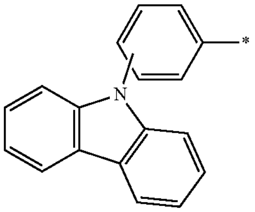
(R-103)
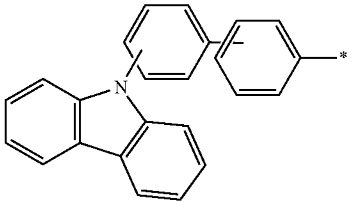
(R-104)
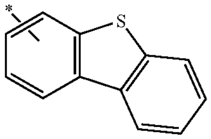
(R-105)
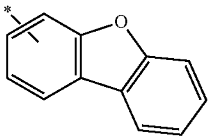
(R-106)
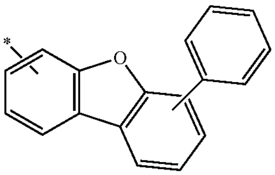
(R-107)
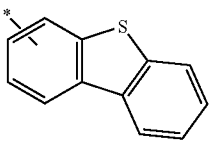

-continued
(R-108)
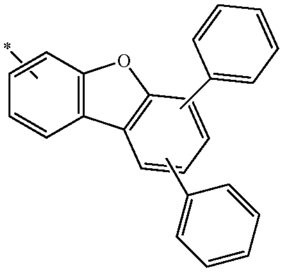
(R-109)
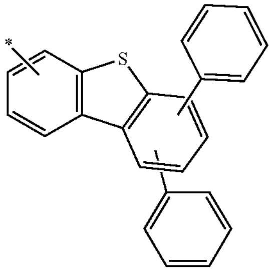
(R-110)
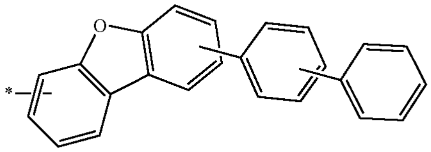
(R-111)
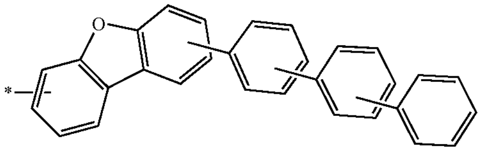
(R-112)
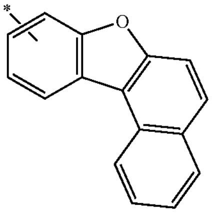
(R-113)
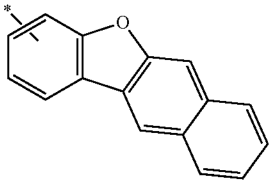
(R-113)
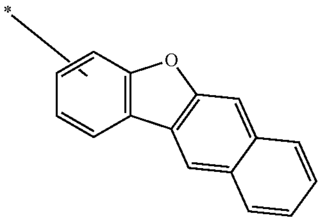
-continued
(R-114)
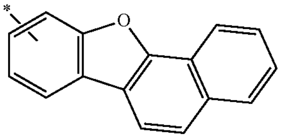
(R-115)
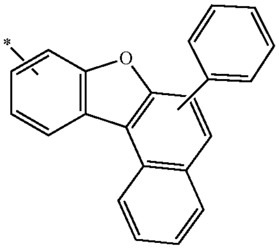
(R-116)
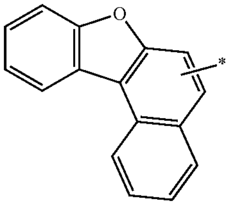
(R-117)
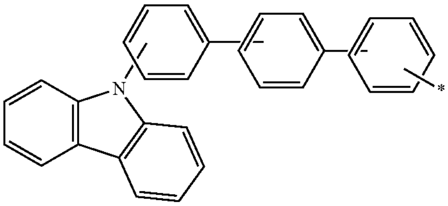
Next, specific examples of the organic compounds (the hole-transport materials) represented by General Formulae (Gh-1) to (Gh-6) are shown below.
[Chemical Formulae 16]
(201)
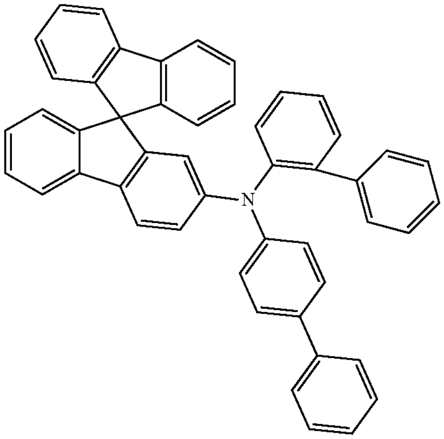

-continued
(202)
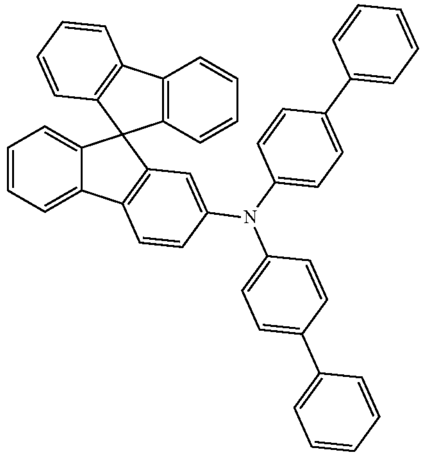
(203)
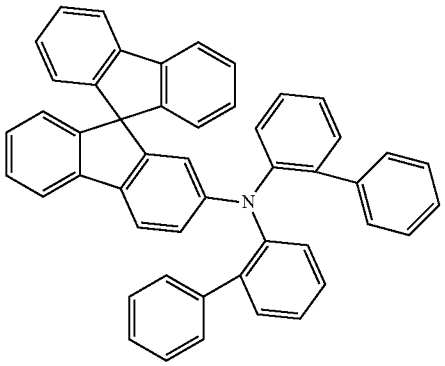
(204)
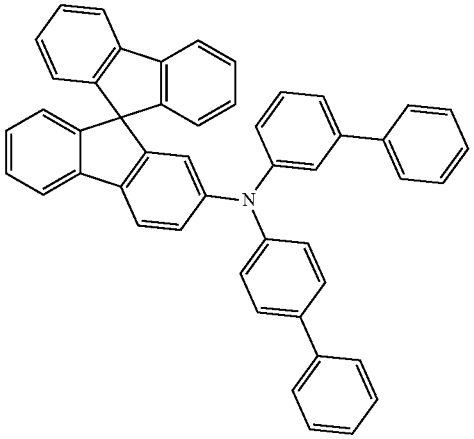
(205)
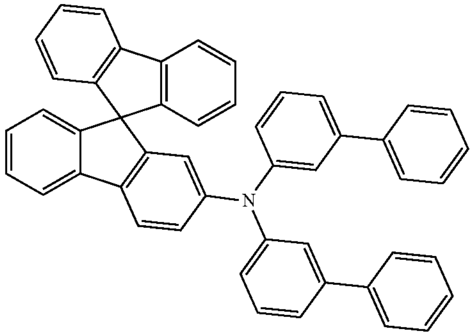
-continued
(206)
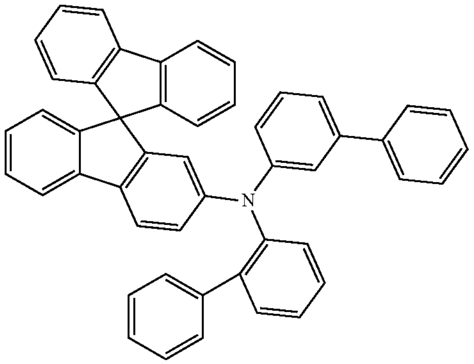
(207)
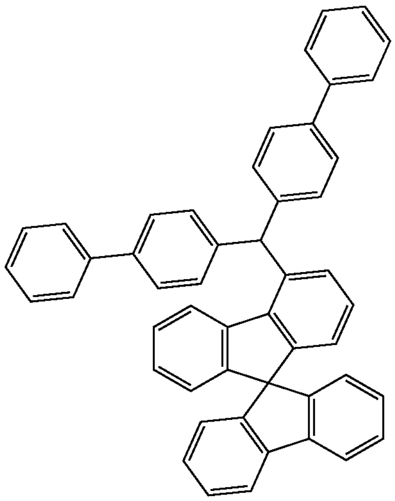
(208)
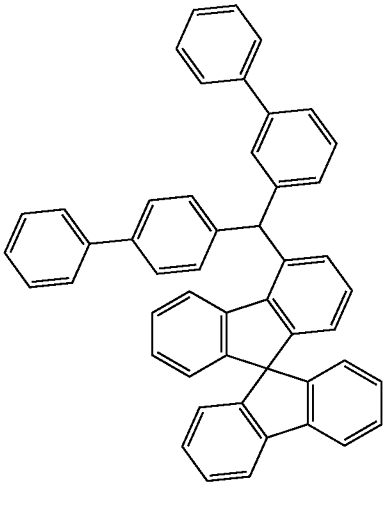

-continued
(209)
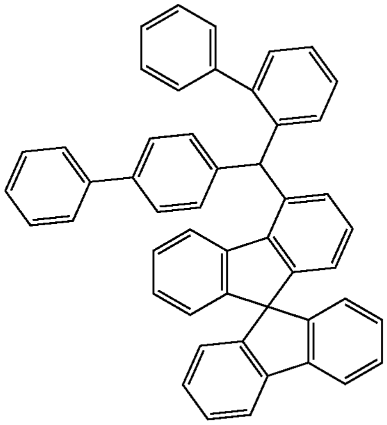
(210)
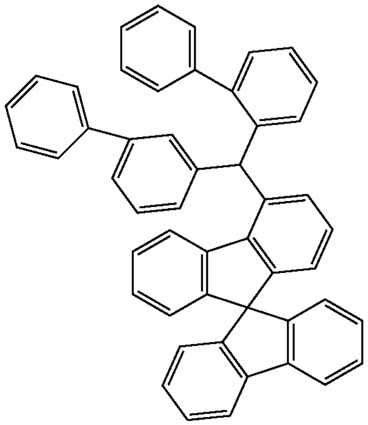
(211)
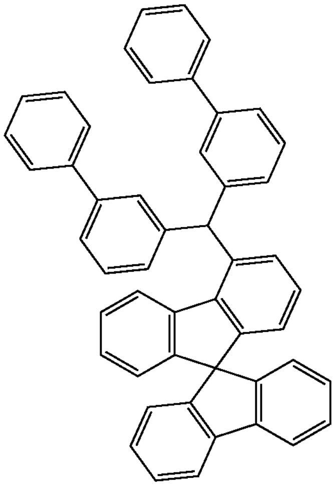
-continued
(212)
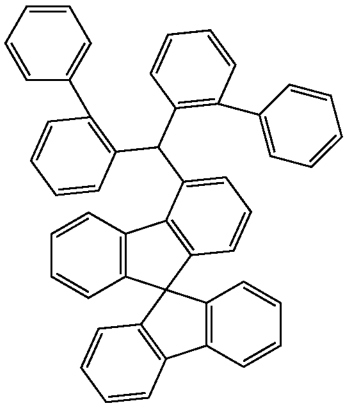
[Chemical Formulae 17]
(213)
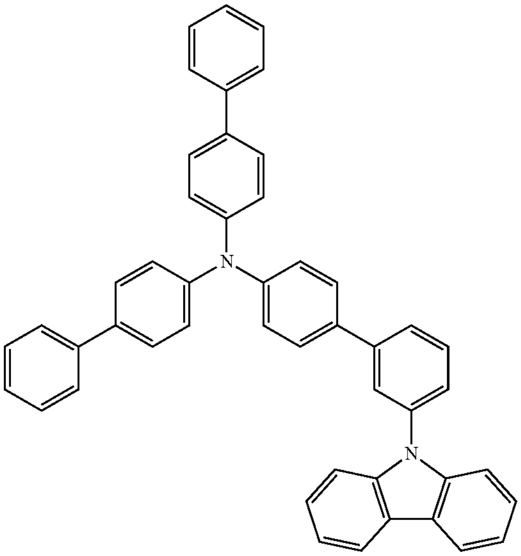
(214)
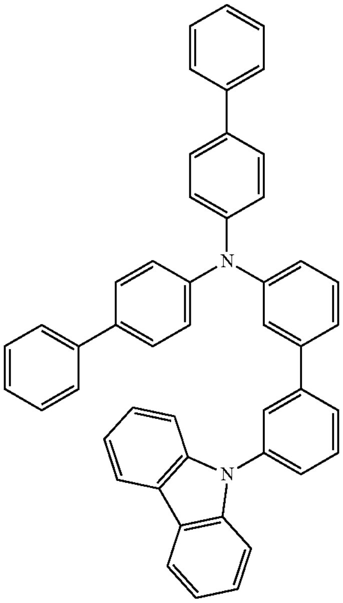

-continued
(215)
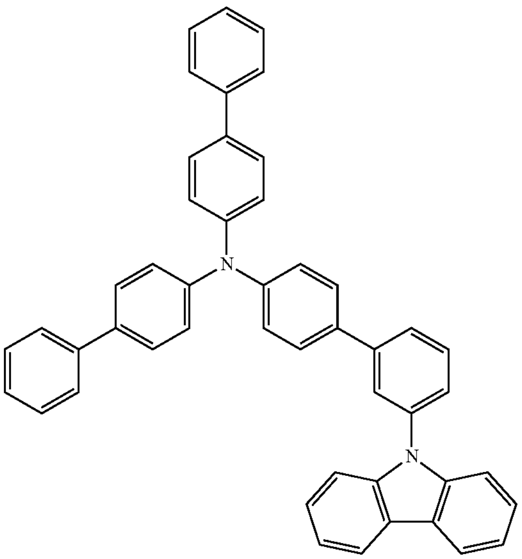
(216)
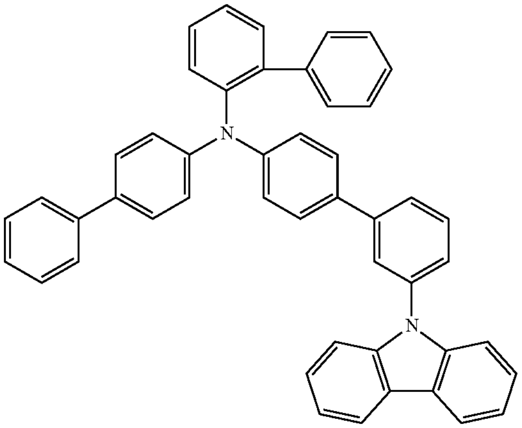
(217)
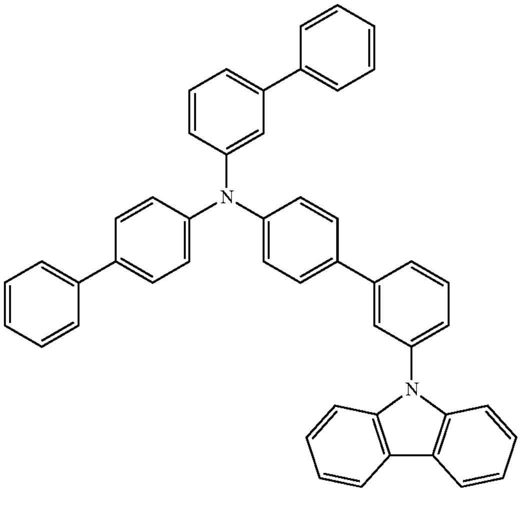
-continued
(218)
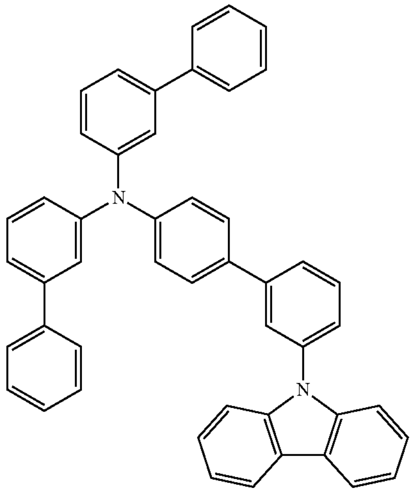
(219)
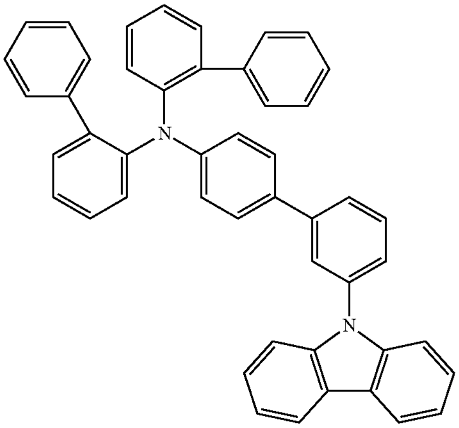
(220)
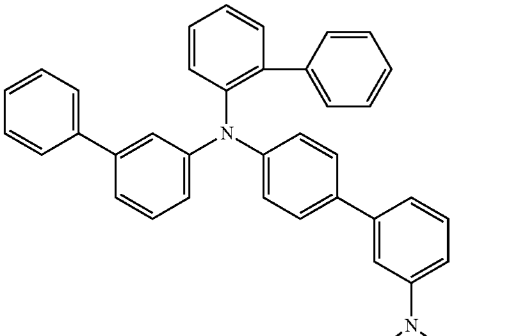

-continued
(221)
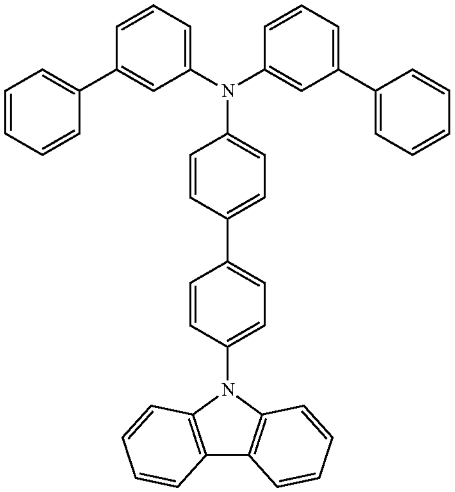
(222)
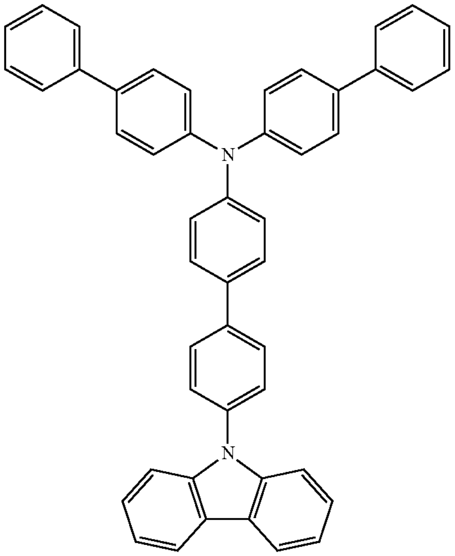
(223)
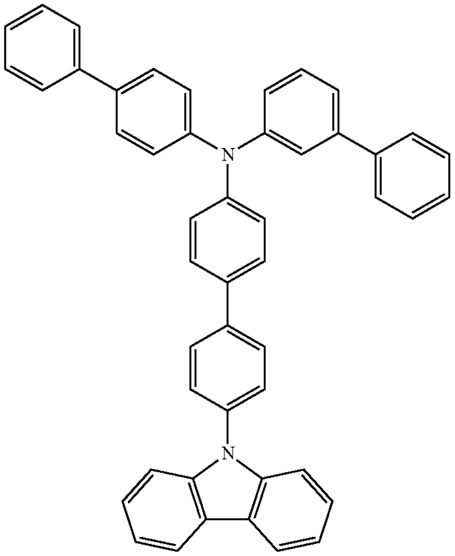
-continued
(224)
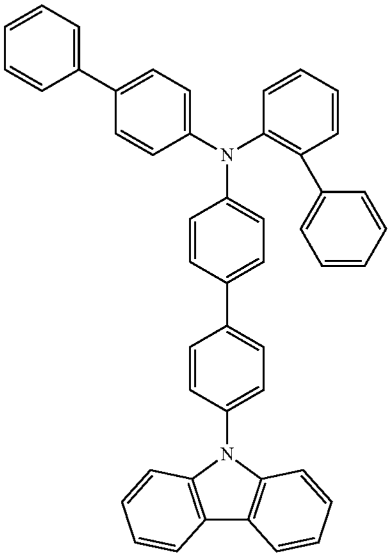
[Chemical Formulae 18]
(225)
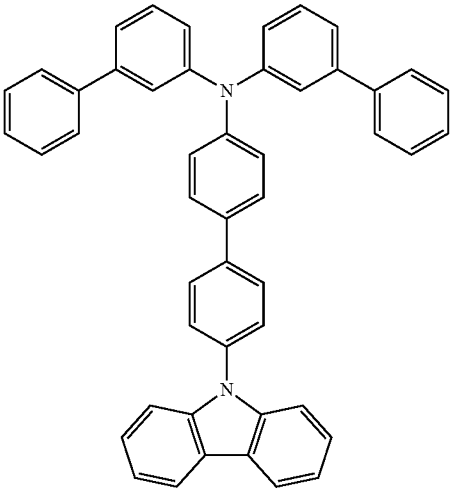
(226)
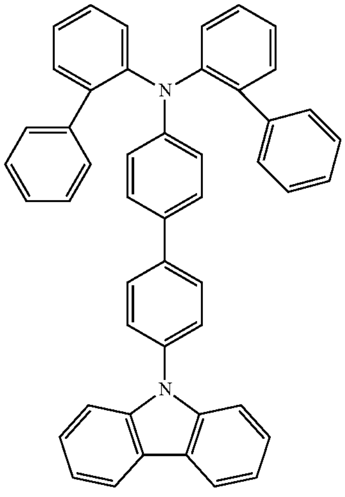

-continued
(227)
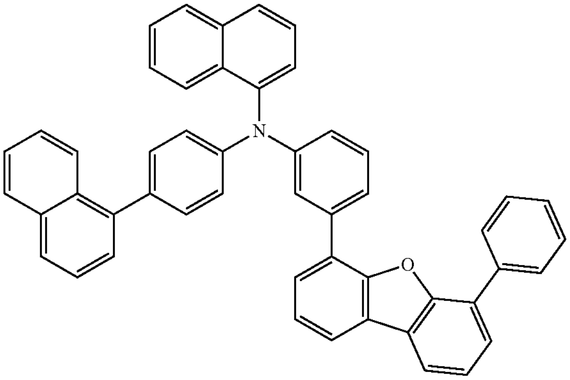
(228)
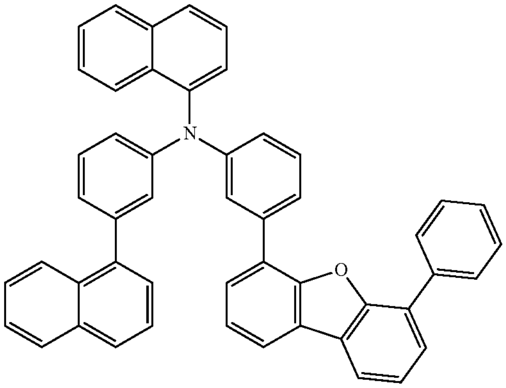
(229)
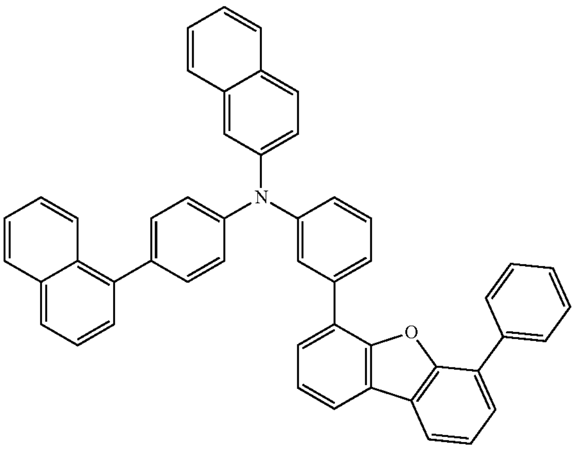
-continued
(230)
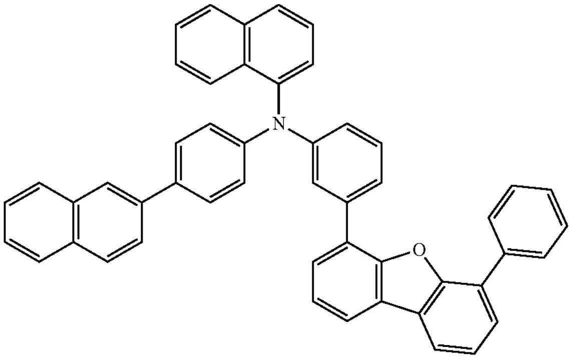
(231)
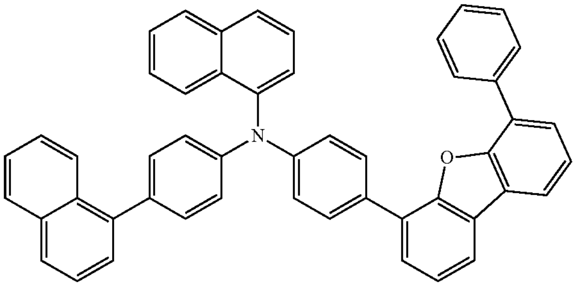
(232)
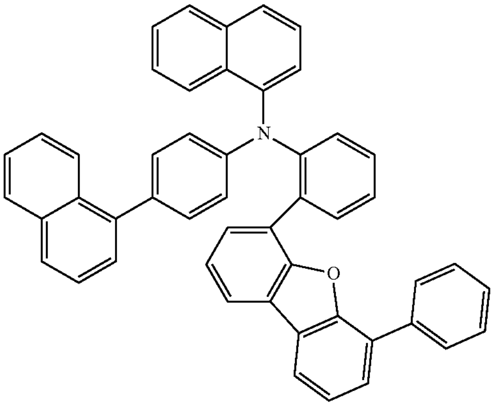
(233)
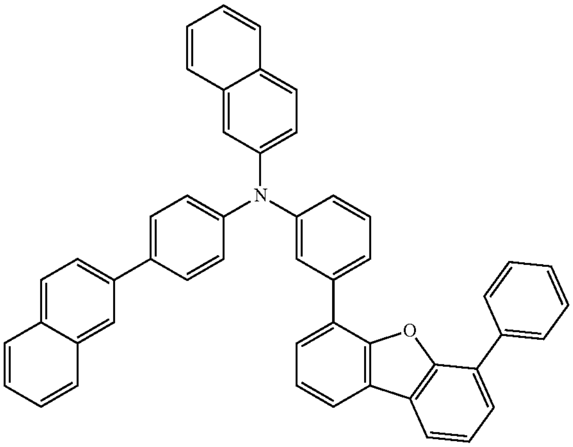

-continued
(234)
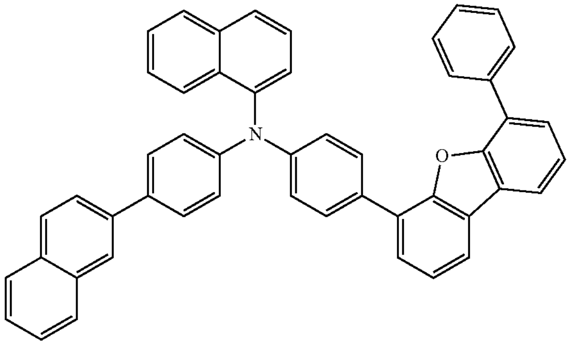
(235)
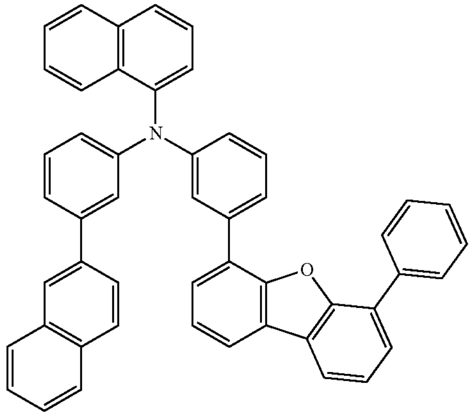
(236)
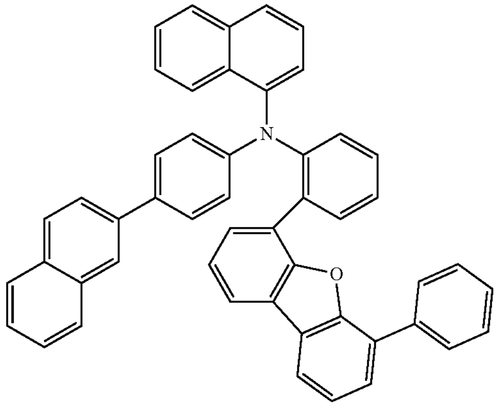
-continued
(237)
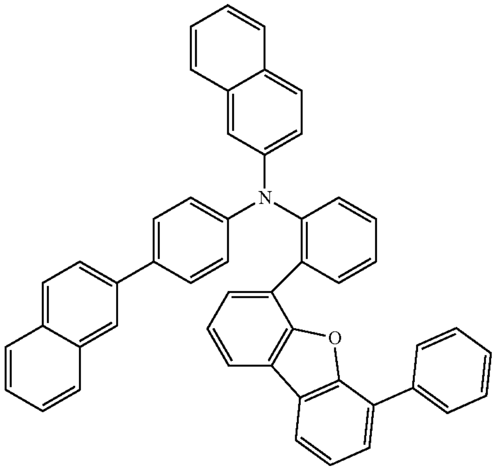
(238)
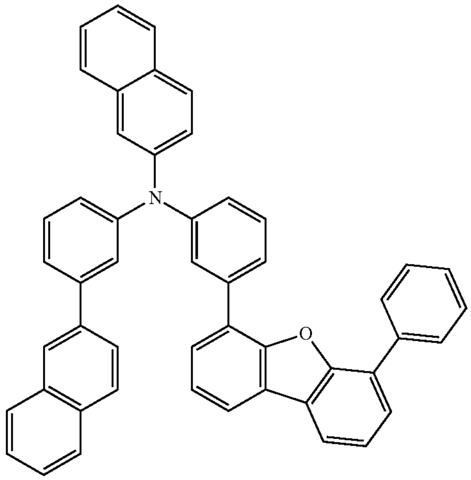
[Chemical Formulae 19]
(239)
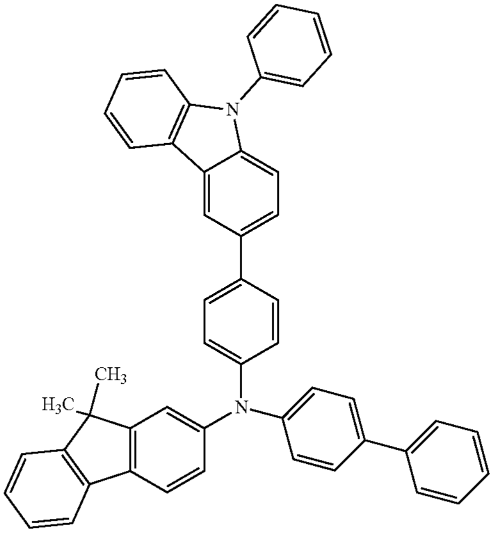

-continued
(240)
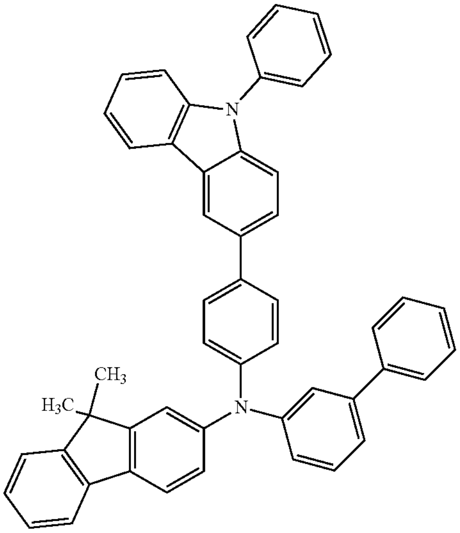
(241)
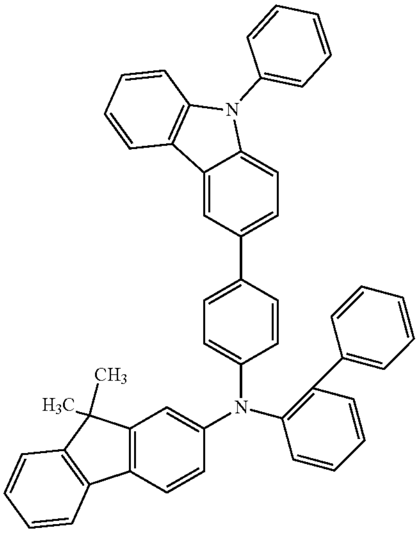
-continued
(242)
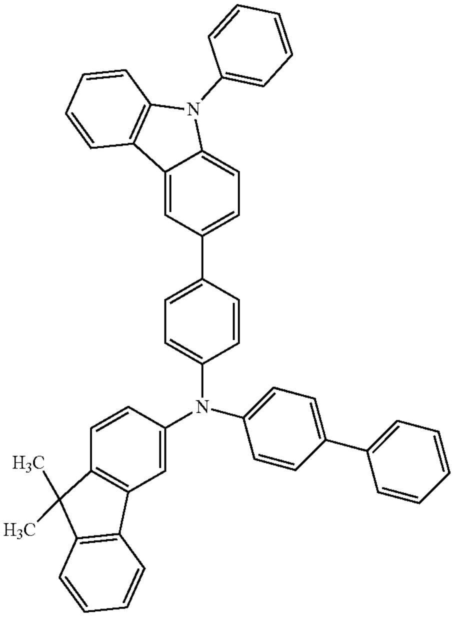
(243)
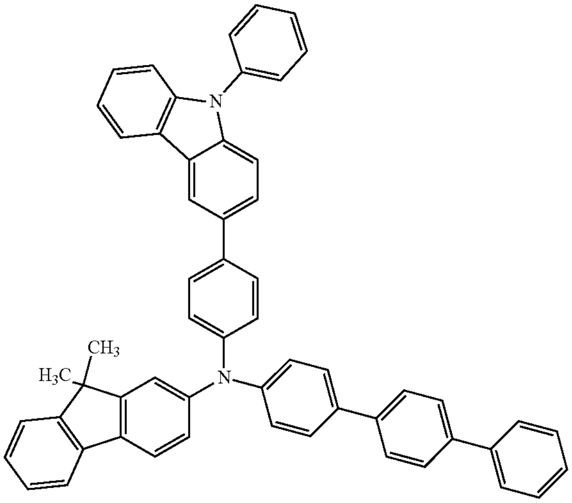
(244)
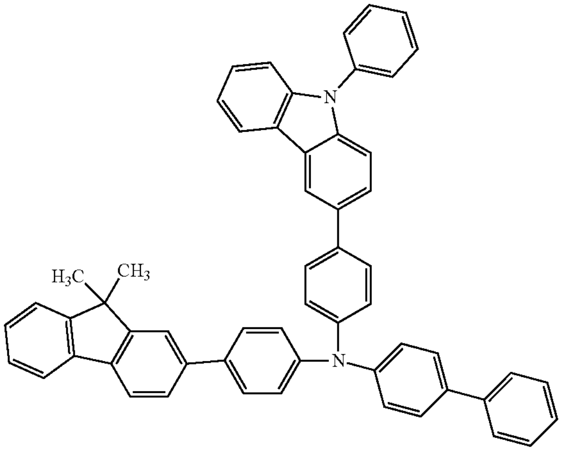

-continued
(245)
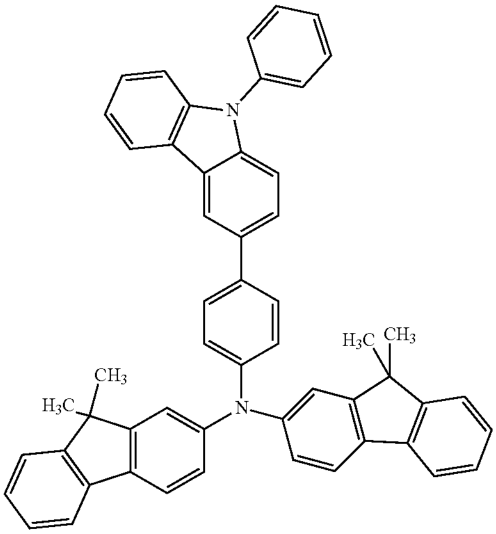
(246)
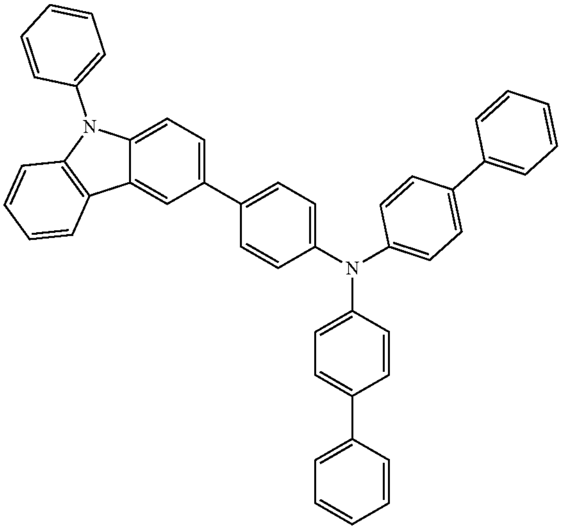
(249)
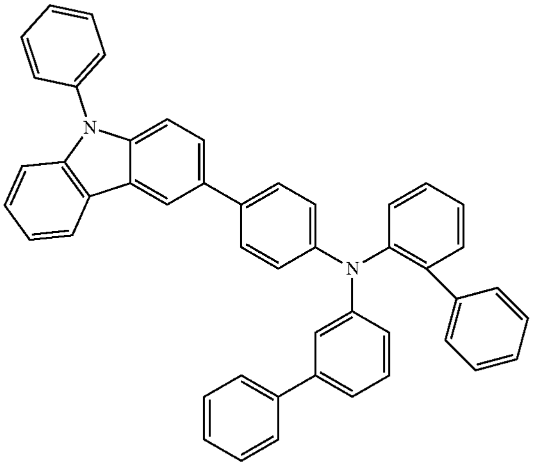
-continued
(247)
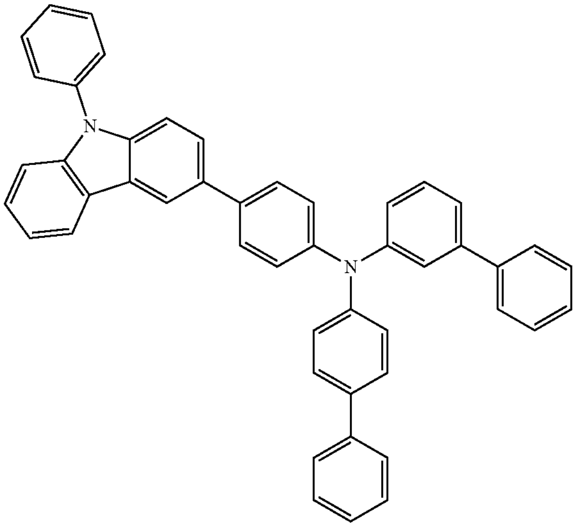
(248)
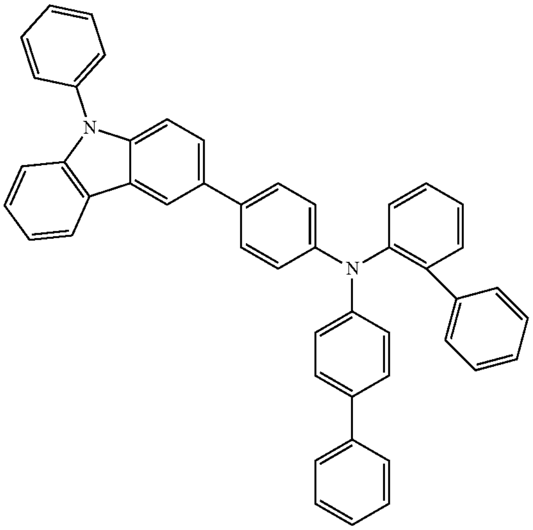
(250)
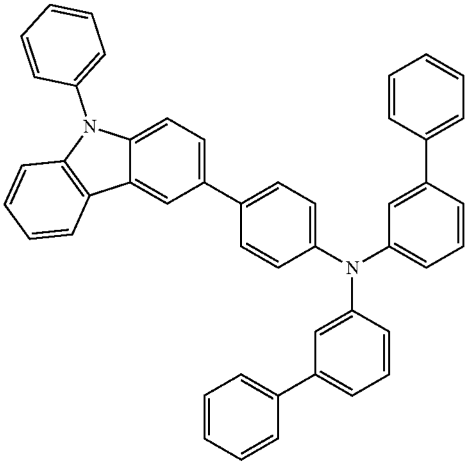

-continued
[Chemical Formulae 20]
(251)
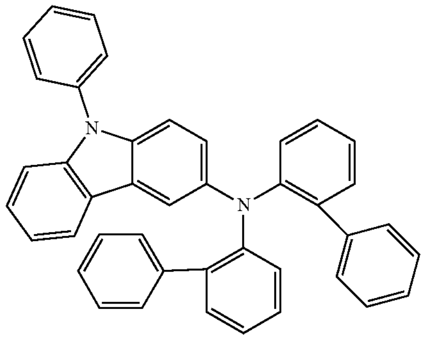
(252)
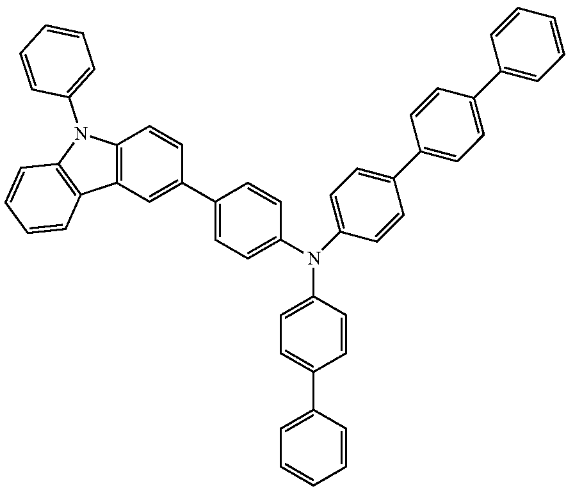
(253)
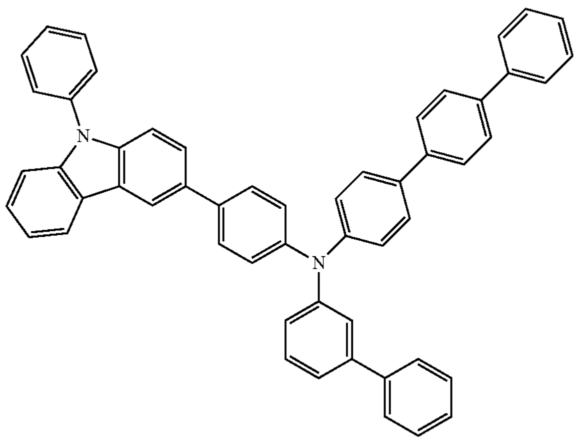
-continued
(254)
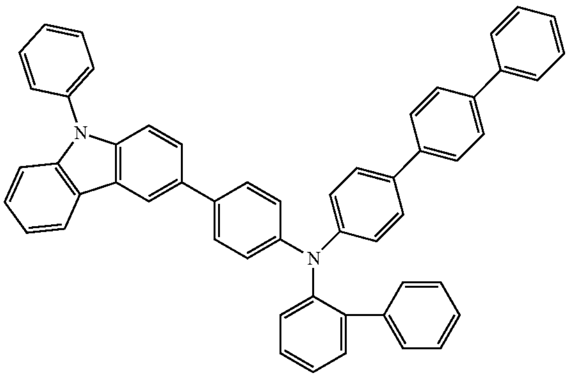
(255)
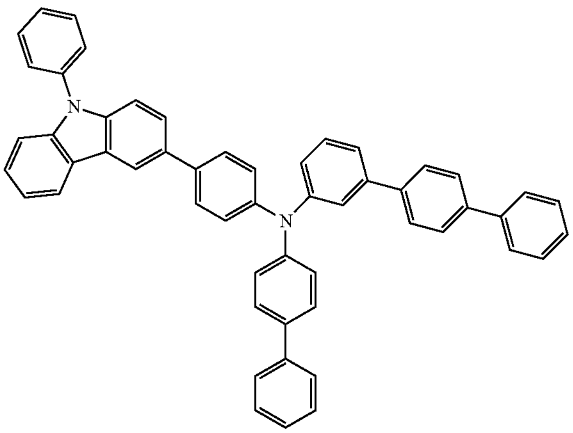
[Chemical Formulae 21]
(256)
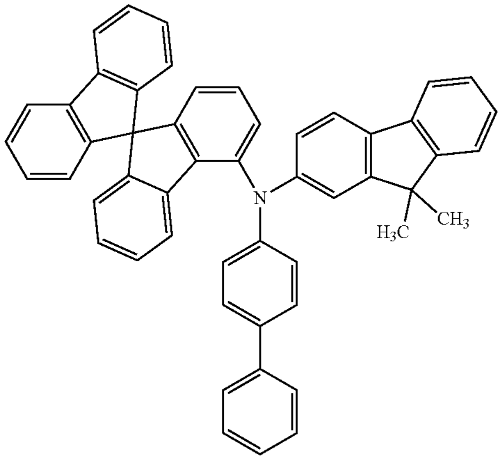

-continued
(257)
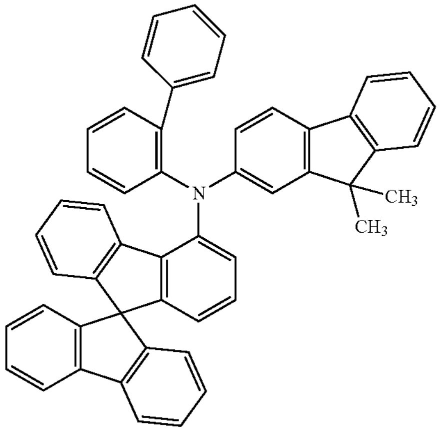
(258)
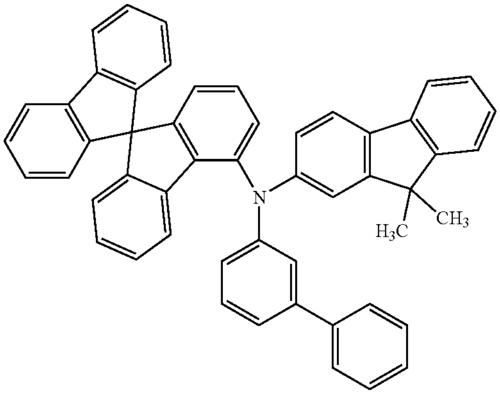
(259)
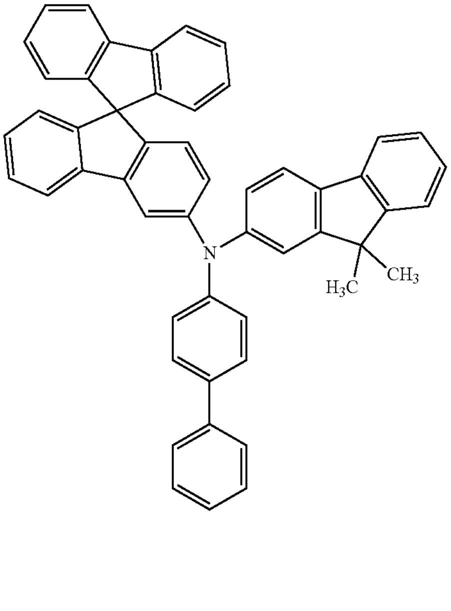
-continued
(260)
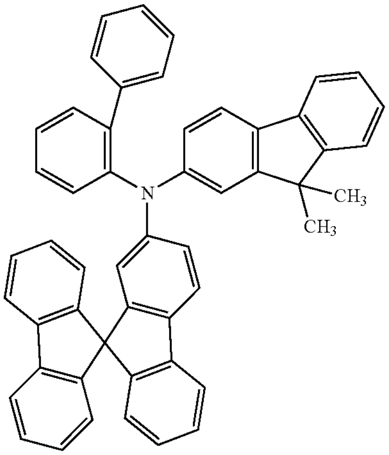
(261)
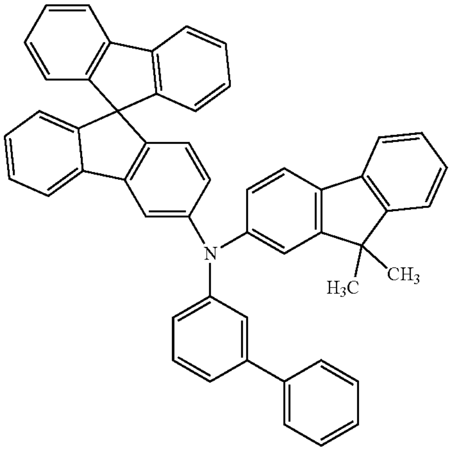
(262)
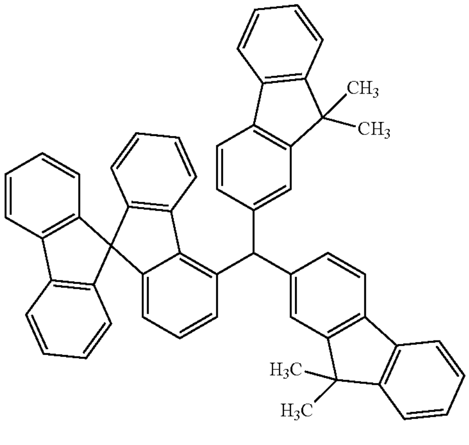

-continued
(263)
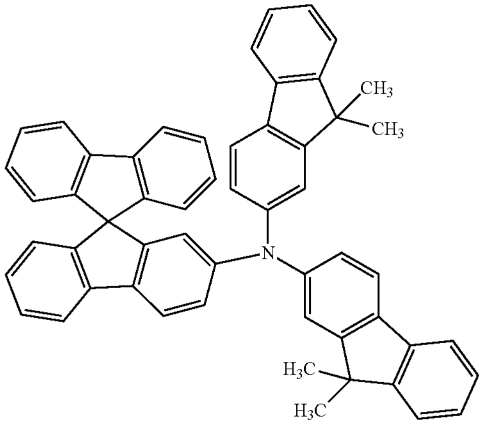
(264)
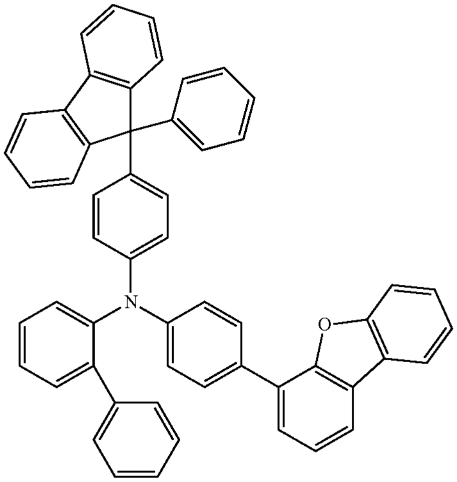
(265)
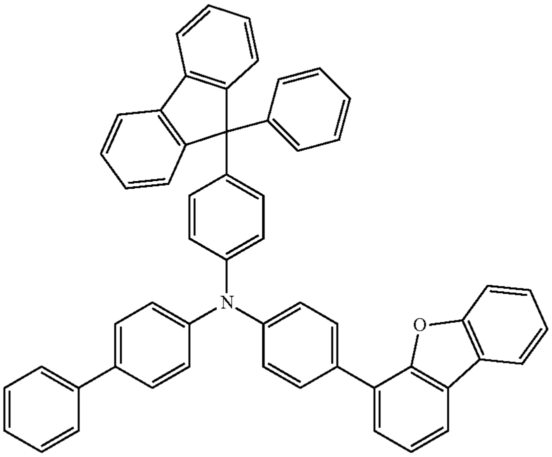
-continued
(266)
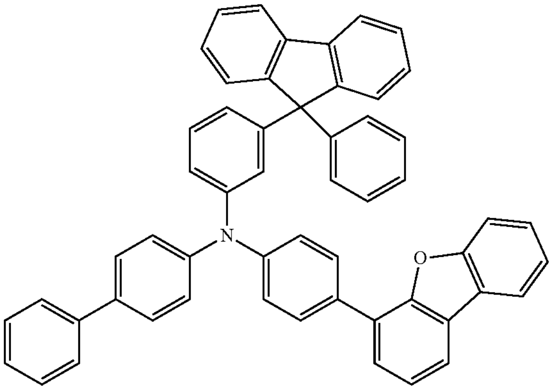
(267)
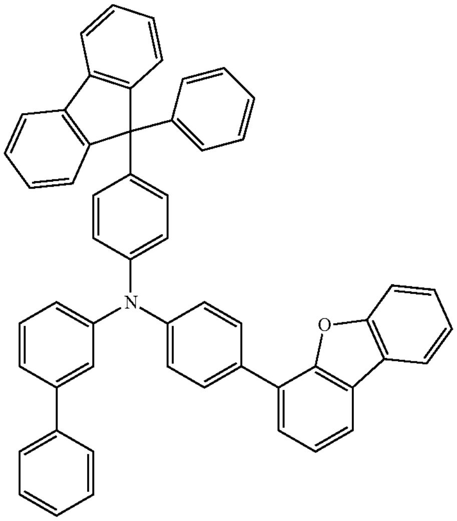
[Chemical Formulae 22]
(268)
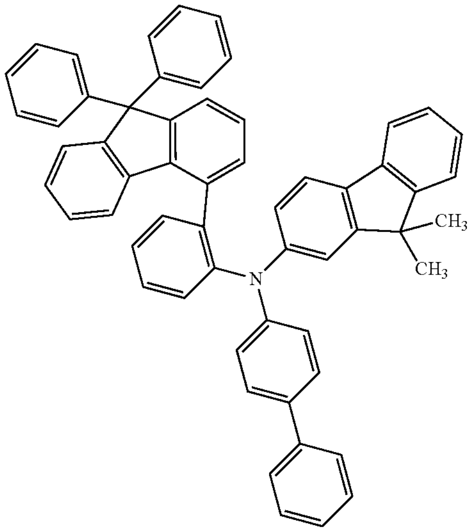

-continued
(269)
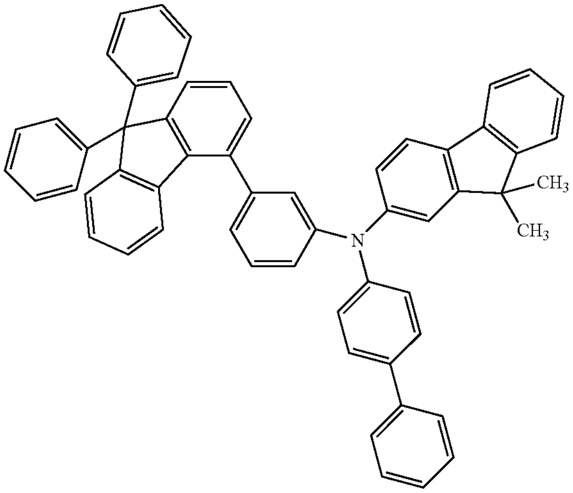
(270)
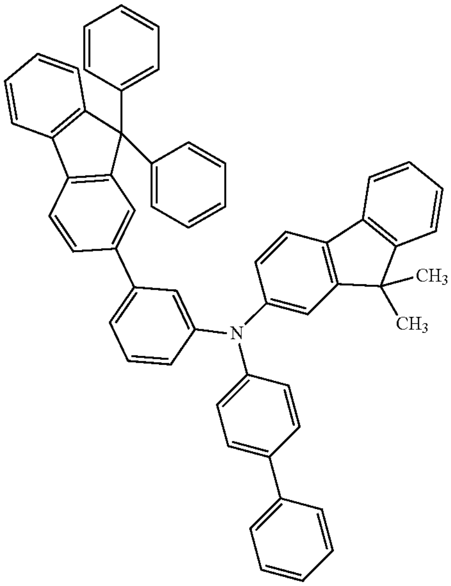
(271)
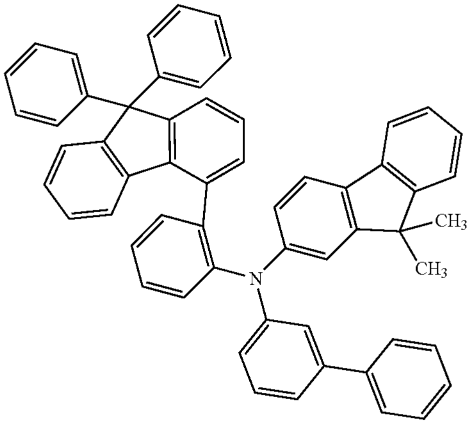
-continued
(272)
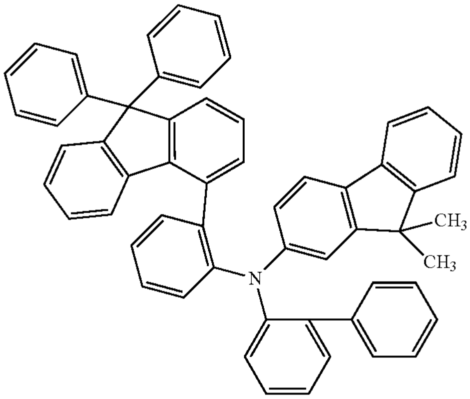
(273)
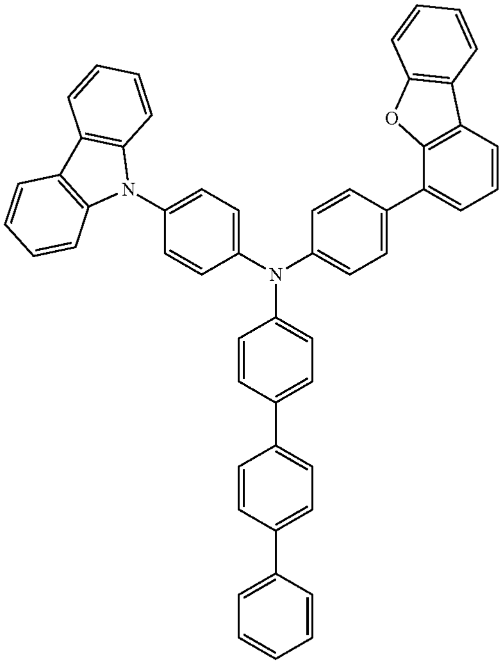

-continued
(274)
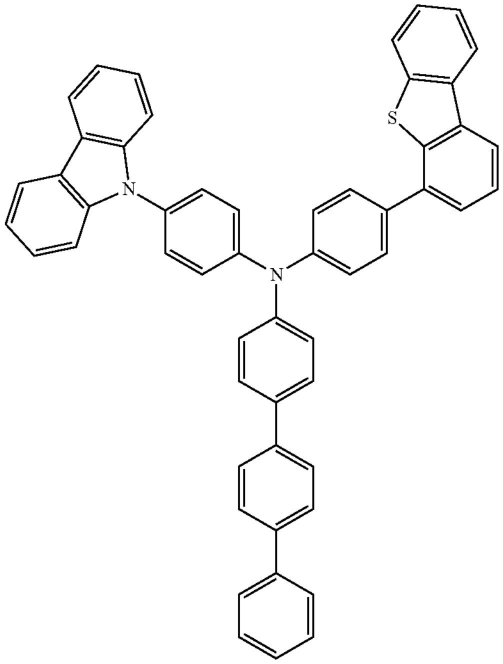
(275)
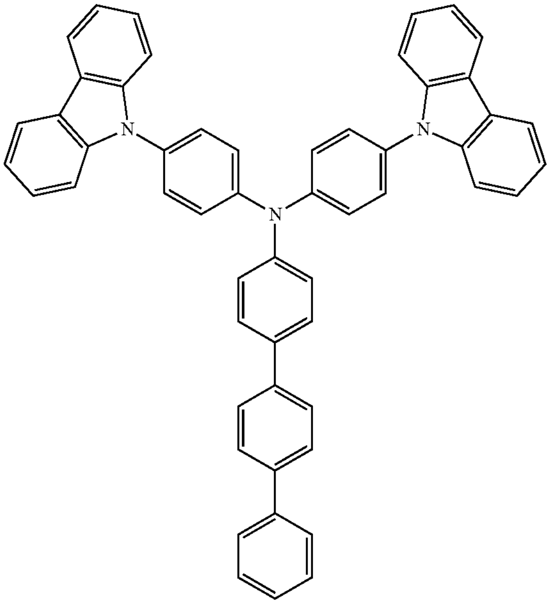
-continued
(276)
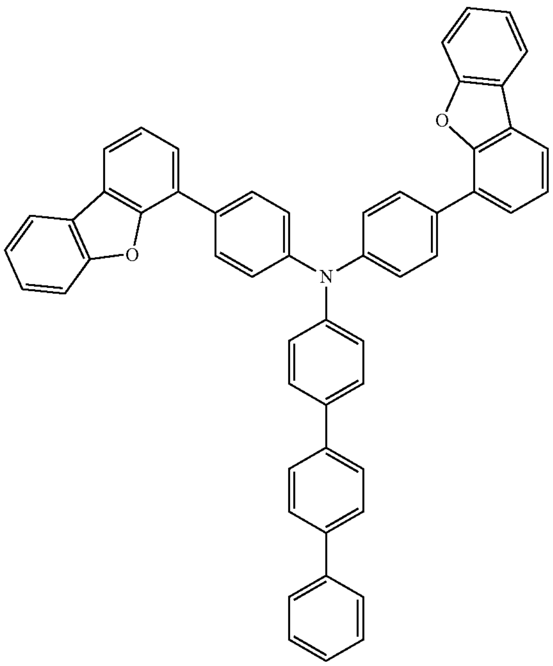
[Chemical Formulae 23]
(277)
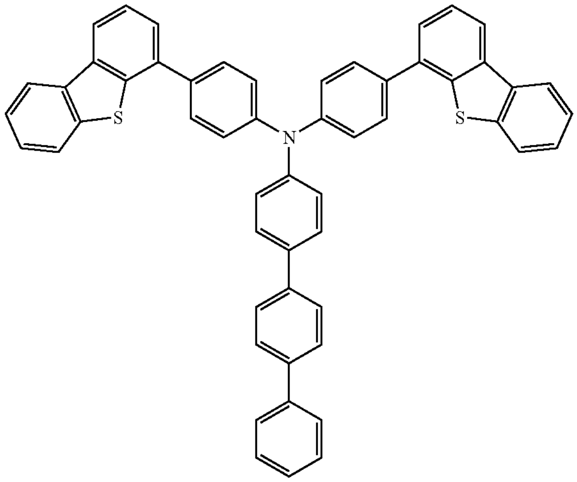
(278)
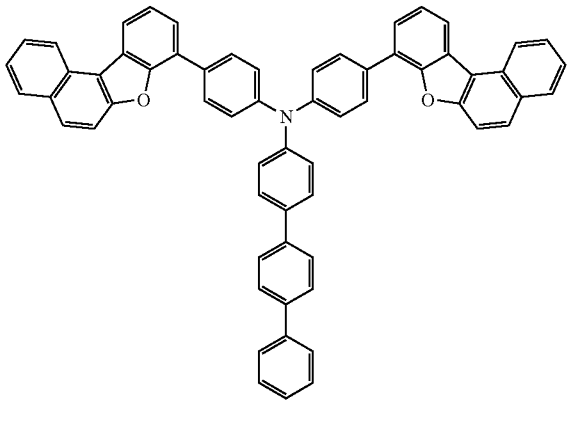

-continued
(279)
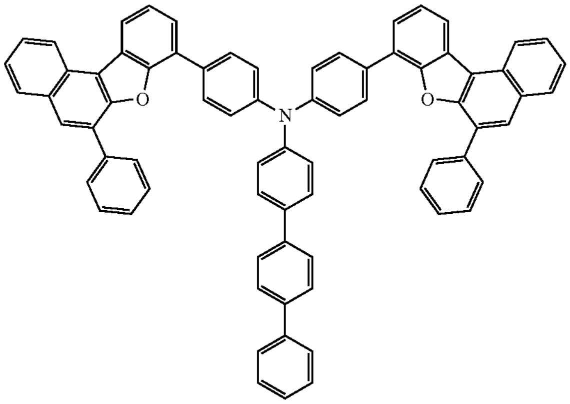
(280)
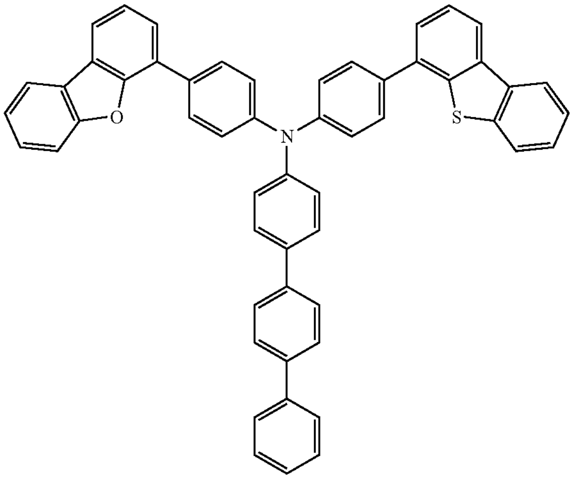
(281)
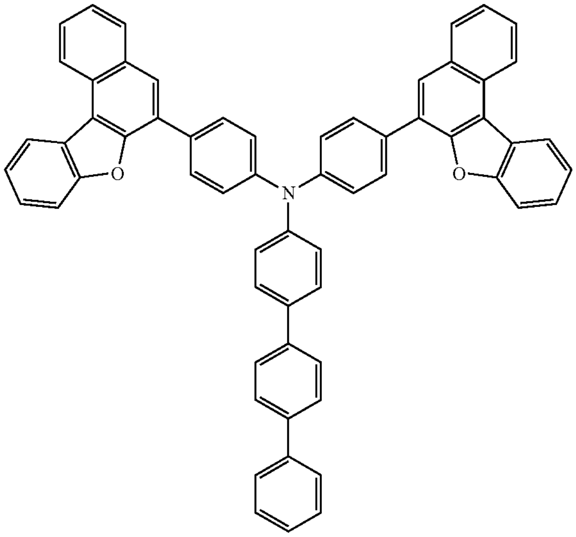
-continued
(282)
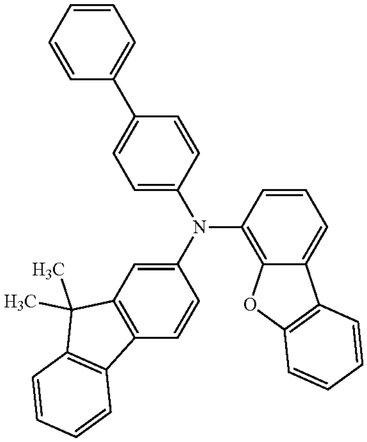
(283)
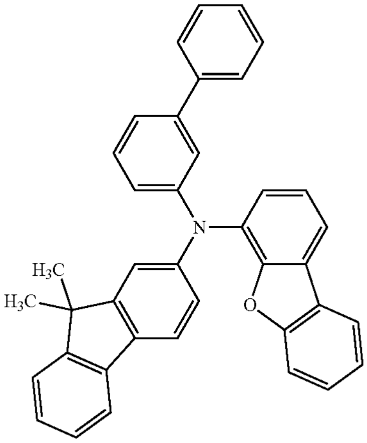
(284)
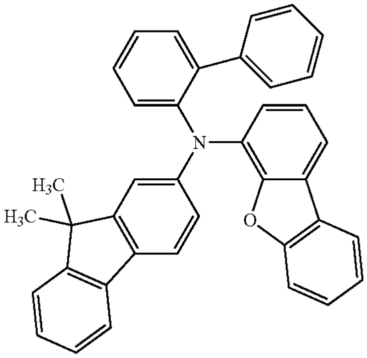

(285)
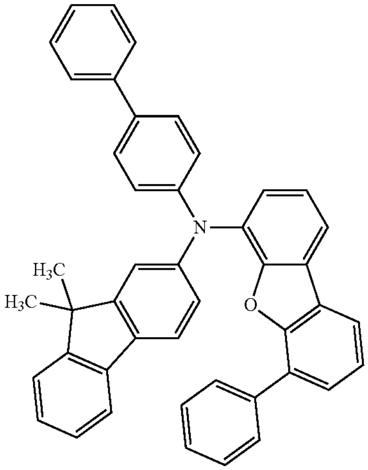
(286)
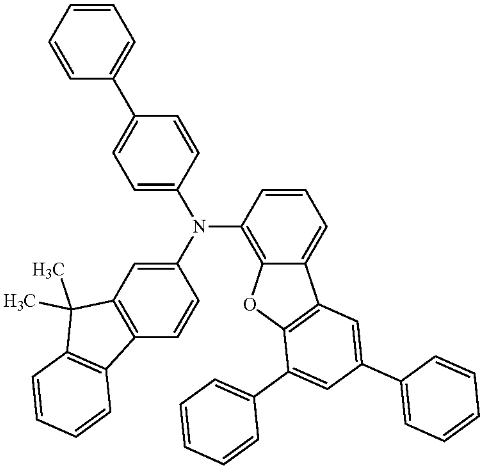
(287)
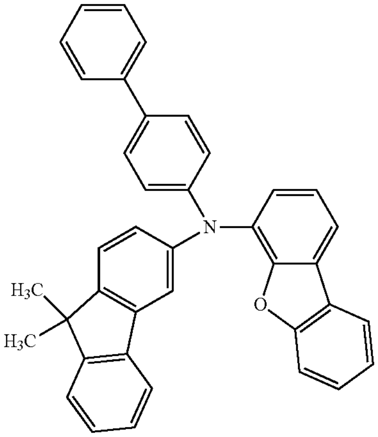
[Chemical Formulae 24]
(288)
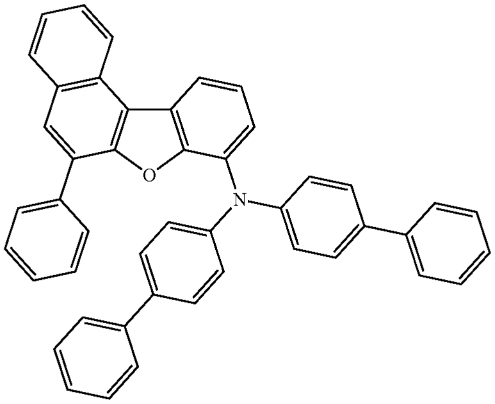
(289)
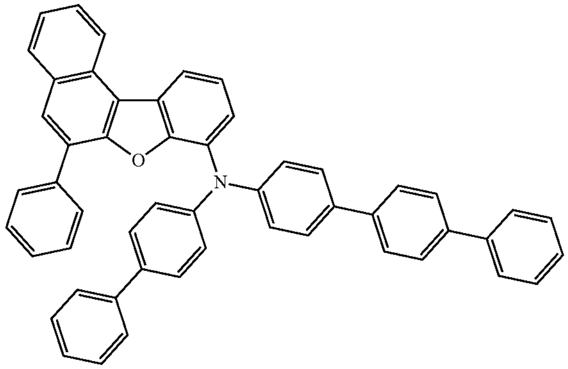
(290)
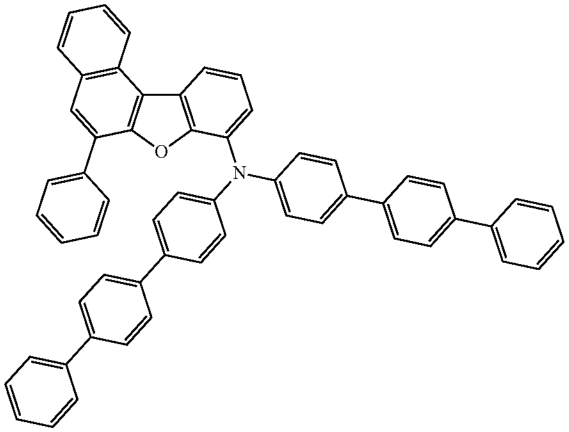

-continued
(291)
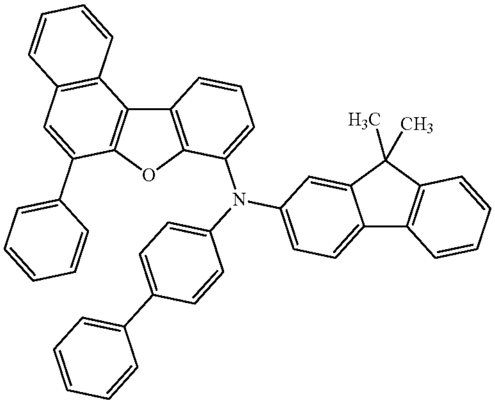
(292)
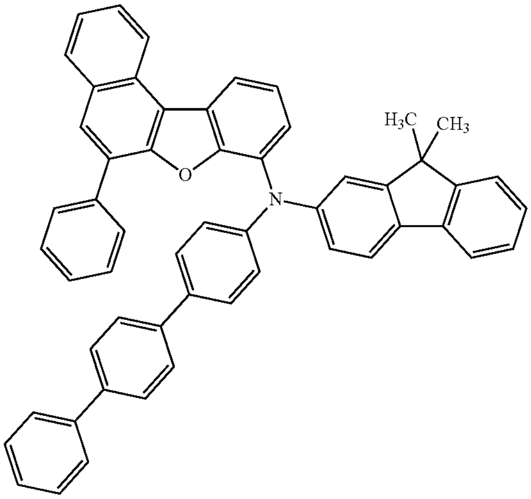
(293)
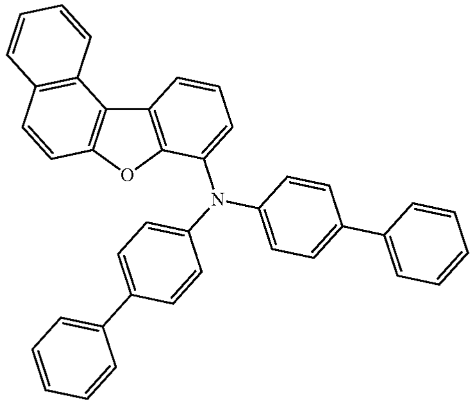
-continued
(294)
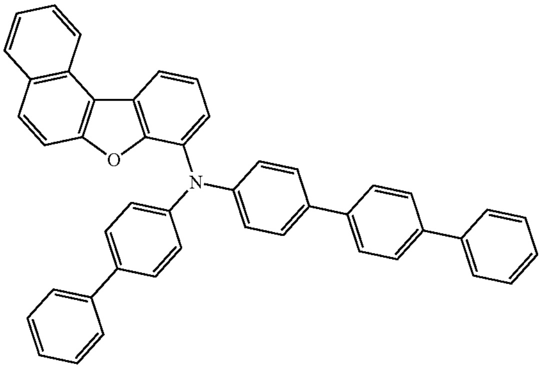
(295)
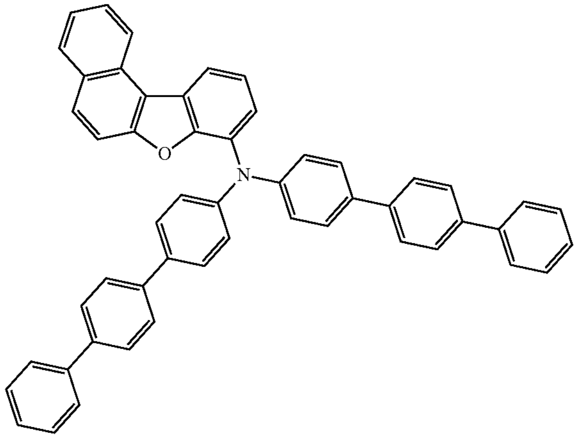
(296)
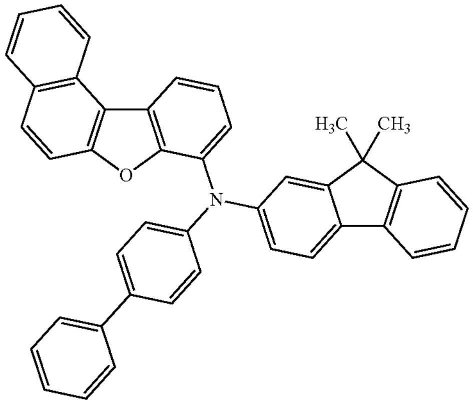

-continued
(297)
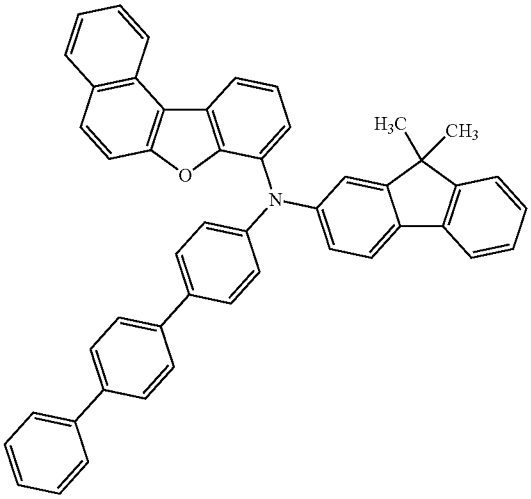
[Chemical Formulae 25]
(298)
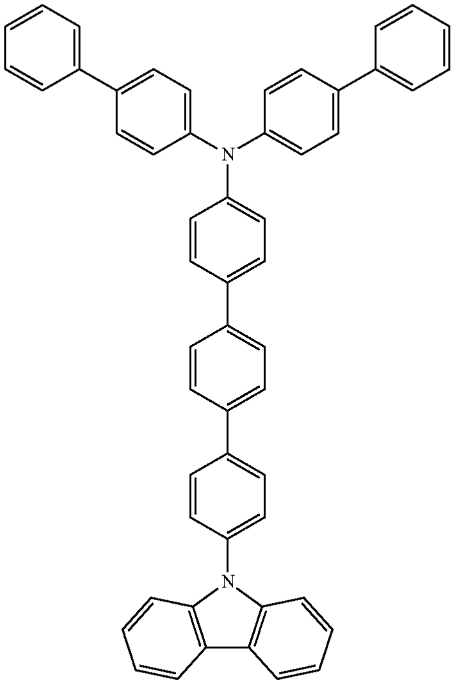
-continued
(299)
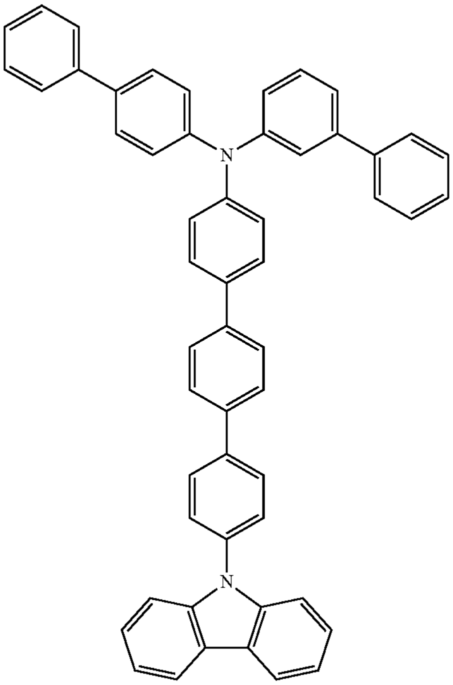
(300)
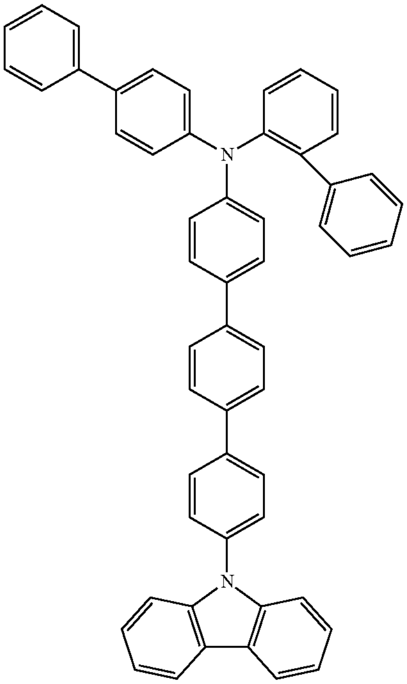

-continued (301)

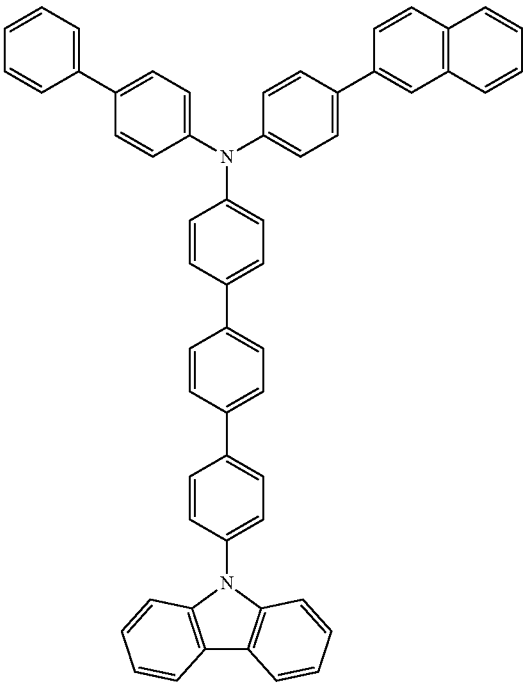

(302)

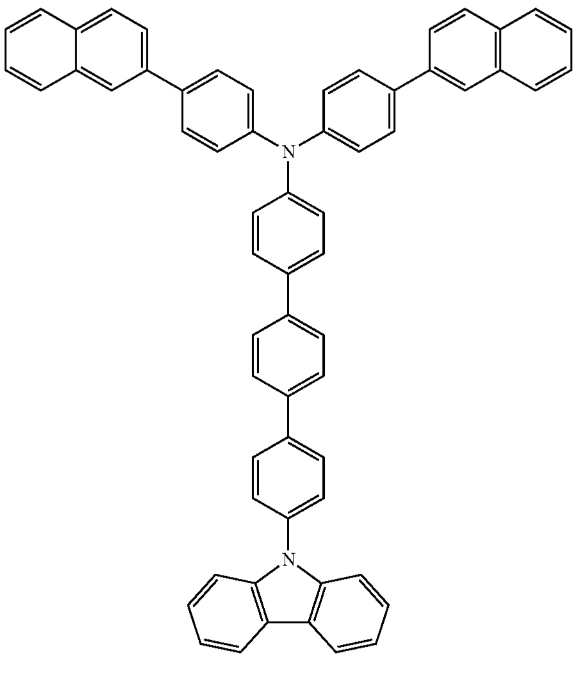

The organic compounds represented by Structural Formulae (201) to (302) are examples of the organic compounds (the hole-transport materials) represented by General Formulae (Gh-1) to (Gh-6), and the specific examples are not limited thereto.

The first carrier-transport layer 212 can also be formed using a material that can be used for a hole-transport layer 112 of the light-emitting device, which will be described in Embodiment 2.

The first carrier-transport layer 212 is not limited to a single layer, and may be a stack of two or more layers each containing any of the above substances.

In the light-receiving device described in this embodiment, the active layer 213 can be formed using the same organic compound as the first carrier-transport layer 212. The use of the same organic compound for the first carrier-transport layer 212 and the active layer 213 is preferable, in which case carriers can be efficiently transported from the first carrier-transport layer 212 to the active layer 213.

<Active Layer>

The active layer 213 generates carriers on the basis of incident light and contains a semiconductor. Examples of the semiconductor include an inorganic semiconductor such as silicon and an organic semiconductor including an organic compound. This embodiment shows an example in which an organic semiconductor is used as the semiconductor contained in the active layer. The use of an organic semiconductor is preferable because the light-emitting layer and the active layer can be formed by the same method (e.g., a vacuum evaporation method) and thus the same manufacturing apparatus can be used.

The active layer 213 includes at least a p-type semiconductor material and an n-type semiconductor material.

Examples of the p-type semiconductor material include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Other examples of the p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The p-type semiconductor material is preferably an organic compound represented by General Formula (Ga-1) below.

[Chemical Formula 26]

(Ga-1)

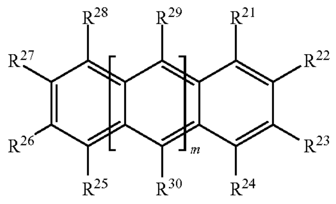

In General Formula (Ga-1), each of $R^{21}$ to $R^{30}$ independently represents hydrogen (including deuterium), a substituted or unsubstituted alkyl group having 1 to 13 carbon atoms, a cycloalkyl group having 3 to 13 carbon atoms, halogen, a substituted or unsubstituted alkyl halide group having 1 to 13 carbon atoms, a cyano group, a substituted or unsubstituted alkoxy group having 1 to 13 carbon atoms, a substituted or unsubstituted aryl group having 6 to 30 carbon atoms, a substituted or unsubstituted heteroaryl group having 2 to 30 carbon atoms, or a substituted or unsubstituted vinyl group, and m represents an integer of 1 to 5. Further, when adjacent two of $R^{21}$ to $R^{24}$ or adjacent two of $R^{25}$ to $R^{28}$ each independently represent a substituted or unsubstituted vinyl group, the two may be bonded to each other to form a condensed ring.

In General Formula (Ga-1), each of $R^{21}$ to $R^{30}$ is preferably a substituent represented by any of Formulae (Ra-1) to (Ra-77) below. Note that * in the formula represents a bond.

[Chemical Formulae 27]

(Ra-1)

(Ra-2)

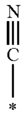
(Ra-3)

(Ra-4)

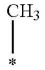
(Ra-5)

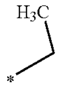
(Ra-6)

(Ra-7)

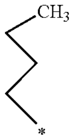
(Ra-8)

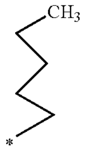
(Ra-9)

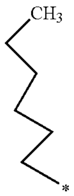
(Ra-10)

-continued

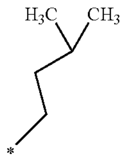
(Ra-11)

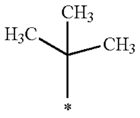
(Ra-12)

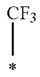
(Ra-13)

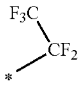
(Ra-14)

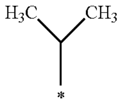
(Ra-15)

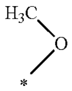
(Ra-16)

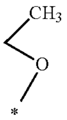
(Ra-17)

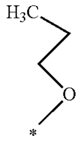
(Ra-18)

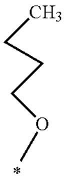
(Ra-19)

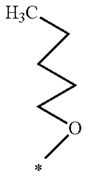
(Ra-20)

-continued
(Ra-21)
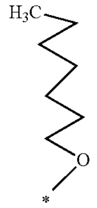
(Ra-22)
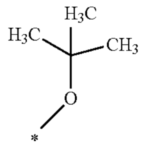
(Ra-23)
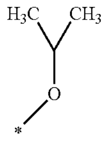
[Chemical Formulae 28]
(Ra-24)
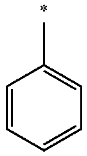
(Ra-25)
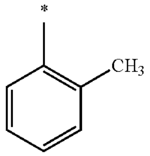
(Ra-26)
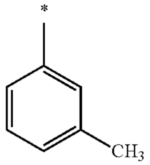
(Ra-27)
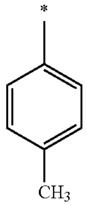
(Ra-28)
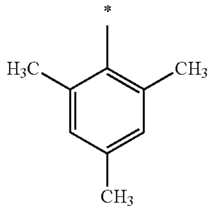
-continued
(Ra-29)
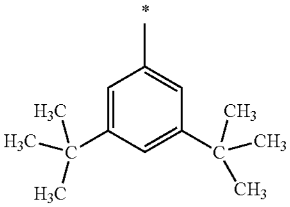
(Ra-30)
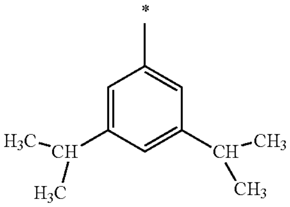
(Ra-31)
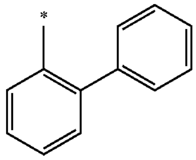
(Ra-32)
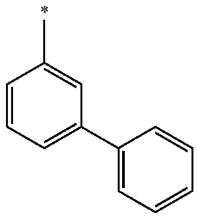
(Ra-33)
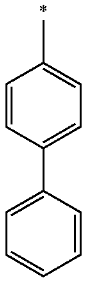
(Ra-34)
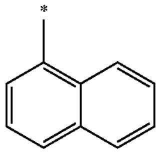
(Ra-35)
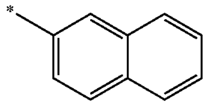

-continued
(Ra-36)
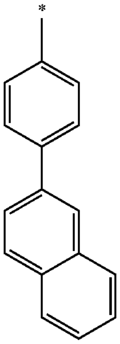
(Ra-37)
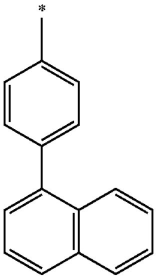
(Ra-38)
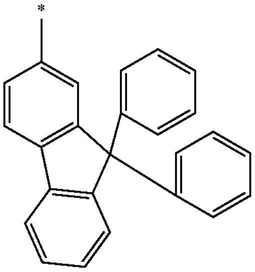
(Ra-39)
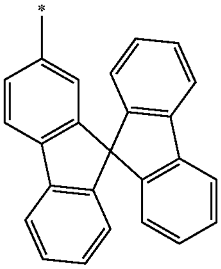
[Chemical Formulae 29]
(Ra-40)
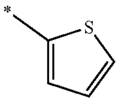
(Ra-41)
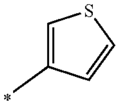
(Ra-42)
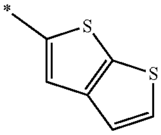
-continued
(Ra-43)
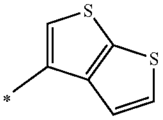
(Ra-44)
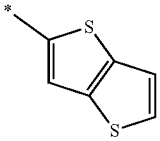
(Ra-45)
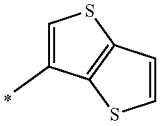
(Ra-46)
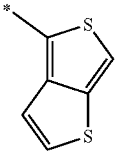
(Ra-47)
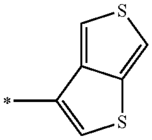
(Ra-48)
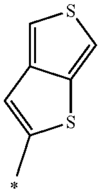
(Ra-49)
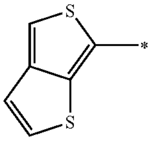
(Ra-50)
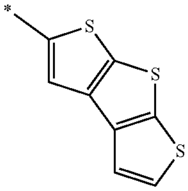
(Ra-51)
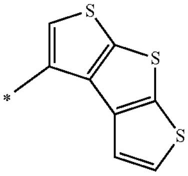

-continued
(Ra-52)
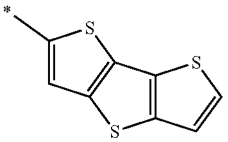
(Ra-53)
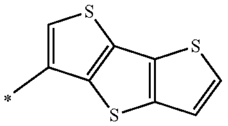
(Ra-54)
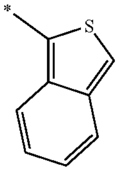
(Ra-55)
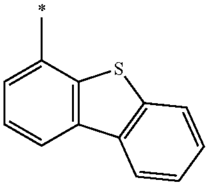
(Ra-56)
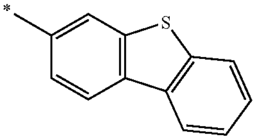
(Ra-57)
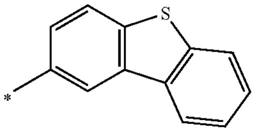
(Ra-58)
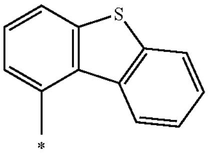
(Ra-59)
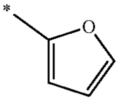
(Ra-60)
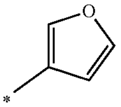
(Ra-61)
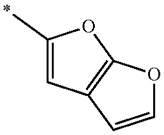
-continued
(Ra-62)
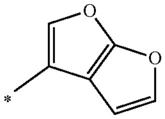
(Ra-63)
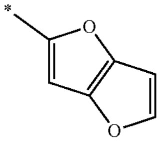
(Ra-64)
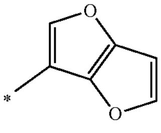
(Ra-65)
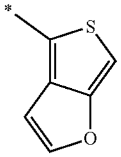
(Ra-66)
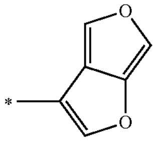
(Ra-67)
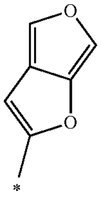
(Ra-68)
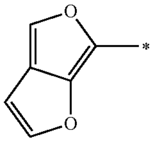
(Ra-69)
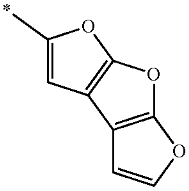
(Ra-70)
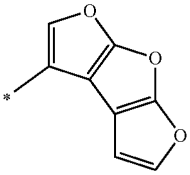

-continued
(Ra-71)
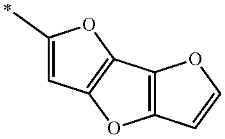
(Ra-72)
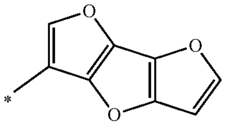
(Ra-73)
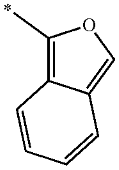
(Ra-74)
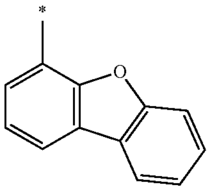
(Ra-75)
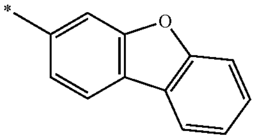
(Ra-76)
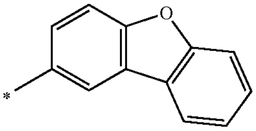
(Ra-77)
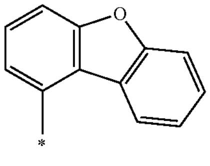
Next, specific examples of the p-type semiconductor material represented by General Formula (Ga-1) are shown below.
[Chemical Formulae 30]
(101)
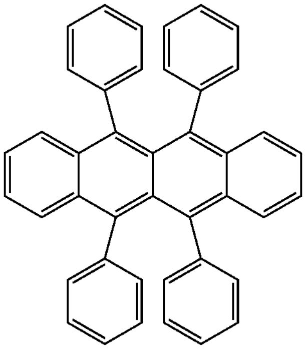
(102)
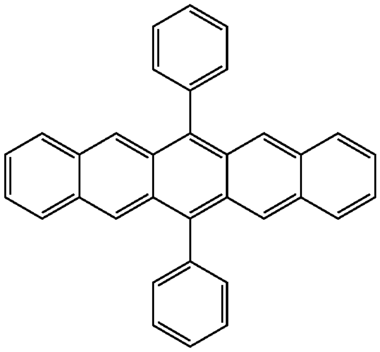
(103)
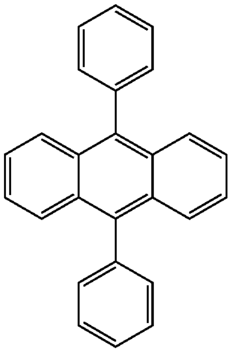
(104)
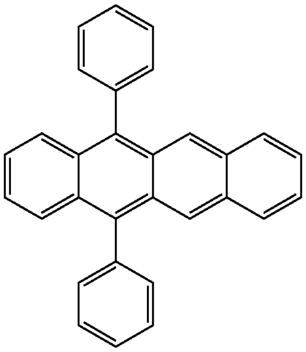

-continued
(105)
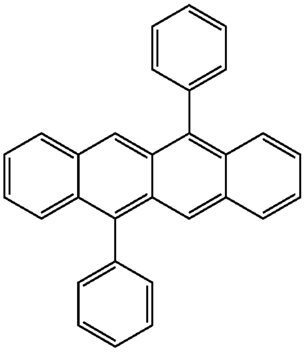
(106)
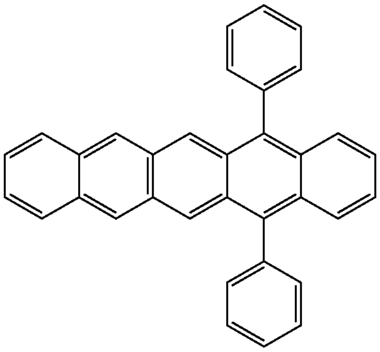
(107)
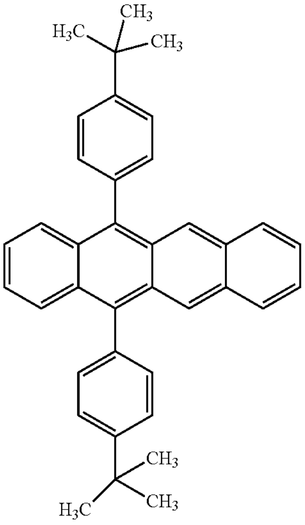
(108)
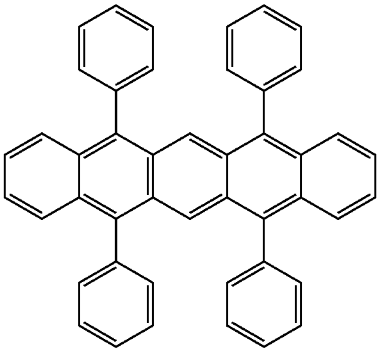
-continued
(109)
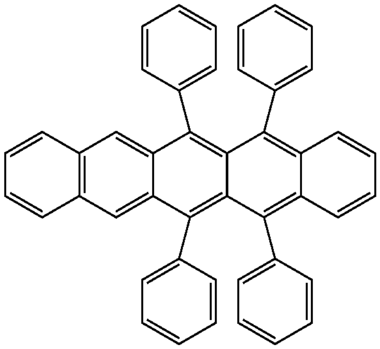
(110)
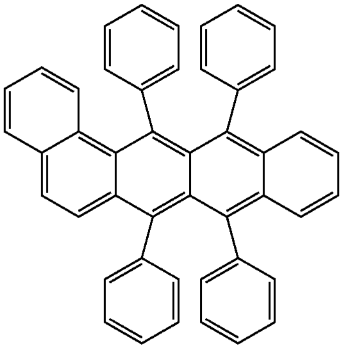
[Chemical Formulae 31]
(111)
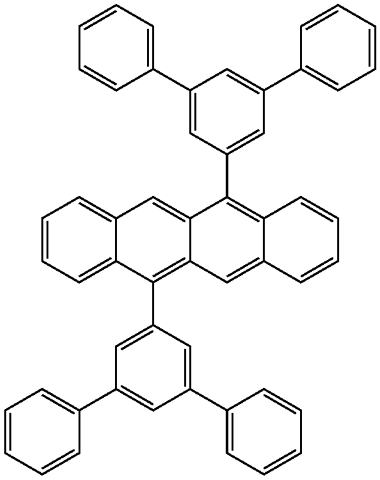

-continued (112)

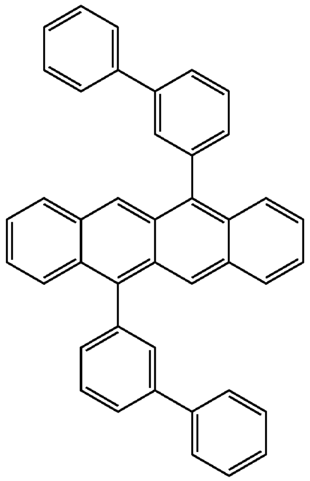

(113)

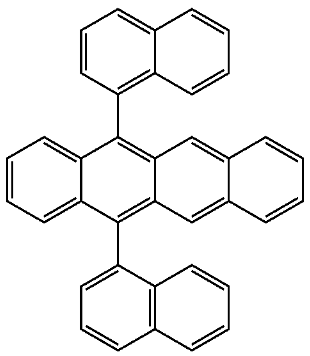

(114)

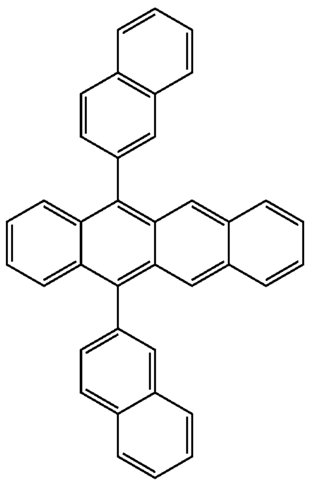

-continued (115)

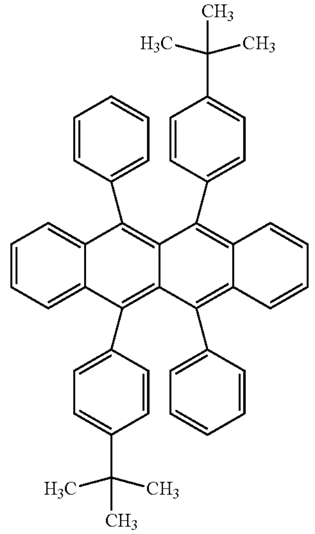

(116)

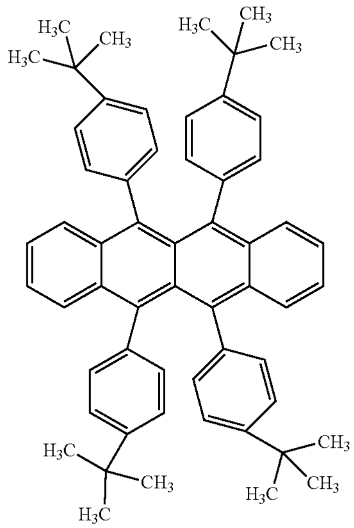

The organic compounds represented by Structural Formulae (101) to (116) are examples of the organic compound represented by General Formula (Ga-1), and the specific examples of the p-type semiconductor material are not limited thereto. Note that, Structural Formulae (110) is an example where, in General Formula (Ga-1), $R^{27}$ and $R^{28}$ each independently represent a vinyl group and are bonded to each other to form a condensed ring.

Examples of the n-type semiconductor material include electron-accepting organic semiconductor materials such as fullerene (e.g., $C_{60}$ and $C_{70}$) and fullerene derivatives. Fullerene has a soccer ball-like shape, which is energetically stable. Both the highest occupied molecular orbital (HOMO) level and the lowest unoccupied molecular orbital (LUMO) level of fullerene are deep (low). Having a deep LUMO level, fullerene has an extremely high electron-accepting property (acceptor property). When π-electron conjugation (resonance) spreads on a plane as in benzene, an electron-donating property (donor property) usually increases; however, fullerene has a spherical shape, and thus has a high electron-accepting property although π-electron conjugation widely spread therein. The high electron-accepting property efficiently causes rapid charge separation and thus is useful for light-receiving devices. Both $C_{60}$ and $C_{70}$ have a wide absorption band in the visible light region, and $C_{70}$ is especially preferable because of having a larger π-electron conjugation system and a wider absorption band in the long wavelength region than $C_{60}$. Other examples of fullerene derivatives include [6,6]-phenyl-$C_{71}$-butyric acid methyl ester (abbreviation: $PC_{71}BM$), [6,6]-phenyl-$C_{61}$-butyric acid methyl ester (abbreviation: $PC_{61}BM$), and 1',1",4',4"-tetrahydro-di[1,4]methanonaphthaleno[1,2:2',3',56,60:2",3"][5,6]fullerene-$C_{60}$ (abbreviation: ICBA).

Other examples of the n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, animidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

The n-type semiconductor material is preferably an organic compound represented by any of General Formulae (Gb-1) to (Gb-3) below.

[Chemical Formulae 32]

(Gb-1)

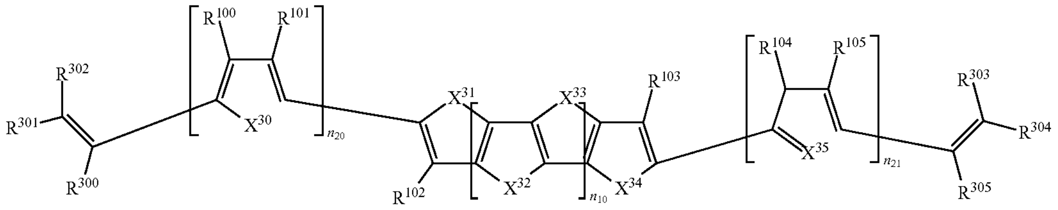

(Gb-2)

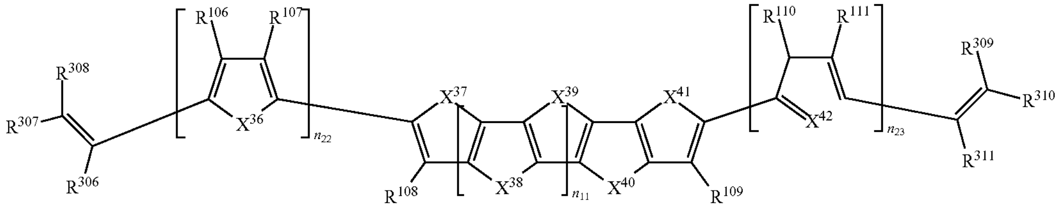

(Gb-3)

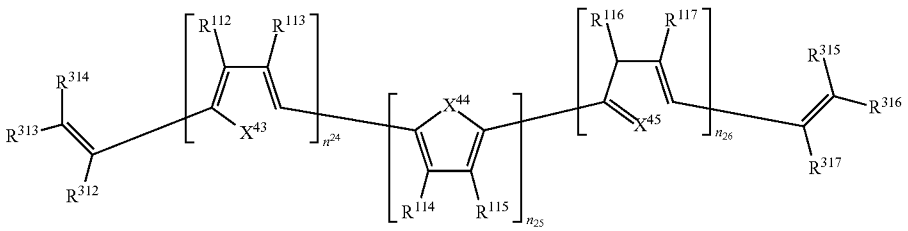

In General Formulae (Gb-1) to (Gb-3), each of $X^{30}$ to $X^{45}$ independently represents oxygen or sulfur. Each of $n_{10}$ and $n_{11}$ independently represents an integer of 0 to 4. Each of $n_{20}$ to $n_{26}$ independently represents an integer of 0 to 3. At least one of $n_{24}$ to $n_{26}$ represents an integer of 1 to 3. Each of $R^{100}$ to $R^{117}$ independently represents hydrogen (including deuterium), a cyano group, a substituted or unsubstituted alkyl group having 1 to 13 carbon atoms, a cycloalkyl group having 3 to 13 carbon atoms, a substituted or unsubstituted alkoxy group having 1 to 13 carbon atoms, a substituted or unsubstituted aryl group having 6 to 30 carbon atoms, a substituted or unsubstituted heteroaryl group having 2 to 30 carbon atoms, a substituted or unsubstituted alkyl halide group having 1 to 13 carbon atoms, or halogen. Each of $R^{300}$ to $R^{317}$ independently represents hydrogen (including deuterium), a cyano group, fluorine, chlorine, a substituted or unsubstituted alkyl halide group having 1 to 13 carbon atoms, or a substituted or unsubstituted alkoxy group having 1 to 13 carbon atoms.

In General Formulae (Gb-1) to (Gb-3), each of $R^{100}$ to $R^{117}$ is preferably a substituent represented by any of Formulae (Rb-1) to (Rb-79) and Formulae (R-41) to (R-117) below. Note that * in the formula represents a bond.

In General Formulae (Gb-1) to (Gb-3), each of $R^{300}$ to $R^{317}$ is preferably a substituent represented by any of Formulae (Rb-1) to (Rb-4), Formula (Rb-7), and Formulae (R-33) to (R-72) below. Note that * in the formula represents a bond.

[Chemical Formulae 33]

(Rb-1)

-continued (Rb-2)

(Rb-3)

-continued
(Rb-4)
(Rb-5)
(Rb-6)
(Rb-7)
[Chemical Formulae 34]
(Rb-8)
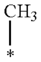
(Rb-9)
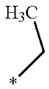
(Rb-10)
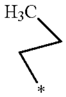
(Rb-11)
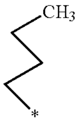
(Rb-12)
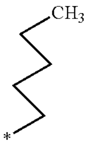
(Rb-13)
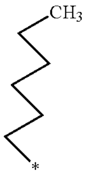
(Rb-14)
(Rb-15)
-continued
(Rb-16)
(Rb-17)
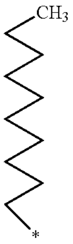
(Rb-18)
(Rb-19)
[Chemical Formulae 35]
(Rb-20)
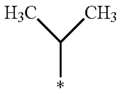
(Rb-21)
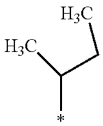
(Rb-22)
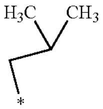
(Rb-23)
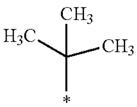

-continued
(Rb-24)
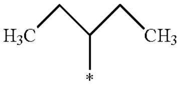
(Rb-25)
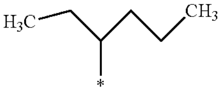
(Rb-26)
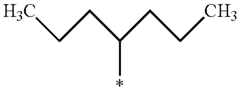
(Rb-27)
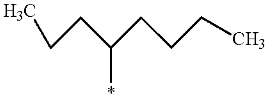
(Rb-28)
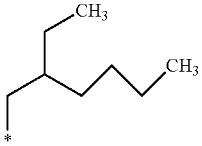
(Rb-29)
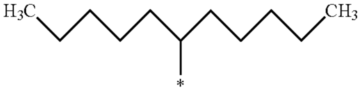
(Rb-30)
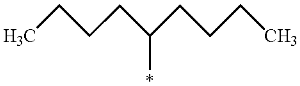
(Rb-31)
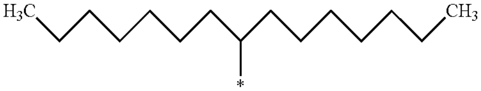
(Rb-32)
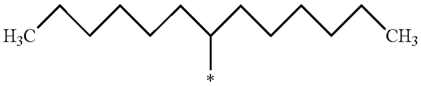
[Chemical Formulae 36]
(Rb-33)
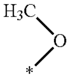
(Rb-34)
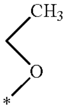
(Rb-35)
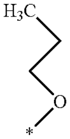
(Rb-36)
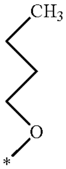
-continued
(Rb-37)
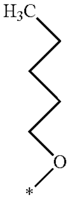
(Rb-38)
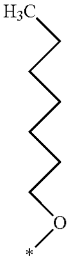
(Rb-39)
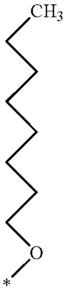
(Rb-40)
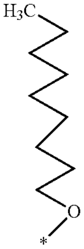
(Rb-41)
(Rb-42)
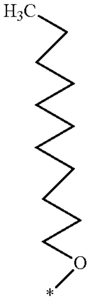

-continued
(Rb-43)
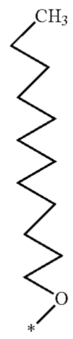
(Rb-44)
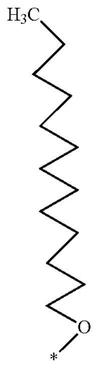
(Rb-45)
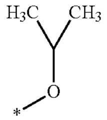
(Rb-46)
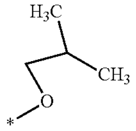
(Rb-47)
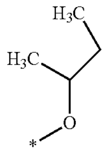
(Rb-48)
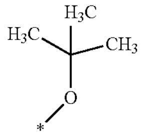
(Rb-49)
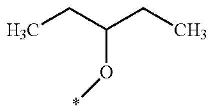
(Rb-50)
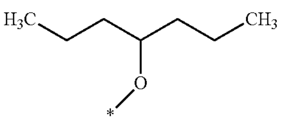
-continued
(Rb-51)
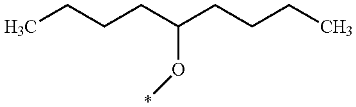
[Chemical Formulae 37]
(Rb-52)
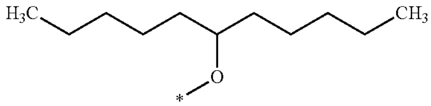
(Rb-53)
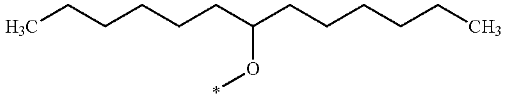
(Rb-54)
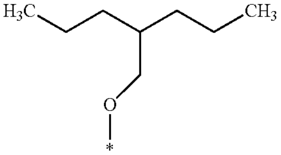
(Rb-55)
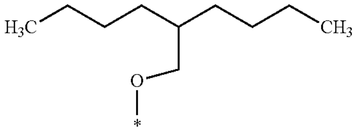
(Rb-56)
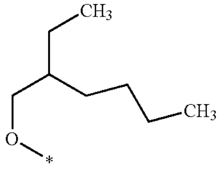
(Rb-57)
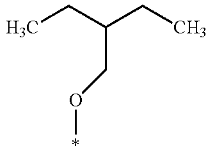
(Rb-58)
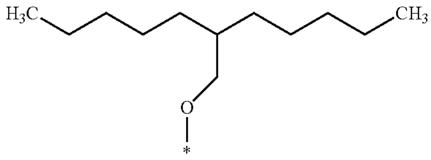
[Chemical Formulae 38]
(Rb-59)
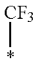
(Rb-60)
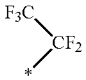
(Rb-61)
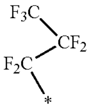

-continued
(Rb-62)
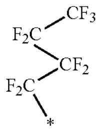
(Rb-63)
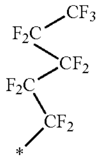
(Rb-64)
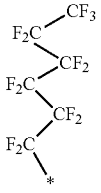
(Rb-65)
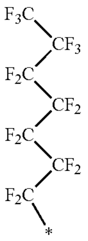
(Rb-66)
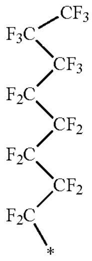
(Rb-67)
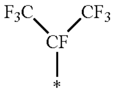
(Rb-68)
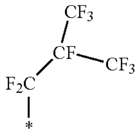
[Chemical Formulae 39]
(Rb-69)
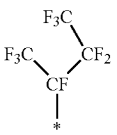
(Rb-70)
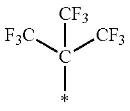
-continued
(Rb-71)
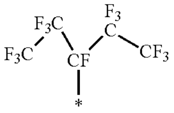
(Rb-72)
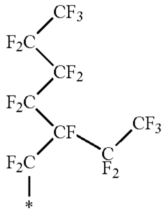
[Chemical Formulae 40]
(Rb-73)
(Rb-74)
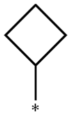
(Rb-75)
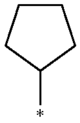
(Rb-76)
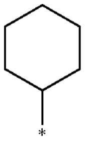
(Rb-77)
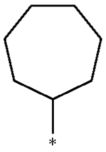
(Rb-78)
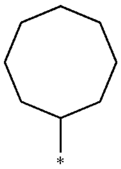
[Chemical Formulae 41]
(Rb-79)
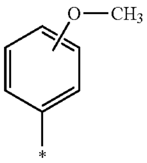

-continued
[Chemical Formulae 42]
(R-41)
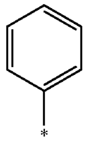
(R-42)
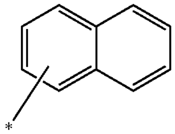
(R-43)
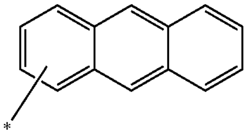
(R-44)
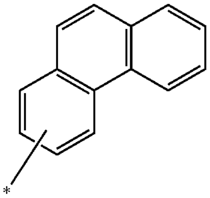
(R-45)
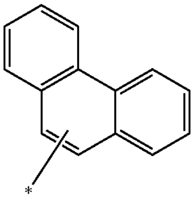
(R-46)
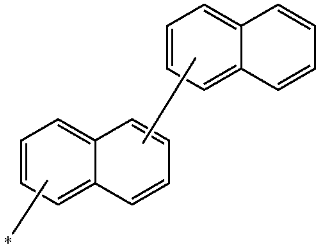
(R-47)
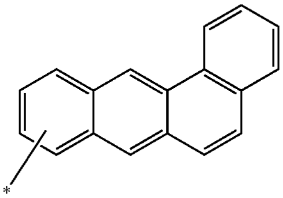
(R-48)
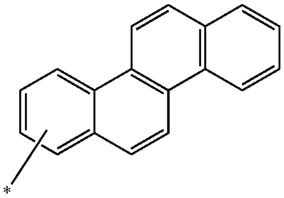
-continued
(R-49)
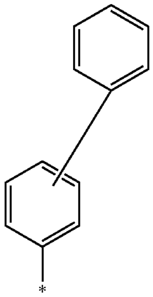
(R-50)
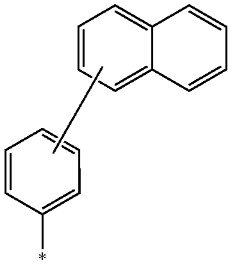
(R-51)
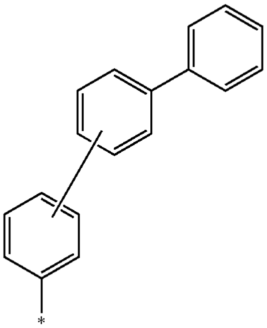
(R-52)
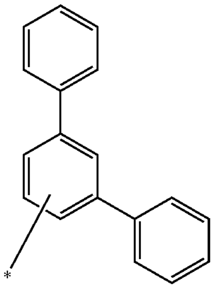
(R-53)
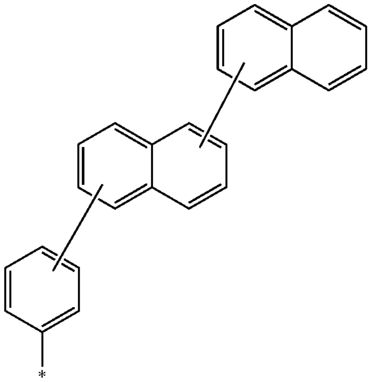

-continued
(R-54)
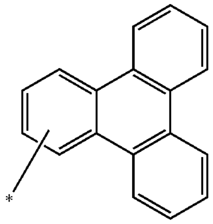
(R-55)
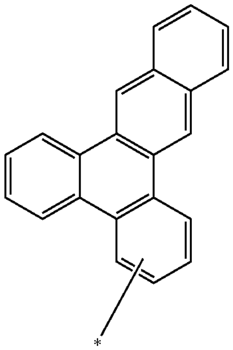
(R-56)
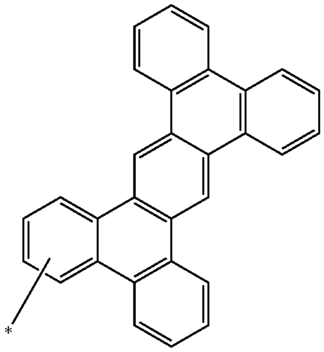
(R-57)
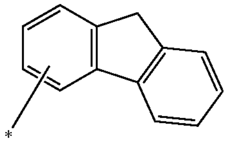
(R-58)
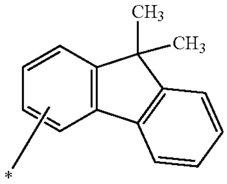
(R-59)
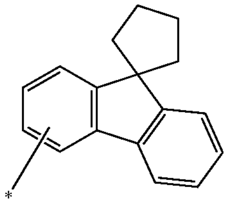
-continued
(R-60)
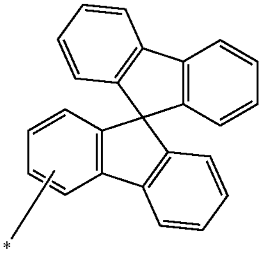
(R-61)
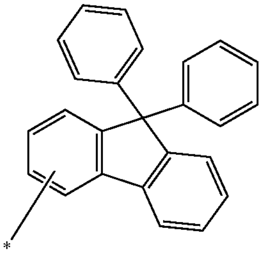
(R-62)
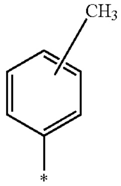
(R-63)
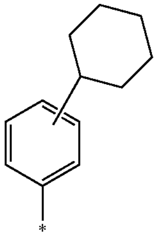
[Chemical Formulae 43]
(R-64)
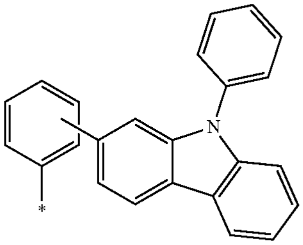
(R-65)
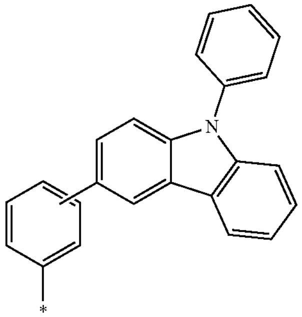

-continued
(R-66)
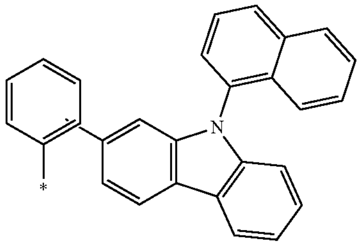
(R-67)
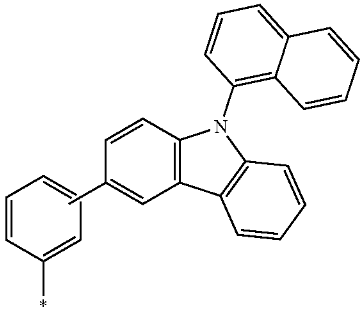
(R-68)
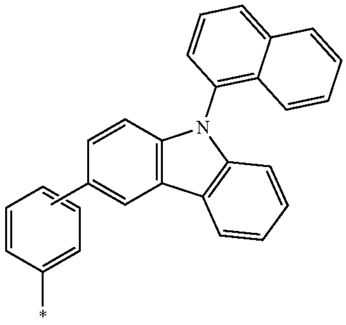
(R-69)
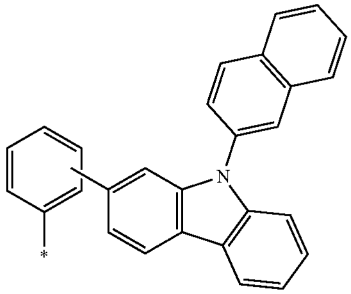
(R-70)
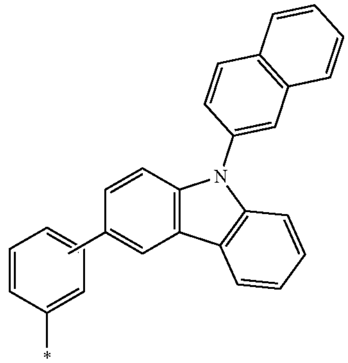
-continued
(R-71)
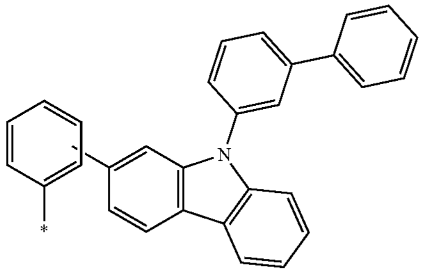
(R-72)
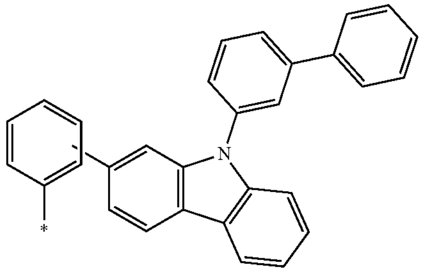
(R-72)
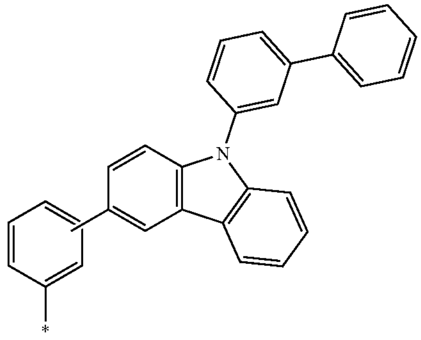
(R-73)
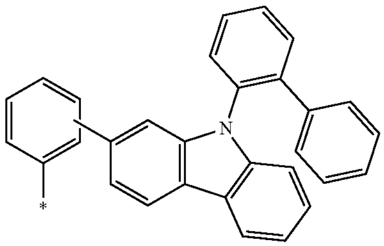
(R-74)
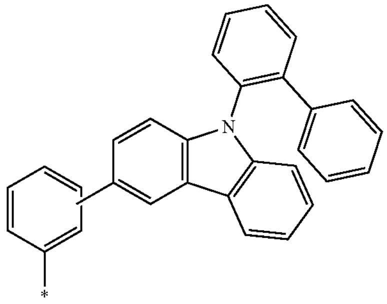

-continued
(R-75)
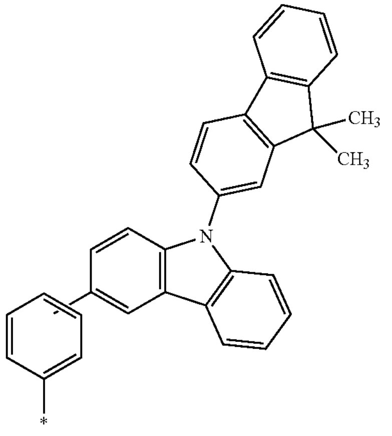
(R-76)
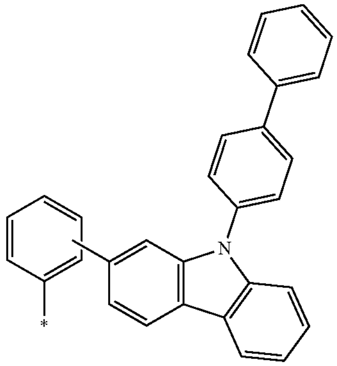
(R-77)
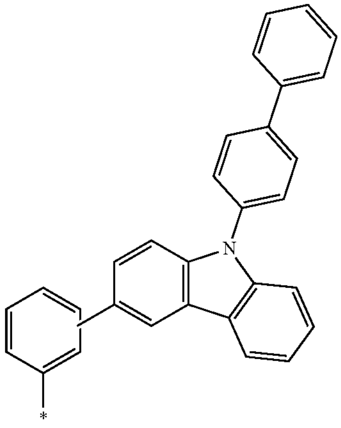
(R-78)
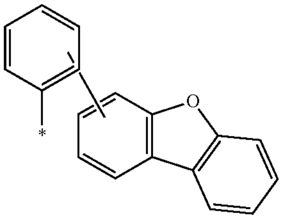
-continued
(R-79)
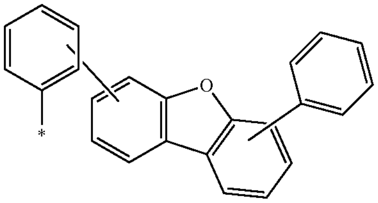
(R-80)
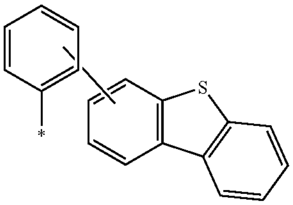
(R-81)
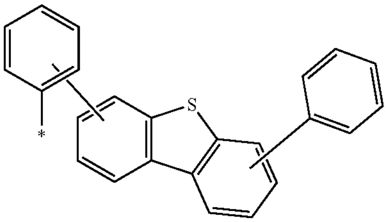
(R-82)
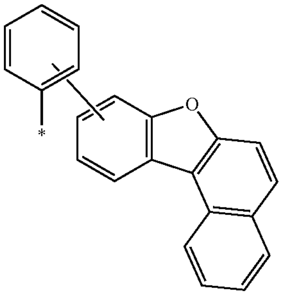
(R-83)
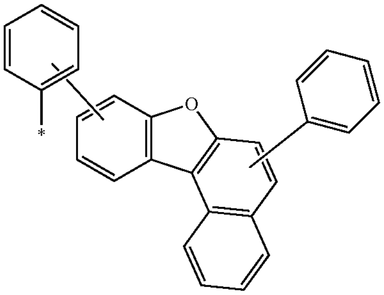
[Chemical Formulae 44]
(R-84)
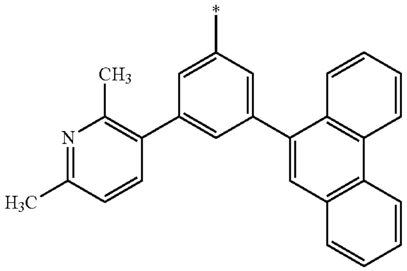

-continued
(R-85)
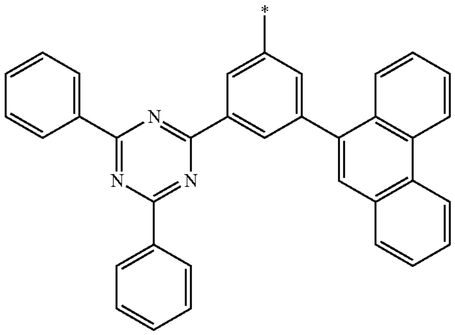
(R-86)
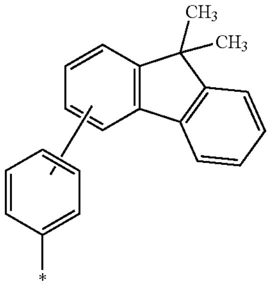
(R-87)
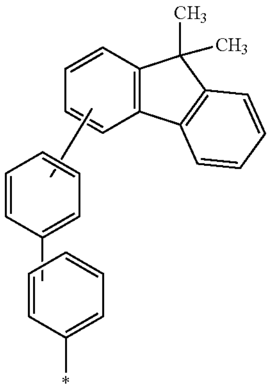
(R-88)
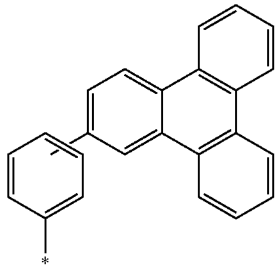
-continued
(R-89)
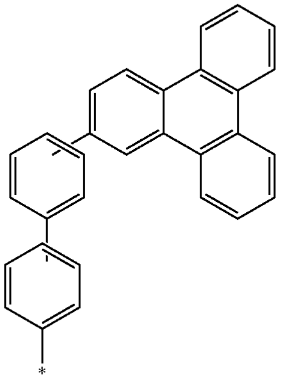
(R-90)
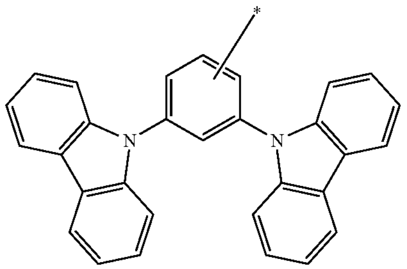
(R-91)
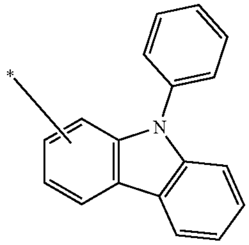
(R-92)
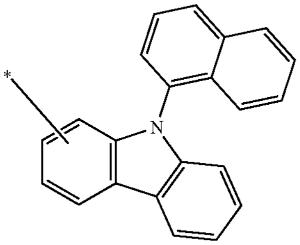
(R-93)
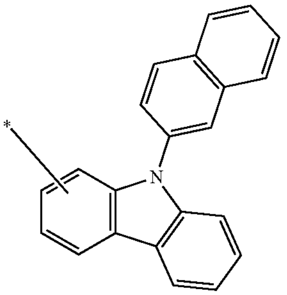

-continued
(R-94)
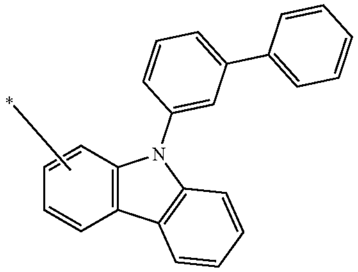
(R-95)
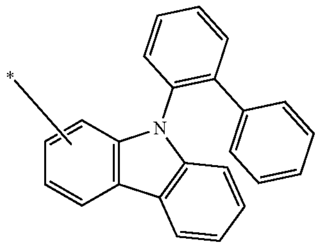
(R-96)
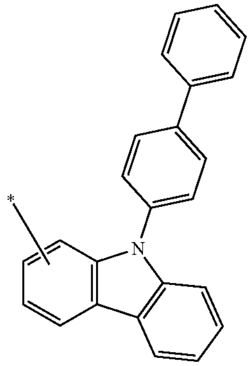
(R-97)
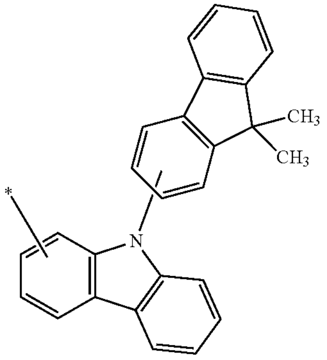
(R-98)
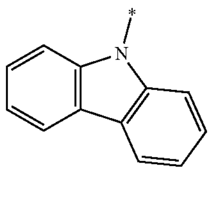
-continued
(R-99)
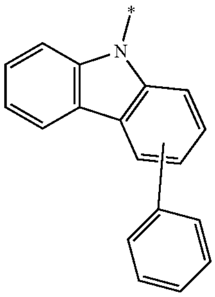
(R-100)
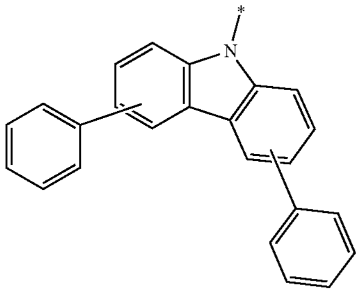
(R101)
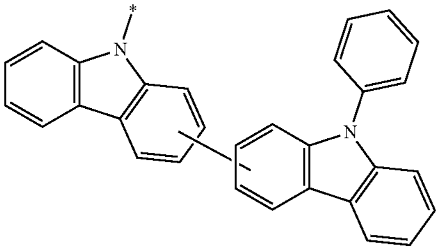
[Chemical Formulae 45]
(R-102)
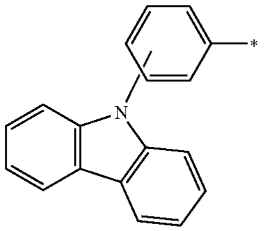
(R-103)
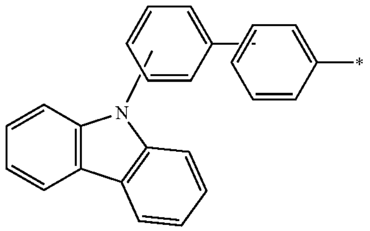
(R-104)
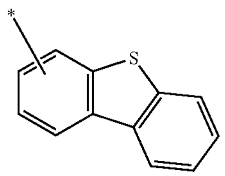

-continued
(R-105)
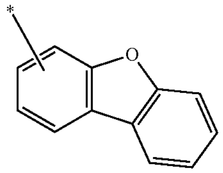
(R-106)
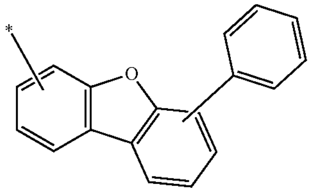
(R-107)
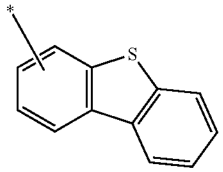
(R-108)
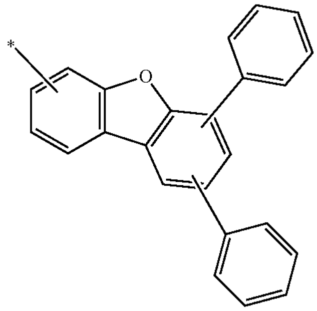
(R-109)
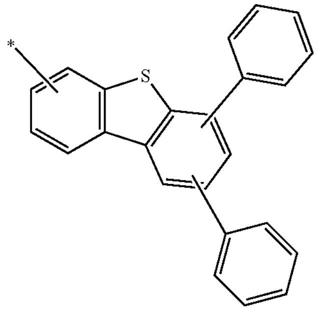
(R-110)
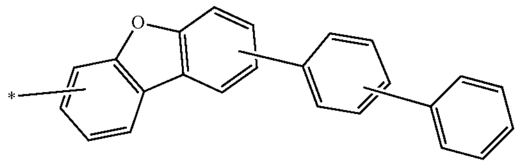
(R-111)
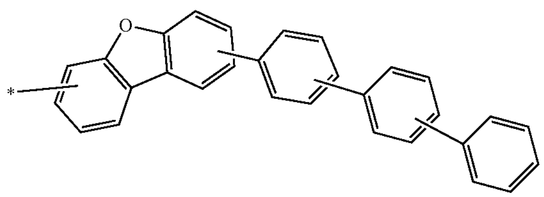
-continued
(R-112)
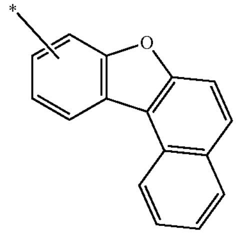
(R-113)
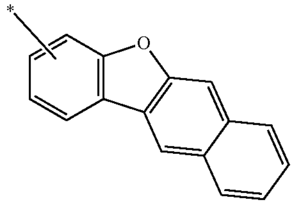
(R-114)
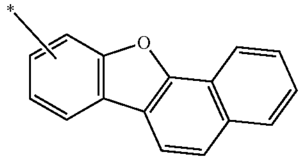
(R-115)
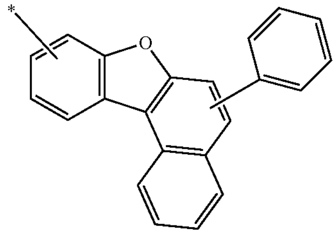
(R-116)
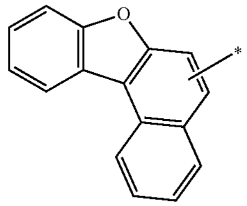
(R-117)
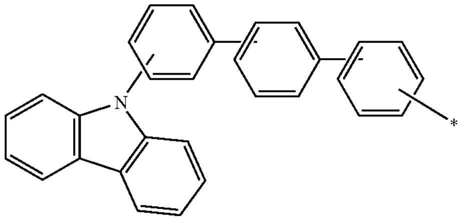
Next, specific examples of the n-type semiconductor material represented by General Formula (Gb-1) are shown below.

[Chemical Formulae 46]

(300)
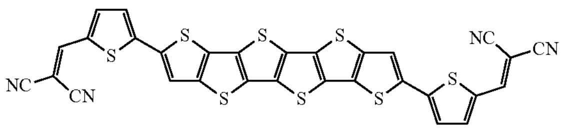

(301)
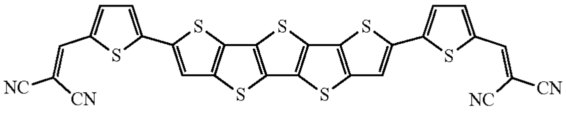

(302)
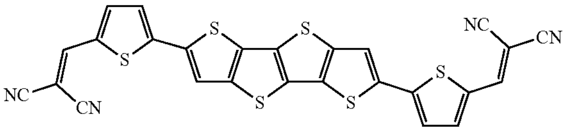

(303)
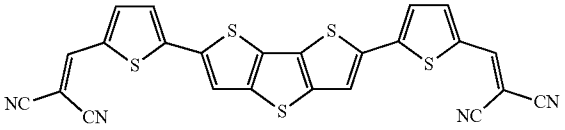

(304)
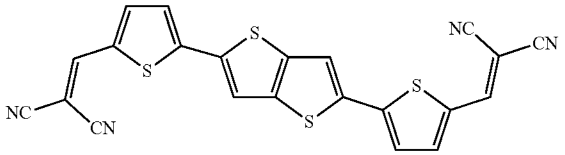

(305)
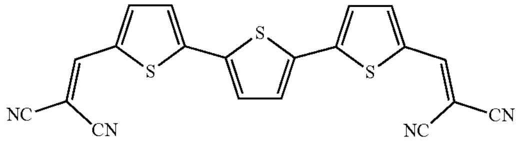

(306)
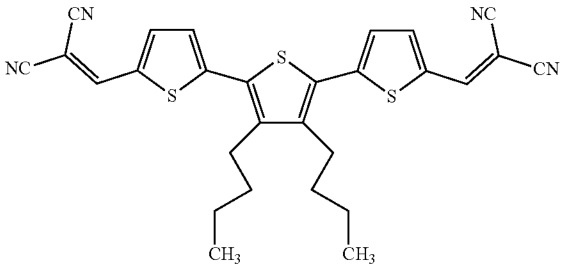

(307)
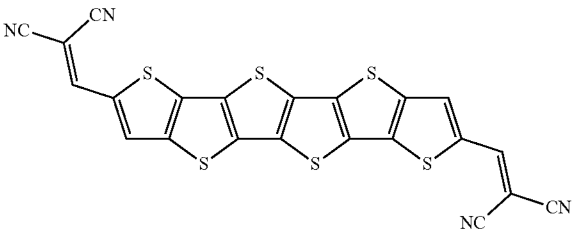

-continued (308)
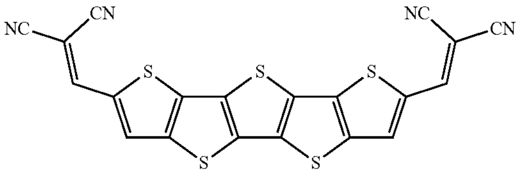

(309)
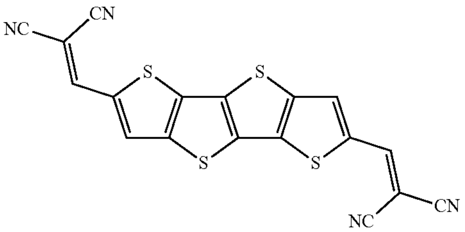

(310)
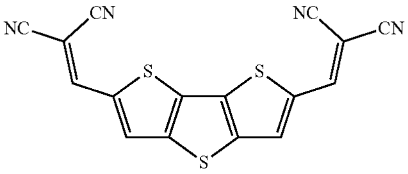

(311)
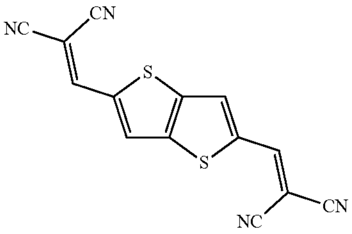

(312)
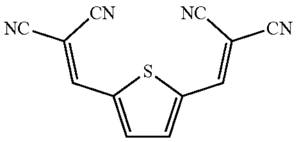

The organic compounds represented by Structural Formulae (300) to (312) are examples of the organic compounds (the n-type semiconductor materials) represented by General Formulae (Gb-1) to (Gb-3), and the specific examples are not limited thereto.

Alternatively, an organic compound represented by General Formula (Gc-1) below may be used as the n-type semiconductor material.

[Chemical Formula 47]

(Gc-1)
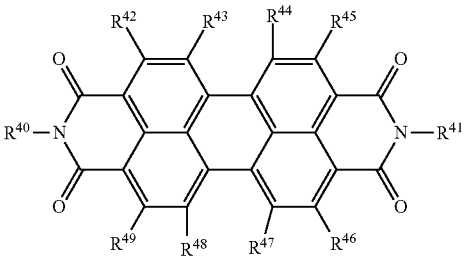

In General Formula (Gc-1), each of $R^{40}$ and $R^{41}$ independently represents hydrogen, a substituted or unsubstituted chain alkyl group having 1 to 13 carbon atoms, a branched alkyl group having 3 to 13 carbon atoms, a substituted or unsubstituted aryl group having 6 to 13 carbon atoms, or a substituted or unsubstituted aromatic alkyl group having 6 to 13 carbon atoms. Each of $R^{42}$ to $R^{49}$ independently represents hydrogen, a substituted or unsubstituted alkyl group having 1 to 13 carbon atoms, a substituted or unsubstituted alkyl halide group having 1 to 13 carbon atoms, a substituted or unsubstituted cycloalkyl group having 3 to 13 carbon atoms, or halogen.

In General Formula (Gc-1), it is preferable that each of $R^{40}$ and $R^{41}$ independently represent a chain alkyl group having 2 to 12 carbon atoms. It is further preferable that each of $R^{40}$ and $R^{41}$ independently represent a branched alkyl group. In this case, solubility can be improved.

Next, specific examples of the n-type semiconductor material represented by General Formula (Gc-1) are shown below.

[Chemical Formulae 48]

(400)

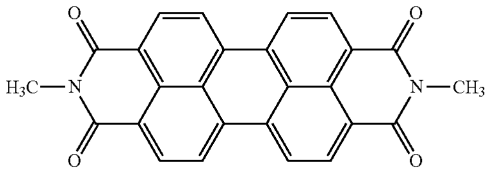

(401)

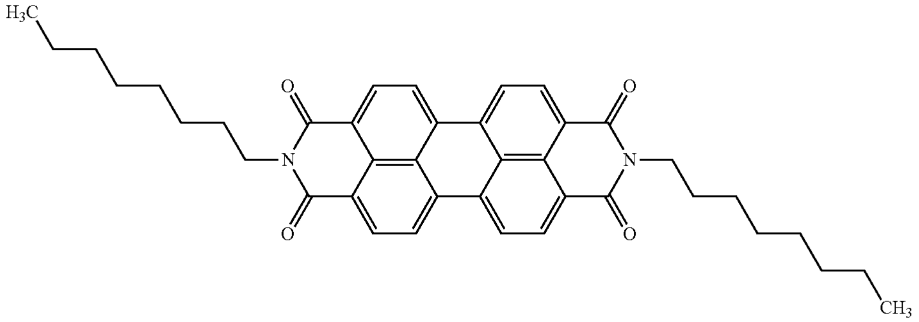

(402)

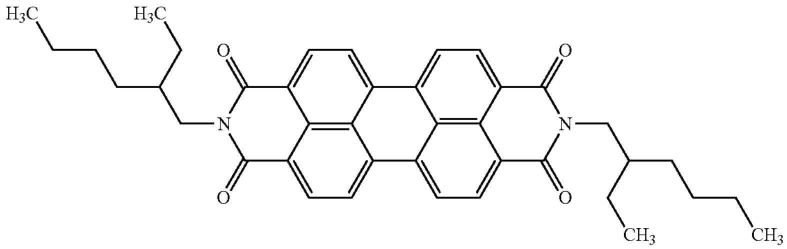

(403)

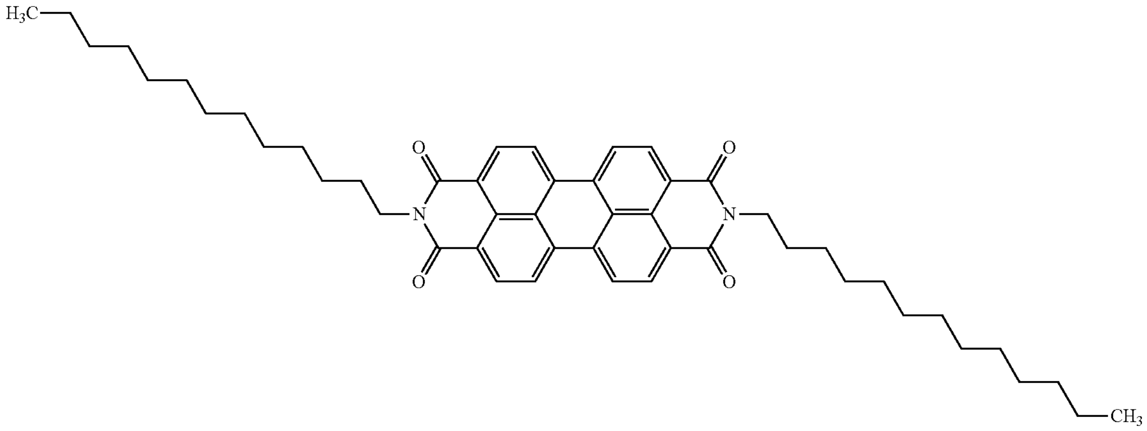

The organic compounds represented by Structural Formulae (400) to (403) are examples of the organic compound (the n-type semiconductor material) represented by General Formula (Gc-1), and the specific examples are not limited thereto.

The active layer 213 is preferably a stacked film of a first layer containing the p-type semiconductor material and a second layer containing the n-type semiconductor material.

In the light-receiving device having any of the aforementioned structures, the active layer 213 is preferably a mixed film containing the p-type semiconductor material and the n-type semiconductor material.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape may be used as the electron-accepting organic semiconductor material, and an organic semiconductor material having a substantially planar shape may be used as the electron-donating organic semiconductor material. Molecules of similar shapes tend to aggregate, and aggregated molecules of similar kinds, which have molecular orbital energy levels close to each other, can increase the carrier-transport property.

<Buffer Layer>

The buffer layer 220 receives electrons from the active layer 213 and supplies electrons to the second carrier-transport layer 214. Providing the buffer layer 220 in the light-receiving device 200 can inhibit an increase in the drive voltage of the light-receiving device 200.

An organic compound having an electron-withdrawing group can be used for the buffer layer 220. The organic compound having an electron-withdrawing group has an acceptor property. Therefore, using the organic compound having an electron-withdrawing group for the buffer layer 220 facilitates reception of electrons from the active layer 213 and supply of electrons to the second carrier-transport layer 214, making it possible to inhibit an increase in the driving voltage of the light-receiving device 200.

Examples of the electron-withdrawing group include halogen groups (e.g., a fluoro group, a chloro group, and an iodo group), a cyano group, an isocyanate group, a nitro group, an alkyl halide group, a cycloalkyl halide group, a carbonyl group, a carboxy group, and an acyl group. In particular, it is preferable to use an organic compound having a cyano group for the buffer layer 220, in which case the effect of inhibiting an increase in the driving voltage of the light-receiving device 200 is enhanced.

A heteroaromatic compound having an electron-withdrawing group can be used as the organic compound having an electron-withdrawing group. Specific examples of the heteroaromatic compound having an electron-withdrawing group include 2-cyanopyridine, 3-cyanopyridine, 4-cyanopyridine, pyrazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT-CN), 2,3-bis(4-fluorophenyl)pyrido[2,3-b]pyrazine (abbreviation: F2PYPR), and 2,3,8,9,14,15-Hexafluorodiquinoxalino[2,3-a:2',3'-c]phenazine (abbreviation: HATNA-F6).

Among the above-described heteroaromatic compounds having electron-withdrawing groups, heteroaromatic compounds in which a plurality of cyano groups are bonded, such as PPDN and HAT-CN, are particularly preferable because their acceptor properties are higher.

Furthermore, among the above-described heteroaromatic compounds having electron-withdrawing groups, heteroaromatic compounds having fused heteroaromatic rings, such as PPDN, HAT-CN, F2PYPR, and HATNA-F6, are particularly preferable because their film qualities are highly stable against heat.

Other specific examples of the organic compound having an electron-withdrawing group that can be used include benzonitrile, 7,7,8,8-tetracyanoquinodimethane (abbreviation: TCNQ), 7,7,8,8-tetracyano-2,3,5,6-tetrafluoroquinodimethane (abbreviation: $F_4$-TCNQ), 3,6-difluoro-2,5,7,7,8,8-hexacyanoquinodimethane, chloranil, 1,3,4,5,7,8-hexafluorotetracyano-naphthoquinodimethane (abbreviation: F6-TCNNQ), 2-(7-dicyanomethylene-1,3,4,5,6,8,9,10-octafluoro-7H-pyren-2-ylidene)malononitrile, perfluoropentacene, copper hexadecafluorophthalocyanine (abbreviation: $F_{16}$CuPc), N,N'-bis(2,2,3,3,4,4,5,5,6,6,7,7,8,8,8-pentadecafluorooctyl)-1,4,5,8-naphthalenetetracarboxylic diimide (abbreviation: NTCDI-C8F), 3',4'-dibutyl-5,5"-bis(dicyanomethylene)-5,5"-dihydro-2,2':5',2"-terthiophene (abbreviation: DCMT), and 1,4,5,8-naphthalenetetracarboxylicdianhydride (abbreviation: NTCDA). Besides, a [3]radialene derivative having an electron-withdrawing group, which has a very high acceptor property, is preferred; specific examples include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile].

Furthermore, an organic compound with a LUMO level that is higher than the LUMO level of the n-type semiconductor material in the active layer 213 and lower than the LUMO level of the electron-transport material in the second carrier-transport layer 214 can be used for the buffer layer 220. When such an organic compound is used for the buffer layer 220, a carrier-injection barrier from the active layer 213 to the second carrier-transport layer 214 can be made smaller, whereby an increase in the driving voltage of the light-receiving device 200 can be inhibited.

Figure 1D:
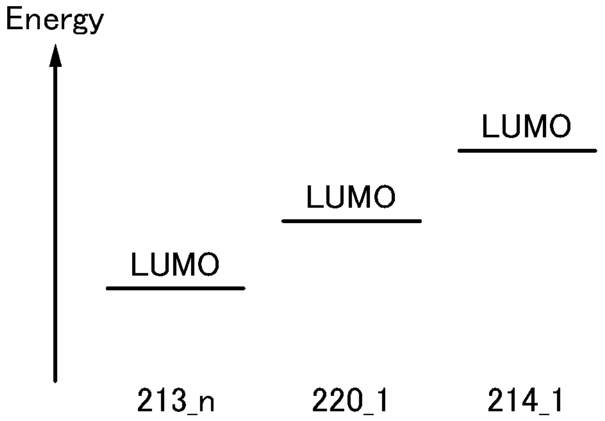

FIG. 1D illustrates the relationship of the LUMO levels of the above-described organic compounds. As illustrated in FIG. 1D, the LUMO level of an organic compound 220_1 included in the buffer layer 220 is higher than the LUMO level of an n-type semiconductor material 213_*n* included in the active layer 213 and lower than the LUMO level of an electron-transport material 214_1 included in the second carrier-transport layer 214. When such an organic compound 220_1 is used for the buffer layer 220, the carrier-injection barrier from the active layer 213 to the second carrier-transport layer 214 can be made smaller, whereby an increase in the driving voltage of the light-receiving device 200 can be inhibited.

It is preferable that the difference between the LUMO level of the organic compound included in the buffer layer 220 and the LUMO level of the n-type semiconductor material included in the active layer 213 be less than or equal to 0.5 eV. The buffer layer 220 can facilitate reception of electrons from the active layer 213, thereby inhibiting recombination of holes and electrons in the active layer 213.

Moreover, it is preferable that the difference between the LUMO level of the organic compound included in the buffer layer 220 and the LUMO level of the electron-transport material included in the second carrier-transport layer 214 be less than or equal to 1.0 eV. The buffer layer 220 facilitates supply of electrons to the second carrier-transport layer 214.

Specifically, the LUMO level of the organic compound included in the buffer layer 220 is preferably higher than or equal to −4.5 eV and lower than or equal to −3.0 eV.

Specific examples of the organic compound that can be used for the buffer layer 220 and whose LUMO level is higher than or equal to −4.5 eV and lower than or equal to −3.0 eV include PPDN, HAT-CN, diquinoxalino[2,3-a:2',3'-c]phenazine (abbreviation: HATNA), and HATNA-F6. Note that the organic compound that can be used for the buffer layer 220 and whose LUMO level is higher than or equal to −4.5 eV and lower than or equal to −3.0 eV is not limited to them.

Note that the organic compound that can be used for the buffer layer 220 is not limited to the organic compound whose LUMO level is higher than or equal to −4.5 eV and lower than or equal to −3.0 eV. It is preferable to use an organic compound having a suitable LUMO level for the buffer layer 220 depending on the LUMO level of the n-type semiconductor material used for the active layer 213 and the LUMO level of the electron-transport material used for the second carrier-transport layer 214.

Furthermore, an organic compound that has an electron-withdrawing group and whose LUMO level is higher than the LUMO level of the n-type semiconductor material included in the active layer 213 and lower than the LUMO level of the electron-transport material included in the second carrier-transport layer 214 is preferably used for the buffer layer 220. An organic compound that has an electron-withdrawing group and whose LUMO level is different from the LUMO level of the n-type semiconductor material included in the active layer 213 by 0.5 eV or less is preferably used for the buffer layer 220. An organic compound that has an electron-withdrawing group and whose LUMO level is different from the LUMO level of the electron-transport material included in the second carrier-transport layer 214 by 1.0 eV or less is preferably used for the buffer layer 220. An organic compound that has an electron-withdrawing group and whose LUMO level is higher than or equal to −4.5 eV and lower than or equal to −3.0 eV is preferably used for the buffer layer 220. The use of such an organic compound for the buffer layer 220 can enhance the effect of inhibiting an increase in the driving voltage of the light-receiving device 200.

Specific examples of the organic compound that has an electron-withdrawing group and whose LUMO level is higher than or equal to −4.5 eV and lower than or equal to −3.0 eV include PPDN, HAT-CN, and HATNA-F6, which are described above. Note that the organic compound that can be used for the buffer layer 220 and has an electron-withdrawing group, and whose LUMO level is higher than or equal to −4.5 eV and lower than or equal to −3.0 eV is not limited to them.

<Second Carrier-Transport Layer>

The second carrier-transport layer 214 transports electrons supplied from the buffer layer 220 to the second electrode 202 and includes an electron-transport material. A material with an electron mobility of $1\times10^{-6}$ $cm^2/Vs$ or higher is preferable as the electron-transport material. Note that other substances can also be used as long as the substances have an electron-transport property higher than a hole-transport property. In this specification and the like, the second carrier-transport layer is also referred to as an electron-transport layer in some cases.

As the electron-transport material, a π-electron deficient heteroaromatic compound can be used.

As the electron-transport material, any of the following materials can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a π-electron deficient heteroaromatic compound such as a nitrogen-containing heteroaromatic compound.

Alternatively, the electron-transport material is a compound having a triazine ring.

Alternatively, the electron-transport material is an organic compound represented by General Formula (Ge-1) below.

[Chemical Formula 49]

(Ge-1)

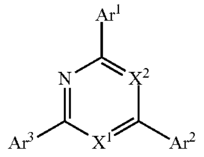

In General Formula (Ge-1), each of $Ar^1$ to $Ar^3$ independently represents hydrogen, a substituted or unsubstituted aryl group having 6 to 30 carbon atoms, or a substituted or unsubstituted heteroaryl group having 2 to 30 carbon atoms. Each of $X^1$ and $X^2$ independently represents carbon or nitrogen. In the case where one or both of $X^1$ and $X^2$ are carbon, the carbon is bonded to hydrogen, a substituted or unsubstituted aryl group having 6 to 30 carbon atoms, a substituted or unsubstituted heteroaryl group having 2 to 30 carbon atoms, a substituted or unsubstituted alkyl group having 1 to 20 carbon atoms, or a substituted or unsubstituted cycloalkyl group having 1 to 20 carbon atoms.

Alternatively, the electron-transport material is an organic compound represented by General Formula (Ge-2) below.

[Chemical Formula 50]

(Ge-2)

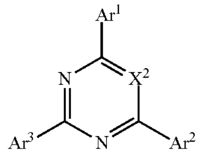

In General Formula (Ge-2), each of $Ar^1$ to $Ar^3$ independently represents hydrogen, a substituted or unsubstituted aryl group having 6 to 30 carbon atoms or a substituted or unsubstituted heteroaryl group having 2 to 30 carbon atoms, and $X^2$ represents carbon or nitrogen. In the case where $X^2$ is carbon, the carbon is bonded to hydrogen, a substituted or unsubstituted aryl group having 6 to 30 carbon atoms, a substituted or unsubstituted heteroaryl group having 2 to 30 carbon atoms, a substituted or unsubstituted alkyl group having 1 to 20 carbon atoms, or a substituted or unsubstituted cycloalkyl group having 1 to 20 carbon atoms.

Alternatively, the electron-transport material is an organic compound represented by General Formula (Ge-3) below.

[Chemical Formula 51]

(Ge-3)

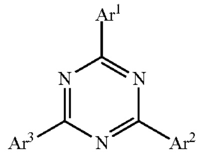

In General Formula (Ge-3), each of $Ar^1$ to $Ar^3$ independently represents hydrogen, a substituted or unsubstituted aryl group having 6 to 30 carbon atoms or a substituted or unsubstituted heteroaryl group having 2 to 30 carbon atoms.

Alternatively, the electron-transport material is an organic compound represented by General Formula (Ge-4) below.

[Chemical Formula 52]

(Ge-4)

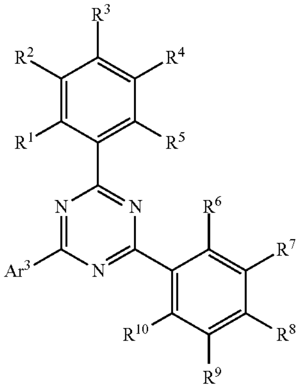

In General Formula (Ge-4), $Ar^3$ represents hydrogen, a substituted or unsubstituted aryl group having 6 to 30 carbon atoms or a substituted or unsubstituted heteroaryl group having 2 to 30 carbon atoms. Each of $R^1$ to $R^{10}$ independently represents hydrogen, a substituted or unsubstituted alkyl group having 1 to 20 carbon atoms, a substituted or unsubstituted cycloalkyl group having 3 to 20 carbon atoms, a substituted or unsubstituted aryl group having 6 to 30 carbon atoms, or a substituted or unsubstituted heteroaryl group having 2 to 30 carbon atoms.

Each of $R^1$ to $R^{10}$ in General Formula (Ge-4) represents, other than the above-described substituents, halogen, a substituted or unsubstituted alkyl halide group having 1 to 13 carbon atoms, a cyano group, or a substituted or unsubstituted alkoxy group having 1 to 13 carbon atoms.

Each of $R^1$ to $R^{10}$ in General Formula (Ge-4) is preferably a substituent represented by any of Formulae (R-1) to (R-38), Formulae (R-41) to (R-116), and Formulae (R-118) to (R-131) below.

Each of $Ar^1$ to $Ar^3$ in General Formulae (Ge-1) to (Ge-3) and $Ar^3$ in General Formula (Ge-4) is preferably a substituent represented by any of Formulae (R-41) to (R-116) and Formulae (R-118) to (R-131).

[Chemical Formulae 53]

(R-1)

(R-2)

(R-3)

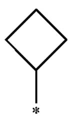

-continued (R-4)

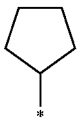

(R-5)

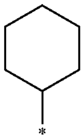

(R-6)

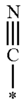

(R-7)

(R-8)

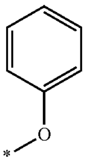

(R-9)

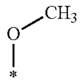

(R-10)

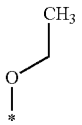

(R-11)

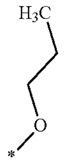

(R-12)

(R-13)

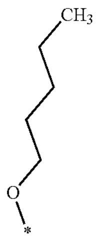

-continued
(R-14)
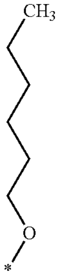
(R-15)
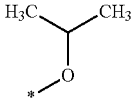
(R-16)
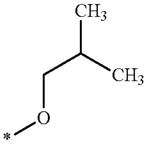
(R-17)
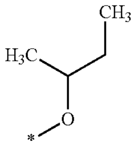
(R-18)
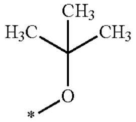
(R-19)
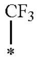
(R-20)
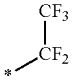
(R-21)
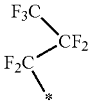
(R-22)
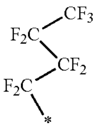
(R-23)
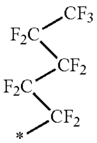
(R-24)
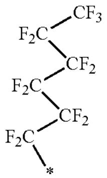
-continued
(R-25)
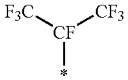
(R-26)
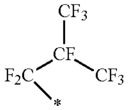
(R-27)
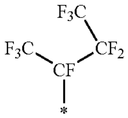
(R-28)
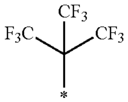
(R-29)
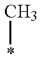
(R-30)
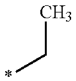
(R-31)
(R-32)
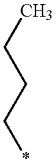
(R-33)
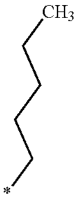
(R-34)
(R-35)
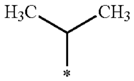

-continued
(R-36)
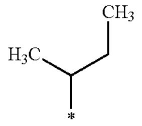
(R-37)
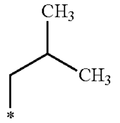
(R-38)
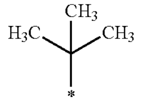
[Chemical Formulae 54]
(R-41)
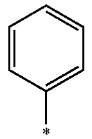
(R-42)
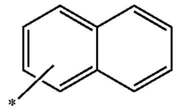
(R-43)
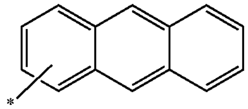
(R-44)
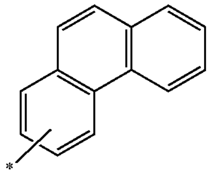
(R-45)
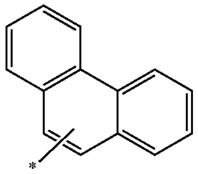
(R-46)
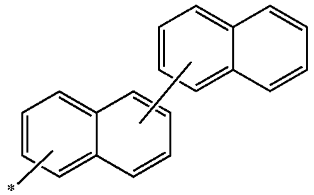
(R-47)
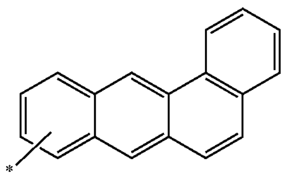
-continued
(R-48)
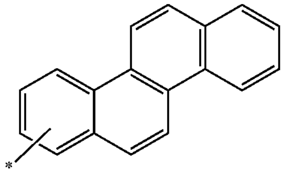
(R-49)
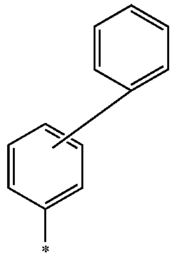
(R-50)
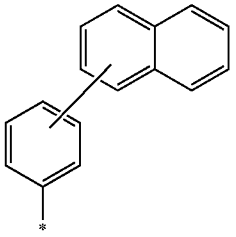
(R-51)
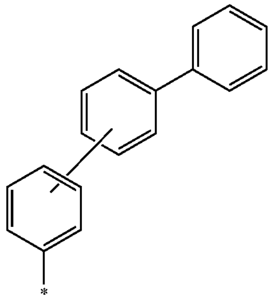
(R-52)
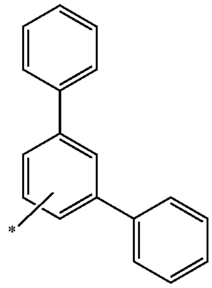
(R-53)
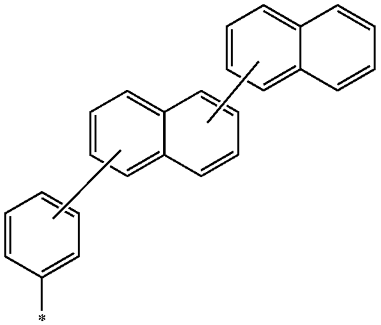

-continued
(R-54)
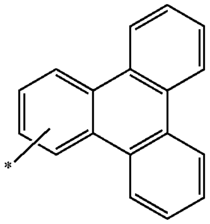
(R-55)
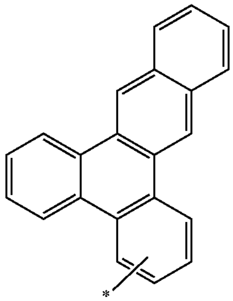
(R-56)
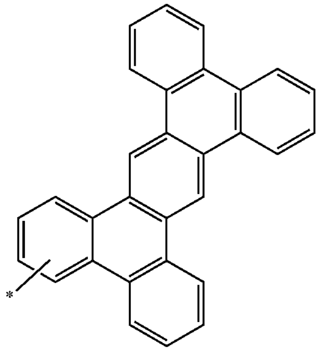
(R-57)
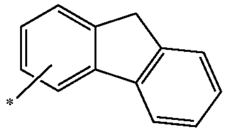
(R-58)
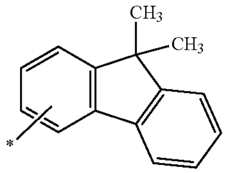
(R-59)
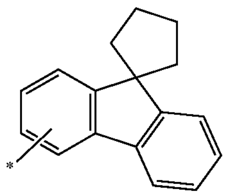
-continued
(R-60)
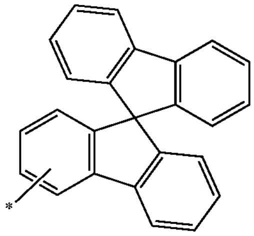
(R-61)
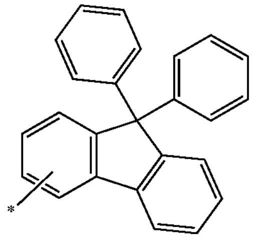
(R-62)
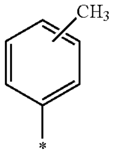
(R-63)
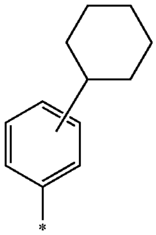
[Chemical Formulae 55]
(R-64)
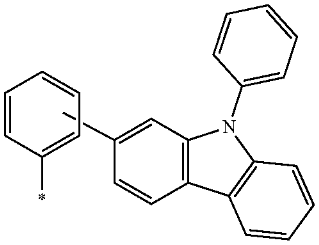
(R-65)
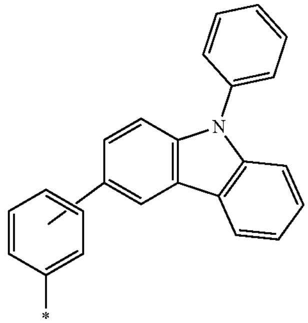

(R-66)
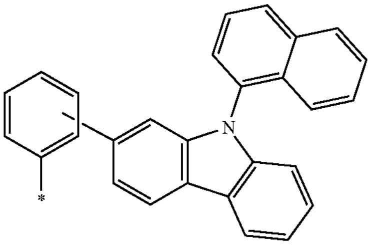
(R-67)
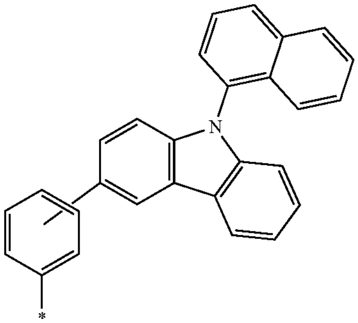
(R-68)
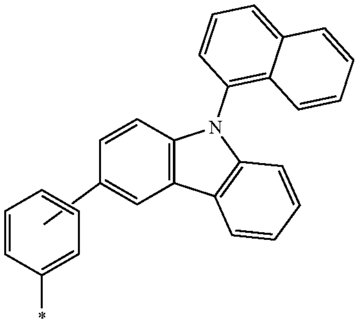
(R-69)
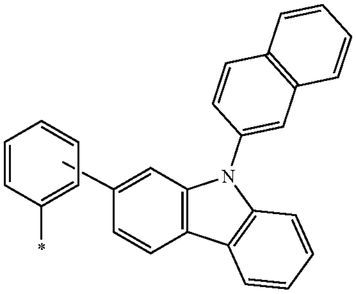
(R-70)
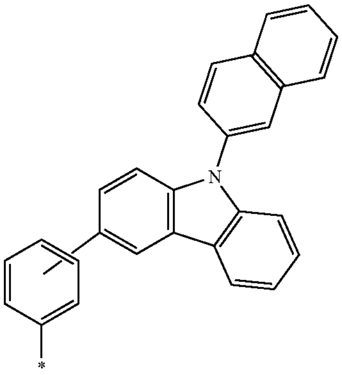
(R-71)
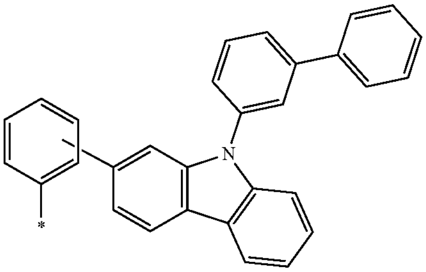
(R-72)
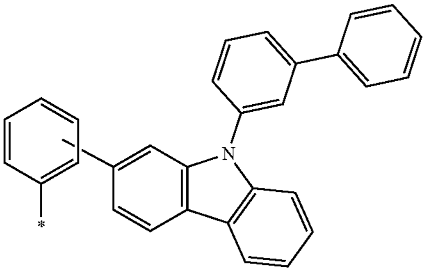
(R-72)
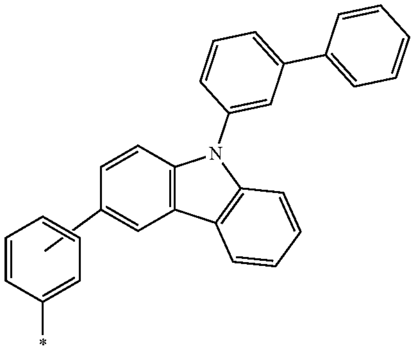
(R-73)
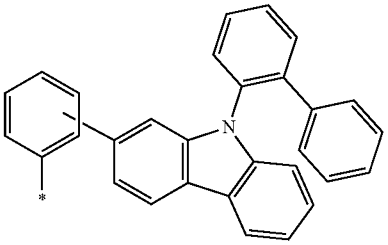
(R-74)
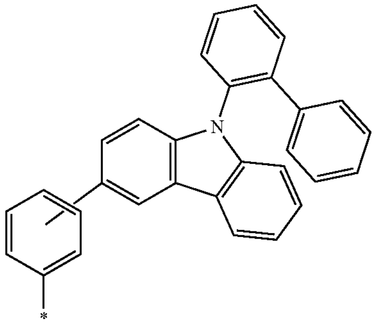

-continued
(R-75)
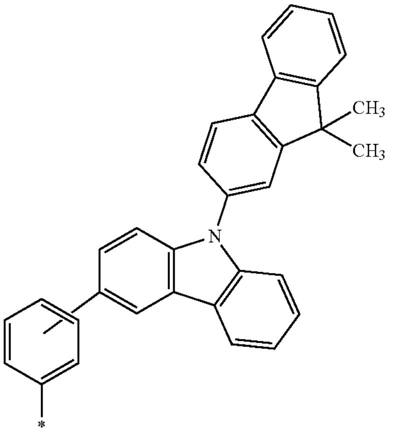
(R-76)
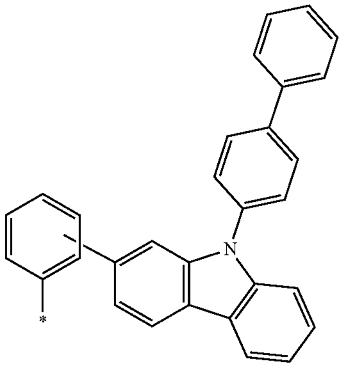
(R-77)
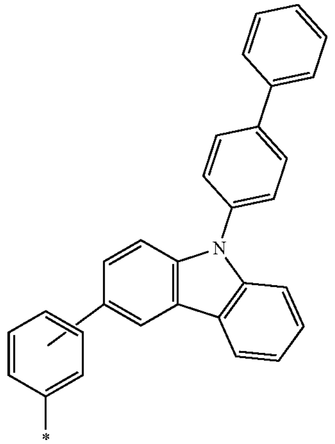
(R-78)
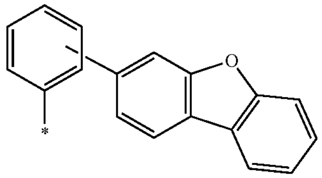
(R-79)
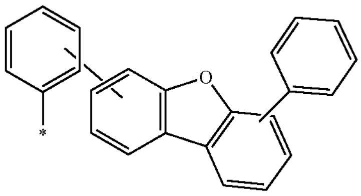
-continued
(R-80)
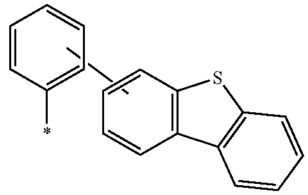
(R-81)
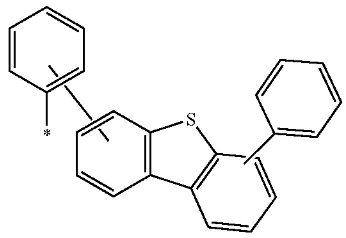
(R-82)
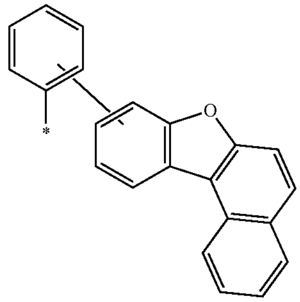
(R-83)
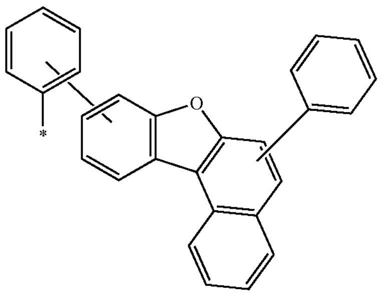
[Chemical Formulae 56]
(R-84)
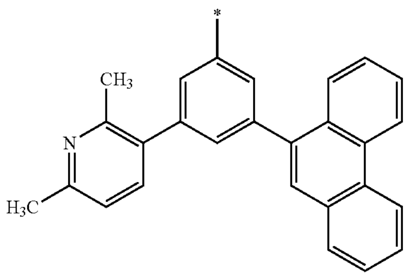

-continued
(R-85)
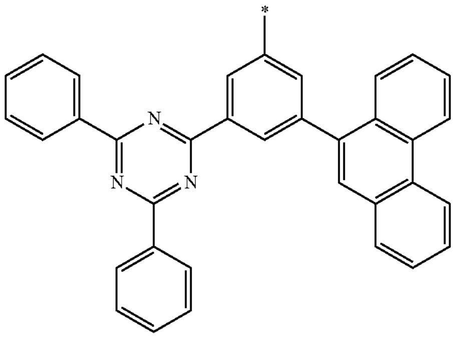
(R-86)
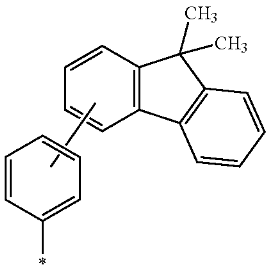
(R-87)
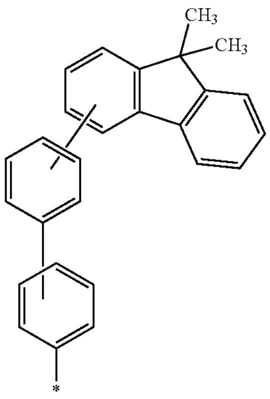
(R-88)
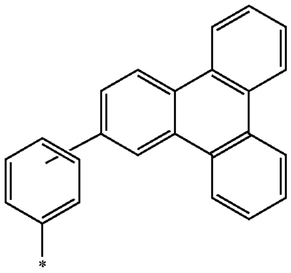
-continued
(R-89)
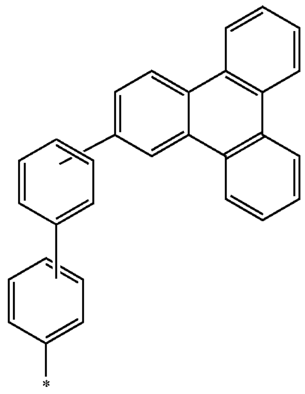
(R-90)
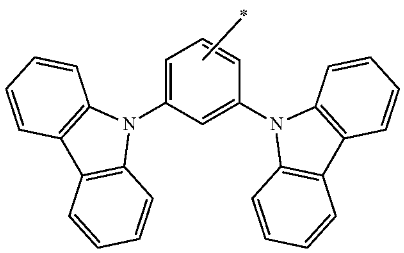
(R-91)
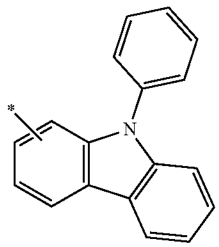
(R-92)
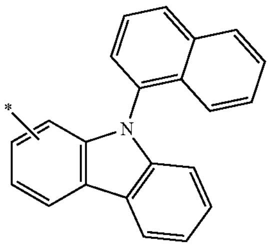
(R-93)
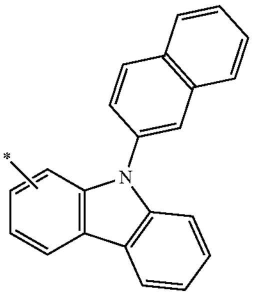

-continued
(R-94)
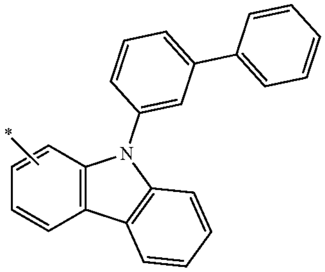
(R-95)
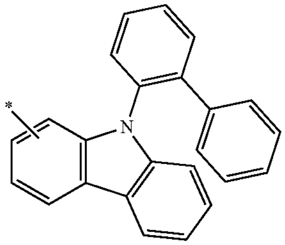
(R-96)
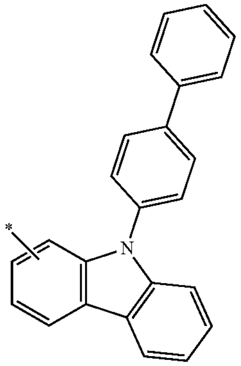
(R-97)
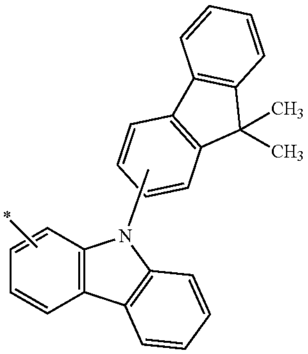
(R-98)
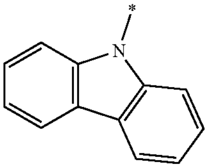
-continued
(R-99)
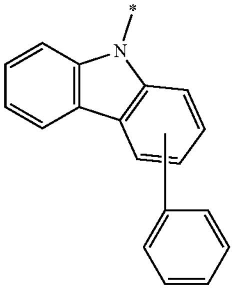
(R-100)
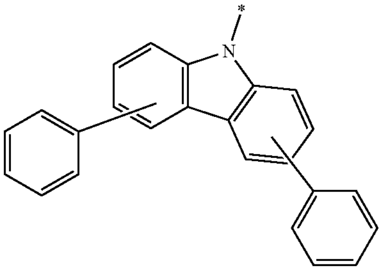
(R-101)
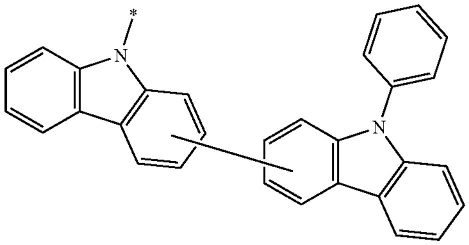
[Chemical Formulae 57]
(R-102)
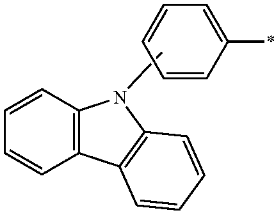
(R-103)
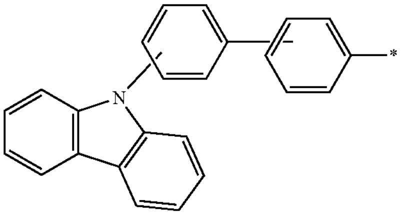
(R-104)
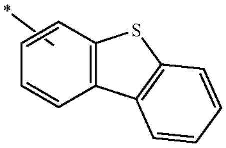
(R-105)
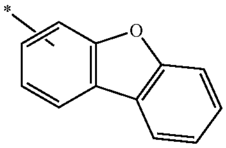

-continued
(R-106)
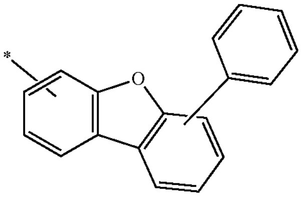
(R-107)
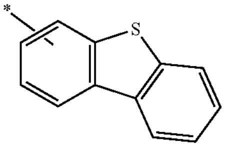
(R-108)
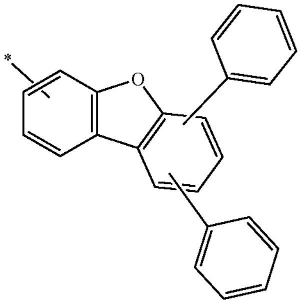
(R-109)
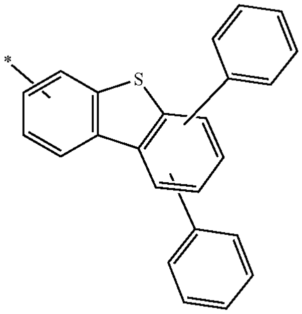
(R-110)
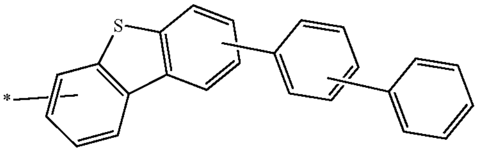
(R-111)
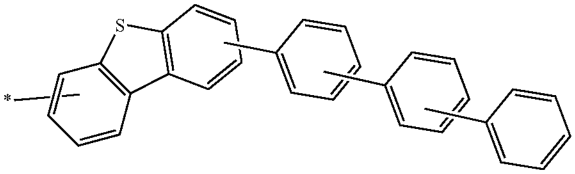
(R-112)
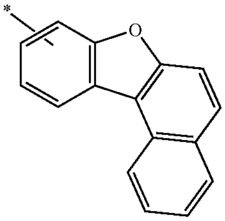
-continued
(R-113)
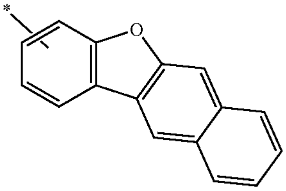
(R-114)
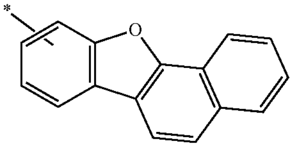
(R-115)
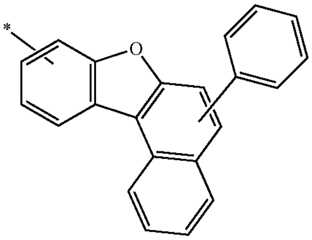
(R-116)
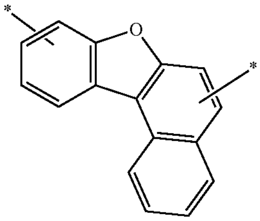
[Chemical Formulae 58]
(R-118)
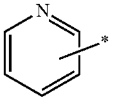
(R-119)
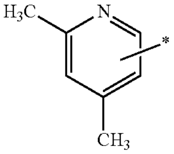
(R-120)
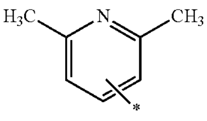
(R-121)
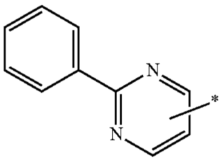

-continued
(R-122)
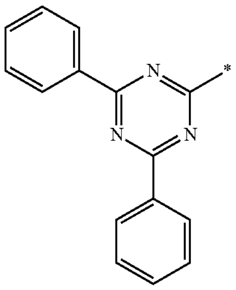
(R-123)
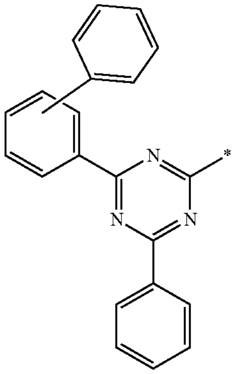
(R-124)
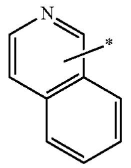
(R-125)
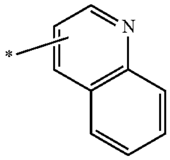
(R-126)
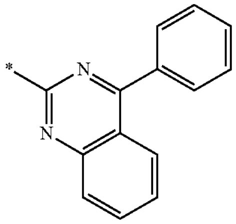
(R-127)
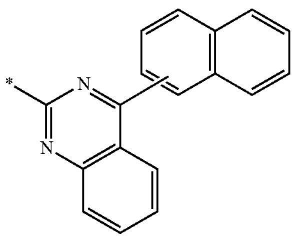
-continued
(R-128)
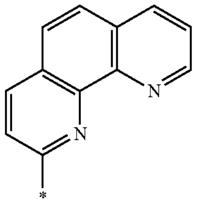
(R-129)
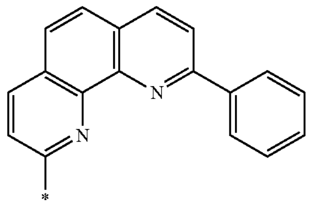
(R-130)
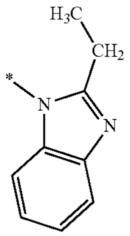
(R-131)
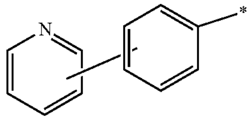
Next, specific examples of the electron-transport material having any of the above structures are shown below.
[Chemical Formulae 59]
(500)
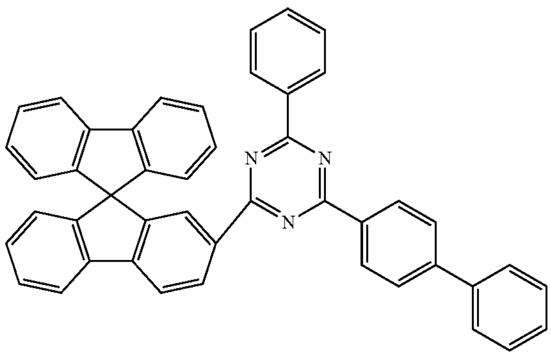

-continued
(501)
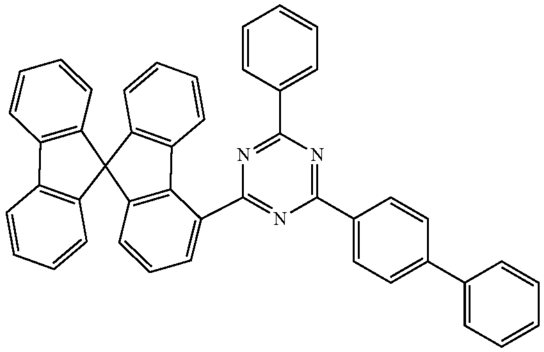
(502)
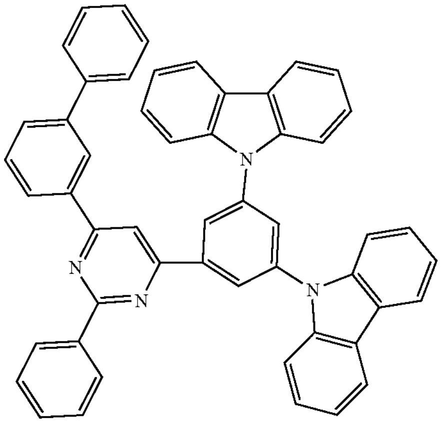
(503)
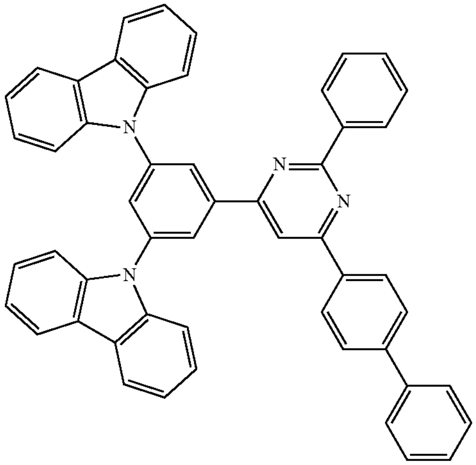
-continued
(504)
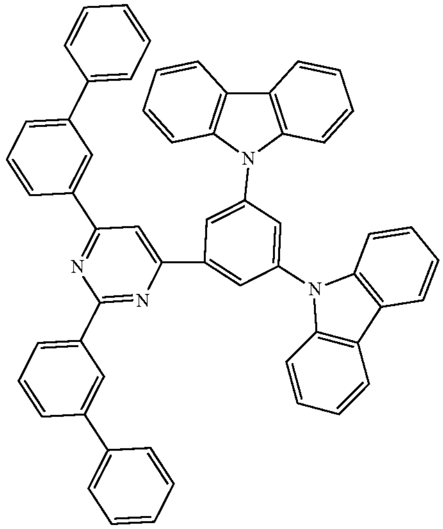
(505)
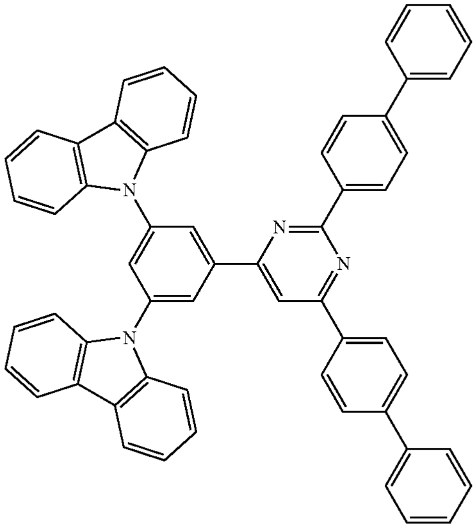
(506)
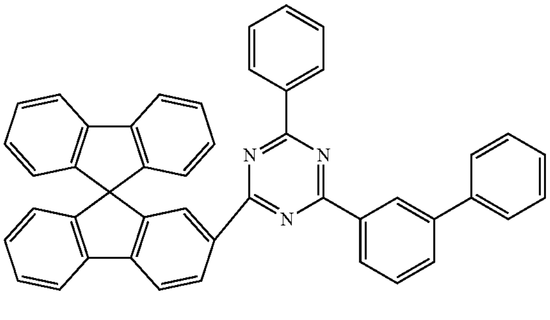

-continued
(507)
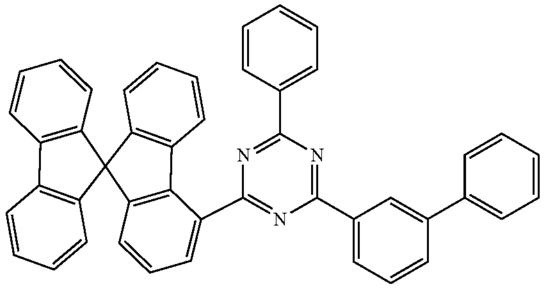
(508)
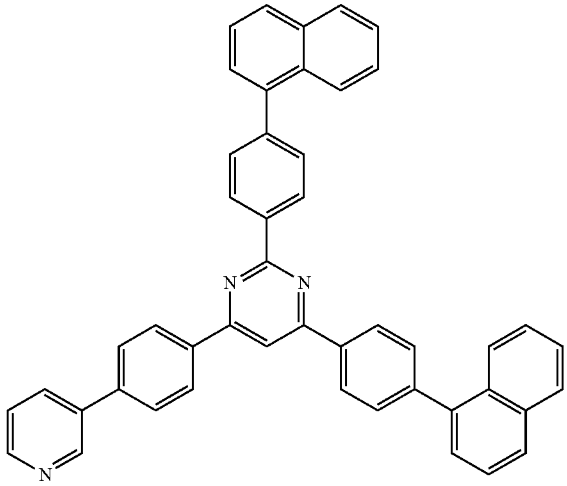
(509)
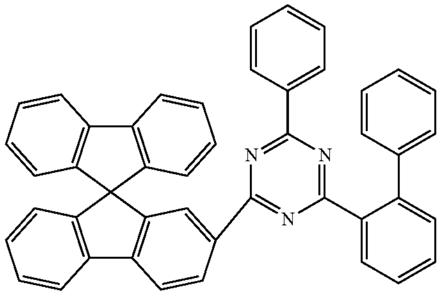
(510)
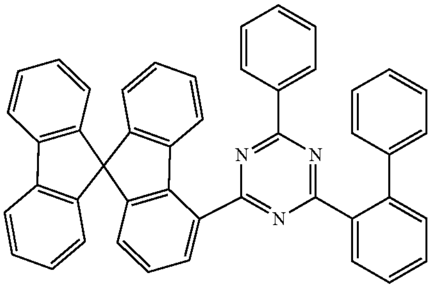
-continued
(511)
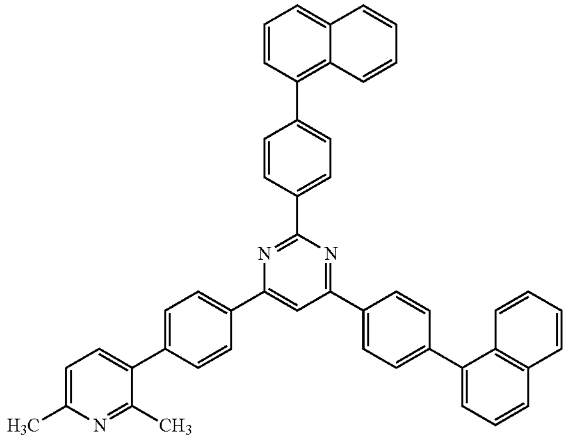
(512)
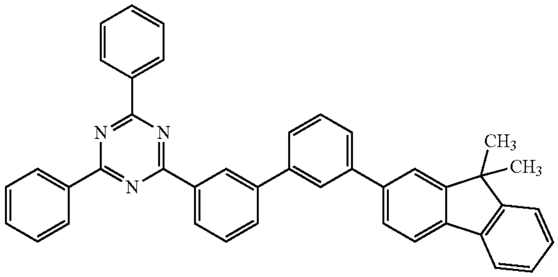
[Chemical Formulae 60]
(513)
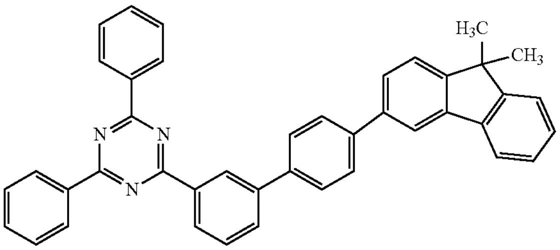
(514)
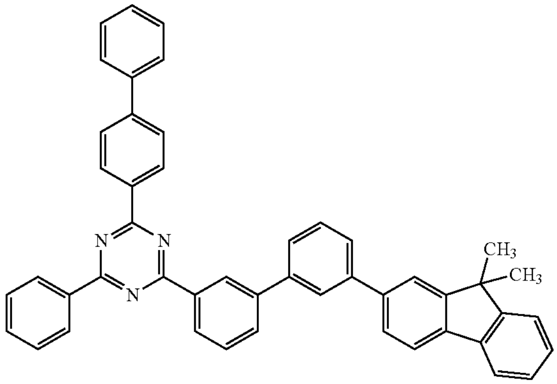

-continued
(515)
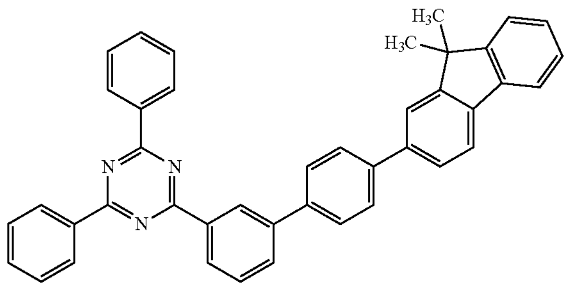
(516)
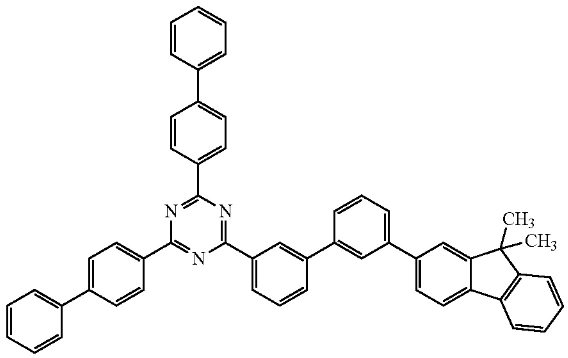
(517)
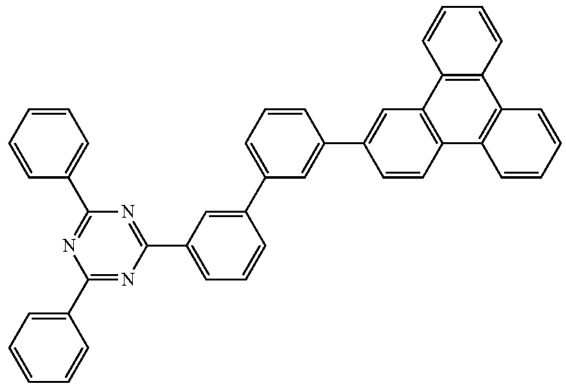
(518)
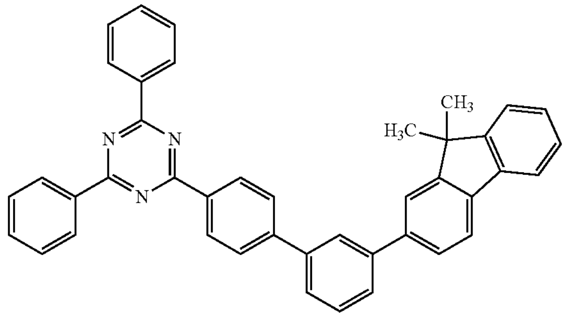
-continued
(519)
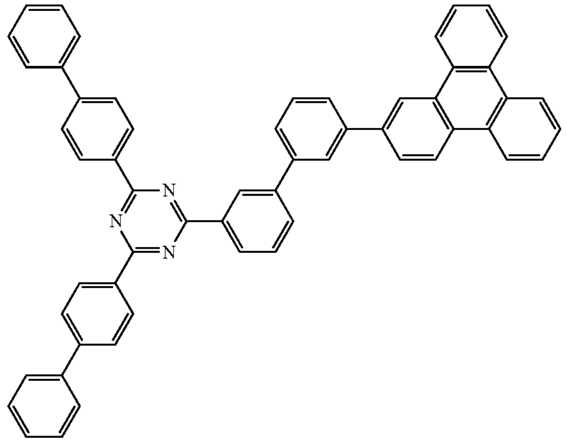
(520)
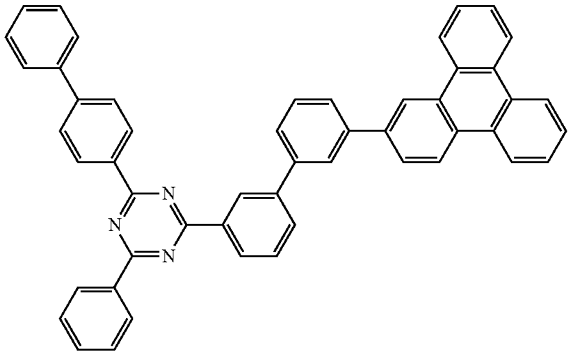
(521)
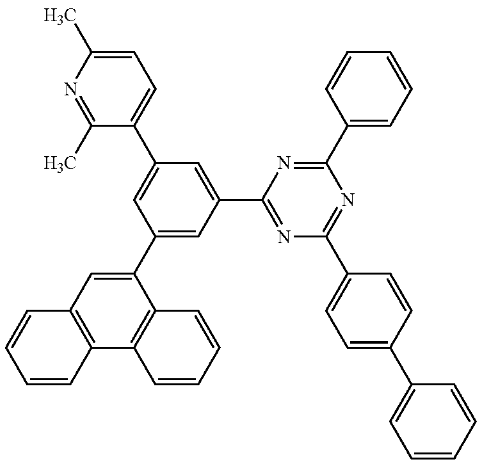

-continued (522)

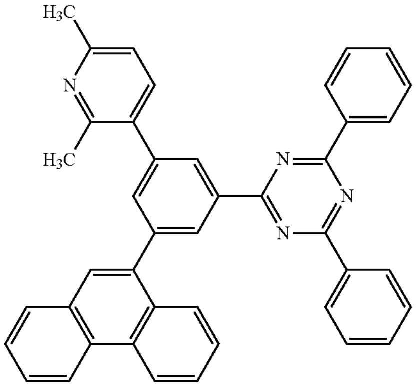

(523)

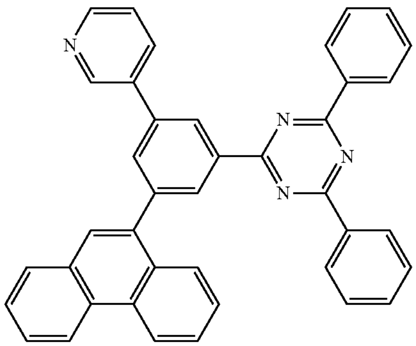

(524)

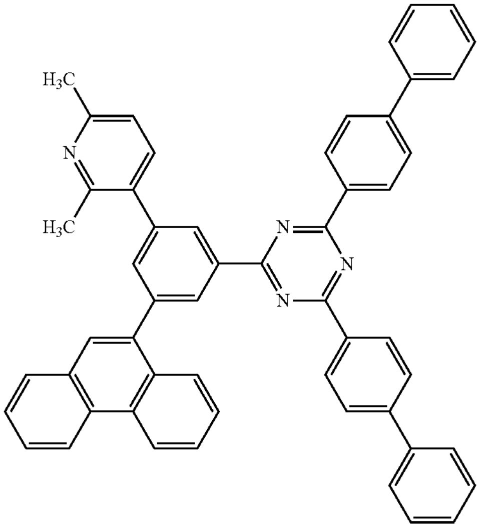

The organic compounds represented by Structural Formulae (500) to (524) are examples of the organic compounds represented by General Formulae (Ge-1) to (Ge-4), and the specific examples of the electron-transport materials are not limited thereto.

Alternatively, an organic compound represented by any of Structural Formulae (600) to (622) below can be used as the electron-transport material.

[Chemical Formulae 61]

(600)

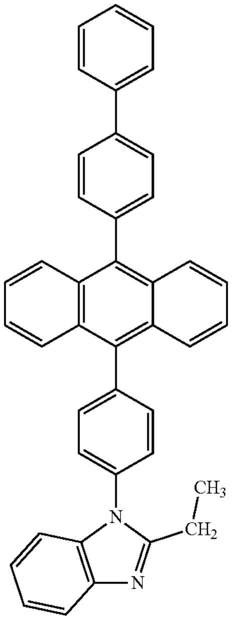

(601)

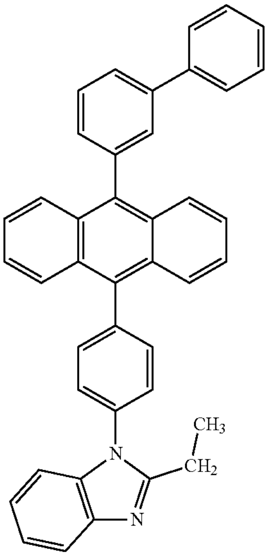

-continued
(602)
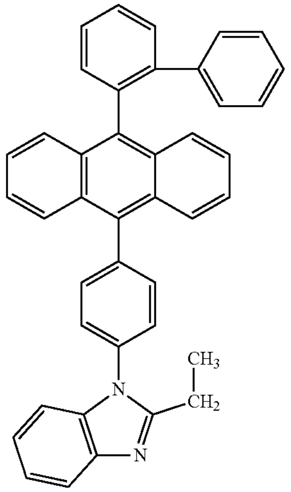
(603)
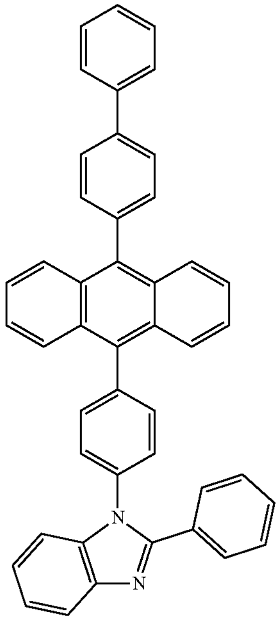
(604)
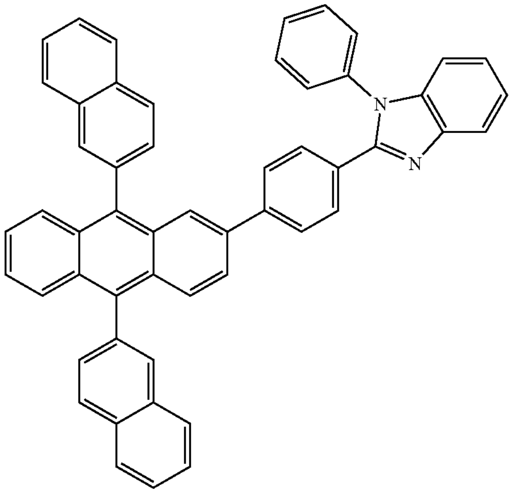
-continued
(605)
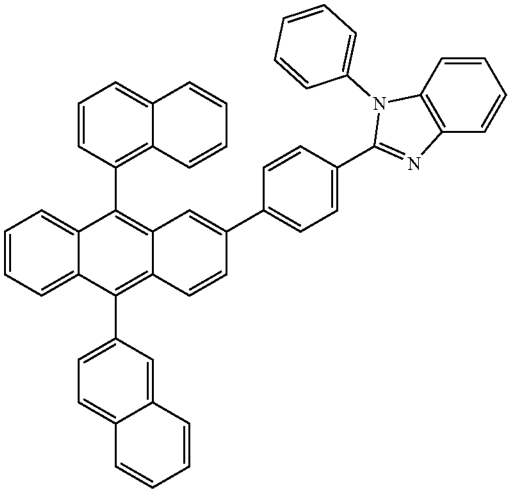
(606)
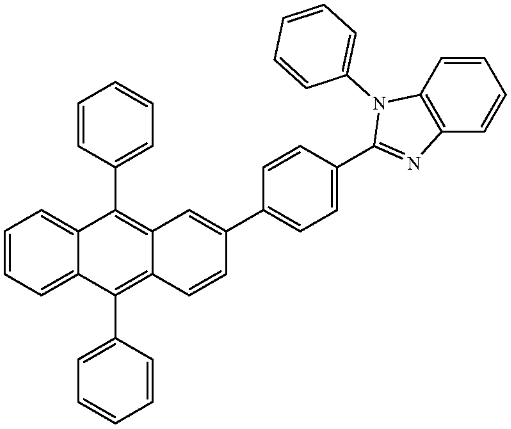
(607)
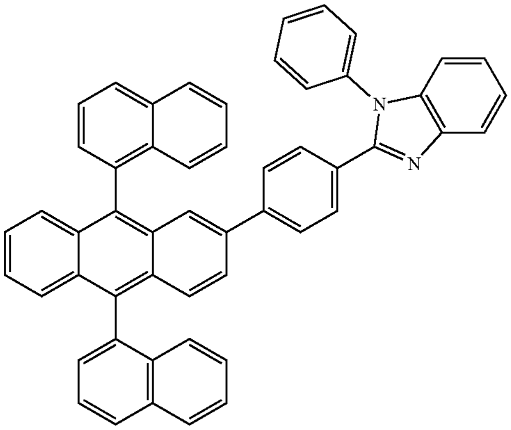

-continued
(608)
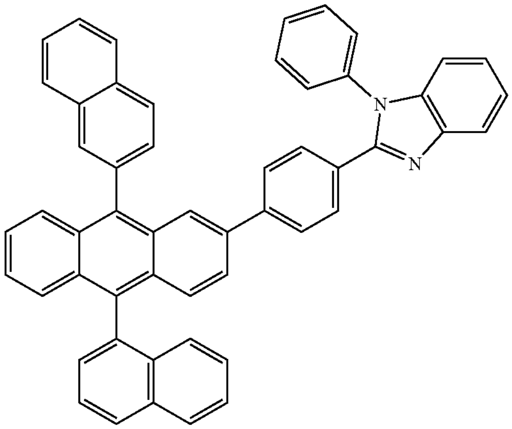
(609)
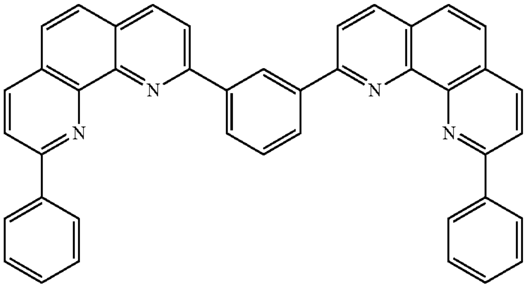
(610)
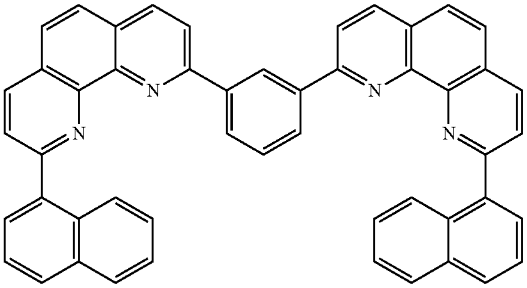
(611)
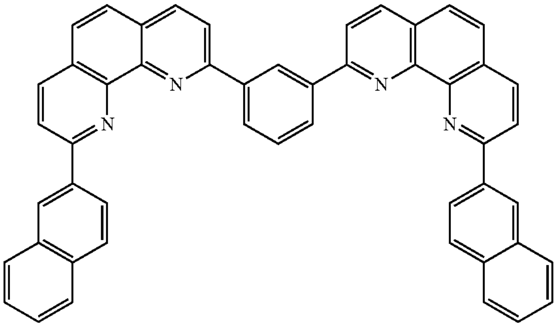
-continued
[Chemical Formulae 62]
(612)
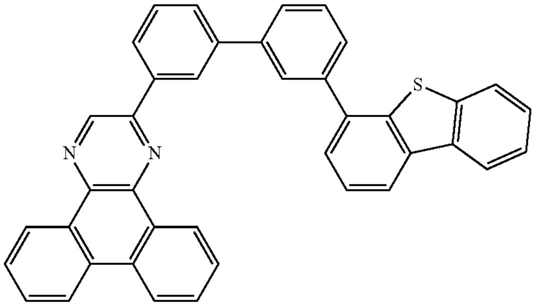
(613)
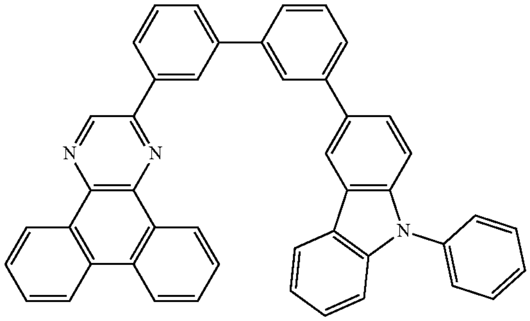
(614)
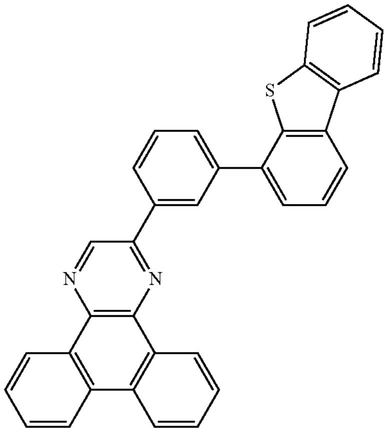
(615)
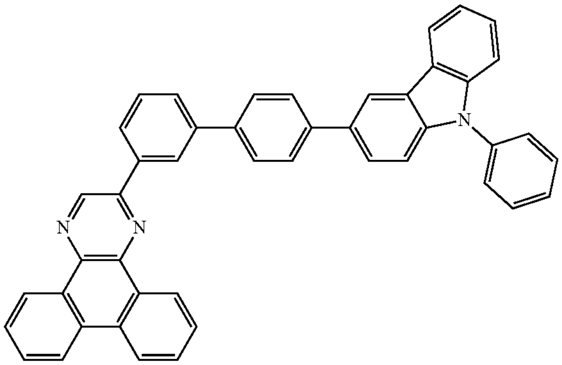

-continued (616)

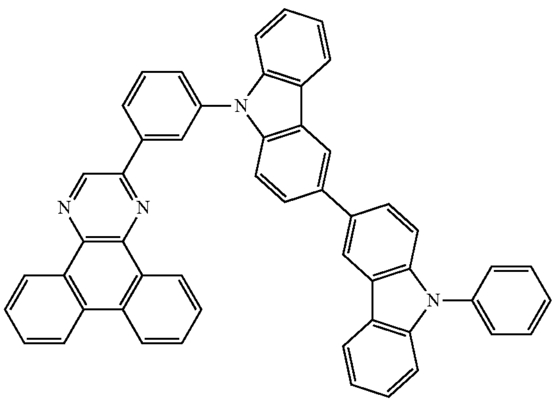

(617)

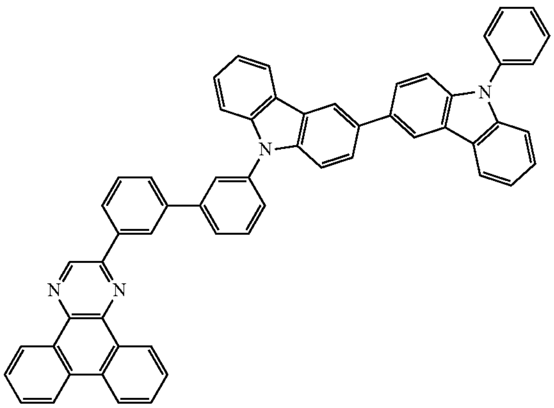

(618)

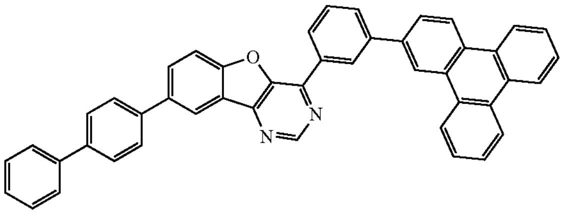

(619)

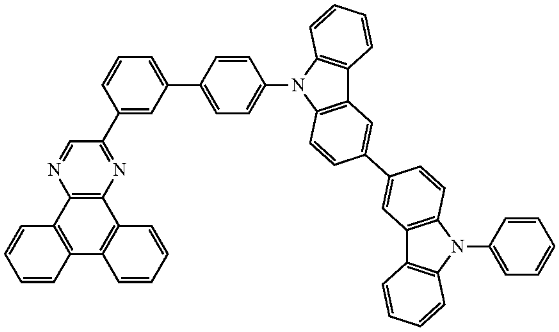

-continued (620)

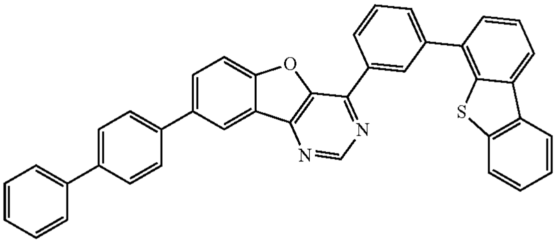

(621)

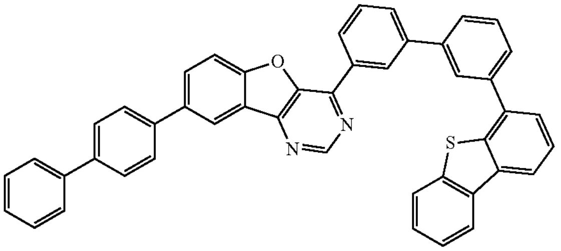

(622)

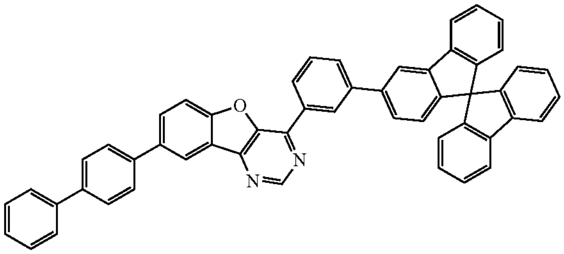

The second carrier-transport layer 214 can be formed using a material that can be used for an electron-transport layer 114 of the light-emitting device, which will be described in Embodiment 2.

The second carrier-transport layer 214 is not limited to a single layer and may be a stack of two or more layers each containing any of the above substances.

<Second Carrier-Injection Layer>

The second carrier-injection layer 215 is a layer for increasing the efficiency of electron injection from the light-receiving layer 203 to the second electrode 202, and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used. In this specification and the like, the second carrier-injection layer is also referred to as an electron-injection layer in some cases.

The second carrier-injection layer 215 can be formed using a material that can be used for an electron-injection layer 115 of the light-emitting device, which will be described in Embodiment 2.

A structure in which a plurality of light-receiving layers are stacked between a pair of electrodes (the structure is also referred to as a tandem structure) can be obtained by providing a charge-generation layer between two light-receiving layers 203. In addition, three or more light-receiving layers may be stacked with charge-generation layers each provided between adjacent light-receiving layers. The charge-generation layer can be formed using a material that can be used for a charge-generation layer 106 of the light-emitting device, which will be described in Embodiment 2.

Materials that can be used for the layers (the first carrier-injection layer 211, the first carrier-transport layer 212, the active layer 213, the second carrier-transport layer 214, and the second carrier-injection layer 215) included in the light-receiving layer 203 of the light-receiving device described in this embodiment are not limited to the materials described in this embodiment, and other materials can be used in combination as long as the functions of the layers are fulfilled.

Note that in this specification and the like, the terms "layer" and "film" can be interchanged with each other as appropriate.

Note that the light-receiving device of one embodiment of the present invention has a function of sensing visible light. The light-receiving device of one embodiment of the present invention has sensitivity to visible light. The light-receiving device of one embodiment of the present invention preferably has a function of sensing visible light and infrared light. The light-receiving device of one embodiment of the present invention preferably has sensitivity to visible light and infrared light.

In this specification and the like, a blue (B) wavelength range is greater than or equal to 400 nm and less than 490 nm, and blue (B) light has at least one emission spectrum peak in the wavelength range. A green (G) wavelength range is greater than or equal to 490 nm and less than 580 nm, and green (G) light has at least one emission spectrum peak in the wavelength range. A red (R) wavelength range is greater than or equal to 580 nm and less than or equal to 750 nm, and red (R) light has at least one emission spectrum peak in the wavelength range. In this specification and the like, a visible light wavelength range is greater than or equal to 400 nm and less than or equal to 750 nm, and visible light has at least one emission spectrum peak in the wavelength range. An infrared (IR) wavelength range is greater than or equal to 700 nm and less than 900 nm, and infrared (IR) light has at least one emission spectrum peak in the wavelength range.

Figure 2A:
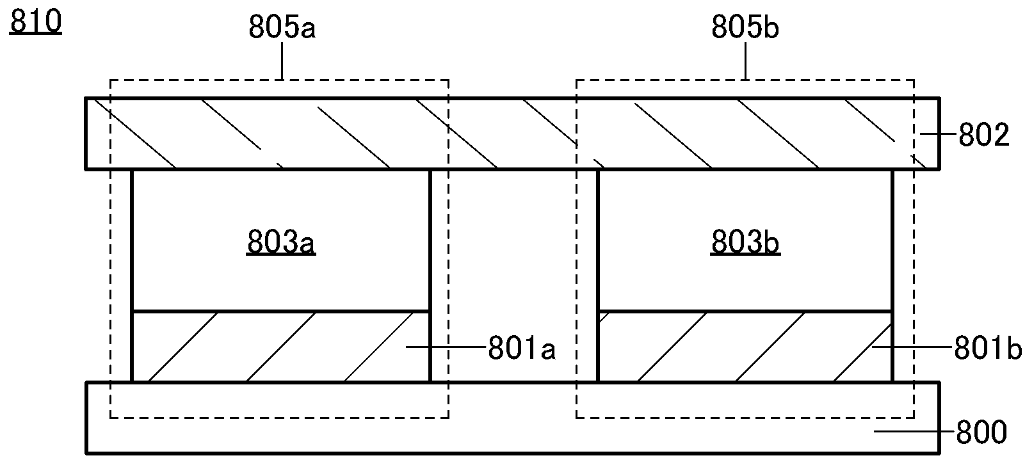
FIGS. 2A to 2C each illustrate a light-emitting and light-receiving apparatus of one embodiment of the present invention.

The above-described light-receiving device of one embodiment of the present invention can be used for a display apparatus including an organic EL device. In other words, the light-receiving device of one embodiment of the present invention can be incorporated into a display apparatus including an organic EL device. In other words, the light-receiving device of one embodiment of the present invention can be used as a light-receiving device in a light-emitting and light-receiving apparatus including an organic EL device and a light-receiving device. As an example, FIG. 2A illustrates a schematic cross-sectional view of a light-emitting and light-receiving apparatus 810 in which a light-emitting device 805*a* and a light-receiving device 805*b* are formed over the same substrate.

The light-emitting and light-receiving apparatus 810 includes the light-emitting device 805*a* and the light-receiving device 805*b*, and thus has one or both of an imaging function and a sensing function in addition to a function of displaying an image.

The light-emitting device 805*a* has a function of emitting light (hereinafter, also referred to as a light-emitting function). The light-emitting device 805*a* includes an electrode 801*a*, an EL layer 803*a*, and an electrode 802. Thus, the EL layer 803*a* interposed between the electrode 801*a* and the electrode 802 at least includes a light-emitting layer. The light-emitting layer contains a light-emitting substance. The EL layer 803*a* emits light when a voltage is applied between the electrode 801*a* and the electrode 802. The EL layer 803*a* may include any of a variety of layers such as a hole-injection layer, a hole-transport layer, an electron-transport layer, an electron-injection layer, a carrier-blocking (hole-blocking or electron-blocking) layer, and a charge-generation layer, in addition to the light-emitting layer. For the light-emitting device 805*a*, a structure of the light-emitting device, which is an organic EL device to be described in Embodiment 2, can be employed.

The light-receiving device 805*b* has a function of sensing light (hereinafter, also referred to as a light-receiving function). The light-emitting device 805*b* includes an electrode 801*b*, a light-receiving layer 803*b*, and the electrode 802. The light-receiving layer 803*b* interposed between the electrode 801*b* and the electrode 802 at least includes an active layer. The light-receiving device 805*b* functions as a photoelectric conversion device; when light is incident on the light-receiving layer 803*b*, electric charge can be generated and extracted as a current. At this time, a voltage may be applied between the electrode 801*b* and the electrode 802. The amount of generated electric charge depends on the amount of the light incident on the light-receiving layer 803*b*. For the light-receiving device 805*b*, the structure of the above-described light-receiving device 200 can be employed.

The light-receiving device 805*b*, which is easily made thin, lightweight, and large in area and has a high degree of freedom for shape and design, can be used in a variety of display apparatuses. In addition, the EL layer 803*a* included in the light-emitting device 805*a* and the light-receiving layer 803*b* included in the light-receiving device 805*b* can be formed by the same method (e.g., a vacuum evaporation method) with the same manufacturing apparatus, which is preferable.

The electrode 801*a* and the electrode 801*b* are provided on the same plane. In FIG. 2A, the electrodes 801*a* and 801*b* are provided over a substrate 800. The electrodes 801*a* and 801*b* can be formed by processing a conductive film formed over the substrate 800 into an island shape, for example. In other words, the electrodes 801*a* and 801*b* can be formed through the same process.

As the substrate 800, a substrate having heat resistance high enough to withstand the formation of the light-emitting device 805*a* and the light-receiving device 805*b* can be used. When an insulating substrate is used as the substrate 800, a glass substrate, a quartz substrate, a sapphire substrate, a ceramic substrate, an organic resin substrate, or the like can be used. Alternatively, a semiconductor substrate can be used. For example, a single crystal semiconductor substrate or a polycrystalline semiconductor substrate of silicon, silicon carbide, or the like; a compound semiconductor substrate of silicon germanium or the like; an SOI substrate; or the like can be used.

As the substrate 800, it is particularly preferable to use the insulating substrate or the semiconductor substrate over which a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

The electrode 802 is formed of a layer shared by the light-emitting device 805*a* and the light-receiving device 805*b*. As the electrode through which light enters or exits among the electrodes 801*a*, 801*b*, and 802, a conductive film that transmits visible light and infrared light is used. As the electrode through which light neither enters nor exits, a conductive film that reflects visible light and infrared light is preferably used.

The electrode 802 in the light-emitting and light-receiving apparatus of one embodiment of the present invention functions as one of the electrodes in each of the light-emitting device 805*a* and the light-receiving device 805*b*.

Figure 2B:
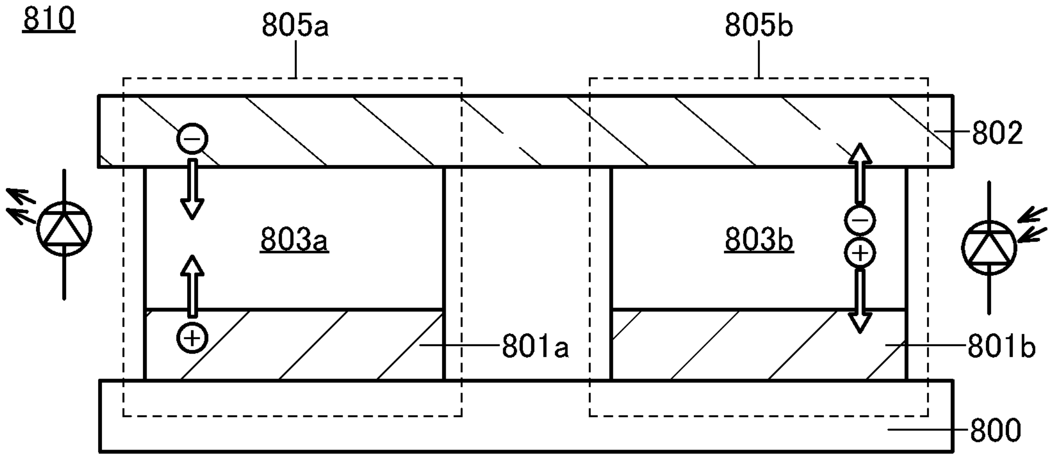

In FIG. 2B, the electrode 801*a* of the light-emitting device 805*a* has a potential higher than that of the electrode 802. In this case, the electrode 801*a* functions as an anode and the electrode 802 functions as a cathode in the light-emitting device 805*a*. The electrode 801*b* of the light-receiving device 805*b* has a potential lower than that of the electrode 802. For easy understanding of the direction of current flow, FIG. 2B illustrates a circuit symbol of a light-emitting diode on the left of the light-emitting device 805*a* and a circuit symbol of a photodiode on the right of the light-receiving device 805*b*. The flow directions of carriers (electrons and holes) in each device are also schematically indicated by arrows.

In the structure illustrated in FIG. 2B, when a first potential is supplied to the electrode 801*a* through a first wiring, a second potential is supplied to the electrode 802 through a second wiring, and a third potential is supplied to the electrode 801*b* through a third wiring, the following relationship is satisfied: the first potential>the second potential>the third potential.

Figure 2C:
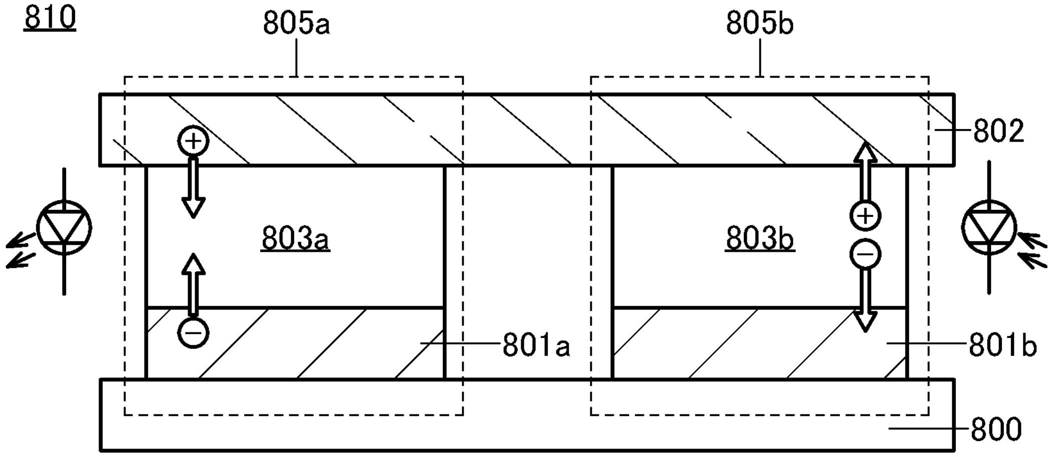

In FIG. 2C, the electrode 801*a* of the light-emitting device 805*a* has a potential lower than that of the electrode 802. In this case, the electrode 801*a* functions as a cathode and the electrode 802 functions as an anode in the light-emitting device 805*a*. The electrode 801*b* of the light-receiving device 805*b* has a potential lower than that of the electrode 802 and a potential higher than that of the electrode 801*a*. For easy understanding of the direction of current flow, FIG. 2C illustrates a circuit symbol of a light-emitting diode on the left of the light-emitting device 805*a* and a circuit symbol of a photodiode on the right of the light-receiving device 805*b*. The flow directions of carriers (electrons and holes) in each device are also schematically indicated by arrows.

In the structure illustrated in FIG. 2C, when a first potential is supplied to the electrode 801*a* through a first wiring, a second potential is supplied to the electrode 802 through a second wiring, and a third potential is supplied to the electrode 801*b* through a third wiring, the following relationship is satisfied: the second potential>the third potential>the first potential.

Figure 3A:
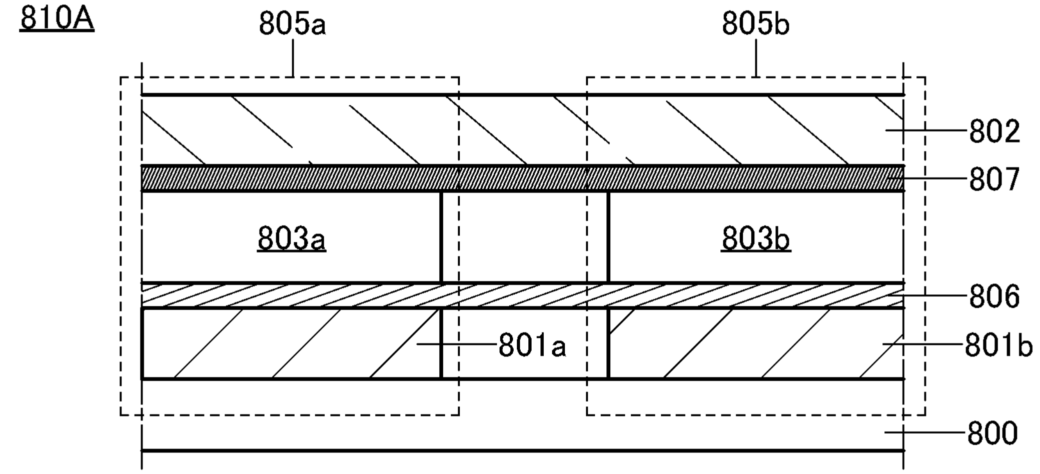
FIGS. 3A and 3B each illustrate a light-emitting and light-receiving apparatus of one embodiment of the present invention.

FIG. 3A illustrates a light-emitting and light-receiving apparatus 810A that is a variation example of the light-emitting and light-receiving apparatus 810. The light-emitting and light-receiving apparatus 810A is different from the light-emitting and light-receiving apparatus 810 in including a common layer 806 and a common layer 807. In the light-emitting device 805*a*, the common layers 806 and 807 function as part of the EL layer 803*a*. In the light-receiving device 805*b*, the common layers 806 and 807 function as part of the light-receiving layer 803*b*. The common layer 806 includes a hole-injection layer and a hole-transport layer, for example. The common layer 807 includes an electron-transport layer and an electron-injection layer, for example.

With the common layers 806 and 807, a light-receiving device can be incorporated without a significant increase in the number of times of separate coloring, whereby the light-emitting and light-receiving apparatus 810A can be manufactured with a high throughput.

Figure 3B:
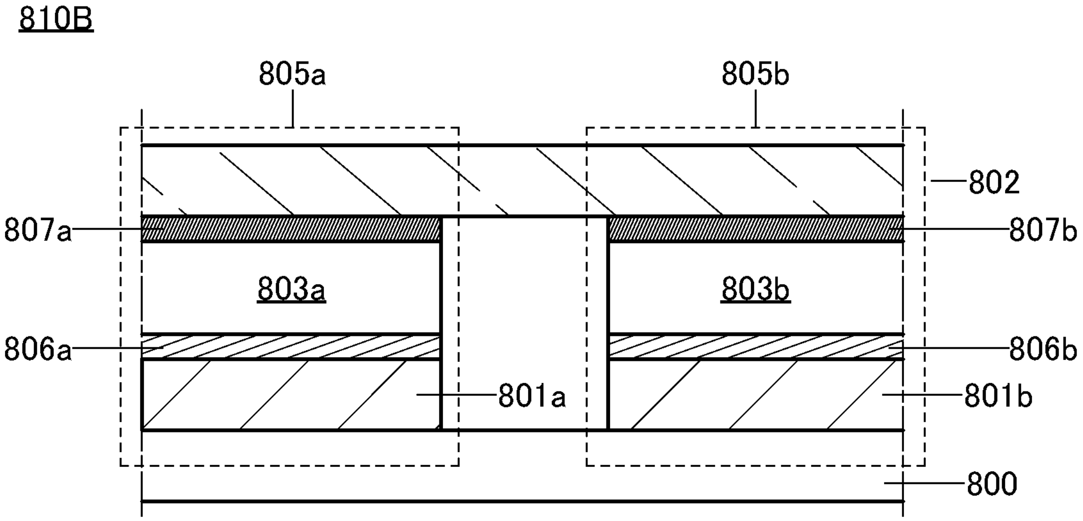

FIG. 3B illustrates a light-emitting and light-receiving apparatus 810B that is a variation example of the light-emitting and light-receiving apparatus 810. The light-emitting and light-receiving apparatus 810B is different from the light-emitting and light-receiving apparatus 810 in that the EL layer 803*a* includes a layer 806*a* and a layer 807*a* and the light-receiving layer 803*b* includes a layer 806*b* and a layer 807*b*. The layers 806*a* and 806*b* are formed using different materials, and each include a hole-injection layer and a hole-transport layer, for example. Note that the layers 806*a* and 806*b* may be formed using the same material. The layers 807*a* and 807*b* are formed using different materials, and each include an electron-transport layer and an electron-injection layer, for example. Note that the layers 807*a* and 807*b* may be formed using the same material.

An optimum material for forming the light-emitting device 805*a* is selected for the layers 806*a* and 807*a* and an optimum material for forming the light-receiving device 805*b* is selected for the layers 806*b* and 807*b*, whereby the light-emitting device 805*a* and the light-receiving device 805*b* can have higher performance in the light-emitting and light-receiving apparatus 810B.

The resolution of the light-receiving device 805*b* can be 100 ppi or more, preferably 200 ppi or more, further preferably 300 ppi or more, still further preferably 400 ppi or more, and yet further preferably 500 ppi or more, and 2000 ppi or less, 1000 ppi or less, or 600 ppi or less, for example. In particular, when the resolution of the light-receiving device 805*b* is 200 ppi or more and 600 ppi or less, preferably 300 ppi or more and 600 ppi or less, the light-emitting and light-receiving apparatus of one embodiment of the present invention can be suitably used for image capturing of a fingerprint. In fingerprint authentication with the light-emitting and light-receiving apparatus 810, the increased resolution of the light-receiving device 805*b* enables, for example, highly accurate extraction of the minutiae of fingerprints; thus, the accuracy of the fingerprint authentication can be increased. The resolution is preferably 500 ppi or more, in which case the authentication conforms to the standard by the National Institute of Standards and Technology (NIST) or the like. On the assumption that the resolution of the light-receiving device is 500 ppi, the size of each pixel is 50.8 μm, which is adequate for image capturing of a fingerprint ridge distance (typically, greater than or equal to 300 μm and less than or equal to 500 μm).

The structures described in this embodiment can be used in appropriate combination with any of the structures described in the other embodiments.

Embodiment 2

In this embodiment, other structures of the light-emitting devices described in Embodiment 1 will be described with reference to FIG. 4A to 4E.

<<Basic Structure of Light-Emitting Device>>

Figure 4A:
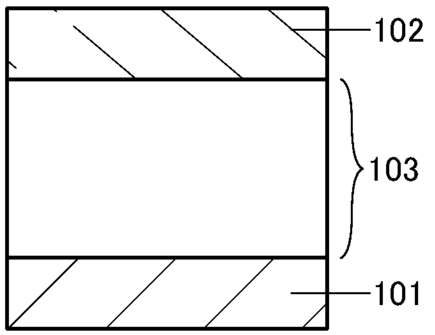
FIGS. 4A to 4E each illustrate a structure of a light-emitting device of an embodiment.

Basic structures of the light-emitting device are described. FIG. 4A illustrates a light-emitting device including, between a pair of electrodes, an EL layer including a light-emitting layer. Specifically, an EL layer 103 is interposed between the first electrode 101 and the second electrode 102.

Figure 4B:
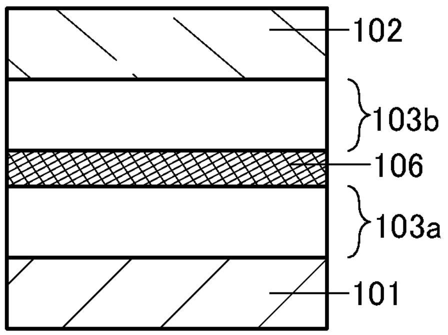

FIG. 4B illustrates a light-emitting device that has a stacked-layer structure (tandem structure) in which a plurality of EL layers (two EL layers 103*a* and 103*b* in FIG. 4B) are provided between a pair of electrodes and the charge-generation layer 106 is provided between the EL layers. A light-emitting device having a tandem structure enables fabrication of a light-emitting apparatus that can be driven at a low voltage and has low power consumption.

The charge-generation layer 106 has a function of injecting electrons into one of the EL layers 103*a* and 103*b* and injecting holes into the other of the EL layers 103*a* and 103*b* when a potential difference is caused between the first electrode 101 and the second electrode 102. Thus, when a voltage is applied in FIG. 4B such that the potential of the first electrode 101 is higher than that of the second electrode 102, the charge-generation layer 106 injects electrons into the EL layer 103*a* and injects holes into the EL layer 103*b*.

Note that in terms of light extraction efficiency, the charge-generation layer 106 preferably has a property of transmitting visible light (specifically, the charge-generation layer 106 preferably has a visible light transmittance of 40% or more). The charge-generation layer 106 functions even if it has lower conductivity than the first electrode 101 or the second electrode 102.

Figure 4C:
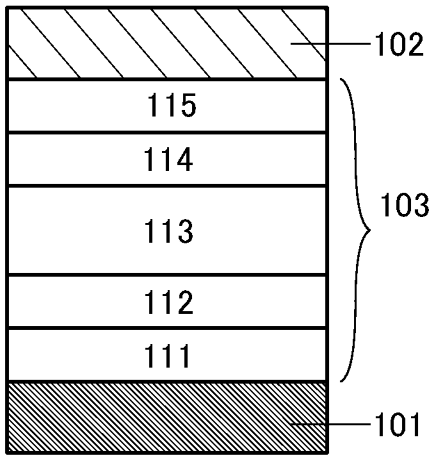

FIG. 4C illustrates a stacked-layer structure of the EL layer 103 in the light-emitting device of one embodiment of the present invention. In this case, the first electrode 101 is regarded as functioning as an anode and the second electrode 102 is regarded as functioning as a cathode. The EL layer 103 has a structure in which the hole-injection layer 111, the hole-transport layer 112, the light-emitting layer 113, the electron-transport layer 114, and the electron-injection layer 115 are stacked in this order over the first electrode 101. Note that the light-emitting layer 113 may have a stacked-layer structure of a plurality of light-emitting layers that emit light of different colors. For example, a light-emitting layer containing a light-emitting substance that emits red light, a light-emitting layer containing a light-emitting substance that emits green light, and a light-emitting layer containing a light-emitting substance that emits blue light may be stacked with or without a layer containing a carrier-transport material therebetween. Alternatively, a light-emitting layer containing a light-emitting substance that emits yellow light and a light-emitting layer containing a light-emitting substance that emits blue light may be used in combination. Note that the stacked-layer structure of the light-emitting layer 113 is not limited to the above. For example, the light-emitting layer 113 may have a stacked-layer structure of a plurality of light-emitting layers that emit light of the same color. For example, a first light-emitting layer containing a light-emitting substance that emits blue light and a second light-emitting layer containing a light-emitting substance that emits blue light may be stacked with or without a layer containing a carrier-transport material therebetween. The structure in which a plurality of light-emitting layers that emit light of the same color are stacked can sometimes achieve higher reliability than a single-layer structure. In the case where a plurality of EL layers are provided as in the tandem structure illustrated in FIG. 4B, the layers in each EL layer are sequentially stacked from the anode side as described above. When the first electrode 101 is the cathode and the second electrode 102 is the anode, the stacking order of the layers in the EL layer 103 is reversed. Specifically, the layer 111 over the first electrode 101 serving as the cathode is an electron-injection layer; the layer 112 is an electron-transport layer; the layer 113 is a light-emitting layer; the layer 114 is a hole-transport layer; and the layer 115 is a hole-injection layer.

The light-emitting layer 113 included in the EL layers (103, 103*a*, and 103*b*) contains an appropriate combination of a light-emitting substance and a plurality of substances, so that fluorescent or phosphorescent light of a desired emission color can be obtained. The light-emitting layer 113 may have a stacked-layer structure having different emission colors. In that case, one or both of light-emitting substances and other substances are different between the stacked light-emitting layers. Alternatively, the plurality of EL layers (103*a* and 103*b*) in FIG. 4B may exhibit their respective emission colors. Also in that case, one or both of the light-emitting substances and other substances are different between the stacked light-emitting layers.

The light-emitting device of one embodiment of the present invention can have a micro optical resonator (microcavity) structure when, for example, the first electrode 101 is a reflective electrode and the second electrode 102 is a semi-transmissive and semi-reflective electrode in FIG. 4C. Thus, light from the light-emitting layer 113 in the EL layer 103 can be resonated between the electrodes and light obtained through the second electrode 102 can be intensified.

Note that when the first electrode 101 of the light-emitting device is a reflective electrode having a stacked-layer structure of a reflective conductive material and a light-transmitting conductive material (transparent conductive film), optical adjustment can be performed by adjusting the thickness of the transparent conductive film. Specifically, when the wavelength of light obtained from the light-emitting layer 113 is $\lambda$, the optical path length between the first electrode 101 and the second electrode 102 (the product of the thickness and the refractive index) is preferably adjusted to be $m\lambda/2$ (m is a natural number) or close to $m\lambda/2$.

To amplify desired light (wavelength: $\lambda$) obtained from the light-emitting layer 113, it is preferable to adjust each of the optical path length from the first electrode 101 to a region where the desired light is obtained in the light-emitting layer 113 (light-emitting region) and the optical path length from the second electrode 102 to the region where the desired light is obtained in the light-emitting layer 113 (light-emitting region) to be $(2m'+1)\lambda/4$ (m' is a natural number) or close to $(2m'+1)\lambda/4$. Here, the light-emitting region means a region where holes and electrons are recombined in the light-emitting layer 113.

By such optical adjustment, the spectrum of specific monochromatic light obtained from the light-emitting layer 113 can be narrowed and light emission with high color purity can be obtained.

In the above case, the optical path length between the first electrode 101 and the second electrode 102 is, to be exact, the total thickness from a reflective region in the first electrode 101 to a reflective region in the second electrode 102. However, it is difficult to precisely determine the reflective regions in the first electrode 101 and the second electrode 102; thus, it is assumed that the above effect can be sufficiently obtained wherever the reflective regions may be set in the first electrode 101 and the second electrode 102. Furthermore, the optical path length between the first electrode 101 and the light-emitting layer that emits the desired light is, to be exact, the optical path length between the reflective region in the first electrode 101 and the light-emitting region in the light-emitting layer that emits the desired light. However, it is difficult to precisely determine the reflective region in the first electrode 101 and the light-emitting region in the light-emitting layer that emits the desired light; thus, it is assumed that the above effect can be sufficiently obtained wherever the reflective region and the light-emitting region may be set in the first electrode 101 and the light-emitting layer that emits the desired light, respectively.

Figure 4D:
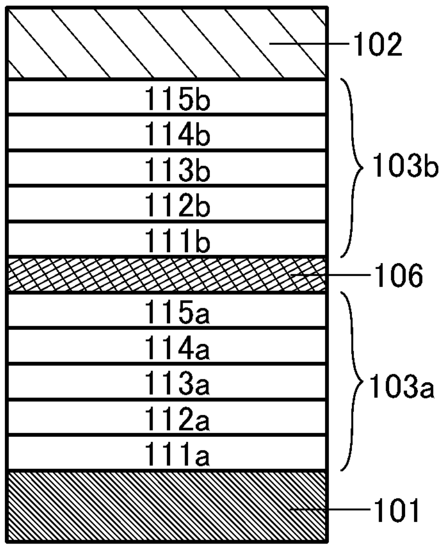

The light-emitting device illustrated in FIG. 4D is a light-emitting device having a tandem structure. Owing to a microcavity structure of the light-emitting device, light (monochromatic light) with different wavelengths from the EL layers (103a and 103b) can be extracted. Thus, separate coloring for obtaining a plurality of emission colors (e.g., R, G, and B) is not necessary. Therefore, high resolution can be easily achieved. A combination with coloring layers (color filters) is also possible. Furthermore, the emission intensity of light with a specific wavelength in the front direction can be increased, whereby power consumption can be reduced.

Figure 4E:
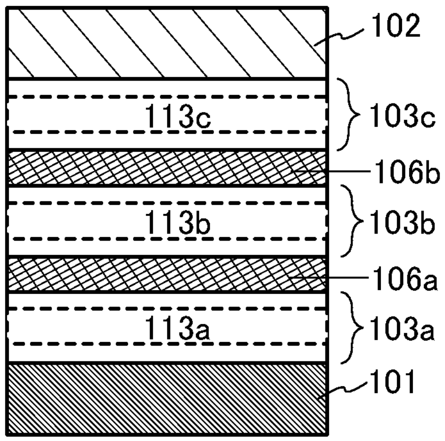

The light-emitting device illustrated in FIG. 4E is an example of the light-emitting device having the tandem structure illustrated in FIG. 4B, and includes three EL layers (103a, 103b, and 103c) stacked with charge-generation layers (106a and 106b) interposed therebetween, as illustrated in FIG. 4E. The three EL layers (103a, 103b, and 103c) include respective light-emitting layers (113a, 113b, and 113c), and the emission colors of the light-emitting layers can be selected freely. For example, each of the light-emitting layer 113a and the light-emitting layer 113c can emit blue light, and the light-emitting layer 113b can emit red light, green light, or yellow light. For another example, the light-emitting layer 113a can emit red light, the light-emitting layer 113b can emit blue light, green light, or yellow light, and the light-emitting layer 113c can emit red light.

In the light-emitting device of one embodiment of the present invention, at least one of the first electrode 101 and the second electrode 102 is a light-transmitting electrode (e.g., a transparent electrode or a semi-transmissive and semi-reflective electrode). In the case where the light-transmitting electrode is a transparent electrode, the transparent electrode has a visible light transmittance higher than or equal to 40%. In the case where the light-transmitting electrode is a semi-transmissive and semi-reflective electrode, the semi-transmissive and semi-reflective electrode has a visible light reflectance higher than or equal to 20% and lower than or equal to 80%, preferably higher than or equal to 40% and lower than or equal to 70%. These electrodes preferably have a resistivity of $1\times10^{-2}$ Ωcm or less.

When one of the first electrode 101 and the second electrode 102 is a reflective electrode in the light-emitting device of one embodiment of the present invention, the visible light reflectance of the reflective electrode is higher than or equal to 40% and lower than or equal to 100%, preferably higher than or equal to 70% and lower than or equal to 100%. This electrode preferably has a resistivity of $1\times10^{-2}$ Ωcm or less.

<Specific Structure of Light-Emitting Device>>

Next, a specific structure of the light-emitting device of one embodiment of the present invention will be described. Here, the description is made using FIG. 4D illustrating the tandem structure. Note that the structure of the EL layer applies also to the structure of the light-emitting devices having a single structure in FIG. 4A and FIG. 4C. When the light-emitting device in FIG. 4D has a microcavity structure, the first electrode 101 is formed as a reflective electrode and the second electrode 102 is formed as a semi-transmissive and semi-reflective electrode. Thus, a single-layer structure or a stacked-layer structure can be formed using one or more kinds of desired electrode materials. Note that the second electrode 102 is formed after formation of the EL layer 103b, with the use of a material selected as described above.

<First Electrode and Second Electrode>

As materials for the first electrode 101 and the second electrode 102, any of the following materials can be used in an appropriate combination as long as the above functions of the electrodes can be fulfilled. For example, a metal, an alloy, an electrically conductive compound, a mixture of these, and the like can be used as appropriate. Specifically, an In—Sn oxide (also referred to as ITO), an In—Si—Sn oxide (also referred to as ITSO), an In—Zn oxide, or an In—W—Zn oxide can be used. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use an element belonging to Group 1 or Group 2 of the periodic table that is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

In the light-emitting device in FIG. 4D, when the first electrode 101 is the anode, a hole-injection layer 111a and a hole-transport layer 112a of the EL layer 103a are sequentially stacked over the first electrode 101 by a vacuum evaporation method. After the EL layer 103a and the charge-generation layer 106 are formed, a hole-injection layer 111b and a hole-transport layer 112b of the EL layer 103b are sequentially stacked over the charge-generation layer 106 in a similar manner.

<Hole-Injection Layer>

The hole-injection layers (111, 111a, and 1/1b) inject holes from the first electrode 101 serving as the anode or the charge-generation layers (106, 106a, and 106b) to the EL layers (103, 103a, and 103b) and contain an organic acceptor material, a material having a high hole-injection property, and the like.

The organic acceptor material allows holes to be generated in another organic compound whose HOMO level is close to the LUMO level of the organic acceptor material when charge separation is caused between the organic acceptor material and the organic compound. Thus, as the organic acceptor material, a compound having an electron-withdrawing group (e.g., a halogen group or a cyano group), such as a quinodimethane derivative, a chloranil derivative, and a hexaazatriphenylene derivative, can be used. Examples of the organic acceptor material include 7,7,8,8-tetracyano-2,3,5,6-tetrafluoroquinodimethane (abbreviation: $F_4$-TCNQ), 3,6-difluoro-2,5,7,7,8,8-hexacyanoquinodimethane, chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), and 2-(7-dicyanomethylene-1,3,4,5,6,8,9,10-octafluoro-7H-pyren-2-ylidene)malononitrile. Note that among organic acceptor materials, a compound in which electron-withdrawing groups are bonded to fused aromatic rings each having a plurality of heteroatoms, such as HAT-CN, is particularly preferable because it has a high acceptor property and stable film quality against heat. Besides, a [3]radialene derivative having an electron-withdrawing group (particularly a cyano group or a halogen group such as a fluoro group), which has a very high electron-accepting property, is preferable; specific examples include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile].

As the material having a high hole-injection property, an oxide of a metal belonging to Group 4 to Group 8 of the periodic table (e.g., a transition metal oxide such as molybdenum oxide, vanadium oxide, ruthenium oxide, tungsten oxide, or manganese oxide) can be used. Specific examples include molybdenum oxide, vanadium oxide, niobium oxide, tantalum oxide, chromium oxide, tungsten oxide, manganese oxide, and rhenium oxide. Among these oxides, molybdenum oxide is preferable because it is stable in the air, has a low hygroscopic property, and is easily handled. Other examples include phthalocyanine (abbreviation: $H_2Pc$) and a phthalocyanine-based compound such as copper phthalocyanine (abbreviation: CuPc).

Other examples include aromatic amine compounds, which are low molecular compounds, such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), N,N-bis{4-[bis(3-methylphenyl)amino]phenyl}-N,N-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Other examples include high-molecular compounds (e.g., oligomers, dendrimers, and polymers) such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N-phenylamino}phenyl) methacrylamide] (abbreviation: PTPDMA), and poly[N,N-bis(4-butylphenyl)-N,N-bis(phenyl)benzidine] (abbreviation: Poly-TPD). Alternatively, it is possible to use a high-molecular compound to which acid is added, such as poly(3,4-ethylenedioxythiophene)/poly(styrenesulfonic acid) (abbreviation: PEDOT/PSS) or polyaniline/poly(styrenesulfonic acid) (abbreviation: PAni/PSS), for example.

As the material having a high hole-injection property, a mixed material containing a hole-transport material and the above-described organic acceptor material (electron-accepting material) can be used. In that case, the organic acceptor material extracts electrons from the hole-transport material, so that holes are generated in the hole-injection layer 111 and the holes are injected into the light-emitting layer 113 through the hole-transport layer 112. Note that the hole-injection layer 111 may be formed to have a single-layer structure using a mixed material containing a hole-transport material and an organic acceptor material (electron-accepting material), or a stacked-layer structure of a layer containing a hole-transport material and a layer containing an organic acceptor material (electron-accepting material).

The hole-transport material preferably has a hole mobility higher than or equal to $1\times10^{-6}$ $cm^2/Vs$ in the case where the square root of the electric field strength [V/cm] is 600. Note that any other substance can also be used as long as the substance has a hole-transport property higher than an electron-transport property.

As the hole-transport material, materials having a high hole-transport property, such as a compound having a π-electron rich heteroaromatic ring (e.g., a carbazole derivative, a furan derivative, or a thiophene derivative) and an aromatic amine (an organic compound having an aromatic amine skeleton), are preferable.

Examples of the carbazole derivative (an organic compound having a carbazole ring) include a bicarbazole derivative (e.g., a 3,3'-bicarbazole derivative) and an aromatic amine having a carbazolyl group.

Specific examples of the bicarbazole derivative (e.g., a 3,3'-bicarbazole derivative) include 3,3'-bis(9-phenyl-9H-carbazole) (abbreviation: PCCP), 9,9'-bis(biphenyl-4-yl)-3,3'-bi-9H-carbazole (abbreviation: BisBPCz), 9,9'-bis(1,1'-biphenyl-3-yl)-3,3'-bi-9H-carbazole (abbreviation: BismBPCz), 9-(1,1'-biphenyl-3-yl)-9'-(1,1'-biphenyl-4-yl)-9H,9'H-3,3'-bicarbazole (abbreviation: mBPCCBP), and 9-(2-naphthyl)-9'-phenyl-9H,9'H-3,3'-bicarbazole (abbreviation: PNCCP).

Specific examples of the aromatic amine having a carbazolyl group include 4-phenyl-4'-(9-phenyl-9H-carbazol-3-yl)triphenylamine (abbreviation: PCBA1BP), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N-bis(9-phenylcarbazol-3-yl)-N,N-diphenylbenzene-1,3-diamine (abbreviation: PCA2B), N,N,N"-triphenyl-N,N,N"-tris(9-phenylcarbazol-3-yl)benzene-1,3,5-triamine (abbreviation: PCA3B), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 2-[N-(9-phenylcarbazol-3-yl)-N-phenylamino]spiro-9,9'-bifluorene (abbreviation: PCASF), N-[4-(9H-carbazol-9-yl)phenyl]-N-(4-phenyl)phenylaniline (abbreviation: YGA1BP), N,N-bis[4-(carbazol-9-yl)phenyl]-N,N'-diphenyl-9,9-dimethylfluorene-2,7-diamine (abbreviation: YGA2F), and 4,4',4"-tris(carbazol-9-yl)triphenylamine (abbreviation: TCTA).

Other examples of the carbazole derivative include 3-[4-(9-phenanthryl)-phenyl]-9-phenyl-9H-carbazole (abbreviation: PCPPn), 3-[4-(1-naphthyl)-phenyl]-9-phenyl-9H-carbazole (abbreviation: PCPN), 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA).

Specific examples of the furan derivative (an organic compound having a furan ring) include 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II).

Specific examples of the thiophene derivative (an organic compound having a thiophene ring) include organic compounds having a thiophene ring, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV).

Specific examples of the aromatic amine include 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(4-biphenyl)-N-{4-[(9-phenyl)-9H-fluoren-9-yl]-phenyl}-9,9-dimethyl-9H-fluoren-2-amine (abbreviation: FBiFLP), N,N,N,N'-tetrakis(4-biphenyl)-1,1-biphenyl-4,4'-diamine (abbreviation: BBA2BP), N,N-bis(9,9-dimethyl-9H-fluoren-2-yl)-9,9'-spirobi[9H-fluoren]-4-amine (abbreviation: $SF_4FAF$), N-(9,9-dimethyl-9H-fluoren-2-yl)-N-{9,9-dimethyl-2-[N-phenyl-N-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 2,7-bis[N-(4-diphenylaminophenyl)-N-phenylamino]-spiro-9,9'-bifluorene (abbreviation: DPA2SF), 4,4',4"-tris[N-(1-naphthyl)-N-phenylamino]triphenylamine (abbreviation: 1'-TNATA), 4,4',4"-tris(N,N-diphenylamino)triphenylamine (abbreviation: TDATA), 4,4',4"-tris[N-(3-methylphenyl)-N-phenylamino]triphenylamine (abbreviation: m-MTDATA), N,N-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), DNTPD, 1,3,5-tris[N-(4-diphenylaminophenyl)-N-phenylamino]benzene (abbreviation: DPA3B), N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), N,N-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBiβNB), bis-biphenyl-4'-(carbazol-9-yl)biphenylamine (abbreviation: YGBBi1BP), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis([1,1'-biphenyl]-4-yl)-9,9'-spirobi[9H-fluoren]-2-amine (abbreviation: BBASF), N,N-bis([1,1'-biphenyl]-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-[4-(9-phenylfluoren-9-yl)phenyl]triphenylamine (abbreviation: BPAFLBi), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, and N,N-bis(9,9-dimethyl-9H-fluoren-2-yl)-9,9'-spirobi-9H-fluoren-1-amine.

Other examples of the hole-transport material include high-molecular compounds (e.g., oligomers, dendrimers, and polymers) such as poly(N-vinylcarbazole) (abbreviation: PVK), poly(4-vinyltriphenylamine) (abbreviation: PVTPA), poly[N-(4-{N-[4-(4-diphenylamino)phenyl]phenyl-N-phenylamino}phenyl)methacrylamide](abbreviation: PTPDMA), and poly[N,N-bis(4-butylphenyl)-N,N-bis(phenyl)benzidine](abbreviation: Poly-TPD). Alternatively, it is possible to use a high-molecular compound to which acid is added, such as poly(3,4-ethylenedioxythiophene)/poly(styrenesulfonic acid) (abbreviation: PEDOT/PSS) or polyaniline/poly(styrenesulfonic acid) (abbreviation: PAni/PSS), for example.

Note that the hole-transport material is not limited to the above examples, and any of a variety of known materials may be used alone or in combination as the hole-transport material.

The hole-injection layers (111, 111*a*, and 111*b*) can be formed by any of known film formation methods such as a vacuum evaporation method.

<Hole-Transport Layer>

The hole-transport layers (112, 112*a*, and 112*b*) transport the holes, which are injected from the first electrode 101 by the hole-injection layers (111, 111*a*, and 111*b*), to the light-emitting layers (113, 113*a*, 113*b*, and 113*c*). Note that the hole-transport layers (112, 112*a*, and 112*b*) contain a hole-transport material. Thus, the hole-transport layers (112, 112*a*, and 112*b*) can be formed using a hole-transport material that can be used for the hole-injection layers (111, 111*a*, and 111*b*).

Note that in the light-emitting device of one embodiment of the present invention, the organic compound used for the hole-transport layers (112, 112*a*, and 112*b*) can also be used for the light-emitting layers (113, 113*a*, 113*b*, and 113*c*). The use of the same organic compound for the hole-transport layers (112, 112*a*, and 112*b*) and the light-emitting layers (113, 113*a*, 113*b*, and 113*c*) is preferable, in which case holes can be efficiently transported from the hole-transport layers (112, 112a, and 112b) to the light-emitting layers (113, 113a, 113b, and 113c).

<Light-Emitting Layer>

The light-emitting layers (113, 113a, 113b, and 113c) contain a light-emitting substance. Note that as a light-emitting substance that can be used in the light-emitting layers (113, 113a, 113b, and 113c), a substance whose emission color is blue, violet, bluish violet, green, yellowish green, yellow, orange, red, or the like can be used as appropriate. When a plurality of light-emitting layers are provided, the use of different light-emitting substances for the light-emitting layers enables a structure that exhibits different emission colors (e.g., white light emission obtained by a combination of complementary emission colors). Furthermore, one light-emitting layer may have a stacked-layer structure of layers containing different light-emitting substances.

The light-emitting layers (113, 113a, 113b, and 113c) may each contain one or more kinds of organic compounds (e.g., a host material) in addition to a light-emitting substance (guest material).

In the case where a plurality of host materials are used in the light-emitting layers (113, 113a, 113b, and 113c), a second host material that is additionally used is preferably a substance having a larger energy gap than a known guest material and a first host material. Preferably, the lowest singlet excitation energy level (S1 level) of the second host material is higher than that of the first host material, and the lowest triplet excitation energy level (T1 level) of the second host material is higher than that of the guest material. Preferably, the lowest triplet excitation energy level (T1 level) of the second host material is higher than that of the first host material. With such a structure, an exciplex can be formed by the two kinds of host materials. To form an exciplex efficiently, it is particularly preferable to combine a compound that easily accepts holes (hole-transport material) and a compound that easily accepts electrons (electron-transport material). With the above structure, high efficiency, a low voltage, and a long lifetime can be achieved at the same time.

As an organic compound used as the host material (including the first host material and the second host material), organic compounds such as the hole-transport materials usable in the hole-transport layers (112, 112a, and 112b) and electron-transport materials usable in electron-transport layers (114, 114a, and 114b) described later can be used as long as they satisfy requirements for the host material used in the light-emitting layer. Another example is an exciplex formed by two or more kinds of organic compounds (the first host material and the second host material). An exciplex whose excited state is formed by two or more kinds of organic compounds has an extremely small difference between the S1 level and the T1 level and functions as a TADF material capable of converting triplet excitation energy into singlet excitation energy. In an example of a preferable combination of two or more kinds of organic compounds forming an exciplex, one of the two or more kinds of organic compounds has a π-electron deficient heteroaromatic ring and the other has a π-electron rich heteroaromatic ring. A phosphorescent substance such as an iridium-, rhodium-, or platinum-based organometallic complex or a metal complex may be used as one component of the combination for forming an exciplex.

There is no particular limitation on the light-emitting substances that can be used for the light-emitting layers (113, 113a, 113b, and 113c), and a light-emitting substance that converts singlet excitation energy into light in the visible light range or a light-emitting substance that converts triplet excitation energy into light in the visible light range can be used.

<<Light-Emitting Substance that Converts Singlet Excitation Energy into Light>>

The following substances that emit fluorescent light (fluorescent substances) can be given as examples of the light-emitting substance that converts singlet excitation energy into light and can be used in the light-emitting layers (113, 113a, 113b, and 113c): a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. A pyrene derivative is particularly preferable because it has a high emission quantum yield. Specific examples of pyrene derivatives include N,N-bis(3-methylphenyl)-N,N-bis[3-(9-phenyl-9H-fluoren-9-yl)phenyl]pyrene-1,6-diamine (abbreviation: 1,6mMemFLPAPrn), (N,N'-diphenyl-N,N-bis[4-(9-phenyl-9H-fluoren-9-yl)phenyl]pyrene-1,6-diamine) (abbreviation: 1,6FLPAPm), N,N-bis(dibenzofuran-2-yl)-N,N'-diphenylpyrene-1,6-diamine (abbreviation: 1,6FrAPrn), N,N-bis(dibenzothiophen-2-yl)-N,N'-diphenylpyrene-1,6-diamine (abbreviation: 1,6ThAPrn), N,N-(pyrene-1,6-diyl)bis[(N-phenylbenzo[b]naphtho[1,2-d]furan)-6-amine](abbreviation: 1,6BnfAPm), N,N'-(pyrene-1,6-diyl)bis[(N-phenylbenzo[b]naphtho[1,2-d]furan)-8-amine] (abbreviation: 1,6BnfAPm-02), and N,N-(pyrene-1,6-diyl)bis[(6,N-diphenylbenzo[b]naphtho[1,2-d]furan)-8-amine] (abbreviation: 1,6BnfAPrn-03).

In addition, it is possible to use, for example, 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl)triphenylamine (abbreviation: PCBAPBA), perylene, 2,5,8,11-tetra(tert-butyl)perylene (abbreviation: TBP), N,N'-(2-tert-butylanthracene-9,10-diyldi-4,1-phenylene)bis[N,N',N-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), and N-[4-(9,10-diphenyl-2-anthryl)phenyl]-N,N',N'-triphenyl-1,4-phenylenediamine (abbreviation: 2DPAPPA).

It is also possible to use, for example, N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N,N-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]

ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N,N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[if]quinolizin-9-yl)ethenyl]-4H-pyran-4-ylidene}propanedinitrile (abbreviation: BisDCJTM), 1,6BnfAPm-03, 3,10-bis[N-(9-phenyl-9H-carbazol-2-yl)-N-phenylamino]naphtho [2,3-b;6,7-b']bisbenzofuran (abbreviation: 3,10PCA2Nbf(IV)-02), and 3,10-bis[N-(dibenzofuran-3-yl)-N-phenylamino]naphtho[2,3-b;6,7-b']bisbenzofuran (abbreviation: 3,10FrA2Nbf(IV)-02). In particular, pyrenediamine compounds such as 1,6FLPAPm, 1,6mMemFLPAPrn, and 1,6BnfAPrn-03 can be used, for example.

<<Light-Emitting Substance that Converts Triplet Excitation Energy into Light>>

Examples of the light-emitting substance that converts triplet excitation energy into light and can be used in the light-emitting layers (113, 113*a*, 113*b*, and 113*c*) include substances that emit phosphorescent light (phosphorescent substances) and thermally activated delayed fluorescent (TADF) materials that exhibit thermally activated delayed fluorescence.

A phosphorescent substance is a compound that emits phosphorescent light but does not emit fluorescent light at a temperature higher than or equal to a low temperature (e.g., 77 K) and lower than or equal to room temperature (i.e., higher than or equal to 77 K and lower than or equal to 313 K). The phosphorescent substance preferably contains a metal element with large spin-orbit interaction, and can be an organometallic complex, a metal complex (platinum complex), or a rare earth metal complex, for example. Specifically, the phosphorescent substance preferably contains a transition metal element. It is particularly preferable that the phosphorescent substance contain a platinum group element (ruthenium (Ru), rhodium (Rh), palladium (Pd), osmium (Os), iridium (Ir), or platinum (Pt)), especially iridium, in which case the probability of direct transition between the singlet ground state and the triplet excited state can be increased.

<<Phosphorescent Substance (from 450 nm to 570 nm, Blue or Green)>>

As examples of a phosphorescent substance which emits blue or green light and whose emission spectrum has a peak wavelength of greater than or equal to 450 nm and less than or equal to 570 nm, the following substances can be given.

Examples include organometallic complexes having a 4H-triazole ring, such as tris{2-[5-(2-methylphenyl)-4-(2,6-dimethylphenyl)-4H-1,2,4-triazol-3-yl-κN2]phenyl-κC}iridium(III) (abbreviation: $[Ir(mpptz-dmp)_3]$), tris(5-methyl-3,4-diphenyl-4H-1,2,4-triazolato)iridium(III) (abbreviation: $[Ir(Mptz)_3]$), tris[4-(3-biphenyl)-5-isopropyl-3-phenyl-4H-1,2,4-triazolato]iridium(III) (abbreviation: $[Ir(iPrptz-3b)_3]$), and tris[3-(5-biphenyl)-5-isopropyl-4-phenyl-4H-1,2,4-triazolato]iridium(III) (abbreviation: $[Ir(iPr5btz)_3]$); organometallic complexes having a 1H-triazole ring, such as tris[3-methyl-1-(2-methylphenyl)-5-phenyl-1H-1,2,4-triazolato]iridium(III) (abbreviation: $[Ir(Mptz1-mp)_3]$) and tris(1-methyl-5-phenyl-3-propyl-1H-1,2,4-triazolato)iridium(III) (abbreviation: $[Ir(Prptz1-Me)_3]$); organometallic complexes having an imidazole ring, such as fac-tris[1-(2,6-diisopropylphenyl)-2-phenyl-1H-imidazole]iridium(III) (abbreviation: $[Ir(iPrpmi)_3]$) and tris[3-(2,6-dimethylphenyl)-7-methylimidazo[1,2-f]phenanthridinato]iridium(III) (abbreviation: $[Ir(dmpimpt-Me)_3]$); and organometallic complexes in which a phenylpyridine derivative having an electron-withdrawing group is a ligand, such as bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis{2-[3',5'-bis(trifluoromethyl)phenyl]pyridinato-N,$C^{2'}$}iridium(III) picolinate (abbreviation: $[Ir(CF_3ppy)_2(pic)]$), and bis[2-(4',6'-difluorophenyl)pyridinato-N,$C^{2'}$]iridium(III) acetylacetonate (abbreviation: FIr(acac)).

<<Phosphorescent Substance (from 495 nm to 590 nm, Green or Yellow)>>

As examples of a phosphorescent substance which emits green or yellow light and whose emission spectrum has a peak wavelength of greater than or equal to 495 nm and less than or equal to 590 nm, the following substances can be given.

Examples include organometallic iridium complexes having a pyrimidine ring, such as tris(4-methyl-6-phenylpyrimidinato)iridium(III) (abbreviation: $[Ir(mppm)_3]$), tris(4-t-butyl-6-phenylpyrimidinato)iridium(III) (abbreviation: $[Ir(tBuppm)_3]$), (acetylacetonato)bis(6-methyl-4-phenylpyrimidinato)iridium(III) (abbreviation: $[Ir(mppm)_2(acac)]$), (acetylacetonato)bis(6-tert-butyl-4-phenylpyrimidinato)iridium(III) (abbreviation: $[Ir(tBuppm)_2(acac)]$), (acetylacetonato)bis[6-(2-norbornyl)-4-phenylpyrimidinato]iridium(III) (abbreviation: $[Ir(nbppm)_2(acac)]$), (acetylacetonato)bis[5-methyl-6-(2-methylphenyl)-4-phenylpyrimidinato]iridium(III) (abbreviation: $[Ir(mpmppm)_2(acac)]$), (acetylacetonato)bis{4,6-dimethyl-2-[6-(2,6-dimethylphenyl)-4-pyrimidinyl-κ$N^3$]phenyl-κC}iridium(III) (abbreviation: $[Ir(dmppm-dmp)_2(acac)]$), and (acetylacetonato)bis(4,6-diphenylpyrimidinato)iridium(III) (abbreviation: $[Ir(dppm)_2(acac)]$); organometallic iridium complexes having a pyrazine ring, such as (acetylacetonato)bis(3,5-dimethyl-2-phenylpyrazinato)iridium(III) (abbreviation: $[Ir(mppr-Me)_2(acac)]$) and (acetylacetonato)bis(5-isopropyl-3-methyl-2-phenylpyrazinato)iridium(III) (abbreviation: $[Ir(mppr-iPr)_2(acac)]$); organometallic iridium complexes having a pyridine ring, such as tris(2-phenylpyridinato-N,$C^{2'}$)iridium(III) (abbreviation: $[Ir(ppy)_3]$), bis(2-phenylpyridinato-N,$C^{2'}$)iridium(III) acetylacetonate (abbreviation: $[Ir(ppy)_2(acac)]$), bis(benzo[h]quinolinato)iridium(III) acetylacetonate (abbreviation: $[Ir(bzq)_2(acac)]$), tris(benzo[h]quinolinato)iridium(III) (abbreviation: $[Ir(bzq)_3]$), tris(2-phenylquinolinato-N,$C^{2'}$)iridium(III) (abbreviation: $[Ir(pq)_3]$), bis(2-phenylquinolinato-N,$C^{2'}$)iridium(III) acetylacetonate (abbreviation: $[Ir(pq)_2(acac)]$), bis[2-(2-pyridinyl-κN)phenyl-κC][2-(4-phenyl-2-pyridinyl-κN)phenyl-κC]iridium(III) (abbreviation: $[Ir(ppy)_2(4dppy)]$), bis[2-(2-pyridinyl-κN)phenyl-κC][2-(4-methyl-5-phenyl-2-pyridinyl-N)phenyl-κC], [2-$d_3$-methyl-8-(2-pyridinyl-κN)benzofuro[2,3-b]pyridine-κC]bis[2-(5-$d_3$-methyl-2-pyridinyl-κN2)phenyl-κC]iridium(III) (abbreviation: $Ir(5mppy-d_3)_2(mbfpypy-d_3)$), [2-(methyl-$d_3$)-8-[4-(1- methylethyl-1-d)-2-pyridinyl-κN]benzofuro[2,3-b]pyridin-7-yl-κC]bis[5-(methyl-d₃)-2-[5-(methyl-d₃)-2-pyridinyl-κN]phenyl-κC]iridium(III) (abbreviation: Ir(5mtpy-d₆)₂(mbfpypy-iPr-d₄)), [2-d₃-methyl-(2-pyridinyl-κN)benzofuro[2,3-b]pyridine-κC]bis[2-(2-pyridinyl-κN)phenyl-κC]iridium(III) (abbreviation: Ir(ppy)₂(mbfpypy-d₃)), and [2-(4-methyl-5-phenyl-2-pyridinyl-κN)phenyl-κC]bis[2-(2-pyridinyl-N)phenyl-κC]iridium(III) (abbreviation: Ir(ppy)₂(mdppy)); organometallic complexes such as bis(2,4-diphenyl-1,3-oxazolato-N,C²')iridium(III) acetylacetonate (abbreviation: [Ir(dpo)₂(acac)]), bis{2-[4'-(perfluorophenyl)phenyl]pyridinato-N,C²'}iridium(III) acetylacetonate (abbreviation: [Ir(p-PF-ph)₂(acac)]), and bis(2-phenylbenzothiazolato-N,C²')iridium(III) acetylacetonate (abbreviation: [Ir(bt)₂(acac)]); and a rare earth metal complex such as tris(acetylacetonato) (monophenanthroline)terbium(III) (abbreviation: [Tb(acac)₃(Phen)]).

<<Phosphorescent Substance (from 570 nm to 750 nm, Yellow or Red)>>

As examples of a phosphorescent substance which emits yellow or red light and whose emission spectrum has a peak wavelength of greater than or equal to 570 nm and less than or equal to 750 nm, the following substances can be given.

Examples include organometallic complexes having a pyrimidine ring, such as (diisobutyrylmethanato)bis[4,6-bis(3-methylphenyl)pyrimidinato]iridium(III) (abbreviation: [Ir(5mdppm)₂(dibm)]), bis[4,6-bis(3-methylphenyl)pyrimidinato](dipivaloylmethanato)iridium(III) (abbreviation: [Ir(5mdppm)₂(dpm)]), and (dipivaloylmethanato)bis[4,6-di(naphthalen-1-yl)pyrimidinato]iridium(III) (abbreviation: [Ir(d1npm)₂(dpm)]); organometallic complexes having a pyrazine ring, such as (acetylacetonato)bis(2,3,5-triphenylpyrazinato)iridium(III) (abbreviation: [Ir(tppr)₂(acac)]), bis(2,3,5-triphenylpyrazinato)(dipivaloylmethanato)iridium(III) (abbreviation: [Ir(tppr)₂(dpm)]), bis{4,6-dimethyl-2-[3-(3,5-dimethylphenyl)-5-phenyl-2-pyrazinyl-κN]phenyl-κC}(2,6-dimethyl-3,5-heptanedionato-κ²O,O')iridium(III) (abbreviation: [Ir(dmdppr-P)₂(dibm)]), bis{4,6-dimethyl-2-[5-(4-cyano-2,6-dimethylphenyl)-3-(3,5-dimethylphenyl)-2-pyrazinyl-κN]phenyl-κC}(2,2,6,6-tetramethyl-3,5-heptanedionato-κ²O,O')iridium(III) (abbreviation: [Ir(dmdppr-dmCP)₂(dpm)]), bis[2-(5-(2,6-dimethylphenyl)-3-(3,5-dimethylphenyl)-2-pyrazinyl-κN)-4,6-dimethylphenyl-κC](2,2',6,6'-tetramethyl-3,5-heptanedionato-κ²O,O')iridium(III) (abbreviation: [Ir(dmdppr-dmp)₂(dpm)]), (acetylacetonato)bis[2-methyl-3-phenylquinoxalinato-N,C²']iridium(III) (abbreviation: [Ir(mpq)₂(acac)]), (acetylacetonato)bis(2,3-diphenylquinoxalinato-N,C²')iridium(III) (abbreviation: [Ir(dpq)₂(acac)]), and (acetylacetonato)bis[2,3-bis(4-fluorophenyl)quinoxalinato]iridium(III) (abbreviation: [Ir(Fdpq)₂(acac)]); organometallic complexes having a pyridine ring, such as tris(1-phenylisoquinolinato-N,C²)iridium(III) (abbreviation: [Ir(piq)₃]), bis(1-phenylisoquinolinato-N,C²')iridium(III) acetylacetonate (abbreviation: [Ir(piq)₂(acac)]), and bis[4,6-dimethyl-2-(2-quinolinyl-κN)phenyl-κC](2,4-pentanedionato-κ²O,O')iridium(III) (abbreviation: [Ir(dmpqn)₂(acac)]); a platinum complex such as 2,3,7,8,12,13,17,18-octaethyl-21H,23H-porphyrin platinum(II) (abbreviation: [PtOEP]); and rare earth metal complexes such as tris(1,3-diphenyl-1,3-propanedionato)(monophenanthroline)europium(III) (abbreviation: [Eu(DBM)₃(Phen)]) and tris[1-(2-thenoyl)-3,3,3-trifluoroacetonato](monophenanthroline)europium(III) (abbreviation: [Eu(TTA)₃(Phen)]).

<<TADF Material>>

Any of materials described below can be used as the TADF material. The TADF material is a material that has a small difference between its S1 and T1 levels (preferably less than or equal to 0.2 eV), enables up-conversion of a triplet excited state into a singlet excited state (i.e., reverse intersystem crossing) using a little thermal energy, and efficiently emits light (fluorescent light) from the singlet excited state. The thermally activated delayed fluorescence is efficiently obtained under the condition where the difference in energy between the triplet excited energy level and the singlet excited energy level is greater than or equal to 0 eV and less than or equal to 0.2 eV, preferably greater than or equal to 0 eV and less than or equal to 0.1 eV. Note that delayed fluorescence by the TADF material refers to light emission having a spectrum similar to that of normal fluorescent light and an extremely long lifetime. The lifetime is longer than or equal to $1 \times 10^{-6}$ seconds, preferably longer than or equal to $1 \times 10^{-3}$ seconds.

Examples of the TADF material include fullerene, a derivative thereof, an acridine derivative such as proflavine, and eosin. Other examples include a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (abbreviation: SnF₂(Proto IX)), a mesoporphyrin-tin fluoride complex (abbreviation: SnF₂(Meso IX)), a hematoporphyrin-tin fluoride complex (abbreviation: SnF₂(Hemato IX)), a coproporphyrin tetramethyl ester-tin fluoride complex (abbreviation: SnF₂(Copro III-4Me)), an octaethylporphyrin-tin fluoride complex (abbreviation: SnF₂(OEP)), an etioporphyrin-tin fluoride complex (abbreviation: SnF₂(Etio I)), and an octaethylporphyrin-platinum chloride complex (abbreviation: PtCl₂OEP).

[Chemical Formulae 63]

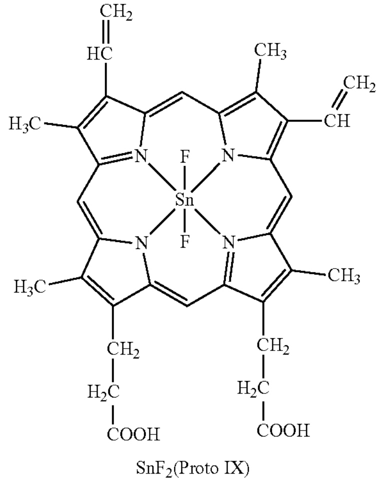

SnF₂(Proto IX)

-continued

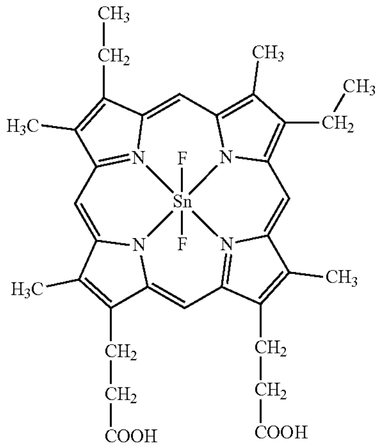

$SnF_2$(Meso IX)

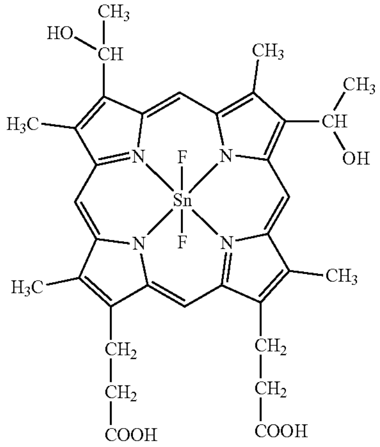

$SnF_2$(Hemato IX)

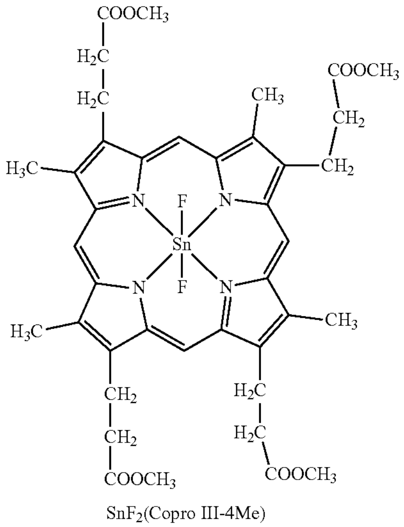

$SnF_2$(Copro III-4Me)

-continued

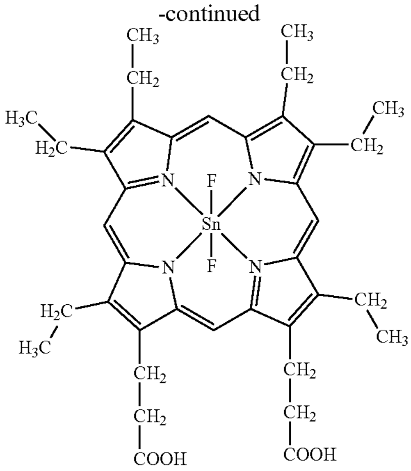

$SnF_2$(OEP)

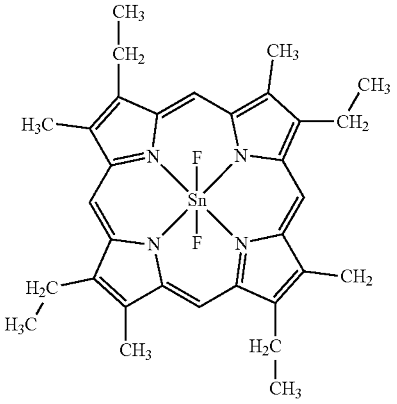

$SnF_2$(Etio I)

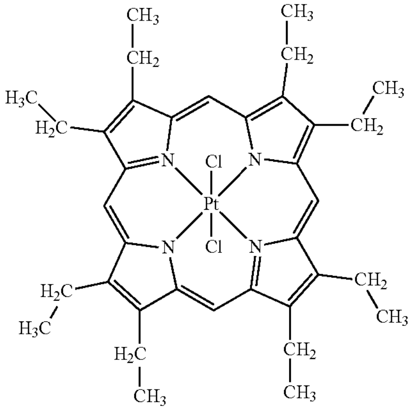

$PtCl_2OEP$

Alternatively, a heteroaromatic compound including a π-electron rich heteroaromatic compound and a π-electron deficient heteroaromatic compound, such as 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10- dihydroacridine)phenyl]sulfone (abbreviation: DMAC-DPS), 10-phenyl-10H,10'H-spiro[acridin-9,9'-anthracen]-10'-one (abbreviation: ACRSA), 4-(9'-phenyl-3,3'-bi-9H-carbazol-9-yl)benzofuro[3,2-d]pyrimidine (abbreviation: 4PCCzBfpm), 4-[4-(9'-phenyl-3,3'-bi-9H-carbazol-9-yl)phenyl]benzofuro[3,2-d]pyrimidine (abbreviation: 4PCCzPBfpm), or 9-[3-(4,6-diphenyl-1,3,5-triazin-2-yl)phenyl]-9'-phenyl-2,3'-bi-9H-carbazole (abbreviation: mPCCzPTzn-02) may be used.

Note that a substance in which a π-electron rich heteroaromatic compound is directly bonded to a π-electron deficient heteroaromatic compound is particularly preferable because both the donor property of the π-electron rich heteroaromatic compound and the acceptor property of the π-electron deficient heteroaromatic compound are improved and the energy difference between the singlet excited state and the triplet excited state becomes small. As the TADF material, a TADF material in which the singlet and triplet excited states are in thermal equilibrium (TADF100) may be used. Since such a TADF material enables a short emission lifetime (excitation lifetime), an efficiency decrease of a light-emitting element in a high-luminance region can be inhibited.

[Chemical Formulae 64]

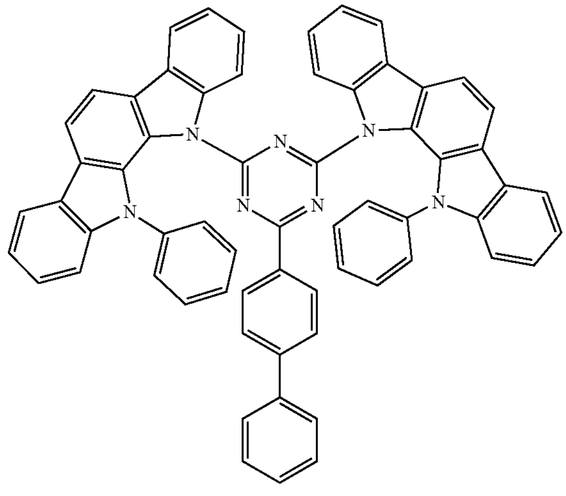

PIC-TRZ

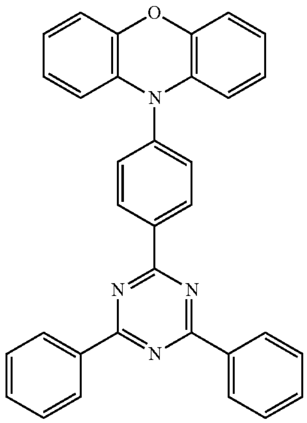

PXZ-TRZ

-continued

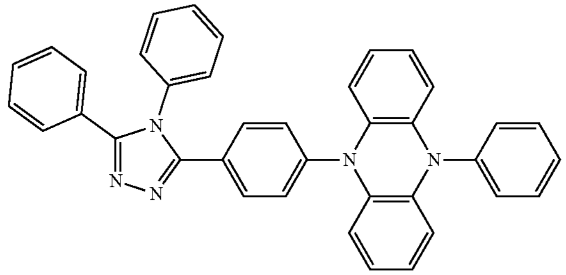

PPZ-3TPT

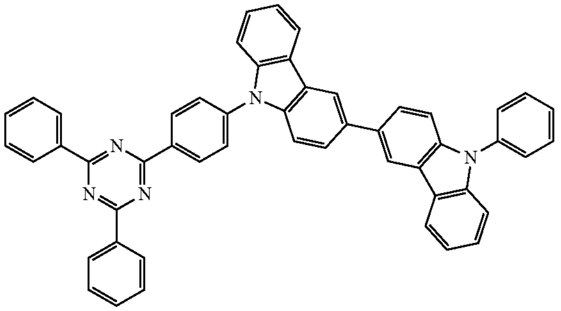

PCCzPTzn

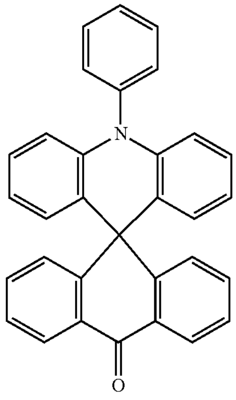

ACRSA

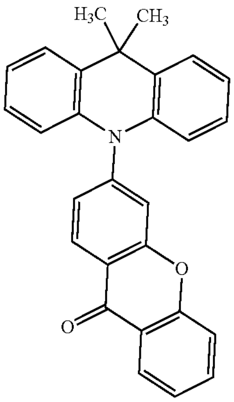

ACRXTN

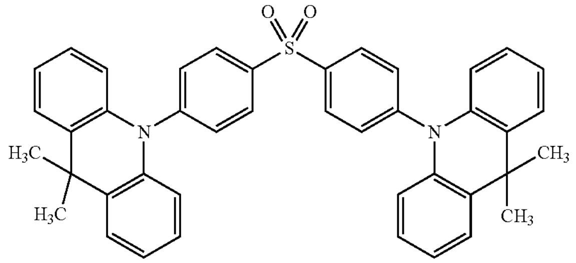

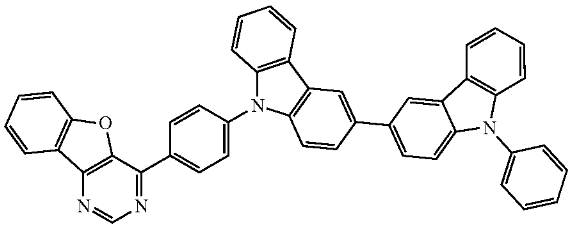

4PCCzPBfpm

-continued

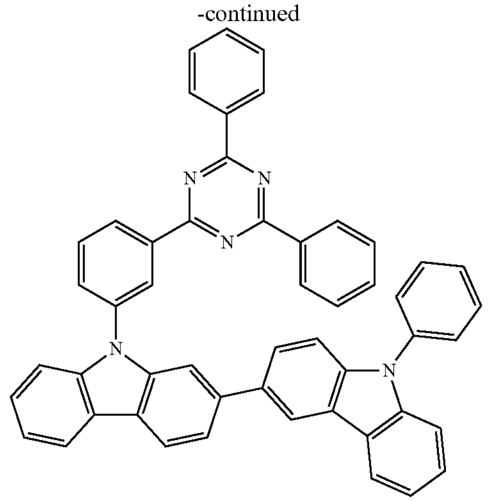

mPCCzPTzn-02

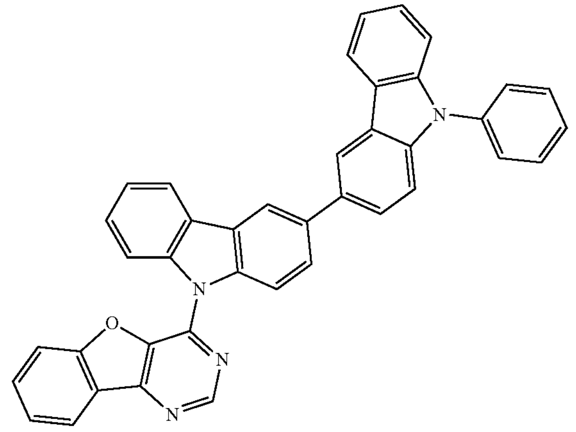

4PCCzBfpm

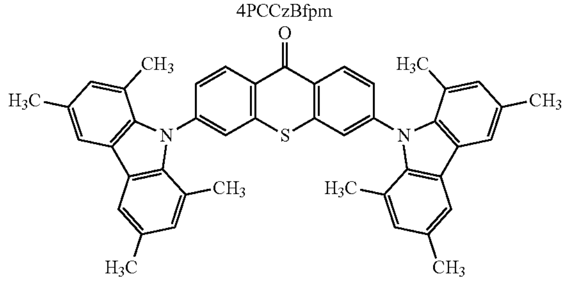

TADF100

In addition to the above, another example of a material having a function of converting triplet excitation energy into light is a nano-structure of a transition metal compound having a perovskite structure. In particular, a nano-structure of a metal halide perovskite material is preferable. The nano-structure is preferably a nanoparticle or a nanorod.

As the organic compound (e.g., the host material) used in combination with the above-described light-emitting substance (guest material) in the light-emitting layers (113, 113*a*, 113*b*, and 113*c*), one or more kinds selected from substances having a larger energy gap than the light-emitting substance (guest material) are used.

<<HOST material for Fluorescence>>

In the case where the light-emitting substance used in the light-emitting layers (113, 113*a*, 113*b*, and 113*c*) is a fluorescent substance, an organic compound (a host material) used in combination with the fluorescent substance is preferably an organic compound that has a high energy level in a singlet excited state and has a low energy level in a triplet excited state, or an organic compound having a high fluorescence quantum yield. Therefore, the hole-transport material (described above) or the electron-transport material (described below) described in this embodiment, for example, can be used as long as it is an organic compound that satisfies such a condition.

In terms of a preferable combination with the light-emitting substance (fluorescent substance), examples of the organic compound (host material), some of which overlap the above specific examples, include fused polycyclic aromatic compounds such as an anthracene derivative, a tetracene derivative, a phenanthrene derivative, a pyrene derivative, a chrysene derivative, and a dibenzo[g,p]chrysene derivative.

Specific examples of the organic compound (host material) that is preferably used in combination with the fluorescent substance include 9-phenyl-3-[4-(10-phenyl-9-anthryl)phenyl]-9H-carbazole (abbreviation: PCzPA), 3,6-diphenyl-9-[4-(10-phenyl-9-anthryl)phenyl]-9H-carbazole (abbreviation: DPCzPA), 3-[4-(1-naphthyl)-phenyl]-9-phenyl-9H-carbazole (abbreviation: PCPN), 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), 6,12-dimethoxy-5,11-diphenylchrysene, N,N,N,N,N',N',N'',N''-octaphenyldibenzo[g,p]chrysene-2,7,10,15-tetraamine (abbreviation: DBC1), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9-(1-naphthyl)-10-(2-naphthyl)anthracene (abbreviation: α,β-ADN), 2-(10-phenylanthracen-9-yl)dibenzofuran, 2-(10-phenyl-9-anthracenyl)-benzo[b]naphtho[2,3-d]furan (abbreviation: Bnf(II)PhA), 9-(1-naphthyl)-10-[4-(2-naphthyl)phenyl]anthracene (abbreviation: αN-βNPAnth), 9-(2-naphthyl)-10-[3-(2-naphthyl)phenyl]anthracene (abbreviation: βN-mβNPAnth), 1-[4-(10-[1,1'-biphenyl]-4-yl-9-anthracenyl)phenyl]-2-ethyl-TH-benzimidazole (abbreviation: EtBImPBPhA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), 5,12-diphenyltetracene, and 5,12-bis(biphenyl-2-yl)tetracene.

<<Host Material for Phosphorescence>>

In the case where the light-emitting substance used in the light-emitting layers (113, 113*a*, 113*b*, and 113*c*) is a phosphorescent substance, an organic compound having triplet excitation energy (an energy difference between a ground state and a triplet excited state) which is higher than that of the light-emitting substance is preferably selected as the organic compound (host material) used in combination with the phosphorescent substance. Note that when a plurality of organic compounds (e.g., a first host material and a second host material (or an assist material)) are used in combination with a light-emitting substance so that an exciplex is formed, the plurality of organic compounds are preferably mixed with the phosphorescent substance.

With such a structure, light emission can be efficiently obtained by exciplex-triplet energy transfer (ExTET), which is energy transfer from an exciplex to a light-emitting substance. Note that a combination of the plurality of organic compounds that easily forms an exciplex is preferably employed, and it is particularly preferable to combine a compound that easily accepts holes (hole-transport material) and a compound that easily accepts electrons (electron-transport material).

In terms of a preferable combination with the light-emitting substance (phosphorescent substance), examples of the organic compounds (the host material and the assist material), some of which overlap the above specific examples, include an aromatic amine (an organic compound having an aromatic amine skeleton), a carbazole derivative (an organic compound having a carbazole ring), a dibenzothiophene derivative (an organic compound having a dibenzothiophene ring), a dibenzofuran derivative (an organic compound having a dibenzofuran ring), an oxadiazole derivative (an organic compound having an oxadiazole ring), a triazole derivative (an organic compound having a triazole ring), a benzimidazole derivative (an organic compound having a benzimidazole ring), a quinoxaline derivative (an organic compound having a quinoxaline ring), a dibenzoquinoxaline derivative (an organic compound having a dibenzoquinoxaline ring), a pyrimidine derivative (an organic compound having a pyrimidine ring), a triazine derivative (an organic compound having a triazine ring), a pyridine derivative (an organic compound having a pyridine ring), a bipyridine derivative (an organic compound having a bipyridine ring), a phenanthroline derivative (an organic compound having a phenanthroline ring), a furodiazine derivative (an organic compound having a furodiazine ring), and zinc- and aluminum-based metal complexes.

Among the above organic compounds, specific examples of the aromatic amine and the carbazole derivative, which are organic compounds having a high hole-transport property, are the same as the specific examples of the hole-transport materials described above, and those materials are preferable as the host material.

Among the above organic compounds, specific examples of the dibenzothiophene derivative and the dibenzofuran derivative, which are organic compounds having a high hole-transport property, include 4-{3-[3-(9-phenyl-9H-fluoren-9-yl)phenyl]phenyl}dibenzofuran (abbreviation: mmDBFFLBi-II), 4,4',4''-(benzene-1,3,5-triyl)tri(dibenzofuran) (abbreviation: DBF3P-II), DBT3P-II, 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylen-2-yl)phenyl]dibenzothiophene (abbreviation: mDBTPTp-II). Such derivatives are preferable as the host material.

Other examples of preferable host materials include metal complexes having an oxazole-based or thiazole-based ligand, such as bis[2-(2-benzoxazolyl)phenolato]zinc(II) (abbreviation: ZnPBO) and bis[2-(2-benzothiazolyl)phenolato]zinc(II) (abbreviation: ZnBTZ).

Among the above organic compounds, specific examples of the oxadiazole derivative, the triazole derivative, the benzimidazole derivative, the quinoxaline derivative, the dibenzoquinoxaline derivative, the quinazoline derivative, and the phenanthroline derivative, which are organic compounds having a high electron-transport property, include an organic compound including a heteroaromatic ring having a polyazole ring, such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), or 4,4'-bis(5-methylbenzoxazol-2-yl)stilbene (abbreviation: BzOs), an organic compound including a heteroaromatic ring having a pyridine ring, such as bathophenanthroline (abbreviation: BPhen), bathocuproine (abbreviation: BCP), 2,9-di(naphthalen-2-yl)-4,7-diphenyl-1,10-phenanthroline (abbreviation: NBPhen), or 2,2-(1,3-phenylene)bis[9-phenyl-1,10-phenanthroline](abbreviation: mPPhen2P), 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 2-{4-[9,10-di(2-naphthyl)-2-anthryl]phenyl}-1-phenyl-1H-benzimidazole (abbreviation: ZADN), and 2-[4'-(9-phenyl-9H-carbazol-3-yl)-3,1'-biphenyl-1-yl]dibenzo[f,h]quinoxaline (abbreviation: 2mpPCBPDBq). Such organic compounds are preferable as the host material.

Among the above organic compounds, specific examples of the pyridine derivative, the diazine derivative (including the pyrimidine derivative, the pyrazine derivative, and the pyridazine derivative), the triazine derivative, and the furodiazine derivative, which are organic compounds having a high electron-transport property, include organic compounds including a heteroaromatic ring having a diazine ring, such as 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), 9,9'-[pyrimidine-4,6-diylbis(biphenyl-3,3'-diyl)]bis(9H-carbazole) (abbreviation: 4,6mCzBP2Pm), 2-[3'-(9,9-dimethyl-9H-fluoren-2-yl)-1,1'-biphenyl-3-yl]-4,6-diphenyl-1,3,5-triazine (abbreviation: mFBPTzn), 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm), 9-[3'-(dibenzothiophen-4-yl)biphenyl-3-yl]naphtho[1',2': 4,5]furo[2,3-b]pyrazine (abbreviation: 9mDBtBPNfpr), 9-[(3'-dibenzothiophen-4-yl)biphenyl-4-yl]naphtho[1',2': 4,5]furo[2,3-b]pyrazine (abbreviation: 9pmDBtBPNfpr), 5-[3-(4,6-diphenyl-1,3,5-triazin-2-yl)phenyl]-7,7-dimethyl-5H,7H-indeno[2,1-b]carbazole (abbreviation: mINc(II)PTzn), 2-[3'-(triphenylen-2-yl)-1,1'-biphenyl-3-yl]-4,6-diphenyl-1,3,5-triazine (abbreviation: mTpBPTzn), 2-[(1,1'-biphenyl)-4-yl]-4-phenyl-6-[9,9'-spirobi(9H-fluoren)-2-yl]-1,3,5-triazine (abbreviation:

BP-SFTzn), 2,6-bis(4-naphthalen-1-ylphenyl)-4-[4-(3-pyridyl)phenyl]pyrimidine (abbreviation: 2,4NP-6PyPPm), 9-[4-(4,6-diphenyl-1,3,5-triazin-2-yl)-2-dibenzothiophenyl]-2-phenyl-9H-carbazole (abbreviation: PCDBfTzn), 2-[1,1'-biphenyl]-3-yl-4-phenyl-6-(8-[1,1': 4',1"-terphenyl]-4-yl-1-dibenzofuranyl)-1,3,5-triazine (abbreviation: mBP-TPDBfTzn), 6-(1,1'-biphenyl-3-yl)-4-[3,5-bis(9H-carbazol-9-yl)phenyl]-2-phenylpyrimidine (abbreviation: 6mBP-4Cz2PPm), and 4-[3,5-bis(9H-carbazol-9-yl)phenyl]-2-phenyl-6-(1,1'-biphenyl-4-yl)pyrimidine (abbreviation: 6BP-4Cz2PPm). Such organic compounds are preferable as the host material.

Among the above organic compounds, specific examples of metal complexes that are organic compounds having a high electron-transport property include zinc- and aluminum-based metal complexes, such as tris(8-quinolinolato) aluminum(III) (abbreviation: Alq), tris(4-methyl-8-quinolinolato)aluminum(III) (abbreviation: $Almq_3$), bis(10-hydroxybenzo[h]quinolinato)beryllium(II) (abbreviation: $BeBq_2$), bis(2-methyl-8-quinolinolato)(4-phenylphenolato) aluminum(III) (abbreviation: BAlq), and bis(8-quinolinolato)zinc(II) (abbreviation: Znq), and metal complexes having a quinoline ring or a benzoquinoline ring. Such metal complexes are preferable as the host material.

Moreover, high molecular compounds such as poly(2,5-pyridinediyl) (abbreviation: PPy), poly[(9,9-dihexylfluorene-2,7-diyl)-co-(pyridine-3,5-diyl)](abbreviation: PF-Py), and poly[(9,9-dioctylfluorene-2,7-diyl)-co-(2,2'-bipyridine-6,6'-diyl)] (abbreviation: PF-BPy) are preferable as the host material.

Examples of organic compounds having bipolar properties, a high hole-transport property and a high electron-transport property, which can be used as the host material, include organic compounds having a diazine ring, such as 9-phenyl-9'-(4-phenyl-2-quinazolinyl)-3,3'-bi-9H-carbazole (abbreviation: PCCzQz), 2-[4'-(9-phenyl-9H-carbazol-3-yl)-3,1'-biphenyl-1-yl]dibenzo[f,h]quinoxaline (abbreviation: 2mpPCBPDBq), 5-[3-(4,6-diphenyl-1,3,5-triazin-2-yl) phenyl]-7,7-dimethyl-5H,7H-indeno[2,1-b]carbazole (abbreviation: mINc(II)PTzn), 11-(4-[1,1'-biphenyl]-4-yl-6-phenyl-1,3,5-triazin-2-yl)-11,12-dihydro-12-phenyl-indolo [2,3-a]carbazole (abbreviation: BP-Icz(II)Tzn), and 7-[4-(9-phenyl-9H-carbazol-2-yl)quinazolin-2-yl]-7H-dibenzo[c,g] carbazole (abbreviation: PC-cgDBCzQz).

<Electron-Transport Layer>

The electron-transport layers (114, 114*a*, and 114*b*) transport the electrons, which are injected from the second electrode 102 or the charge-generation layers (106, 106*a*, and 106*b*) by electron-injection layers (115, 115*a*, and 115*b*) described later, to the light-emitting layers (113, 113*a*, 113*b*, and 113*c*). It is preferable that the electron-transport material used in the electron-transport layers (114, 114*a*, and 114*b*) be a substance having an electron mobility higher than or equal to $1\times10^{-6}$ $cm^2/Vs$ in the case where the square root of the electric field strength [V/cm] is 600. Note that any other substance can also be used as long as the substance has an electron-transport property higher than a hole-transport property. The electron-transport layers (114, 114*a*, and 114*b*) can function even with a single-layer structure and may have a stacked-layer structure including two or more layers. A photolithography process performed over the electron-transport layer including the above-described mixed material, which has heat resistance, can inhibit an adverse effect of the thermal process on the device characteristics.

<<Electron-Transport Material>>

As the electron-transport material that can be used for the electron-transport layers (114, 114*a*, and 114*b*), an organic compound having a high electron-transport property can be used, and for example, a heteroaromatic compound can be used. The heteroaromatic compound refers to a cyclic compound containing at least two different kinds of elements in a ring. Examples of cyclic structures include a three-membered ring, a four-membered ring, a five-membered ring, and a six-membered ring, among which a five-membered ring and a six-membered ring are particularly preferable. The elements contained in the heteroaromatic compound are preferably one or more of nitrogen, oxygen, and sulfur, in addition to carbon. In particular, a heteroaromatic compound containing nitrogen (a nitrogen-containing heteroaromatic compound) is preferable, and any of materials having a high electron-transport property (electron-transport materials), such as a nitrogen-containing heteroaromatic compound and a π-electron deficient heteroaromatic compound including the nitrogen-containing heteroaromatic compound, is preferably used.

The heteroaromatic compound is an organic compound having at least one heteroaromatic ring.

The heteroaromatic ring has any one of a pyridine ring, a diazine ring, a triazine ring, a polyazole ring, an oxazole ring, a thiazole ring, and the like. A heteroaromatic ring having a diazine ring includes a heteroaromatic ring having a pyrimidine ring, a pyrazine ring, a pyridazine ring, or the like. A heteroaromatic ring having a polyazole ring includes a heteroaromatic ring having an imidazole ring, a triazole ring, or an oxadiazole ring.

The heteroaromatic ring includes a fused heteroaromatic ring having a fused ring structure. Examples of the fused heteroaromatic ring include a quinoline ring, a benzoquinoline ring, a quinoxaline ring, a dibenzoquinoxaline ring, a quinazoline ring, a benzoquinazoline ring, a dibenzoquinazoline ring, a phenanthroline ring, a furodiazine ring, and a benzimidazole ring.

Examples of the heteroaromatic compound having a five-membered ring structure, which is a heteroaromatic compound containing carbon and one or more of nitrogen, oxygen, sulfur, and the like, include a heteroaromatic compound having an imidazole ring, a heteroaromatic compound having a triazole ring, a heteroaromatic compound having an oxazole ring, a heteroaromatic compound having an oxadiazole ring, a heteroaromatic compound having a thiazole ring, and a heteroaromatic compound having a benzimidazole ring.

Examples of the heteroaromatic compound having a six-membered ring structure, which is a heteroaromatic compound containing carbon and one or more of nitrogen, oxygen, sulfur, and the like, include a heteroaromatic compound having a heteroaromatic ring, such as a pyridine ring, a diazine ring (including a pyrimidine ring, a pyrazine ring, a pyridazine ring, or the like), a triazine ring, or a polyazole ring. Other examples include a heteroaromatic compound having a bipyridine structure and a heteroaromatic compound having a terpyridine structure, although they are included in examples of a heteroaromatic compound in which pyridine rings are connected.

Examples of the heteroaromatic compound having a fused ring structure including the above six-membered ring structure as a part include a heteroaromatic compound having a fused heteroaromatic ring such as a quinoline ring, a benzoquinoline ring, a quinoxaline ring, a dibenzoquinoxaline ring, a phenanthroline ring, a furodiazine ring (including a structure in which an aromatic ring is fused to a furan ring of a furodiazine ring), or a benzimidazole ring.

Specific examples of the above-described heteroaromatic compound having a five-membered ring structure (a polyazole ring (including an imidazole ring, a triazole ring, or an oxadiazole ring), an oxazole ring, a thiazole ring, or a benzimidazole ring) include 2-(4-biphenylyl)-5-(4-tert-butylphenyl)-1,3,4-oxadiazole (abbreviation: PBD), 1,3-bis [5-(p-tert-butylphenyl)-1,3,4-oxadiazol-2-yl]benzene (abbreviation: OXD-7), 9-[4-(5-phenyl-1,3,4-oxadiazol-2-yl) phenyl]-9H-carbazole (abbreviation: CO11), 3-(4-biphenylyl)-4-phenyl-5-(4-tert-butylphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), and 4,4'-bis(5-methylbenzoxazol-2-yl)stilbene (abbreviation: BzOs).

Specific examples of the above-described heteroaromatic compound having a six-membered ring structure (including a heteroaromatic ring having a pyridine ring, a diazine ring, a triazine ring, or the like) include a heteroaromatic compound including a heteroaromatic ring having a pyridine ring, such as 3,5-bis[3-(9H-carbazol-9-yl)phenyl]pyridine (abbreviation: 35DCzPPy) or 1,3,5-tri[3-(3-pyridyl)phenyl] benzene (abbreviation: TmPyPB), a heteroaromatic compound including a heteroaromatic ring having a triazine ring, such as 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 5-[3-(4,6-diphenyl-1,3,5-triazin-2-yl)phenyl]-7,7-dimethyl-5H,7H-indeno[2,1-b]carbazole (abbreviation: mINc (II)PTzn), 2-[3'-(triphenylen-2-yl)-1,1'-biphenyl-3-yl]-4,6-diphenyl-1,3,5-triazine (abbreviation: mTpBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 2,6-bis(4-naphthalen-1-ylphenyl)-4-[4-(3-pyridyl)phenyl]pyrimidine (abbreviation: 2,4NP-6PyPPm), 9-[4-(4,6-diphenyl-1,3,5-triazin-2-yl)-2-dibenzothiophenyl]-2-phenyl-9H-carbazole (abbreviation: PCDBfTzn), 2-[1,1'-biphenyl]-3-yl-4-phenyl-6-(8-[1,1': 4',1''-terphenyl]-4-yl-1-dibenzofuranyl)-1,3,5-triazine (abbreviation: mBP-TPDBfTzn), 2-{3-[3-(dibenzothiophen-4-yl)phenyl]phenyl}-4,6-diphenyl-1,3,5-triazine (abbreviation: mDBtBPTzn), or mFBPTzn, and a heteroaromatic compound including a heteroaromatic ring having a diazine (pyrimidine) ring, such as 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 4,6mCzBP2Pm, 6-(1,1'-biphenyl-3-yl)-4-[3,5-bis(9H-carbazol-9-yl)phenyl)-2-phenylpyrimidine (abbreviation: 6mBP-4Cz2PPm), 4-[3,5-bis(9H-carbazol-9-yl) phenyl]-2-phenyl-6-(1,1'-biphenyl-4-yl)pyrimidine (abbreviation: 6BP-4Cz2PPm), 4-[3-(dibenzothiophen-4-yl) phenyl]-8-(naphthalen-2-yl)-[1]benzofuro[3,2-d]pyrimidine (abbreviation: 8βN-4mDBtPBfpm), 8BP-4mDBtPBfpm, 9mDBtBPNfpr, 9pmDBtBPNfpr, 3,8-bis[3-(dibenzothiophen-4-yl)phenyl]benzofuro[2,3-b]pyrazine (abbreviation: 3,8mDBtP2Bfpr), 4,8-bis[3-(dibenzothiophen-4-yl)phenyl]-[1]benzofuro[3,2-d]pyrimidine (abbreviation: 4,8mDBtP2Bfpm), 8-[3'-(dibenzothiophen-4-yl)(1,1'-biphenyl-3-yl)]naphtho[1',2': 4,5]furo[3,2-d]pyrimidine (abbreviation: 8mDBtBPNfpm), or 8-[(2,2'-binaphthalen)-6-yl]-4-[3-(dibenzothiophen-4-yl)phenyl]-[1]benzofuro[3,2-d] pyrimidine (abbreviation: 8(βN2)-4mDBtPBfpm). Note that the above aromatic compounds including a heteroaromatic ring include a heteroaromatic compound having a fused heteroaromatic ring.

Other examples include a heteroaromatic compound including a heteroaromatic ring having a diazine (pyrimidine) ring, such as 2,2'-(pyridine-2,6-diyl)bis(4-phenylbenzo[h]quinazoline) (abbreviation: 2,6(P-Bqn)2Py), 2,2'-(2,2'-bipyridine-6,6'-diyl)bis(4-phenylbenzo[h]quinazoline) (abbreviation: 6,6'(P-Bqn)2BPy), 2,2'-(pyridine-2,6-diyl) bis{4-[4-(2-naphthyl)phenyl]-6-phenylpyrimidine} (abbreviation: 2,6(NP-PPm)2Py), or 6-(1,1'-biphenyl-3-yl)-4-[3,5-bis(9H-carbazol-9-yl)phenyl]-2-phenylpyrimidine (abbreviation: 6mBP-4Cz2PPm), and a heteroaromatic compound including a heteroaromatic ring having a triazine ring, such as 2,4,6-tris(3'-(pyridin-3-yl)biphenyl-3-yl)-1,3,5-triazine (abbreviation: TmPPPyTz), 2,4,6-tris(2-pyridyl)-1,3,5-triazine (abbreviation: 2Py3Tz), or 2-[3-(2,6-dimethyl-3-pyridyl)-5-(9-phenanthryl)phenyl]-4,6-diphenyl-1,3,5-triazine (abbreviation: mPn-mDMePyPTzn).

Specific examples of the above-described heteroaromatic compound having a fused ring structure including the above six-membered ring structure as a part (a heteroaromatic compound having a fused ring structure) include a heteroaromatic compound having a quinoxaline ring, such as bathophenanthroline (abbreviation: BPhen), bathocuproine (abbreviation: BCP), 2,9-di(naphthalen-2-yl)-4,7-diphenyl-1,10-phenanthroline (abbreviation: NBPhen), 2,2'-(1,3-phenylene)bis[9-phenyl-1,10-phenanthroline] (abbreviation: mPPhen2P), 2,2'-(pyridine-2,6-diyl)bis(4-phenylbenzo[h] quinazoline) (abbreviation: 2,6(P-Bqn)2Py), 2-[3-(dibenzothiophen-4-yl)phenyl]dibenzo[f,h]quinoxaline (abbreviation: 2mDBTPDBq-II), 2-[3'-(dibenzothiophen-4-yl) biphenyl-3-yl]dibenzo[f,h]quinoxaline (abbreviation: 2mDBTBPDBq-II), 2-[3'-(9H-carbazol-9-yl)biphenyl-3-yl] dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), or 2mpPCBPDBq.

For the electron-transport layers (114, 114*a*, and 114*b*), any of the metal complexes given below as well as the heteroaromatic compounds described above can be used. Examples of the metal complexes include a metal complex having a quinoline ring or a benzoquinoline ring, such as tris(8-quinolinolato)aluminum(III) (abbreviation: $Alq_3$), $Almq_3$, 8-quinolinolatolithium(I) (abbreviation: Liq), $BeBq_2$, bis(2-methyl-8-quinolinolato) (4-phenylphenolato) aluminum(III) (abbreviation: BAlq), or bis(8-quinolinolato) zinc(II) (abbreviation: Znq), and a metal complex having an oxazole ring or a thiazole ring, such as bis[2-(2-benzoxazolyl)phenolato]zinc(II) (abbreviation: ZnPBO) or bis[2-(2-benzothiazolyl)phenolato]zinc(II) (abbreviation: ZnBTZ).

High-molecular compounds such as poly(2,5-pyridinediyl) (abbreviation: PPy), poly[(9,9-dihexylfluorene-2,7-diyl)-co-(pyridine-3,5-diyl)] (abbreviation: PF-Py), and poly[(9,9-dioctylfluorene-2,7-diyl)-co-(2,2'-bipyridine-6,6'-diyl)] (abbreviation: PF-BPy) can be used as the electron-transport material.

Each of the electron-transport layers (114, 114*a*, and 114*b*) is not limited to a single layer and may be a stack of two or more layers each containing any of the above substances.

<Electron-Injection Layer>

The electron-injection layers (115, 115*a*, and 115*b*) contain a substance having a high electron-injection property. The electron-injection layers (115, 115*a*, and 115*b*) are layers for increasing the efficiency of electron injection from the second electrode 102 and are preferably formed using a material whose value of the LUMO level has a small difference (0.5 eV or less) from the work function of a material used for the second electrode 102. Thus, the electron-injection layer 115 can be formed using an alkali metal, an alkaline earth metal, or a compound thereof, such as lithium, cesium, lithium fluoride (LiF), cesium fluoride (CsF), calcium fluoride ($CaF_2$), 8-quinolinolato-lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), an oxide of lithium ($LiO_x$), or cesium carbonate. A rare earth metal and a compound thereof such as erbium fluoride ($ErF_3$) and ytterbium (Yb) can also be used. To form the electron-injection layers (115, 115*a*, and 115*b*), a plurality of kinds of materials given above may be mixed or stacked. Electride may also be used for the electron-injection layers (115, 115*a*, and 115*b*). Examples of the electride include a substance in which electrons are added at high concentration to calcium oxide-aluminum oxide. Any of the substances used for the electron-transport layers (114, 114*a*, and 114*b*), which are given above, can also be used.

A mixed material in which an organic compound and an electron donor (donor) are mixed may also be used for the electron-injection layers (115, 115*a*, and 115*b*). Such a mixed material is excellent in an electron-injection property and an electron-transport property because electrons are generated in the organic compound by the electron donor. The organic compound here is preferably a material excellent in transporting the generated electrons; specifically, for example, the above-described electron-transport materials used for the electron-transport layers (114, 114*a*, and 114*b*), such as a metal complex and a heteroaromatic compound, can be used. As the electron donor, a substance showing an electron-donating property with respect to an organic compound is used. Specifically, an alkali metal, an alkaline earth metal, and a rare earth metal are preferable, and lithium, cesium, magnesium, calcium, erbium, ytterbium, and the like are given. In addition, an alkali metal oxide and an alkaline earth metal oxide are preferable; for example, lithium oxide, calcium oxide, barium oxide, and the like are given. Alternatively, a Lewis base such as magnesium oxide can be used. Further alternatively, an organic compound such as tetrathiafulvalene (abbreviation: TTF) can be used. Alternatively, a stack of two or more of these materials may be used.

A mixed material in which an organic compound and a metal are mixed may also be used for the electron-injection layers (115, 115*a*, and 115*b*). The organic compound used here preferably has a LUMO level higher than or equal to −3.6 eV and lower than or equal to −2.3 eV. Moreover, a material having an unshared electron pair is preferable.

Thus, as the organic compound used in the above mixed material, a mixed material obtained by mixing a metal and the heteroaromatic compound given above as the material that can be used for the electron-transport layer may be used. Preferable examples of the heteroaromatic compound include materials having an unshared electron pair, such as a heteroaromatic compound having a five-membered ring structure (e.g., an imidazole ring, a triazole ring, an oxazole ring, an oxadiazole ring, a thiazole ring, or a benzimidazole ring), a heteroaromatic compound having a six-membered ring structure (e.g., a pyridine ring, a diazine ring (including a pyrimidine ring, a pyrazine ring, a pyridazine ring, or the like), a triazine ring, a bipyridine ring, or a terpyridine ring), and a heteroaromatic compound having a fused ring structure including a six-membered ring structure as a part (e.g., a quinoline ring, a benzoquinoline ring, a quinoxaline ring, a dibenzoquinoxaline ring, or a phenanthroline ring). Since the materials are specifically described above, description thereof is omitted here.

As a metal used for the above mixed material, a transition metal belonging to Group 5, Group 7, Group 9, or Group 11 or a material belonging to Group 13 of the periodic table is preferably used, and examples include Ag, Cu, Al, and In. Here, the organic compound forms a singly occupied molecular orbital (SOMO) with the transition metal.

To amplify light obtained from the light-emitting layer 113*b*, for example, the optical path length between the second electrode 102 and the light-emitting layer 113*b* is preferably less than one fourth of the wavelength λ of light emitted from the light-emitting layer 113*b*. In that case, the optical path length can be adjusted by changing the thickness of the electron-transport layer 114*b* or the electron-injection layer 115*b*.

When the charge-generation layer 106 is provided between the two EL layers (103*a* and 103*b*) as in the light-emitting device in FIG. 4D, a structure in which a plurality of EL layers are stacked between the pair of electrodes (the structure is also referred to as a tandem structure) can be obtained.

<Charge-Generation Layer>

The charge-generation layer 106 has a function of injecting electrons into the EL layer 103*a* and injecting holes into the EL layer 103*b* when voltage is applied between the first electrode (anode) 101 and the second electrode (cathode) 102. The charge-generation layer 106 may have either a structure in which an electron acceptor (acceptor) is added to a hole-transport material or a structure in which an electron donor (donor) is added to an electron-transport material. Alternatively, both of these layers may be stacked. Note that forming the charge-generation layer 106 with the use of any of the above materials can inhibit an increase in driving voltage caused by the stack of the EL layers.

In the case where the charge-generation layer 106 has a structure in which an electron acceptor is added to a hole-transport material, which is an organic compound, any of the materials described in this embodiment can be used as the hole-transport material. Examples of the electron acceptor include 7,7,8,8-tetracyano-2,3,5,6-tetrafluoroquinodimethane (abbreviation: $F_4$-TCNQ) and chloranil. Other examples include oxides of metals that belong to Group 4 to Group 8 of the periodic table. Specific examples include vanadium oxide, niobium oxide, tantalum oxide, chromium oxide, molybdenum oxide, tungsten oxide, manganese oxide, and rhenium oxide.

In the case where the charge-generation layer 106 has a structure in which an electron donor is added to an electron-transport material, any of the materials described in this embodiment can be used as the electron-transport material. As the electron donor, it is possible to use an alkali metal, an alkaline earth metal, a rare earth metal, a metal belonging to Group 2 or Group 13 of the periodic table, or an oxide or a carbonate thereof. Specifically, lithium (Li), cesium (Cs), magnesium (Mg), calcium (Ca), ytterbium (Yb), indium (In), lithium oxide, cesium carbonate, or the like is preferably used. An organic compound such as tetrathianaphthacene may be used as the electron donor.

Although FIG. 4D illustrates the structure in which two EL layers 103 are stacked, three or more EL layers may be stacked with charge-generation layers each provided between two adjacent EL layers.

<Substrate>

The light-emitting device described in this embodiment can be formed over a variety of substrates. Note that the type of substrate is not limited to a certain type. Examples of the substrate include semiconductor substrates (e.g., a single crystal substrate and a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film.

Examples of the glass substrate include a barium borosilicate glass substrate, an aluminoborosilicate glass substrate, and a soda lime glass substrate. Examples of the flexible substrate, the attachment film, and the base material film include plastics typified by polyethylene terephthalate (PET), polyethylene naphthalate (PEN), and polyether sulfone (PES), a synthetic resin such as acrylic, polypropylene, polyester, polyvinyl fluoride, polyvinyl chloride, polyamide, polyimide, aramid, an epoxy resin, an inorganic vapor deposition film, and paper.

For fabrication of the light-emitting device in this embodiment, a gas phase method such as an evaporation method or a liquid phase method such as a spin coating method or an ink-jet method can be used. When an evaporation method is used, a physical vapor deposition method (PVD method) such as a sputtering method, an ion plating method, an ion beam evaporation method, a molecular beam evaporation method, or a vacuum evaporation method, a chemical vapor deposition method (CVD method), or the like can be used. Specifically, the layers having various functions (the hole-injection layer 111, the hole-transport layer 112, the light-emitting layer 113, the electron-transport layer 114, and the electron-injection layer 115) included in the EL layers of the light-emitting device can be formed by an evaporation method (e.g., a vacuum evaporation method), a coating method (e.g., a dip coating method, a die coating method, a bar coating method, a spin coating method, or a spray coating method), a printing method (e.g., an ink-jet method, screen printing (stencil), offset printing (planography), flexography (relief printing), gravure printing, or micro-contact printing), or the like In the case where a film formation method such as the coating method or the printing method is employed, a high molecular compound (e.g., an oligomer, a dendrimer, or a polymer), a middle molecular compound (a compound between a low molecular compound and a high molecular compound with a molecular weight of 400 to 4000), an inorganic compound (e.g., a quantum dot material), or the like can be used. The quantum dot material can be a colloidal quantum dot material, an alloyed quantum dot material, a core-shell quantum dot material, a core quantum dot material, or the like.

Materials that can be used for the layers (the hole-injection layer 111, the hole-transport layer 112, the light-emitting layer 113, the electron-transport layer 114, and the electron-injection layer 115) included in the EL layer 103 of the light-emitting device described in this embodiment are not limited to the materials described in this embodiment, and other materials can be used in combination as long as the functions of the layers are fulfilled.

In this specification and the like, the terms "layer" and "film" can be interchanged with each other as appropriate.

The structures described in this embodiment can be used in combination with any of the structures described in the other embodiments as appropriate.

Embodiment 3

In this embodiment, specific structure examples of a light-emitting and light-receiving apparatus of one embodiment of the present invention and an example of the manufacturing method will be described.

<Structure Example of Light-Emitting and Light-Receiving Apparatus 700>

Figure 5A:
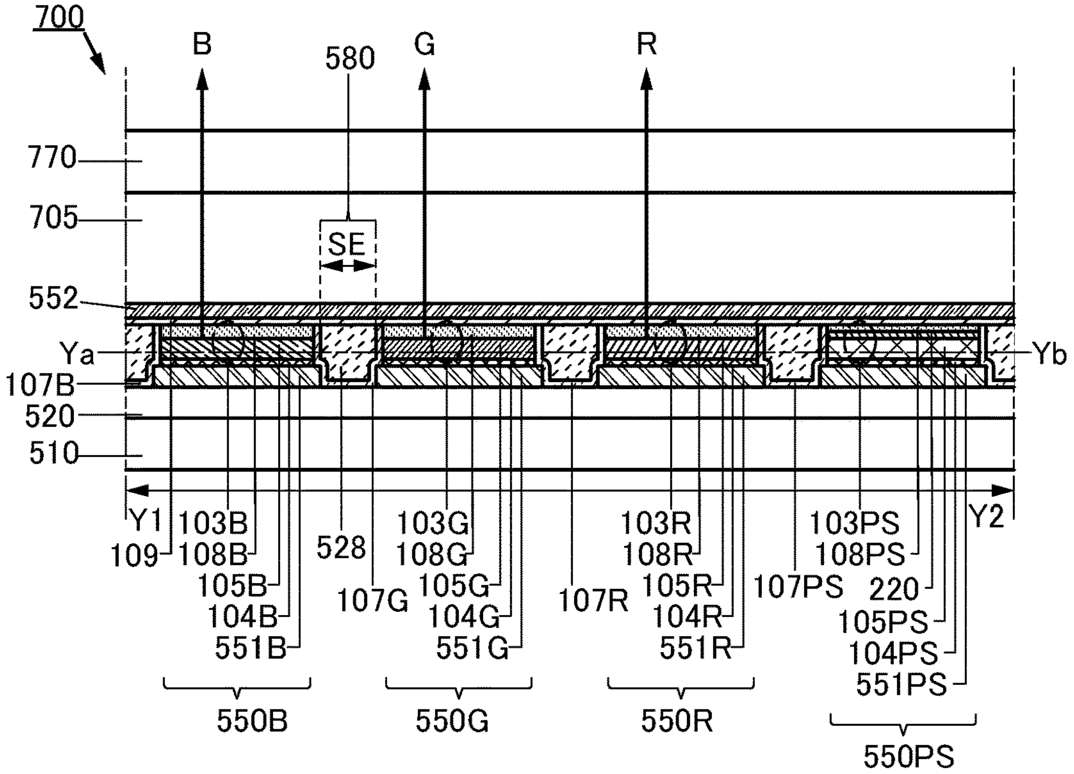
FIGS. 5A to 5D illustrate a light-emitting and light-receiving apparatus of an embodiment.

A light-emitting and light-receiving apparatus 700 illustrated in FIG. 5A includes a light-emitting device 550B, a light-emitting device 550G, a light-emitting device 550R, and a light-receiving device 550PS. The light-emitting device 550B, the light-emitting device 550G, the light-emitting device 550R, and the light-receiving device 550PS are formed over a functional layer 520 provided over a first substrate 510. The functional layer 520 includes, for example, circuits such as a driver circuit GD and a driver circuit SD that are composed of a plurality of transistors, and wirings that electrically connect these circuits. Note that these driver circuits are electrically connected to the light-emitting device 550B, the light-emitting device 550G, the light-emitting device 550R, and the light-receiving device 550PS, for example, to drive them. The light-emitting and light-receiving apparatus 700 includes an insulating layer 705 over the functional layer 520 and the devices (the light-emitting devices and the light-receiving device), and the insulating layer 705 has a function of attaching a second substrate 770 and the functional layer 520.

The light-emitting device 550B, the light-emitting device 550G, the light-emitting device 550R, and the light-receiving device 550PS each have any of the device structures described in Embodiment 1 and Embodiment 2. Described here is the case where the light-emitting devices have any of the structures illustrated in FIGS. 4A to 4E and the light-receiving device has the structure illustrated in FIG. 1C. Note that the light-emitting and light-receiving apparatus illustrated in FIG. 3A has a structure in which parts of the EL layer (the hole-injection layer, the hole-transport layer, and the electron-transport layer) of the light-emitting device and parts of the light-receiving layer (the first carrier-transport layer and the second carrier-transport layer) of the light-receiving device are concurrently formed using the same material in a manufacturing process; meanwhile, this embodiment describes a case where separation can be made not only between the light-emitting device and the light-receiving device, but also between all the devices (the light-emitting devices and the light-receiving device).

In this specification and the like, a structure in which light-emitting layers in light-emitting devices of different colors (for example, blue (B), green (G), and red (R)) and a light-receiving layer in a light-receiving device are separately formed or separately patterned is sometimes referred to as a side-by-side (SBS) structure. Although the light-emitting device 550B, the light-emitting device 550G, the light-emitting device 550R, and the light-receiving device 550PS are arranged in this order in the light-emitting and light-receiving apparatus 700 illustrated in FIG. 5A, one embodiment of the present invention is not limited to this structure. For example, in the light-emitting and light-receiving apparatus 700, these devices may be arranged in the order of the light-emitting device 550R, the light-emitting device 550G, the light-emitting device 550B, and the light-receiving device 550PS.

In FIG. 5A, the light-emitting device 550B includes an electrode 551B, the electrode 552, and an EL layer 103B. The light-emitting device 550G includes an electrode 551G, the electrode 552, and an EL layer 103G. The light-emitting device 550R includes an electrode 551R, the electrode 552, and an EL layer 103R. The light-receiving device 550PS includes an electrode 551PS, the electrode 552, and a light-receiving layer 103PS. Note that a specific structure of each layer of the light-receiving device is as described in Embodiment 1. In addition, a specific structure of each layer of the light-emitting device is as described in Embodiment 2. The EL layer 103B, the EL layer 103G, and the EL layer 103R each have a stacked-layer structure of layers having different functions including their respective light-emitting layers (105B, 105G, and 105R). The light-receiving layer 103PS has a stacked-layer structure of layers having different functions including an active layer 105PS. FIG. 5A illustrates a case where the EL layer 103B includes a hole-injection/transport layer 104B, a light-emitting layer 105B, an electron-transport layer 108B, and an electron-injection layer 109; the EL layer 103G includes a hole-injection/transport layer 104G, a light-emitting layer 105G, an electron-transport layer 108G, and the electron-injection layer 109; the EL layer 103R includes a hole-injection/transport layer 104R, a light-emitting layer 105R, an electron-transport layer 108R, and the electron-injection layer 109; and the light-receiving layer 103PS includes a first transport layer 104PS, the active layer 105PS, the buffer layer 220, a second transport layer 108PS, and the electron-injection layer 109. However, the present invention is not limited thereto. Note that each of the hole-injection/transport layers (104B, 104G, and 104R) represents a layer having the functions of the hole-injection layer and the hole-transport layer described in Embodiment 2, and may have a stacked-layer structure.

Note that the electron-transport layers (108B, 108G, and 108R) and the second transport layer 108PS may have a function of blocking holes moving from the anode side to the cathode side through the EL layers (103B, 103G, and 103R) and the light-receiving layer 103PS. The electron-injection layer 109 may have a stacked-layer structure in which some or all of layers are formed using different materials.

As illustrated in FIG. 5A, insulating layers (107B, 107G, 107R, and 107PS) may be formed on side surfaces (or end portions) of the hole-injection/transport layers (104B, 104G, and 104R), the light-emitting layers (105B, 105G, and 105R), and the electron-transport layers (108B, 108G, and 108R) included in the EL layers (103B, 103G, and 103R), and side surfaces (or end portions) of the first transport layer 104PS, the active layer 105PS, and the second transport layer 108PS included in the light-receiving layer 103PS. The insulating layers (107B, 107G, 107R, and 107PS) are formed in contact with the side surfaces (or the end portions) of the EL layers (103B, 103G, and 103R) and the light-receiving layer 103PS. This can inhibit entry of oxygen, moisture, or constituent elements thereof into the inside through the side surfaces of the EL layers (103B, 103G, and 103R) and the light-receiving layer 103PS. For the insulating layers (107B, 107G, 107R, and 107PS), aluminum oxide, magnesium oxide, hafnium oxide, gallium oxide, indium gallium zinc oxide, silicon nitride, or silicon nitride oxide can be used, for example. Some of the above-described materials may be stacked to form the insulating layers (107B, 107G, 107R, and 107PS). The insulating layers (107B, 107G, 107R, and 107PS) can be formed by a sputtering method, a CVD method, an MBE method, a PLD method, an ALD method, or the like and is formed preferably by an ALD method, which achieves favorable coverage. Note that the insulating layers (107B, 107G, 107R, and 107PS) continuously cover the side surfaces (or the end portions) of part of the EL layers (103B, 103G, and 103R) and part of the light-receiving layer 103PS of adjacent devices. For example, in FIG. 5A, the side surfaces of part of the EL layer 103B of the light-emitting device 550B and part of the EL layer 103G of the light-emitting device 550G are covered with the insulating layers (107G and 107R). In regions covered with the insulating layers (107G and 107R), partition walls 528 formed using an insulating material are preferably formed, as illustrated in FIG. 5A.

In addition, the electron-injection layer 109 is formed over the electron-transport layers (108B, 108G, and 108R) that are parts of the EL layers (103B, 103G, and 103R), the second transport layer 108PS that is part of the light-receiving layer 103PS, and the insulating layers (107B, 107G, 107R, and 107PS). Note that the electron-injection layer 109 may have a stacked-layer structure of two or more layers (for example, stacked layers having different electric resistances).

The electrode 552 is formed over the electron-injection layer 109. Note that the electrodes (551B, 551G, and 551R) and the electrode 552 include overlap regions. The light-emitting layer 105B is provided between the electrode 551B and the electrode 552, the light-emitting layer 105G is provided between the electrode 551G and the electrode 552, the light-emitting layer 105R is provided between the electrode 551R and the electrode 552, and the light-receiving layer 103PS is provided between the electrode 551PS and the electrode 552.

The EL layers (103B, 103G, and 103R) illustrated in FIG. 5A each have a structure similar to that of the EL layer 103 described in Embodiment 2. The light-receiving layer 103PS has a structure similar to that of the light-receiving layer 203 described in Embodiment 1. The light-emitting layer 105B can emit blue light, the light-emitting layer 105G can emit green light, and the light-emitting layer 105R can emit red light, for example.

The partition walls 528 are provided in regions surrounded by the electron-injection layer 109 and the insulating layers (107B, 107G, 107R, and 107PS). As illustrated in FIG. 5A, the partition walls 528 are in contact with the side surfaces (or the end portions) of the electrodes (551B, 551G, 551R, and 551PS), parts of the EL layers (103B, 103G, and 103R), and part of the light-receiving layer 103PS with the insulating layers (107B, 107G, 107R, and 107PS) therebetween.

In each of the EL layers and the light-receiving layer, particularly the hole-injection layer, which is included in the hole-transport region between the anode and the active layer and between the anode and the active layer, often has high conductivity; thus, a hole-injection layer formed as a layer shared by adjacent devices might cause crosstalk. Thus, as described in this structure example, the partition walls 528 formed using an insulating material are provided between the EL layers and between the EL layer and the light-receiving layer, which can inhibit occurrence of crosstalk between adjacent devices.

In the manufacturing method described in this embodiment, side surfaces (or end portions) of the EL layer and the light-receiving layer are exposed in the patterning step. This may promote deterioration of the EL layer and the light-receiving layer by allowing the entry of oxygen, water, or the like through the side surfaces (or the end portions) of the EL layer and the light-receiving layer. Hence, providing the partition wall 528 can inhibit the deterioration of the EL layer and the light-receiving layer in the manufacturing process.

Providing the partition wall 528 can flatten the surface by reducing a depressed portion formed between adjacent devices. When the depressed portion is reduced, disconnection of the electrode 552 formed over the EL layers and the light-receiving layer can be inhibited. Examples of an insulating material used to form the partition wall 528 include organic materials such as an acrylic resin, a polyimide resin, an epoxy resin, an imide resin, a polyamide resin, a polyimide-amide resin, a silicone resin, a siloxane resin, a benzocyclobutene-based resin, a phenol resin, and precursors of these resins. Other examples include organic materials such as polyvinyl alcohol (PVA), polyvinyl butyral, polyvinyl pyrrolidone, polyethylene glycol, polyglycerin, pullulan, water-soluble cellulose, and alcohol-soluble polyamide resin. A photosensitive resin such as a photoresist can also be used. Examples of the photosensitive resin include positive-type materials and negative-type materials.

With the use of the photosensitive resin, the partition wall 528 can be fabricated by only light exposure and developing steps. The partition wall 528 may be fabricated using a negative photosensitive resin (e.g., a resist material). In the case where an insulating layer containing an organic material is used as the partition wall 528, a material absorbing visible light is suitably used. When such a material absorbing visible light is used for the partition wall 528, light emission from the EL layer can be absorbed by the partition wall 528, leading to a reduction in light leakage (stray light) to an adjacent EL layer or light-receiving layer. Accordingly, a display panel with high display quality can be provided.

For example, the difference between the top-surface level of the partition wall 528 and the top-surface level of any of the EL layer 103B, the EL layer 103G, the EL layer 103R, and the light-receiving layer 103PS is preferably 0.5 times or less, further preferably 0.3 times or less the thickness of the partition wall 528. The partition wall 528 may be provided such that the top-surface level of any of the EL layer 103B, the EL layer 103G, the EL layer 103R, and the light-receiving layer 103PS is higher than the top-surface level of the partition wall 528, for example. Alternatively, the partition wall 528 may be provided such that the top-surface level of the partition wall 528 is higher than the top-surface level of any of the EL layer 103B, the EL layer 103G, the EL layer 103R, and the light-receiving layer 103PS, for example.

When electrical continuity is established between the EL layer 103B, the EL layer 103G, the EL layer 103R, and the light-receiving layer 103PS in a light-emitting and light-receiving apparatus (display panel) with a high resolution more than 1000 ppi, crosstalk occurs, resulting in a narrower color gamut that the light-emitting and light-receiving apparatus is capable of reproducing. Providing the partition wall 528 in a high-resolution display panel with more than 1000 ppi, preferably more than 2000 ppi, or further preferably in an ultrahigh-resolution display panel with more than 5000 ppi allows the display panel to express vivid colors.

Figure 5B:
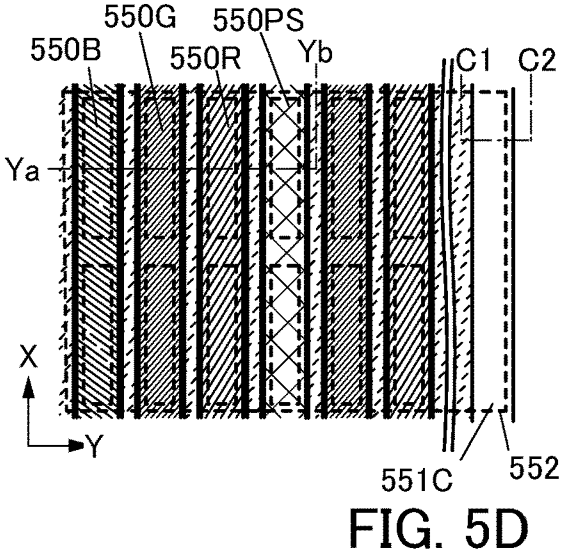
Figure 5C:
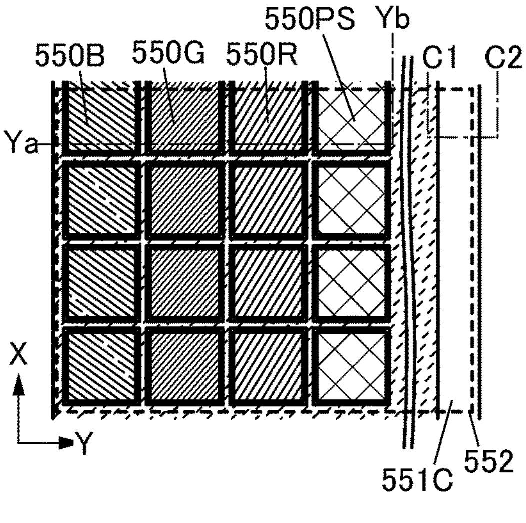

FIGS. 5B and 5C are each a schematic top view of the light-emitting and light-receiving apparatus 700 taken along the dashed-dotted line Ya-Yb in the cross-sectional view of FIG. 5A. Specifically, the light-emitting device 550B, the light-emitting device 550G, and the light-emitting device 550R are arranged in a matrix. Note that FIG. 5B illustrates what is called a stripe arrangement, in which the light-emitting devices of the same color are arranged in the Y-direction. FIG. 5C illustrates a structure in which the light-emitting devices of the same color are arranged in the Y-direction and separated by patterning for each pixel. Note that the arrangement method of the light-emitting devices is not limited thereto; another method such as a delta, zigzag, PenTile, or diamond arrangement may also be used.

The EL layers (the EL layer 103B, the EL layer 103G, and the EL layer 103R) and the light-receiving layer 103PS are processed to be separated by patterning using a photolithography method; hence, a light-emitting and light-receiving apparatus (display panel) with a high resolution can be fabricated. The end portions (side surfaces) of the EL layer processed by patterning using a photolithography method have substantially the same surface (or are positioned on substantially the same plane). In addition, the side surfaces (end portions) of the layers of the light-receiving layer processed by patterning using a photolithography method have substantially the same surface (or are positioned on substantially the same plane). In this case, the widths (SE) of spaces 580 between the EL layers and between the EL layer and the light-receiving layer are each preferably m or less, further preferably 1 μm or less.

In the EL layer, particularly the hole-injection layer, which is included in the hole-transport region between the anode and the light-emitting layer, often has high conductivity; thus, a hole-injection layer formed as a layer shared by adjacent light-emitting devices might cause crosstalk. Therefore, processing the EL layers to be separated by patterning using a photolithography method as described in this structure example can suppress occurrence of crosstalk between adjacent light-emitting devices.

Figure 5D:
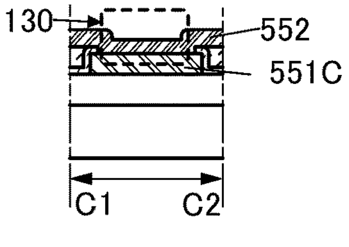

FIG. 5D is a schematic cross-sectional view taken along the dashed-dotted line C1-C2 in FIGS. 5B and 5C. FIG. 5D illustrates a connection portion 130 where a connection electrode 551C and the electrode 552 are electrically connected to each other. In the connection portion 130, the electrode 552 is provided over and in contact with the connection electrode 551C. The partition wall 528 is provided to cover an end portion of the connection electrode 551C.

<Example of Method for Manufacturing Light-Emitting and Light-Receiving Apparatus>

Figure 6A:
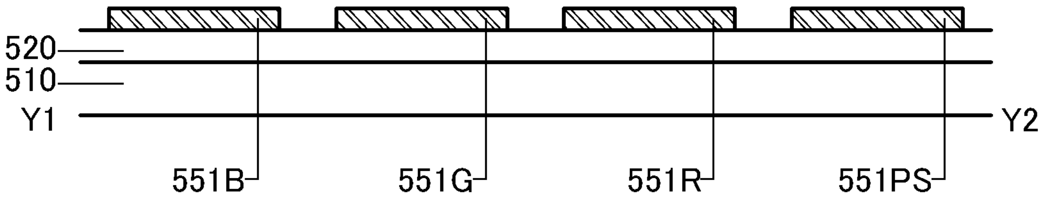
FIGS. 6A to 6C illustrate a method for manufacturing a light-emitting and light-receiving apparatus of an embodiment.

The electrode 551B, the electrode 551G, the electrode 551R, and the electrode 551PS are formed as illustrated in FIG. 6A. For example, a conductive film is formed over the functional layer 520 over the first substrate 510 and processed into predetermined shapes by a photolithography method.

The conductive film can be formed by any of a sputtering method, a chemical vapor deposition (CVD) method, a molecular beam epitaxy (MBE) method, a vacuum evaporation method, a pulsed laser deposition (PLD) method, an atomic layer deposition (ALD) method, and the like. Examples of the CVD method include a plasma-enhanced chemical vapor deposition (PECVD) method and a thermal CVD method. An example of a thermal CVD method is a metal organic CVD (MOCVD) method.

The conductive film may be processed by a nanoimprinting method, a sandblasting method, a lift-off method, or the like as well as a photolithography method described above. Alternatively, island-shaped thin films may be directly formed by a film formation method using a shielding mask such as a metal mask.

There are two typical examples of photolithography methods. In one of the methods, a resist mask is formed over a thin film that is to be processed, the thin film is processed by etching or the like, and then the resist mask is removed. In the other method, a photosensitive thin film is formed and then processed into a desired shape by light exposure and development. The former method involves heat treatment steps such as pre-applied bake (PAB) after resist application and post-exposure bake (PEB) after light exposure. In one embodiment of the present invention, a lithography method is used not only for processing of a conductive film but also for processing of a thin film used for formation of an EL layer (a film made of an organic compound or a film partly including an organic compound).

As light for exposure in a photolithography method, it is possible to use light with the i-line (wavelength: 365 nm), light with the g-line (wavelength: 436 nm), light with the h-line (wavelength: 405 nm), or light in which the i-line, the g-line, and the h-line are mixed. Alternatively, ultraviolet light, KrF laser light, ArF laser light, or the like can be used. Exposure may be performed by liquid immersion exposure technique. As the light for exposure, extreme ultraviolet (EUV) light or X-rays may also be used. Instead of the light for exposure, an electron beam can be used. It is preferable to use EUV, X-rays, or an electron beam because extremely minute processing can be performed. Note that a photomask is not needed when light exposure is performed by scanning with a beam such as an electron beam.

For etching of a thin film using a resist mask, a dry etching method, a wet etching method, a sandblast method, or the like can be used.

Figure 6B:
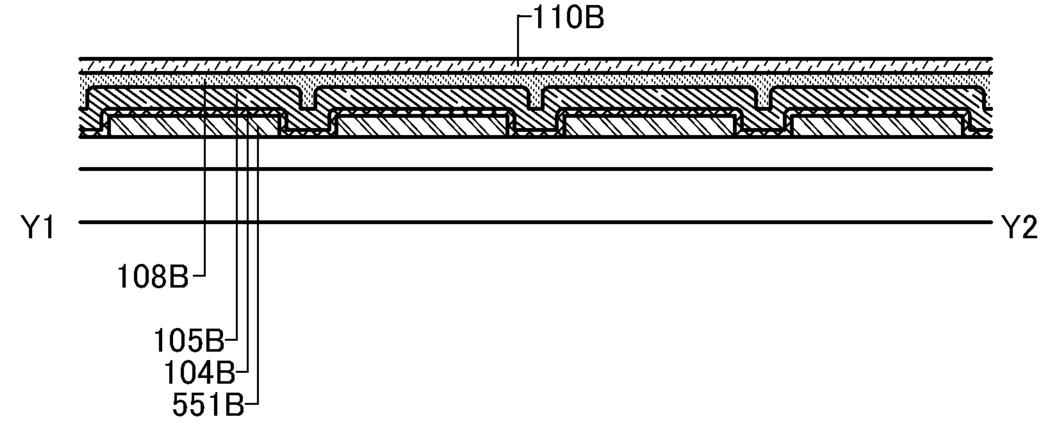

Subsequently, as illustrated in FIG. 6B, the hole-injection/transport layer 104B, the light-emitting layer 105B, and the electron-transport layer 108B are formed over the electrode 551B, the electrode 551G, the electrode 551R, and the electrode 551PS. Note that the hole-injection/transport layer 104B, the light-emitting layer 105B, and the electron-transport layer 108B can be formed using a vacuum evaporation method, for example. Furthermore, a sacrifice layer 1101B is formed over the electron-transport layer 108B. For the formation of the hole-injection/transport layer 104B, the light-emitting layer 105B, and the electron-transport layer 108B, any of the materials described in Embodiment 2 can be used.

For the sacrifice layer 110B, it is preferable to use a film highly resistant to etching treatment performed on the hole-injection/transport layer 104B, the light-emitting layer 105B, and the electron-transport layer 108B, i.e., a film having high etching selectivity with respective to the hole-injection/transport layer 104B, the light-emitting layer 105B, and the electron-transport layer 108B. The sacrifice layer 1101B preferably has a stacked-layer structure of a first sacrifice layer and a second sacrifice layer which have different etching selectivities. For the sacrifice layer 110B, it is possible to use a film that can be removed by a wet etching method, which causes less damage to the EL layer 103B. In wet etching, oxalic acid or the like can be used as an etching material.

For the sacrifice layer 110B, an inorganic film such as a metal film, an alloy film, a metal oxide film, a semiconductor film, or an inorganic insulating film can be used, for example. The sacrifice layer 110B can be formed by any of a variety of film formation methods such as a sputtering method, an evaporation method, a CVD method, and an ALD method.

For the sacrifice layer 110B, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used, for example. It is particularly preferable to use a low-melting-point material such as aluminum or silver.

A metal oxide such as indium gallium zinc oxide (also referred to as In—Ga—Zn oxide or IGZO) can be used for the sacrifice layer 110B. It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Alternatively, indium tin oxide containing silicon can also be used, for example.

An element M(M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium. In particular, M is preferably one or more of gallium, aluminum, and yttrium.

For the sacrifice layer 1101B, an inorganic insulating material such as aluminum oxide, hafnium oxide, or silicon oxide can be used.

The sacrifice layer 110B is preferably formed using a material that can be dissolved in a solvent chemically stable with respect to at least the electron-transport layer 108B that is in the uppermost position. Specifically, a material that can be dissolved in water or alcohol can be suitably used for the sacrifice layer 1101B. In formation of the sacrifice layer 1101B, it is preferable that application of such a material dissolved in a solvent such as water or alcohol be performed by a wet process and followed by heat treatment for evaporating the solvent. At this time, the heat treatment is preferably performed under a reduced-pressure atmosphere, in which case the solvent can be removed at a low temperature in a short time and thermal damage to the hole-injection/transport layer 104B, the light-emitting layer 105B, and the electron-transport layer 108B can be accordingly reduced.

In the case where the sacrifice layer 110B having a stacked-layer structure is formed, the stacked-layer structure can include the first sacrifice layer formed using any of the above-described materials and the second sacrifice layer thereover.

The second sacrifice layer in that case is a film used as a hard mask for etching of the first sacrifice layer. In processing the second sacrifice layer, the first sacrifice layer is exposed. Thus, a combination of films having greatly different etching rates is selected for the first sacrifice layer and the second sacrifice layer. Thus, a film that can be used for the second sacrifice layer can be selected in accordance with the etching conditions of the first sacrifice layer and those of the second sacrifice layer.

For example, in the case where the second sacrifice layer is etched by dry etching involving a fluorine-containing gas (also referred to as a fluorine-based gas), the second sacrifice layer can be formed using silicon, silicon nitride, silicon oxide, tungsten, titanium, molybdenum, tantalum, tantalum nitride, an alloy containing molybdenum and niobium, an alloy containing molybdenum and tungsten, or the like. Here, a film of a metal oxide such as IGZO or ITO can be given as an example of a film having a high etching selectivity to the second sacrifice layer (i.e., a film with a low etching rate) in the dry etching involving the fluorine-based gas, and can be used for the first sacrifice layer.

Note that the material for the second sacrifice layer is not limited to the above and can be selected from a variety of materials in accordance with the etching conditions of the first sacrifice layer and those of the second sacrifice layer. For example, any of the films that can be used for the first sacrifice layer can be used for the second sacrifice layer.

For the second sacrifice layer, a nitride film can be used, for example. Specifically, it is possible to use a nitride such as silicon nitride, aluminum nitride, hafnium nitride, titanium nitride, tantalum nitride, tungsten nitride, gallium nitride, or germanium nitride.

Alternatively, an oxide film can be used for the second sacrifice layer. Typically, it is possible to use a film of an oxide or an oxynitride such as silicon oxide, silicon oxynitride, aluminum oxide, aluminum oxynitride, hafnium oxide, or hafnium oxynitride.

Figure 6C:
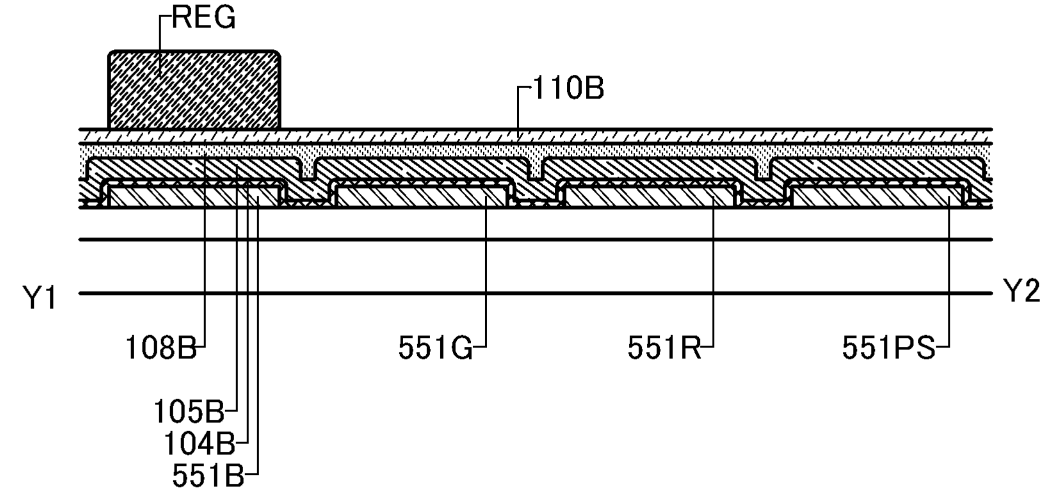

Next, as illustrated in FIG. 6C, a resist is applied onto the sacrifice layer 110B, and the resist having a desired shape (a resist mask REG) is formed by a photolithography method. Such a method involves heat treatment steps such as pre-applied bake (PAB) after the resist application and post-exposure bake (PEB) after light exposure. The temperature reaches approximately 100° C. during the PAB, and approximately 120° C. during the PEB, for example. Therefore, the light-emitting device should be resistant to such high treatment temperatures.

Figure 7A:
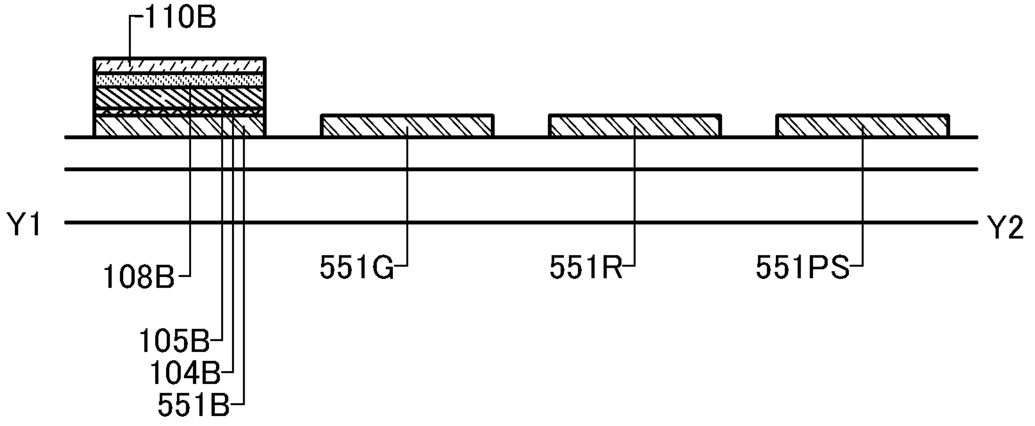
FIGS. 7A to 7C illustrate the method for manufacturing the light-emitting and light-receiving apparatus of the embodiment.

Next, part of the sacrifice layer 110B that is not covered with the resist mask REG is removed by etching using the resist mask REG, the resist mask REG is removed, and then the hole-injection/transport layer 104B, the light-emitting layer 105B, and the electron-transport layer 108B that are not covered with the sacrifice layer 1101B are removed by etching, so that the hole-injection/transport layer 104B, the light-emitting layer 105B, and the electron-transport layer 108B are processed to have side surfaces (or have their side surfaces exposed) over the electrode 551B or have belt-like shapes extending in the direction intersecting the sheet of the diagram. Note that dry etching is preferably employed for the etching. Note that in the case where the sacrifice layer 110B has the aforementioned stacked-layer structure of the first sacrifice layer and the second sacrifice layer, the hole-injection/transport layer 104B, the light-emitting layer 105B, and the electron-transport layer 108B may be processed into a predetermined shape in the following manner: part of the second sacrifice layer is etched using the resist mask REG, the resist mask REG is then removed, and part of the first sacrifice layer is etched using the second sacrifice layer as a mask. The structure illustrated in FIG. 7A is obtained through these etching steps.

Figure 7B:
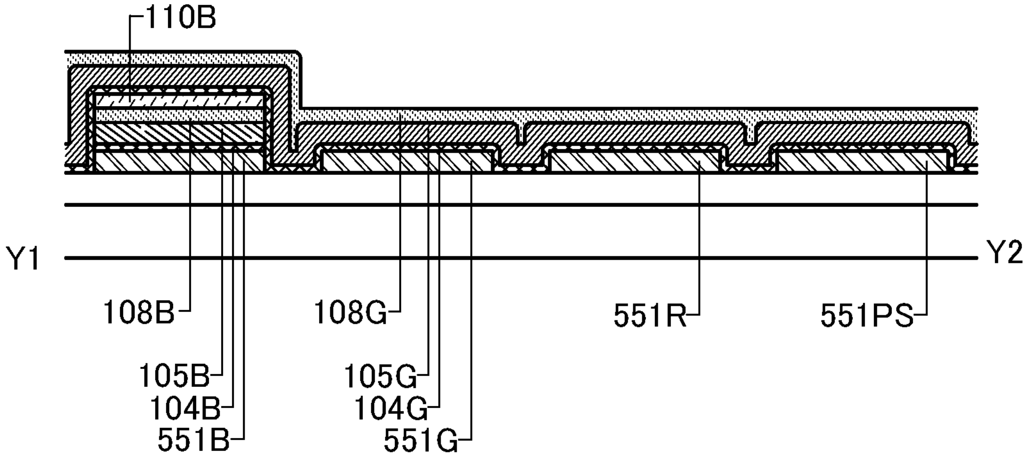

Subsequently, as illustrated in FIG. 7B, the hole-injection/transport layer 104G, the light-emitting layer 105G, and the electron-transport layer 108G are formed over the sacrifice layer 110B, the electrode 551G, the electrode 551R, and the electrode 551PS. The hole-injection/transport layer 104G, the light-emitting layer 105G, and the electron-transport layer 108G can be formed using any of the materials described in Embodiment 2. Note that the hole-injection/transport layer 104G, the light-emitting layer 105G, and the electron-transport layer 108G can be formed by a vacuum evaporation method, for example.

Figure 7C:
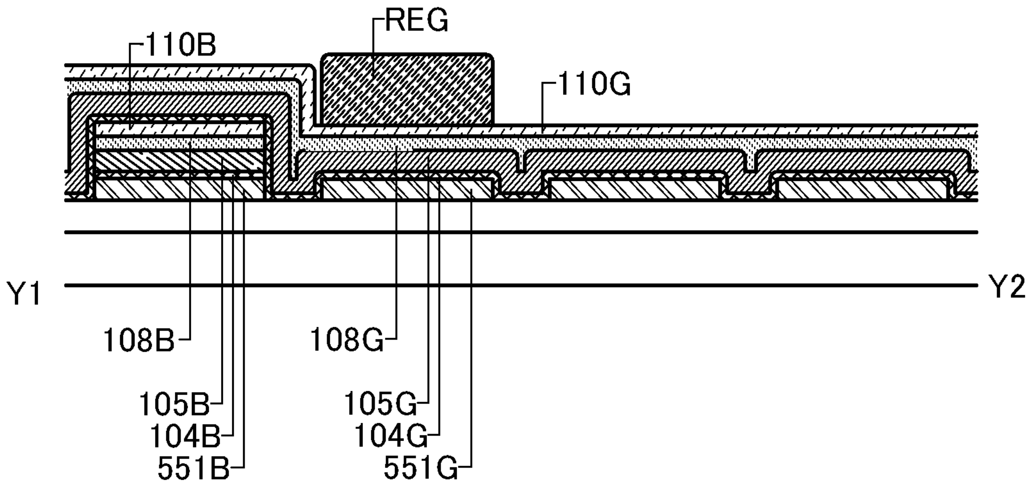
Figure 8A:
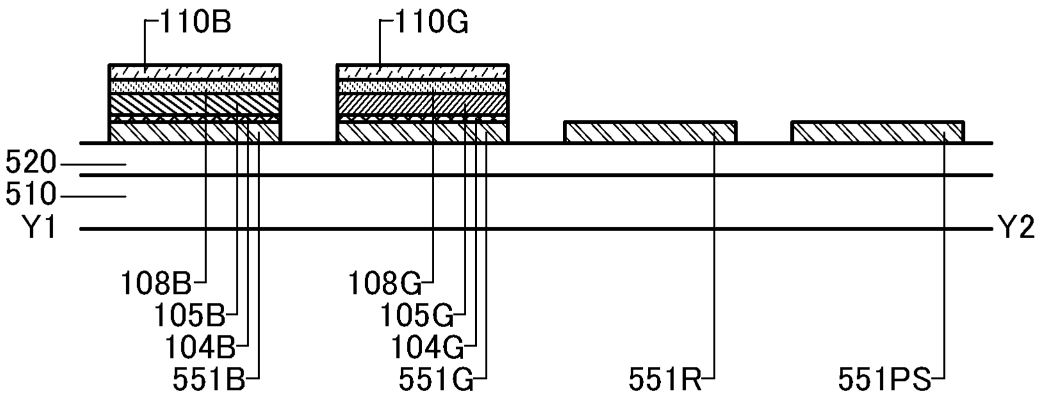
FIGS. 8A to 8C illustrate the method for manufacturing the light-emitting and light-receiving apparatus of the embodiment.

Next, as illustrated in FIG. 7C, the sacrifice layer 110G is formed over the electron-transport layer 108G, a resist is applied onto the sacrifice layer 110G, and the resist having a desired shape (the resist mask REG) is formed by a lithography method. Part of the sacrifice layer 110G that is not covered with the obtained resist mask REG is removed by etching, the resist mask REG is removed, and then parts of the hole-injection/transport layer 104G, the light-emitting layer 105G, and the electron-transport layer 108G that are not covered with the sacrifice layer 110G are removed by etching. Thus, the hole-injection/transport layer 104G, the light-emitting layer 105G, and the electron-transport layer 108G are processed to have side surfaces (or have their side surfaces exposed) over the electrode 551G or have belt-like shapes extending in the direction intersecting the sheet of the diagram. Note that dry etching is preferably employed for the etching. Note that the sacrifice layer 110G can be formed using a material similar to that for the sacrifice layer 110B. In the case where the sacrifice layer 110G has the aforementioned stacked-layer structure of the first sacrifice layer and the second sacrifice layer, the hole-injection/transport layer 104G, the light-emitting layer 105G, and the electron-transport layer 108G may be processed into a predetermined shape in the following manner: part of the second sacrifice layer is etched using the resist mask REG, the resist mask REG is then removed, and part of the first sacrifice layer is etched using the second sacrifice layer as a mask. The structure illustrated in FIG. 8A is obtained through these etching steps.

Figure 8B:
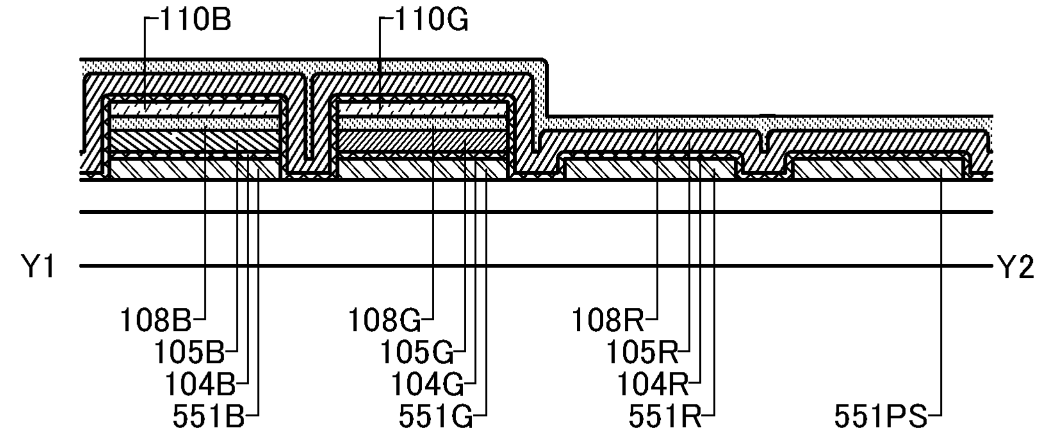

Next, as illustrated in FIG. 8B, the hole-injection/transport layer 104R, the light-emitting layer 105R, and the electron-transport layer 108R are formed over the sacrifice layer 110B, the sacrifice layer 110G, the electrode 551R, and the electrode 551PS. The hole-injection/transport layer 104R, the light-emitting layer 105R, and the electron-transport layer 108R can be formed using any of the materials described in Embodiment 2. The hole-injection/transport layer 104R, the light-emitting layer 105R, and the electron-transport layer 108R can be formed by a vacuum evaporation method, for example.

Figure 8C:
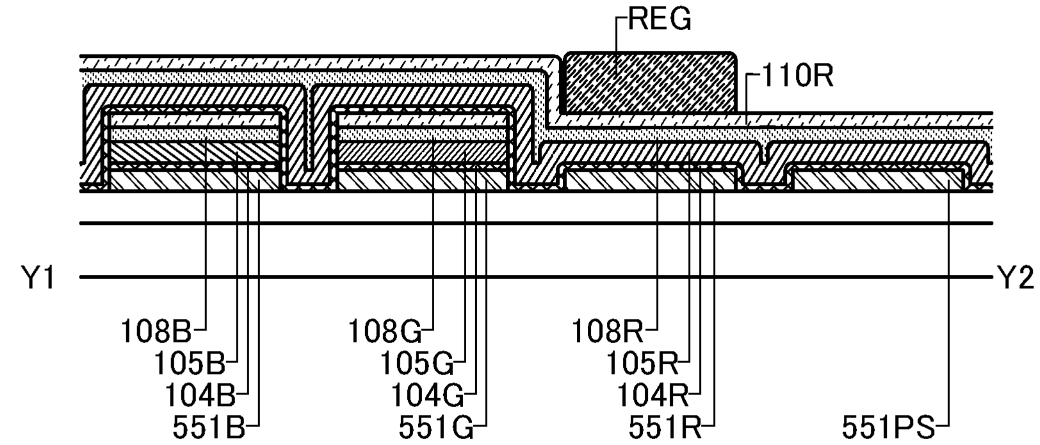
Figure 9A:
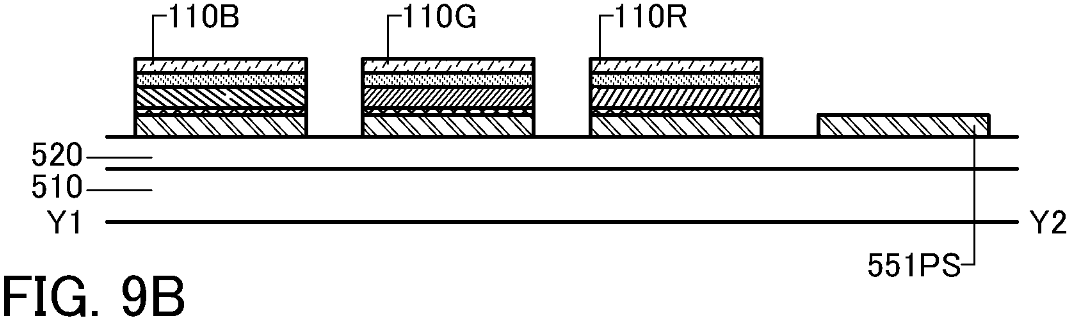
FIGS. 9A to 9D illustrate the method for manufacturing the light-emitting and light-receiving apparatus of the embodiment.

Next, as illustrated in FIG. 8C, the sacrifice layer 110R is formed over the electron-transport layer 108R, a resist is applied onto the sacrifice layer 110R, and the resist having a desired shape (the resist mask REG) is formed by a photolithography method. Part of the sacrifice layer 110R that is not covered with the obtained resist mask REG is removed by etching, the resist mask REG is removed, and then parts of the hole-injection/transport layer 104R, the light-emitting layer 105R, and the electron-transport layer 108R that are not covered with the sacrifice layer 110R are removed by etching. Thus, the hole-injection/transport layer 104R, the light-emitting layer 105R, and the electron-transport layer 108R are processed to have side surfaces (or have their side surfaces exposed) over the electrode 551R or have belt-like shapes extending in the direction intersecting the sheet of the diagram. Note that dry etching is preferably employed for the etching. Note that the sacrifice layer 110R can be formed using a material similar to that for the sacrifice layer 110B. In the case where the sacrifice layer 110R has the aforementioned stacked-layer structure of the first sacrifice layer and the second sacrifice layer, the hole-injection/transport layer 104R, the light-emitting layer 105R, and the electron-transport layer 108R may be processed into a predetermined shape in the following manner: part of the second sacrifice layer is etched using the resist mask REG, the resist mask REG is then removed, and part of the first sacrifice layer is etched using the second sacrifice layer as a mask. The structure illustrated in FIG. 9A is obtained through these etching steps.

Figure 9B:
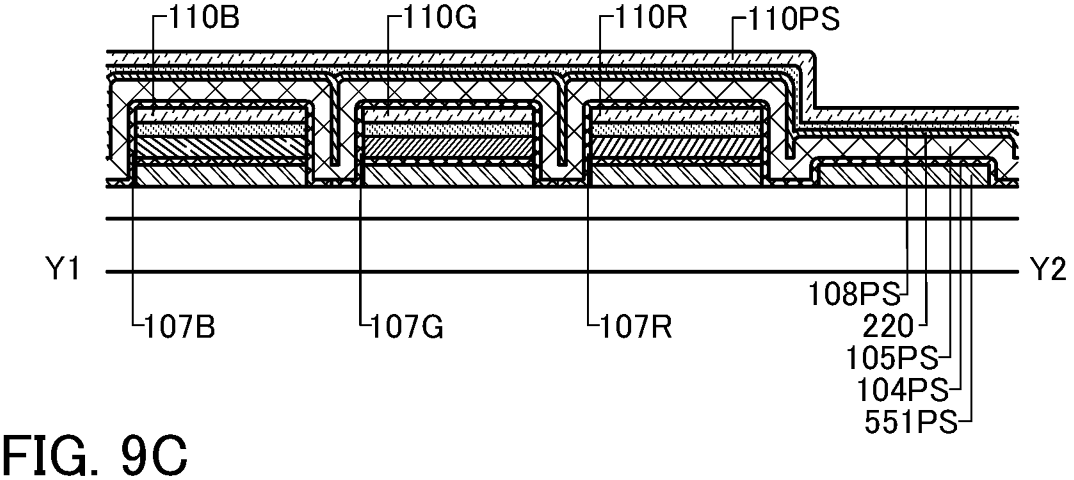

Next, as illustrated in FIG. 9B, the first transport layer 104PS, the active layer 105PS, the buffer layer 220, and the second transport layer 108PS are formed over the sacrifice layer 110B, the sacrifice layer 110G, the sacrifice layer 110R, and the electrode 551PS. The first transport layer 104PS, the active layer 105PS, the buffer layer 220, and the second transport layer 108PS can be formed using any of the materials described in Embodiment 1 and Embodiment 2. Note that the first transport layer 104PS, the active layer 105PS, the buffer layer 220, and the second transport layer 108PS can be formed by a vacuum evaporation method, for example.

Figure 9C:
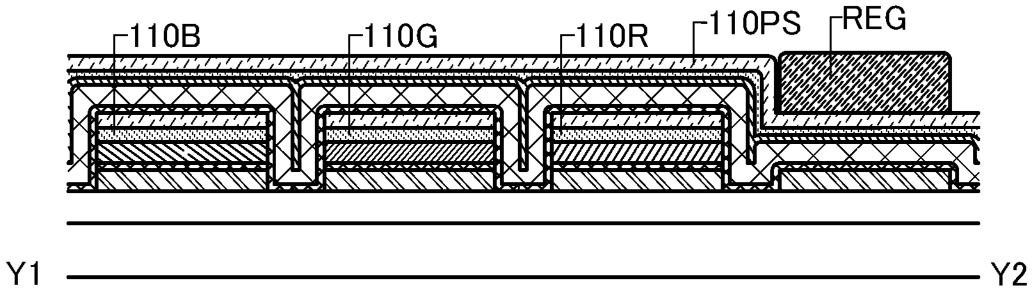
Figure 9D:
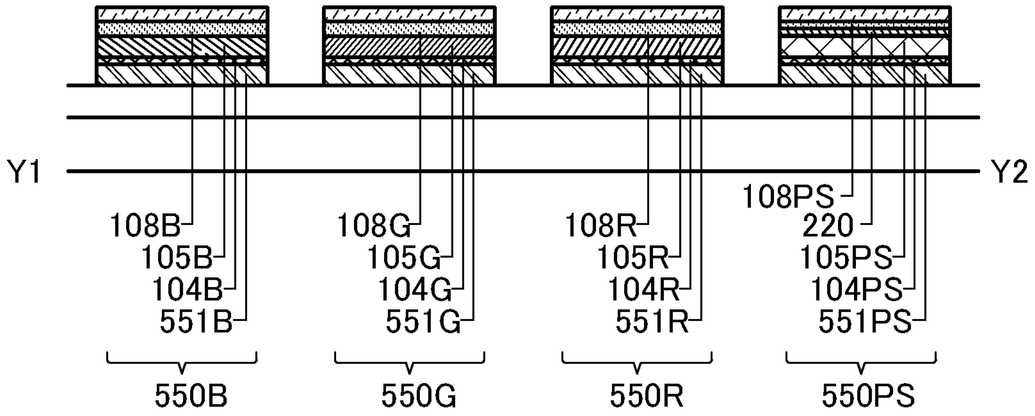

Next, as illustrated in FIG. 9C, the sacrifice layer 110PS is formed over the second transport layer 108PS, a resist is applied onto the sacrifice layer 110PS, and the resist having a desired shape (the resist mask REG) is formed by a photolithography method. Part of the sacrifice layer 110PS that is not covered with the obtained resist mask REG is removed by etching, the resist mask REG is removed, and then parts of the first transport layer 104PS, the active layer 105PS, and the second transport layer 108PS that are not covered with the sacrifice layer 110PS are removed by etching. Thus, the first transport layer 104PS, the active layer 105PS, and the second transport layer 108PS are processed to have side surfaces (or have their side surfaces exposed) over the electrode 551PS or have belt-like shapes extending in the direction intersecting the sheet of the diagram. Note that dry etching is preferably employed for the etching. Note that the sacrifice layer 110PS can be formed using a material similar to that for the sacrifice layer 1101B. In the case where the sacrifice layer 110PS has the aforementioned stacked-layer structure of the first sacrifice layer and the second sacrifice layer, the first transport layer 104PS, the active layer 105PS, and the second transport layer 108PS may be processed into a predetermined shape in the following manner: part of the second sacrifice layer is etched using the resist mask REG, the resist mask REG is then removed, and part of the first sacrifice layer is etched using the second sacrifice layer as a mask. The structure illustrated in FIG. 9D is obtained through these etching steps.

Figure 10A:
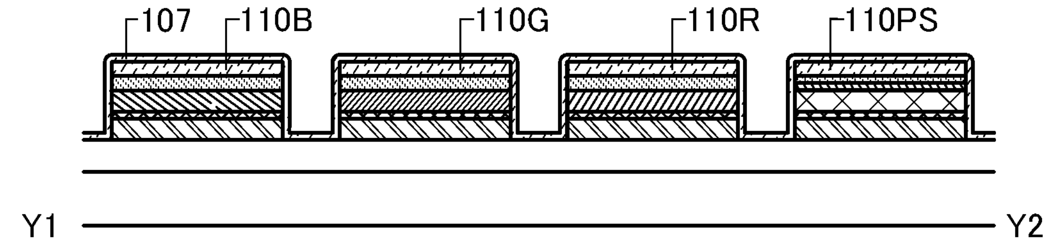
FIGS. 10A to TOE illustrate the method for manufacturing the light-emitting and light-receiving apparatus of the embodiment.

Next, as illustrated in FIG. 10A, the insulating layer 107 is formed over the sacrifice layer 110B, the sacrifice layer 110G, the sacrifice layer 110R, and the sacrifice layer 110PS.

Note that the insulating layer 107 can be formed by an ALD method, for example. In this case, as illustrated in FIG. 10A, the insulating layer 107 is formed to be in contact with the side surfaces (end portions) of the hole-injection/transport layers (104B, 104G, and 104R), the light-emitting layers (105B, 105G, and 105R), and the electron-transport layers (108B, 108G, and 108R) of the light-emitting devices and the first transport layer 104PS, the active layer 105PS, the buffer layer 220, and the second transport layer 108PS of the light-receiving device. This can inhibit entry of oxygen, moisture, or constituent elements thereof into the inside through the side surfaces of the layers. Examples of the material used for the insulating layer 107 include aluminum oxide, magnesium oxide, hafnium oxide, gallium oxide, indium gallium zinc oxide, silicon nitride, and silicon nitride oxide.

Figure 10B:
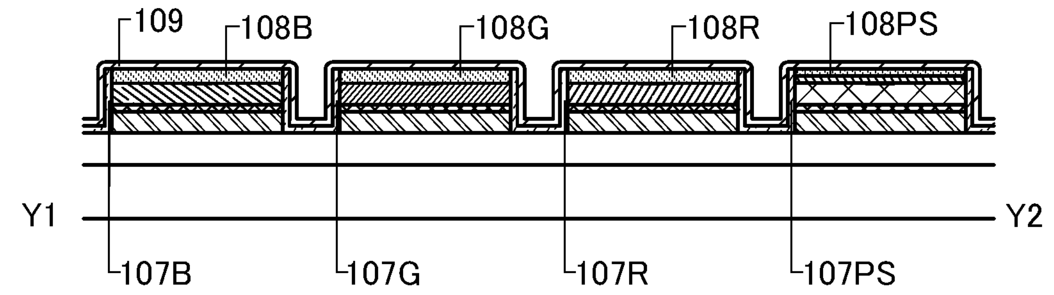

Then, as illustrated in FIG. 10B, after the sacrifice layers (110B, 110G, 110R, and 110PS) are removed, the electron-injection layer 109 is formed over the insulating layers (107B, 107G, 107R, and 107PS) formed by removing parts of the insulating layer 107, the electron-transport layers (108B, 108G, and 108R), and the second transport layer 108PS. The electron-injection layer 109 can be formed using any of the materials described in Embodiment 2. The electron-injection layer 109 is formed by a vacuum evaporation method, for example. Note that the electron-injection layer 109 is in contact with the side surfaces (end portions) of the hole-injection/transport layers (104B, 104G, and 104R), the light-emitting layers (105B, 105G, and 105R), and the electron-transport layers (108B, 108G, and 108R) of the light-emitting devices and the first transport layer 104PS, the active layer 105PS, the buffer layer 220, and the second transport layer 108PS of the light-receiving device with the insulating layers (107B, 107G, 107R, and 107PS) therebetween.

Figure 10C:
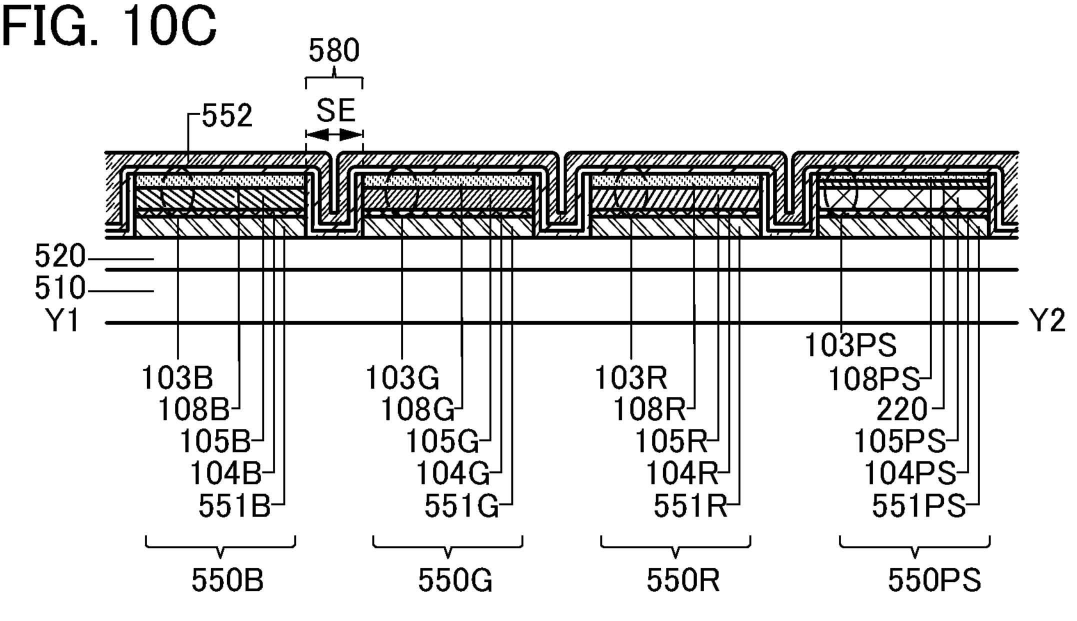
Figure 10D:
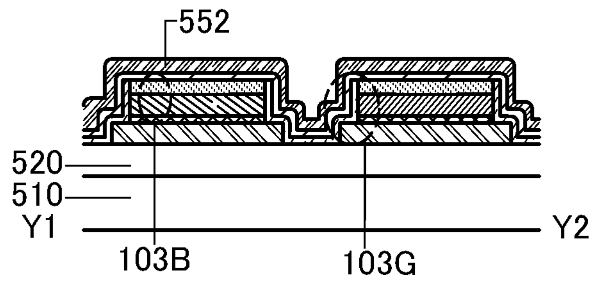

Next, as illustrated in FIG. 10C, the electrode 552 is formed. The electrode 552 is formed by a vacuum evaporation method, for example. The electrode 552 is formed over the electron-injection layer 109. Note that the electrode 552 is in contact with the side surfaces (end portions) of the hole-injection/transport layers (104B, 104G, and 104R), the light-emitting layers (105B, 105G, and 105R), and the electron-transport layers (108B, 108G, and 108R) of the light-emitting devices and the first transport layer 104PS, the active layer 105PS, the buffer layer 220, and the second transport layer 108PS of the light-receiving device with the electron-injection layer 109 and the insulating layers (107B, 107G, 107R, and 107PS) therebetween. This can prevent electrical short circuits between the electrode 552 and each of the following layers: the hole-injection/transport layers (104B, 104G, and 104R), the light-emitting layers (105B, 105G, and 105R), and the electron-transport layers (108B, 108G, and 108R) of the light-emitting devices and the first transport layer 104PS, the active layer 105PS, the buffer layer 220, and the second transport layer 108PS of the light-receiving layer.

Through the above steps, the EL layer 103B, the EL layer 103G, the EL layer 103R, and the light-receiving layer 103PS in the light-emitting device 550B, the light-emitting device 550G, the light-emitting device 550R, and the light-receiving device 550PS can be processed to be separated from each other.

The EL layers (the EL layer 103B, the EL layer 103G, and the EL layer 103R) and the light-receiving layer 103PS are processed to be separated by patterning using a photolithography method; hence, a light-emitting and light-receiving apparatus (display panel) with a high resolution can be fabricated. End portions (side surfaces) of the layers of the EL layer processed by patterning using a photolithography method have substantially the same surface (or are positioned on substantially the same plane). In addition, the side surfaces (end portions) of the layers of the light-receiving layer processed by patterning using a photolithography method have substantially the same surface (or are positioned on substantially the same plane).

Each of the hole-injection/transport layers (104B, 104G, and 104R) of the EL layers and the first transport layer 104PS of the light-receiving layer often has high conductivity, and thus might cause crosstalk when formed as a layer shared by adjacent devices. Therefore, processing the EL layers to be separated by patterning using a photolithography method as described in this structure example can inhibit occurrence of crosstalk between adjacent devices.

In this structure example, the hole-injection/transport layers (104B, 104G, and 104R), the light-emitting layers (105B, 105G, and 105R), and the electron-transport layers (108B, 108G, and 108R) of the EL layers (the EL layer 103B, the EL layer 103G, and the EL layer 103R) included in the light-emitting devices and the first transport layer 104PS, the active layer 105PS, the buffer layer 220, and the second transport layer 108PS of the light-receiving layer 103PS included in the light-receiving device are processed to be separated by patterning using a photolithography method; thus, the end portions (side surfaces) of the processed EL layer have substantially the same surface (or are positioned on substantially the same plane). In addition, the side surfaces (end portions) of the layers of the light-receiving layer processed by patterning using a photolithography method have substantially the same surface (or are positioned on substantially the same plane).

In addition, the hole-injection/transport layers (104B, 104G, and 104R), the light-emitting layers (105B, 105G, and 105R), and the electron-transport layers (108B, 108G, and 108R) of the EL layers (the EL layer 103B, the EL layer 103G, and the EL layer 103R) included in the light-emitting devices and the first transport layer 104PS, the active layer 105PS, the buffer layer 220, and the second transport layer 108PS of the light-receiving layer 103PS included in the light-receiving device are processed to be separated by patterning using a photolithography method. Thus, the space 580 is provided between the processed end portions (side surfaces) of adjacent devices. In FIG. 10C, when the space 580 is denoted by a distance SE between the EL layers or between the EL layer and the light-receiving layer of adjacent devices, decreasing the distance SE increases the aperture ratio and the resolution. By contrast, as the distance SE is increased, the effect of the difference in the fabrication process between the adjacent devices becomes permissible, which leads to an increase in manufacturing yield. Since the light-emitting device and the light-receiving device fabricated according to this specification are suitable for a miniaturization process, the distance SE between the EL layers or between the EL layer and the light-receiving layer of adjacent devices can be longer than or equal to 0.5 μm and shorter than or equal to 5 μm, preferably longer than or equal to 1 μm and shorter than or equal to 3 μm, further preferably longer than or equal to 1 μm and shorter than or equal to 2.5 μm, and still further preferably longer than or equal to 1 μm and shorter than or equal to 2 μm. Typically, the distance SE is preferably longer than or equal to 1 μm and shorter than or equal to 2 μm (e.g., 1.5 μm or a neighborhood thereof).

In this specification and the like, a device formed using a metal mask or a fine metal mask (FMM) is sometimes referred to as a device having a metal mask (MM) structure. In this specification and the like, a device formed without using a metal mask or an FMM is sometimes referred to as a device having a metal maskless (MML) structure. Since a light-emitting and light-receiving apparatus having the MML structure is formed without using a metal mask, the pixel arrangement, the pixel shape, and the like can be designed more flexibly than in a light-emitting and light-receiving apparatus having the FMM structure or the MM structure.

Note that the island-shaped EL layers of the light-emitting and light-receiving apparatus having the MML structure are formed by not patterning using a metal mask but processing after formation of an EL layer. Thus, a light-emitting and light-receiving apparatus with a higher resolution or a higher aperture ratio than a conventional one can be achieved. Moreover, EL layers can be formed separately for each color, which enables extremely clear images; thus, a light-emitting and light-receiving apparatus with a high contrast and high display quality can be achieved. Furthermore, provision of a sacrifice layer over an EL layer can reduce damage on the EL layer during the manufacturing process and increase the reliability of the light-emitting device.

Note that in the case where the EL layer is processed into an island shape, a structure in which processing is performed directly above the light-emitting layer by photolithography can be considered. In the case of the structure, damage might be caused in the light-emitting layer (owing to the processing and the like), thereby greatly deteriorating the reliability. Thus, when the light-emitting and light-receiving apparatus of one embodiment of the present invention is manufactured, it is preferable to use a method in which a sacrificial layer or the like is formed over the second carrier-transport layer or the second carrier-injection layer that is positioned above the light-emitting layer and then the light-emitting layer is processed into an island shape. With the use of the method, a highly reliable display panel can be provided.

In FIG. 5A and FIG. 10C, the widths of the EL layers (103B, 103G, and 103R) are substantially equal to those of the electrodes (551B, 551G, and 551R) in the light-emitting device 550B, the light-emitting device 550G, and the light-emitting device 550R, and the width of the light-receiving layer 103PS is substantially equal to that of the electrode 551PS in the light-receiving device 550PS; however, one embodiment of the present invention is not limited thereto.

In the light-emitting device 550B, the light-emitting device 550G, and the light-emitting device 550R, the widths of the EL layers (103B, 103G, and 103R) may be smaller than those of the electrodes (551B, 551G, and 551R). In the light-receiving device 550PS, the width of the light-receiving layer 103PS may be smaller than that of the electrode 551PS. FIG. TOD illustrates an example in which the widths of the EL layers (103B and 103G) are smaller than those of the electrodes (551B and 551G) in the light-emitting device 550B and the light-emitting device 550G.

Figure 10E:
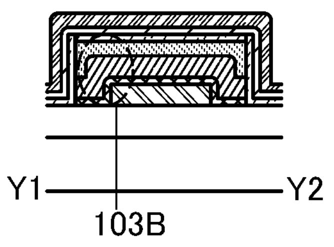

In the light-emitting device 550B, the light-emitting device 550G, and the light-emitting device 550R, the widths of the EL layers (103B, 103G, and 103R) may be larger than those of the electrodes (551B, 551G, and 551R). In the light-receiving device 550PS, the width of the light-receiving layer 103PS may be larger than that of the electrode 551PS. FIG. 10E illustrates an example in which the width of the EL layer 103R is larger than that of the electrode 551R in the light-emitting device 550R.

The structures described in this embodiment can be used in combination with any of the structures described in the other embodiments as appropriate.

Embodiment 4

In this embodiment, a light-emitting and light-receiving apparatus 720 is described with reference to FIGS. 11 to 11F, FIGS. 12A to 12C, and FIG. 13. The light-emitting and light-receiving apparatus 720 illustrated in FIGS. 11A to 11F, FIGS. 12A to 12C, and FIG. 13 includes any of the light-receiving devices and the light-emitting devices described in Embodiments 1 and 2 and therefore is a light-emitting and light-receiving apparatus. Furthermore, the light-emitting and light-receiving apparatus 720 described in this embodiment can be used in a display portion of an electronic appliance or the like and therefore can also be referred to as a display panel or a display apparatus. Moreover, the light-emitting and light-receiving apparatus 720 has a structure in which the light-emitting device is used as a light source and the light-receiving device receives light from the light-emitting device.

Furthermore, the light-emitting and light-receiving apparatus of this embodiment can have high definition or large size. Therefore, the light-emitting and light-receiving apparatus of this embodiment can be used, for example, in display portions of electronic appliances such as a digital camera, a digital video camera, a digital photo frame, a mobile phone, a portable game machine, a smart phone, a wristwatch terminal, a tablet terminal, a portable information terminal, and an audio reproducing apparatus, in addition to display portions of electronic appliances with a relatively large screen, such as a television apparatus, a desktop or laptop personal computer, a monitor of a computer or the like, digital signage, and a large game machine such as a pachinko machine.

FIG. 11A is a top view of the light-emitting and light-receiving apparatus 720.

In FIG. 11A, the light-emitting and light-receiving apparatus 720 has a structure in which a substrate 710 and a substrate 711 are attached to each other. In addition, the light-emitting and light-receiving apparatus 720 includes a display region 701, a circuit 704, a wiring 706, and the like.

Note that the display region 701 includes a plurality of pixels. As illustrated in FIG. 11B, a pixel 703(*i, j*) illustrated in FIG. 11A and a pixel 703(*i*+1, j) are adjacent to each other.

Furthermore, in the example of the light-emitting and light-receiving apparatus 720 illustrated in FIG. 11A, the substrate 710 is provided with an integrated circuit (IC) 712 by a chip on glass (COG) method, a chip on film (COF) method, or the like. As the IC 712, an IC including a scan line driver circuit, a signal line driver circuit, or the like can be used, for example. In the example illustrated in FIG. 11A, an IC including a signal line driver circuit is used as the IC 712, and a scan line driver circuit is used as the circuit 704.

The wiring 706 has a function of supplying signals and power to the display region 701 and the circuit 704. The signals and power are input to the wiring 706 from the outside through a flexible printed circuit (FPC) 713 or to the wiring 706 from the IC 712. Note that the light-emitting and light-receiving apparatus 720 is not necessarily provided with the IC. The IC may be mounted on the FPC by a COF method or the like.

FIG. 11B illustrates the pixel 703(*i, j*) and the pixel 703(*i*+1, j) of the display region 701. A plurality of kinds of subpixels including light-emitting devices that emit different color light from each other can be included in the pixel 703(*i, j*). Alternatively, a plurality of subpixels including light-emitting devices that emit the same color light may be included in addition to those described above. For example, the pixel can include three kinds of subpixels. The three subpixels can be of three colors of red (R), green (G), and blue (B) or of three colors of yellow (Y), cyan (C), and magenta (M), for example. Alternatively, the pixel can include four kinds of subpixels. The four subpixels can be of four colors of R, G, B, and white (W) or of four colors of R, G, B, and Y, for example. Specifically, the pixel 703(*i, j*) can consist of a subpixel 702B(i, j) for blue display, a subpixel 702G(i, j) for green display, and a subpixel 702R(i, j) for red display.

The light-emitting and light-receiving apparatus 720 includes not only a subpixel including a light-emitting device, but also a subpixel including a light-receiving device.

FIGS. 11C to 11E illustrate various layout examples of the pixel 703(*i, j*) including a subpixel 702PS(i, j) including a light-receiving device. The pixel arrangement in FIG. 11C is stripe arrangement, and the pixel arrangement in FIG. 11D is matrix arrangement. The pixel arrangement in FIG. 11E has a structure where three subpixels (the subpixels R, G, and PS) are vertically arranged next to one subpixel (the subpixel B).

Furthermore, as illustrated in FIG. 11F, a subpixel 702IR (i, j) that emits infrared rays may be added to any of the above-described sets of subpixels in the pixel 703(*i, j*). The pixel arrangement in FIG. 11F has a structure where vertically oriented three subpixels (the subpixels G, B, and R) are vertically arranged laterally, and the subpixel PS and a horizontally oriented subpixel IR are arranged laterally below the three subpixels. Specifically, the subpixel 702IR(i, j) that emits light including light with a wavelength of higher than or equal to 650 nm and lower than or equal to 1000 nm may be used in the pixel 703(*i, j*). Note that the wavelength of light detected by the subpixel 702PS(i, j) is not particularly limited; however, the light-receiving device included in the subpixel 702PS(i, j) preferably has sensitivity to light emitted by the light-emitting device included in the subpixel 702R(i, j), the subpixel 702G(i, j), the subpixel 702B(i, j), or the subpixel 702IR(i, j). For example, the light-receiving device preferably detects one or more kinds of light in blue, violet, bluish violet, green, yellowish green, yellow, orange, red, and infrared wavelength ranges, for example.

Note that the arrangement of subpixels is not limited to the structures illustrated in FIGS. 11B to 11F and a variety of arrangement methods can be employed. The arrangement of subpixels may be stripe arrangement, S-stripe arrangement, matrix arrangement, delta arrangement, Bayer arrangement, or PenTile arrangement, for example.

Furthermore, top surfaces of the subpixels may have a triangular shape, a quadrangular shape (including a rectangular shape and a square shape), a polygonal shape such as a pentagonal shape, a polygonal shape with rounded corners, an elliptical shape, or a circular shape, for example. The top surface shape of a subpixel herein refers to a top surface shape of a light-emitting region of a light-emitting device.

Furthermore, in the case where not only a light-emitting device but also a light-receiving device is included in a pixel, the pixel has a light-receiving function and thus can detect a contact or approach of an object while displaying an image. For example, an image can be displayed by using all the subpixels included in a light-emitting apparatus; or light can be emitted by some of the subpixels as a light source and an image can be displayed by using the remaining subpixels.

Note that the light-receiving area of the subpixel 702PS(i, j) is preferably smaller than the light-emitting areas of the other subpixels. A smaller light-receiving area leads to a narrower image-capturing range, prevents a blur in a captured image, and improves the definition. Thus, by using the subpixel 702PS(i, j), high-resolution or high-definition image capturing is possible. For example, image capturing for personal authentication with the use of a fingerprint, a palm print, the iris, the shape of a blood vessel (including the shape of a vein and the shape of an artery), a face, or the like is possible by using the subpixel 702PS(i, j).

Moreover, the subpixel 702PS(i, j) can be used in a touch sensor (also referred to as a direct touch sensor), a near touch sensor (also referred to as a hover sensor, a hover touch sensor, a contactless sensor, or a touchless sensor), or the like. For example, the subpixel 702PS(i, j) preferably detects infrared light. Thus, touch sensing is possible even in a dark place.

Here, the touch sensor or the near touch sensor can detect an approach or contact of an object (e.g., a finger, a hand, or a pen). The touch sensor can detect the object when the light-emitting and light-receiving apparatus and the object come in direct contact with each other. Furthermore, the near touch sensor can detect the object even when the object is not in contact with the light-emitting and light-receiving apparatus. For example, the light-emitting and light-receiving apparatus can preferably detect the object when the distance between the light-emitting and light-receiving apparatus and the object is more than or equal to 0.1 mm and less than or equal to 300 nm, preferably more than or equal to 3 mm and less than or equal to 50 mm. With this structure, light-emitting and light-receiving apparatus can be controlled without the object directly contacting with the light-emitting and light-receiving apparatus. In other words, the light-emitting and light-receiving apparatus can be controlled in a contactless (touchless) manner. With the above-described structure, the light-emitting and light-receiving apparatus can be operated with a reduced risk of being dirty or damaged, or without direct contact between the object and a dirt (e.g., dust, bacteria, or a virus) attached to the light-emitting and light-receiving apparatus.

For high-resolution image capturing, the subpixel 702PS (i, j) is preferably provided in every pixel included in the light-emitting and light-receiving apparatus. Meanwhile, in the case where the subpixel 702PS(i, j) is used in a touch sensor, a near touch sensor, or the like, high accuracy is not required as compared to the case of capturing an image of a fingerprint or the like; accordingly, the subpixel 702PS(i, j) is provided in some subpixels in the light-emitting and light-receiving apparatus. When the number of subpixels 702PS(i, j) included in the light-emitting and light-receiving apparatus is smaller than the number of subpixels 702R(i, j) or the like, higher detection speed can be achieved.

Next, an example of a pixel circuit of a subpixel including the light-emitting device is described with reference to FIG. 12A. A pixel circuit 530 illustrated in FIG. 12A includes a light-emitting device (EL) 550, a transistor M15, a transistor M16, a transistor M17, and a capacitor C3. Note that a light-emitting diode can be used as the light-emitting device 550. In particular, any of the light-emitting devices described in Embodiment 1 and Embodiment 2 is preferably used as the light-emitting device 550.

Figure 12A:
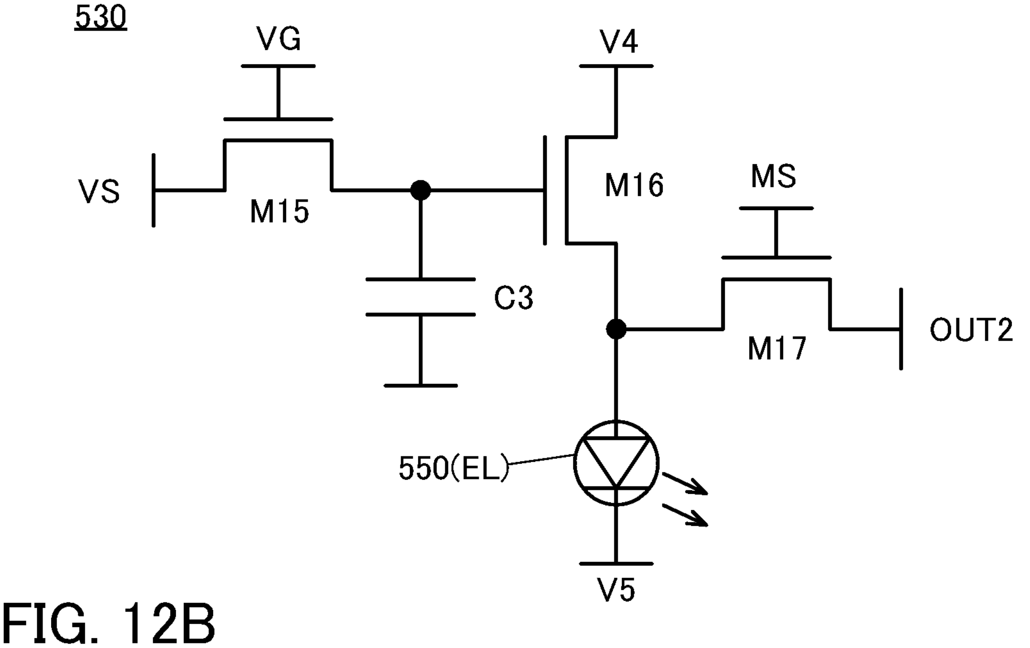
FIGS. 12A to 12C illustrate pixel circuits of an embodiment.

In FIG. 12A, a gate of the transistor M15 is electrically connected to a wiring VG, one of a source and a drain of the transistor M15 is electrically connected to a wiring VS, and the other of the source and the drain of the transistor M15 is electrically connected to one electrode of the capacitor C3 and a gate of the transistor M16. One of a source and a drain of the transistor M16 is electrically connected to a wiring V4, and the other is electrically connected to an anode of the light-emitting device 550 and one of a source and a drain of the transistor M17. A gate of the transistor M17 is electrically connected to a wiring MS, and the other of the source and the drain of the transistor M17 is electrically connected to a wiring OUT2. A cathode of the light-emitting device 550 is electrically connected to a wiring V5.

A constant potential is supplied to the wiring V4 and the wiring V5. In the light-emitting device 550, the anode side can have a high potential and the cathode side can have a lower potential than the anode side. The transistor M15 is controlled by a signal supplied to the wiring VG and functions as a selection transistor for controlling a selection state of the pixel circuit 530. The transistor M16 functions as a driving transistor that controls a current flowing through the light-emitting device 550 in accordance with a potential supplied to the gate of the transistor M16. When the transistor M15 is on, a potential supplied to the wiring VS is supplied to the gate of the transistor M16, and the luminance of the light-emitting device 550 can be controlled in accordance with the potential. The transistor M17 is controlled by a signal supplied to the wiring MS and has a function of outputting a potential between the transistor M16 and the light-emitting device 550 to the outside through the wiring OUT2.

Figure 12B:
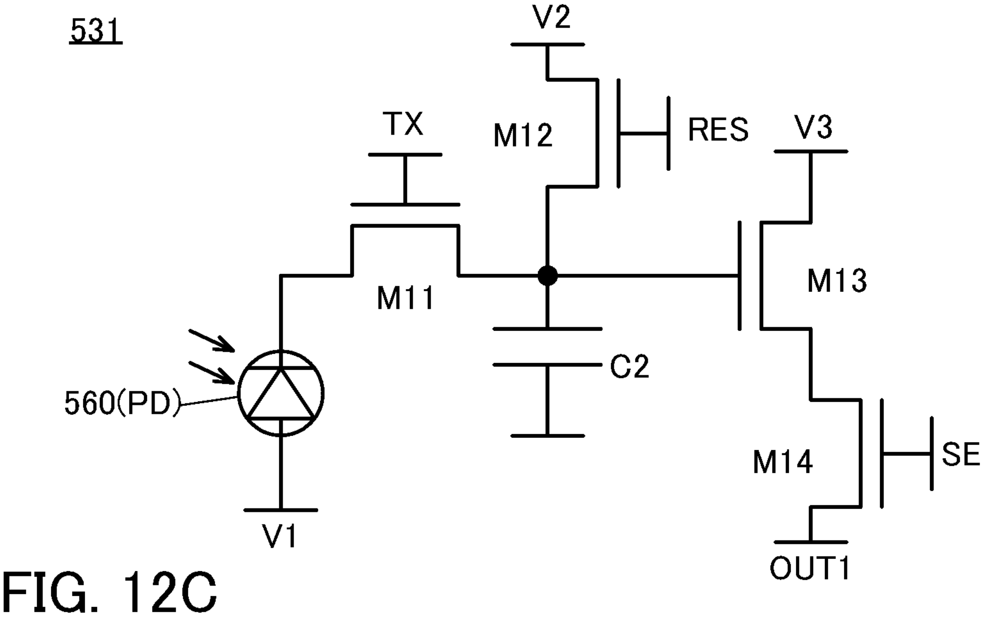

Here, a transistor in which a metal oxide (an oxide semiconductor) is used in a semiconductor layer where a channel is formed is preferably used as transistors M15, M16, and M17 included in the pixel circuit 530 in FIG. 12A and transistors M11, M12, M13, and M14 included in a pixel circuit 531 in FIG. 12B.

A transistor using a metal oxide having a wider band gap and a lower carrier density than silicon can achieve an extremely low off-state current. Such a low off-state current enables retention of charges accumulated in a capacitor that is connected in series with the transistor for a long time. Therefore, it is particularly preferable to use a transistor including an oxide semiconductor as the transistors M11, M12, and M15 each of which is connected in series with a capacitor C2 or the capacitor C3. When each of the other transistors also includes an oxide semiconductor, manufacturing cost can be reduced.

Alternatively, transistors using silicon as a semiconductor in which a channel is formed can be used as the transistors M11 to M17. It is particularly preferable to use silicon with high crystallinity such as single crystal silicon or polycrystalline silicon because high field-effect mobility can be achieved and higher-speed operation can be performed.

Alternatively, a transistor including an oxide semiconductor may be used as at least one of the transistors M11 to M17, and transistors including silicon may be used as the other transistors.

Next, an example of a pixel circuit of a subpixel including a light-receiving device is described with reference to FIG. 12B. The pixel circuit 531 illustrated in FIG. 12B includes a light-receiving device (PD) 560, the transistor M11, the transistor M12, the transistor M13, the transistor M14, and the capacitor C2. In the example illustrated here, a photodiode is used as the light-receiving device (PD) 560.

In FIG. 12B, an anode of the light-receiving device (PD) 560 is electrically connected to a wiring V1, and a cathode of the light-receiving device (PD) 560 is electrically connected to one of a source and a drain of the transistor M11. A gate of the transistor M11 is electrically connected to a wiring TX, and the other of the source and the drain of the transistor M11 is electrically connected to one electrode of the capacitor C2, one of a source and a drain of the transistor M12, and a gate of the transistor M13. A gate of the transistor M12 is electrically connected to a wiring RES, and the other of the source and the drain of the transistor M12 is electrically connected to a wiring V2. One of a source and a drain of the transistor M13 is electrically connected to a wiring V3, and the other of the source and the drain of the transistor M13 is electrically connected to one of a source and a drain of the transistor M14. A gate of the transistor M14 is electrically connected to a wiring SE, and the other of the source and the drain of the transistor M14 is electrically connected to a wiring OUT1.

A constant potential is supplied to the wiring V1, the wiring V2, and the wiring V3. When the light-receiving device (PD) 560 is driven with a reverse bias, the wiring V2 is supplied with a potential higher than the potential of the wiring V1. The transistor M12 is controlled by a signal supplied to the wiring RES and has a function of resetting the potential of a node connected to the gate of the transistor M13 to a potential supplied to the wiring V2. The transistor M11 is controlled by a signal supplied to the wiring TX and has a function of controlling the timing at which the potential of the node changes, in accordance with a current flowing through the light-receiving device (PD) 560. The transistor M13 functions as an amplifier transistor for outputting a signal corresponding to the potential of the node. The transistor M14 is controlled by a signal supplied to the wiring SE and functions as a selection transistor for reading an output corresponding to the potential of the node by an external circuit connected to the wiring OUT1.

Although n-channel transistors are illustrated in FIGS. 12A and 12B, p-channel transistors can alternatively be used.

The transistors included in the pixel circuit 530 and the transistors included in the pixel circuit 531 are preferably formed side by side over the same substrate. It is particularly preferable that the transistors included in the pixel circuit 530 and the transistors included in the pixel circuit 531 be periodically arranged in one region One or more layers including the transistor and/or the capacitor are preferably provided to overlap with the light-receiving device (PD) 560 or the light-emitting device (EL) 550. Thus, the effective area of each pixel circuit can be reduced, and a high-resolution light-receiving portion or display portion can be achieved.

Figure 12C:
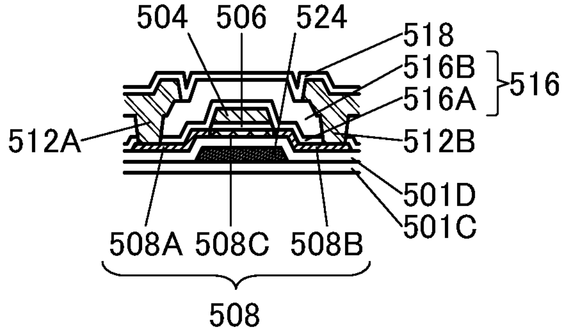

FIG. 12C illustrates an example of a specific structure of a transistor that can be used in the pixel circuit described with reference to FIGS. 12A and 12B. As the transistor, a bottom-gate transistor, a top-gate transistor, or the like can be used as appropriate.

The transistor illustrated in FIG. 12C includes a semiconductor film 508, a conductive film 504, an insulating film 506, a conductive film 512A, and a conductive film 512B. The transistor is formed over an insulating film 501C, for example. The transistor also includes an insulating film 516 (an insulating film 516A and an insulating film 516B) and an insulating film 518.

The semiconductor film 508 includes a region 508A electrically connected to the conductive film 512A and a region 508B electrically connected to the conductive film 512B. The semiconductor film 508 includes a region 508C between the region 508A and the region 508B.

The conductive film 504 includes a region overlapping with the region 508C and has a function of a gate electrode.

The insulating film 506 includes a region positioned between the semiconductor film 508 and the conductive film 504. The insulating film 506 has a function of a first gate insulating film.

The conductive film 512A has one of a function of a source electrode and a function of a drain electrode, and the conductive film 512B has the other.

A conductive film 524 can be used in the transistor. The semiconductor film 508 is positioned between the conductive film 504 and a region included in the conductive film 524. The conductive film 524 has a function of a second gate electrode. An insulating film 501D is positioned between the semiconductor film 508 and the conductive film 524 and has a function of a second gate insulating film.

The insulating film 516 functions as, for example, a protective film covering the semiconductor film 508. Specifically, a film including a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film can be used as the insulating film 516, for example.

For the insulating film 518, a material that has a function of inhibiting diffusion of oxygen, hydrogen, water, an alkali metal, an alkaline earth metal, and the like is preferably used. Specifically, the insulating film 518 can be formed using silicon nitride, silicon oxynitride, aluminum nitride, or aluminum oxynitride, for example. In each of silicon oxynitride and aluminum oxynitride, the number of nitrogen atoms contained is preferably larger than the number of oxygen atoms contained.

Note that in a step of forming the semiconductor film used in the transistor of the pixel circuit, the semiconductor film used in the transistor of the driver circuit can be formed. A semiconductor film having the same composition as the semiconductor film used in the transistor of the pixel circuit can be used in the driver circuit, for example.

For the semiconductor film 508, a semiconductor containing a Group 14 element can be used. Specifically, a semiconductor containing silicon can be used for the semiconductor film 508.

Hydrogenated amorphous silicon can be used for the semiconductor film 508. Microcrystalline silicon or the like can also be used for the semiconductor film 508. In such cases, it is possible to provide an apparatus having less display unevenness than an apparatus (including a light-emitting apparatus, a display panel, a display apparatus, and a light-emitting and light-receiving apparatus) using polysilicon for the semiconductor film 508, for example. Moreover, it is easy to increase the size of the apparatus.

Polysilicon can be used for the semiconductor film 508. In this case, for example, the field-effect mobility of the transistor can be higher than that of a transistor using hydrogenated amorphous silicon for the semiconductor film 508. For another example, the driving capability can be higher than that of a transistor using hydrogenated amorphous silicon for the semiconductor film 508. For another example, the aperture ratio of the pixel can be higher than that in the case of employing a transistor using hydrogenated amorphous silicon for the semiconductor film 508.

For another example, the reliability of the transistor can be higher than that of a transistor using hydrogenated amorphous silicon for the semiconductor film 508.

The temperature required for fabricating the transistor can be lower than that required for a transistor using single crystal silicon, for example.

The semiconductor film used in the transistor of the driver circuit can be formed in the same step as the semiconductor film used in the transistor of the pixel circuit. The driver circuit can be formed over a substrate where the pixel circuit is formed. The number of components of an electronic appliance can be reduced.

Single crystal silicon can be used for the semiconductor film 508. In this case, for example, the resolution can be higher than that of a light-emitting apparatus (or a display panel) using hydrogenated amorphous silicon for the semiconductor film 508. For another example, it is possible to provide a light-emitting apparatus having less display unevenness than a light-emitting apparatus using polysilicon for the semiconductor film 508. For another example, smart glasses or ahead-mounted display can be provided.

A metal oxide can be used for the semiconductor film 508. In this case, the pixel circuit can hold an image signal for a longer time than a pixel circuit including a transistor that uses amorphous silicon for the semiconductor film. Specifically, a selection signal can be supplied at a frequency of lower than 30 Hz, preferably lower than 1 Hz, further preferably less than once per minute while flickering is suppressed. Consequently, fatigue of a user of an electronic device can be reduced. Furthermore, power consumption for driving can be reduced.

An oxide semiconductor can be used for the semiconductor film 508. Specifically, an oxide semiconductor containing indium, an oxide semiconductor containing indium, gallium, and zinc, or an oxide semiconductor containing indium, gallium, zinc, and tin can be used for the semiconductor film 508.

The use of an oxide semiconductor for the semiconductor film achieves a transistor having lower leakage current in the off state than a transistor using amorphous silicon for the semiconductor film. Thus, a transistor using an oxide semiconductor for the semiconductor film is preferably used as a switch or the like. Note that a circuit in which a transistor using an oxide semiconductor for the semiconductor film is used as a switch is capable of retaining the potential of a floating node for a longer time than a circuit in which a transistor using amorphous silicon for the semiconductor film is used as a switch.

In the case of using an oxide semiconductor in a semiconductor film, the light-emitting and light-receiving apparatus 720 includes a light-emitting device including an oxide semiconductor in its semiconductor film and having a metal maskless (MML) structure. With this structure, the leakage current that might flow through the transistor and the leakage current that might flow between adjacent light-emitting devices (also referred to as a lateral leakage current, a side leakage current, or the like) can become extremely low. With the structure, a viewer can notice any one or more of the image crispness, the image sharpness, a high chroma, and a high contrast ratio in an image displayed on the display apparatus. When the leakage current that might flow through the transistor and the lateral leakage current that might flow between light-emitting devices are extremely low, display with little leakage of light at the time of black display (i.e., with few phenomena in which the black image looks whitish) (such display is also referred to as deep black display) can be achieved.

In particular, in the case where a light-emitting device having an MML structure employs the above-described SBS structure, a layer provided between light-emitting devices (for example, also referred to as an organic layer or a common layer which is commonly used between the light-emitting devices) is disconnected; accordingly, display with no or extremely small lateral leakage can be achieved.

Figure 13:
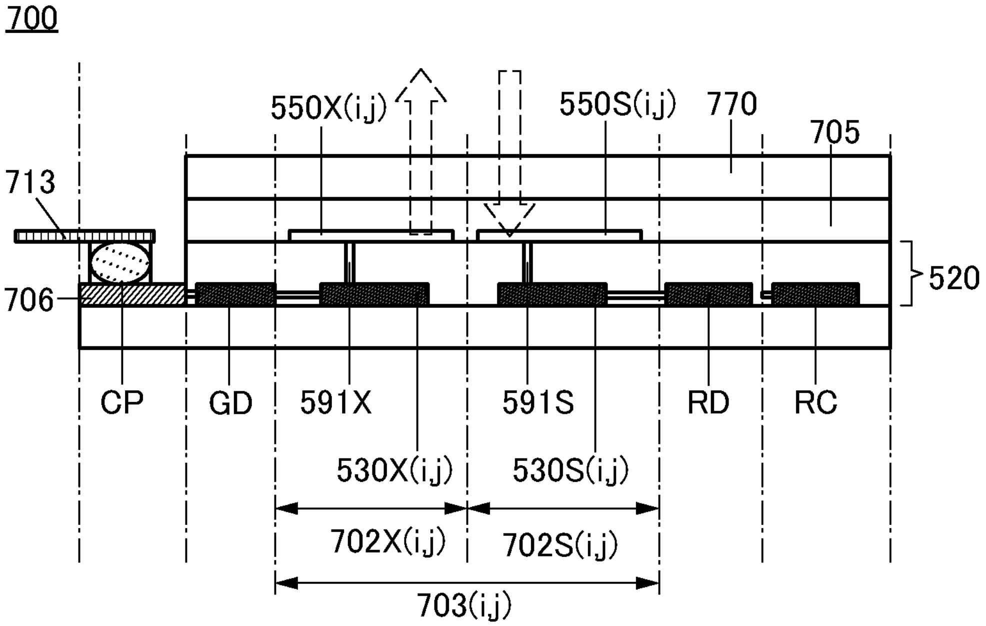
FIG. 13 illustrates a light-emitting and light-receiving apparatus of an embodiment.

Next, a cross-sectional view of a light-emitting and light-receiving apparatus is shown. FIG. 13 is a cross-sectional view of the light-emitting and light-receiving apparatus illustrated in FIG. 11A.

FIG. 13 is a cross-sectional view of part of a region including the FPC 713 and the wiring 706 and part of the display region 701 including the pixel 703(*i, j*).

In FIG. 13, the light-emitting and light-receiving apparatus 700 includes the functional layer 520 between the first substrate 510 and the second substrate 770. The functional layer 520 includes, as well as the above-described transistors (M11, M12, M13, M14, M15, M16, and M17), the capacitor (C2 and C3), and the like described with reference to FIGS. 12A to 12C, wirings (VS, VG, V1, V2, V3, V4, and V5) electrically connected to these components, for example. Although the functional layer 520 includes a pixel circuit 530X(i, j), a pixel circuit 530S(i, j), and the driver circuit GD in FIG. 13, one embodiment of the present invention is not limited thereto.

Furthermore, each pixel circuit (e.g., the pixel circuit 530X(i, j) and the pixel circuit 530S(i, j) in FIG. 13) included in the functional layer 520 is electrically connected to a light-emitting device (e.g., a light-emitting device 550X(i, j) and a light-receiving device 550S(i, j) in FIG. 13) formed over the functional layer 520. Specifically, the light-emitting device 550X(i, j) is electrically connected to the pixel circuit 530X(i, j) through a wiring 591X, and the light-receiving device 550S(i, j) is electrically connected to the pixel circuit 530S(i, j) through a wiring 591S. The insulating layer 705 is provided over the functional layer 520, the light-emitting devices, and the light-receiving device, and has a function of attaching the second substrate 770 and the functional layer 520.

As the second substrate 770, a substrate where touch sensors are arranged in a matrix can be used. For example, a substrate provided with capacitive touch sensors or optical touch sensors can be used as the second substrate 770. Thus, the light-emitting and light-receiving apparatus of one embodiment of the present invention can be used as a touch panel.

The structures described in this embodiment can be used in appropriate combination with any of the structures described in the other embodiments.

Embodiment 5

In this embodiment, structures of electronic devices of embodiments of the present invention will be described with reference to FIGS. 14A to 14E, FIGS. 15A to 15E, and FIGS. 16A and 16B. Note that the electronic devices described in this embodiment can each include a light-emitting and light-receiving apparatus of one embodiment of the present invention.

Figure 14A:
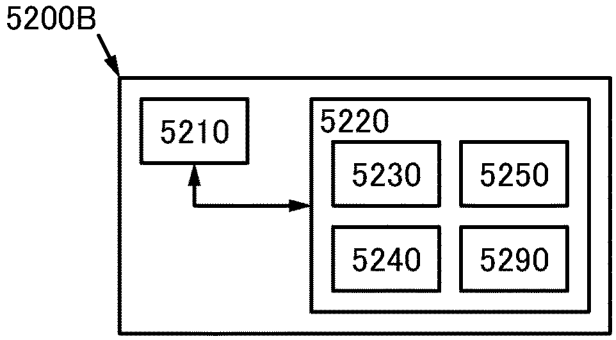
FIGS. 14A to 14E illustrate electronic devices of an embodiment.
Figure 14B:
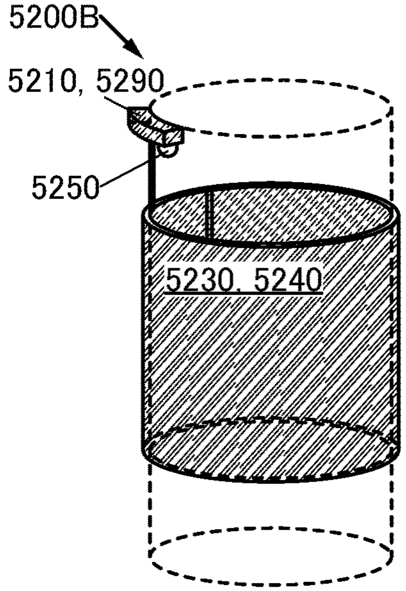
Figure 14C:
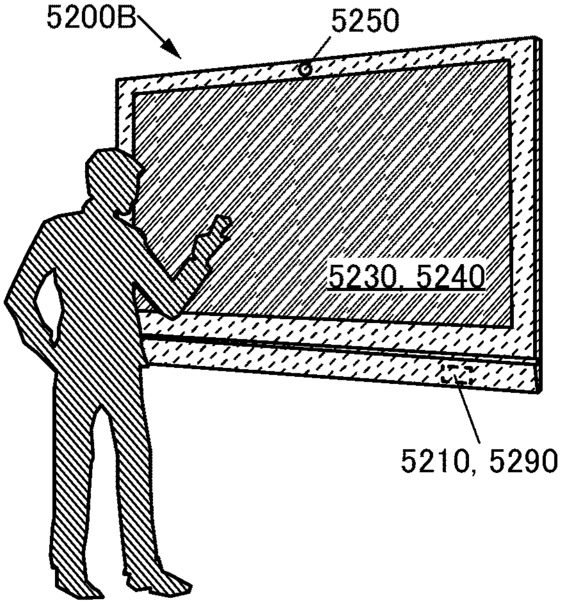
Figure 14D:
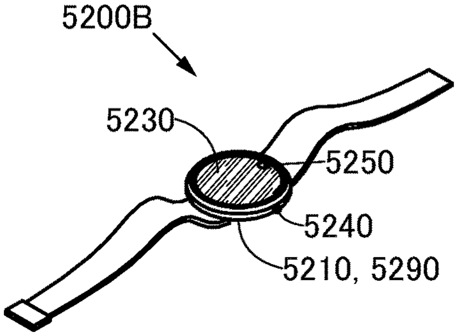
Figure 14E:
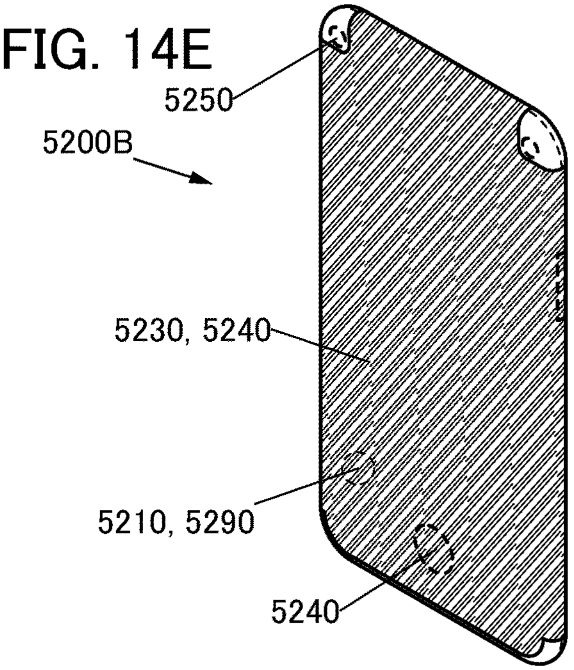
Figure 15A:
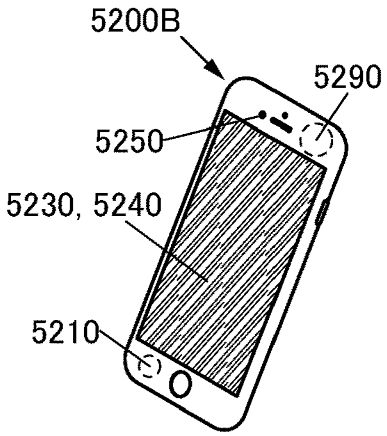
FIGS. 15A to 15E illustrate electronic devices of an embodiment.
Figure 15B:
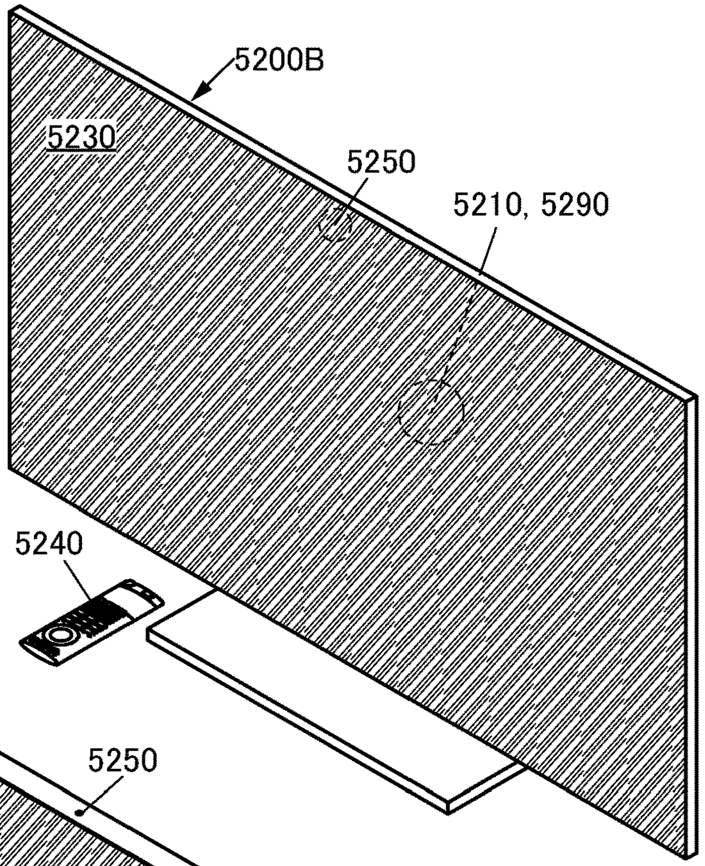
Figure 15C:
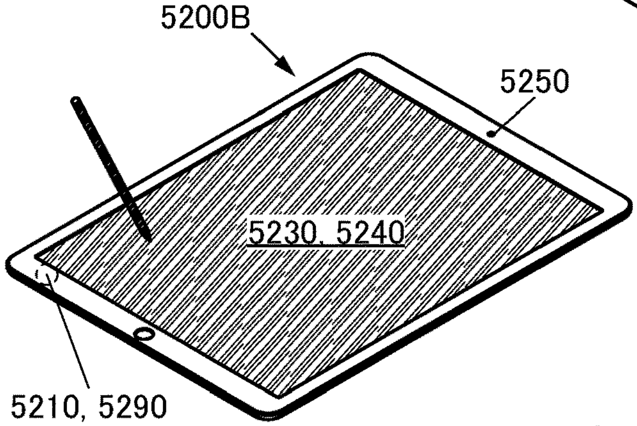
Figure 15D:
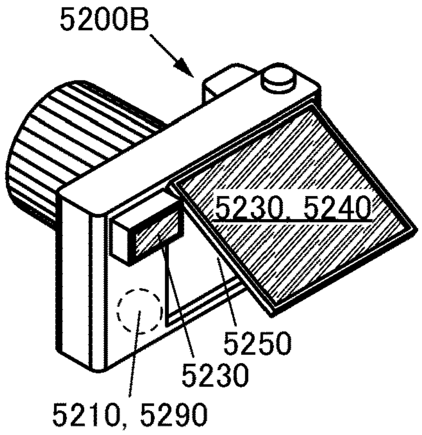
Figure 15E:
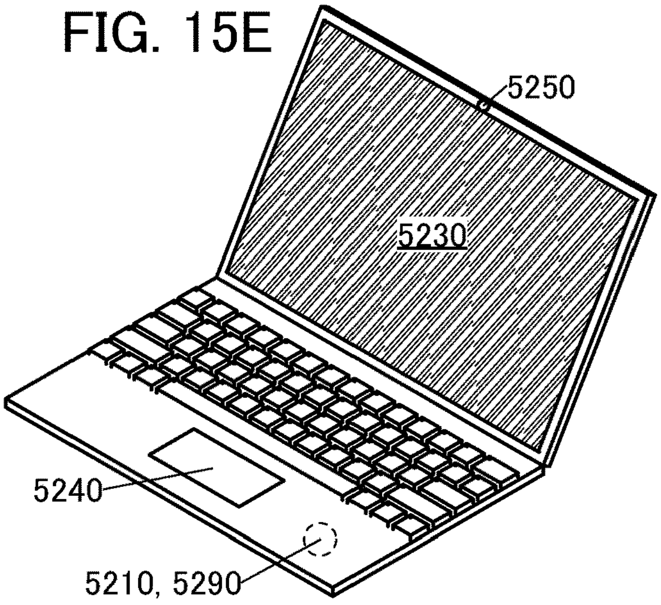
Figure 16A:
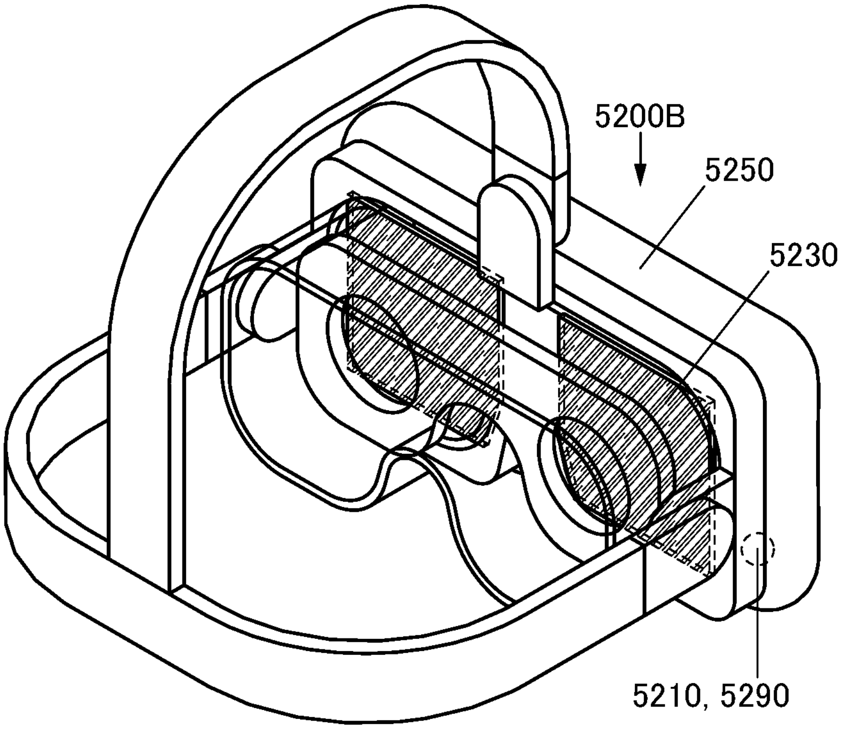
FIGS. 16A and 16B illustrate electronic devices of an embodiment.
Figure 16B:
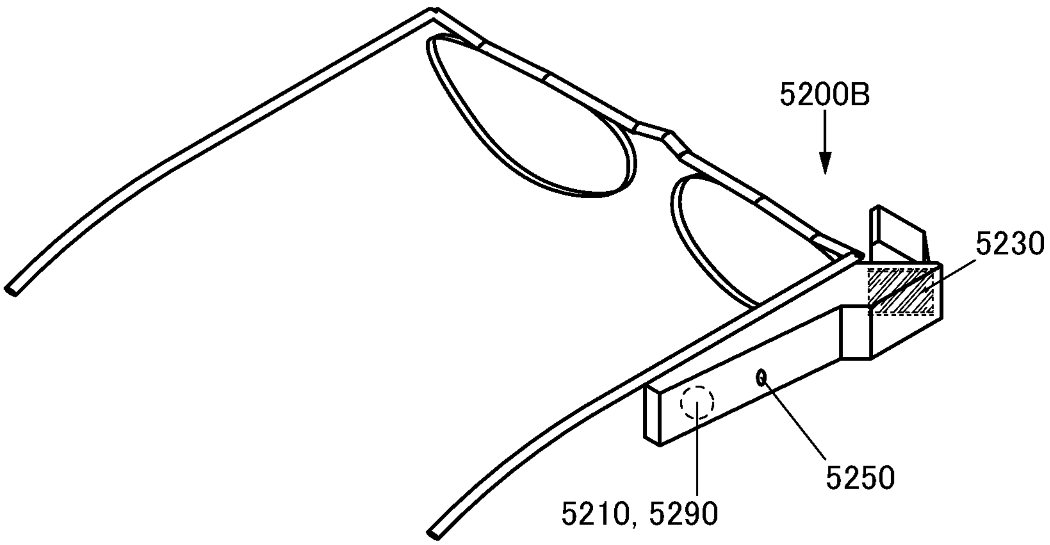

FIGS. 14A to 14E, FIGS. 15A to 15E, and FIGS. 16A and 16B each illustrate a structure of the electronic device of one embodiment of the present invention. FIG. 14A is a block diagram of the electronic device and FIGS. 14B to 14E are perspective views illustrating structures of the electronic device. FIGS. 15A to 15E are perspective views illustrating structures of the electronic device. FIGS. 16A and 16B are perspective views illustrating structures of the electronic device.

An electronic device 5200B described in this embodiment includes an arithmetic device 5210 and an input/output device 5220 (see FIG. 14A).

The arithmetic device 5210 has a function of receiving handling data and a function of supplying image data on the basis of the handling data.

The input/output device 5220 includes a display unit 5230, an input unit 5240, a sensor unit 5250, and a communication unit 5290, and has a function of supplying handling data and a function of receiving image data. The input/output device 5220 also has a function of supplying sensing data, a function of supplying communication data, and a function of receiving communication data.

The input unit 5240 has a function of supplying handling data. For example, the input unit 5240 supplies handling data on the basis of handling by a user of the electronic device 5200B.

Specifically, a keyboard, a hardware button, a pointing device, a touch sensor, an illuminance sensor, an imaging device, an audio input device, an eye-gaze input device, an attitude sensing device, or the like can be used as the input unit 5240.

The display unit 5230 includes a display panel and has a function of displaying image data. For example, the display panel described in Embodiment 3 can be used for the display unit 5230.

The sensor unit 5250 has a function of supplying sensing data. For example, the sensor unit 5250 has a function of sensing a surrounding environment where the electronic device is used and supplying the sensing data.

Specifically, an illuminance sensor, an imaging device, an attitude sensing device, a pressure sensor, a human motion sensor, or the like can be used as the sensor unit 5250.

The communication unit 5290 has a function of receiving and supplying communication data. For example, the communication unit 5290 has a function of being connected to another electronic device or a communication network by wireless communication or wired communication. Specifically, the communication unit 5290 has a function of wireless local area network communication, telephone communication, near field communication, or the like.

FIG. 14B illustrates an electronic device having an outer shape along a cylindrical column or the like. An example of such an electronic device is digital signage. The display panel of one embodiment of the present invention can be used for the display unit 5230. The electronic device may have a function of changing its display method in accordance with the illuminance of a usage environment. The electronic device has a function of changing the displayed content when sensing the existence of a person. Thus, for example, the electronic device can be provided on a column of a building. The electronic device can display advertising, guidance, or the like. The electronic device can be used for digital signage or the like.

FIG. 14C illustrates an electronic device having a function of generating image data on the basis of the path of a pointer used by the user. Examples of such an electronic device include an electronic blackboard, an electronic bulletin board, and digital signage. Specifically, a display panel with a diagonal size of 20 inches or longer, preferably 40 inches or longer, further preferably 55 inches or longer can be used. A plurality of display panels can be arranged and used as one display region. Alternatively, a plurality of display panels can be arranged and used as a multiscreen.

FIG. 14D illustrates an electronic device that is capable of receiving data from another device and displaying the data on the display unit 5230. An example of such an electronic device is a wearable electronic device. Specifically, the electronic device can display several options, and the user can choose some from the options and send a reply to the data transmitter. As another example, the electronic device has a function of changing its display method in accordance with the illuminance of a usage environment. Thus, for example, power consumption of the wearable electronic device can be reduced. As another example, the wearable electronic device can display an image so as to be suitably used even in an environment under strong external light, e.g., outdoors in fine weather.

FIG. 14E illustrates an electronic device including the display unit 5230 having a surface gently curved along a side surface of a housing. An example of such an electronic device is a mobile phone. The display unit 5230 includes a display panel that has a function of displaying images on the front surface, the side surfaces, the top surface, and the rear surface, for example. Thus, a mobile phone can display data on not only its front surface but also its side surfaces, top surface, and rear surface, for example.

FIG. 15A illustrates an electronic device that is capable of receiving data via the Internet and displaying the data on the display unit 5230. An example of such an electronic device is a smartphone. For example, the user can check a created message on the display unit 5230 and send the created message to another device. As another example, the electronic device has a function of changing its display method in accordance with the illuminance of a usage environment. Thus, power consumption of the smartphone can be reduced. As another example, it is possible to obtain a smartphone which can display an image such that the smartphone can be suitably used in an environment under strong external light, e.g., outdoors in fine weather.

FIG. 15B illustrates an electronic device that can use a remote controller as the input unit 5240. An example of such an electronic device is a television system. For example, data received from a broadcast station or via the Internet can be displayed on the display unit 5230. The electronic device can take an image of the user with the sensor unit 5250 and transmit the image of the user. The electronic device can acquire a viewing history of the user and provide it to a cloud service. The electronic device can acquire recommendation data from a cloud service and display the data on the display unit 5230. A program or a moving image can be displayed on the basis of the recommendation data. As another example, the electronic device has a function of changing its display method in accordance with the illuminance of a usage environment. Accordingly, it is possible to obtain a television system which can display an image such that the television system can be suitably used even when irradiated with strong external light that enters the room from the outside in fine weather.

FIG. 15C illustrates an electronic device that is capable of receiving educational materials via the Internet and displaying them on the display unit 5230. An example of such an electronic device is a tablet computer. The user can input an assignment with the input unit 5240 and send it via the Internet. The user can obtain a corrected assignment or the evaluation from a cloud service and have it displayed on the display unit 5230. The user can select suitable educational materials on the basis of the evaluation and have them displayed.

For example, an image signal can be received from another electronic device and displayed on the display unit 5230. When the electronic device is placed on a stand or the like, the display unit 5230 can be used as a sub-display. Thus, for example, it is possible to obtain a tablet computer which can display an image such that the tablet computer is suitably used even in an environment under strong external light, e.g., outdoors in fine weather.

FIG. 15D illustrates an electronic device including a plurality of display units 5230. An example of such an electronic device is a digital camera. For example, the display unit 5230 can display an image that the sensor unit 5250 is capturing. A captured image can be displayed on the sensor unit. A captured image can be decorated using the input unit 5240. A message can be attached to a captured image. A captured image can be transmitted via the Internet. The electronic device has a function of changing shooting conditions in accordance with the illuminance of a usage environment. Accordingly, for example, it is possible to obtain a digital camera that can display a subject such that an image is suitably viewed even in an environment under strong external light, e.g., outdoors in fine weather.

FIG. 15E illustrates an electronic device in which the electronic device of this embodiment is used as a master to control another electronic device used as a slave. An example of such an electronic device is a portable personal computer. For example, part of image data can be displayed on the display unit 5230 and another part of the image data can be displayed on a display unit of another electronic device. Image signals can be supplied. Data written from an input unit of another electronic device can be obtained with the communication unit 5290. Thus, a large display region can be utilized in the case of using a portable personal computer, for example.

FIG. 16A illustrates an electronic device including the sensor unit 5250 that senses an acceleration or a direction. An example of such an electronic device is a goggles-type electronic device. The sensor unit 5250 can supply data on the position of the user or the direction in which the user faces. The electronic device can generate image data for the right eye and image data for the left eye in accordance with the position of the user or the direction in which the user faces. The display unit 5230 includes a display region for the right eye and a display region for the left eye. Thus, a virtual reality image that gives the user a sense of immersion can be displayed on the goggles-type electronic device, for example.

FIG. 16B illustrates an electronic device including an imaging device and the sensor unit 5250 that senses an acceleration or a direction. An example of such an electronic device is a glasses-type electronic device. The sensor unit 5250 can supply data on the position of the user or the direction in which the user faces. The electronic device can generate image data in accordance with the position of the user or the direction in which the user faces. Accordingly, the data can be shown together with a real-world scene, for example. Alternatively, an augmented reality image can be displayed on the glasses-type electronic device.

Note that this embodiment can be combined with any of the other embodiments in this specification as appropriate.

Example

This example describes measurement results of the characteristics of fabricated light-receiving devices (devices 1 to 8) of one embodiment of the present invention described in the above embodiments.

Figure 17:
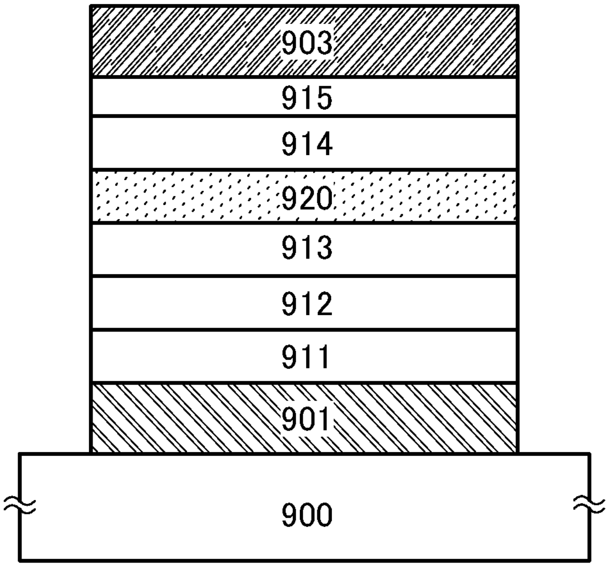
FIG. 17 illustrates the structure of devices 1 to 8.

Structural formulae of organic compounds used for the devices 1 to 8 are shown below.

first electrode 901 formed over a glass substrate 900, and a second electrode 903 is stacked over the electron-injection layer 915, as illustrated in FIG. 17.

First, a reflective film was formed over the glass substrate 900. Specifically, the reflective film was formed to a thickness of 100 nm by a sputtering method using an alloy containing silver (Ag), palladium (Pd), and copper (Cu) (abbreviation: APC) as a target. Then, indium oxide-tin oxide containing silicon or silicon oxide (abbreviation: ITSO) was deposited by a sputtering method, whereby the first electrode 901 was formed. The thickness of the first electrode 901 was 100 nm and the electrode area was 4 $mm^2$ (2 mm×2 mm).

Next, in pretreatment for forming the light-receiving device over the substrate, a surface of the substrate was

[Chemical Formulae 65]

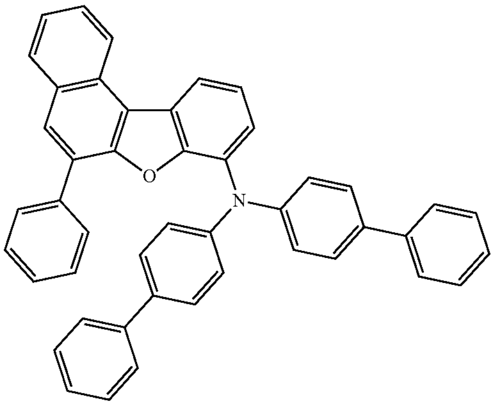

BBABnf

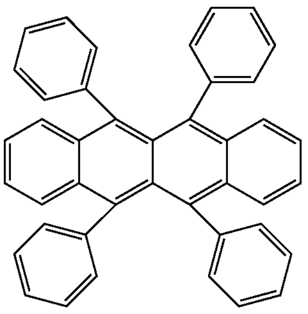

Rubrene

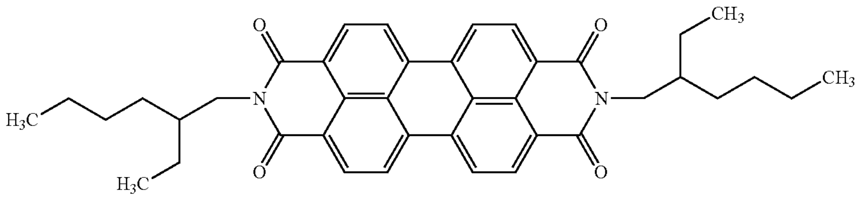

EtHex-PTCDI

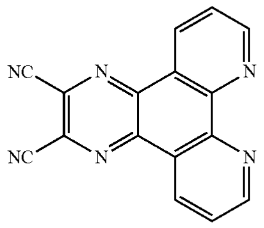

PPDN

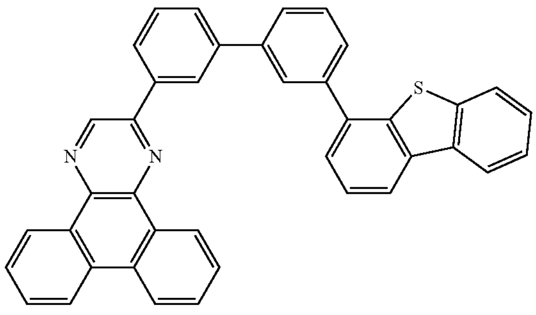

2mDBTBPDBq-II

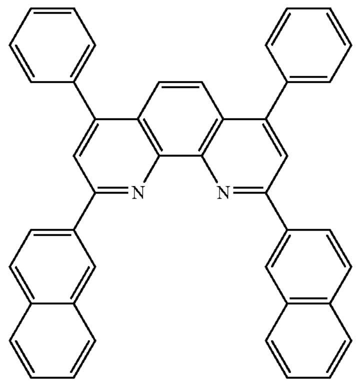

NBPhen (Method for Fabricating Device 1)

The device 1 has a structure in which a hole-injection layer 911, a hole-transport layer 912, an active layer 913, a buffer layer 920, an electron-transport layer 914, and an electron-injection layer 915 are stacked in this order over a washed with water and baking was performed at 200° C. for one hour. Then, the substrate was transferred into a vacuum evaporation apparatus where the pressure was reduced to approximately $10^{-4}$ Pa, and vacuum baking was performed at 180° C. for 60 minutes in a heating chamber of the vacuum evaporation apparatus. After that, natural cooling was performed to 30° C. or lower.

Next, the substrate provided with the first electrode 901 was fixed to a substrate holder provided in the vacuum evaporation apparatus in such a manner that the side over which the first electrode 901 was formed faced downward. Then, N,N-bis(4-biphenyl)-6-phenylbenzo[b]naphtho[1,2-d]furan-8-amine (abbreviation: BBABnf) and an electron acceptor material (OCHD-003) including fluorine at a molecular weight of 672 were deposited over the first electrode 901 to a thickness of 11 nm by a co-evaporation method using resistance heating at a weight ratio of BBABnf to OCHD-003=1:0.1, whereby the hole-injection layer 911 was formed.

Subsequently, over the hole-injection layer 911, BBABnf was deposited by evaporation to a thickness of 40 nm to form the hole-transport layer 912.

After that, over the hole-transport layer 912, Rubrene was deposited by evaporation to a thickness of 42 nm, and then N,N-bis(2-ethylhexyl)-3,4,9,10-perylenetetracarboxylic diimide (abbreviation: EtHex-PTCDI) was deposited by evaporation to a thickness of 18 nm, whereby the active layer 913 was formed.

Next, pyrazino[2,3-f][1,10]phenanthroline-2,3-dicarbonitrile (abbreviation: PPDN) was deposited by evaporation to a thickness of 15 nm over the active layer 913, whereby the buffer layer 920 was formed.

Then, over the buffer layer 920, 2-[3'-(dibenzothiophen-4-yl)biphenyl-3-yl]dibenzo[f,h]quinoxaline (abbreviation: 2mDBTBPDBq-II) was deposited by evaporation to a thickness of 10 nm, and then 2,9-di(naphthalen-2-yl)-4,7-diphenyl-1,10-phenanthroline (abbreviation: NBPhen) was deposited by evaporation to a thickness of 10 nm, whereby the electron-transport layer 914 was formed.

Next, lithium fluoride (LiF) was deposited by evaporation to a thickness of 1 nm over the electron-transport layer 914, whereby the electron-injection layer 915 was formed.

Subsequently, over the electron-injection layer 915, Ag and Mg were deposited by co-evaporation to a thickness of 10 nm in a volume ratio of Ag:Mg=1:0.1 to form the device 1. Note that the second electrode 903 is a semi-transmissive and semi-reflective electrode having functions of transmitting light and reflecting light.

Next, methods for fabricating the devices 2 to 8 will be described.

(Method for Fabricating Device 2)

The device 2 is different from the device 1 in the thickness of the electron-transport layer 914. In other words, the device 2 was fabricated in the same manner as the device 1 except that the electron-transport layer 914 was formed by depositing 2mDBTBPDBq-II by evaporation to a thickness of 10 nm over the buffer layer 920 and then depositing NBPhen by evaporation to a thickness of 20 nm.

(Method for Fabricating Device 3)

The device 3 is different from the device 1 in the thickness of each layer included in the active layer 913. In other words, the device 3 was fabricated in the same manner as the device 1 except that the active layer 913 was formed by depositing Rubrene by evaporation to a thickness of 30 nm over the hole-transport layer 912 and then depositing EtHex-PTCDI by evaporation to a thickness of 30 nm.

(Method for Fabricating Device 4)

The device 4 is different from the device 3 in the thickness of the electron-transport layer 914. In other words, the device 4 was fabricated in the same manner as the device 3 except that the electron-transport layer 914 was formed by depositing 2mDBTBPDBq-II by evaporation to a thickness of 10 nm over the buffer layer 920 and then depositing NBPhen by evaporation to a thickness of 20 nm.

(Method for Fabricating Device 5)

The device 5 is different from the device 1 in that the active layer 913 is a mixed layer. In other words, the device 5 was fabricated in the same manner as the device 1 except that the active layer 913 was formed by depositing Rubrene and EtHex-PTCDI by co-evaporation to a thickness of 60 nm over the hole-transport layer 912 at a weight ratio of Rubrene:EtHex-PTCDI=0.7:0.3.

(Method for Fabricating Device 6)

The device 6 is different from the device 5 in the thickness of the electron-transport layer 914. In other words, the device 6 was fabricated in the same manner as the device 5 except that the electron-transport layer 914 was formed by depositing 2mDBTBPDBq-II by evaporation to a thickness of 10 nm over the buffer layer 920 and then depositing NBPhen by evaporation to a thickness of 20 nm.

(Method for Fabricating Device 7)

The device 7 is different from the device 5 in the mixing ratio in the active layer 913. In other words, the device 7 was fabricated in the same manner as the device 5 except that the active layer 913 was formed by depositing Rubrene and EtHex-PTCDI by co-evaporation to a thickness of 60 nm over the hole-transport layer 912 at a weight ratio of Rubrene:EtHex-PTCDI=0.5:0.5.

(Method for Fabricating Device 8)

The device 8 is different from the device 7 in the thickness of the electron-transport layer 914. In other words, the device 8 was fabricated in the same manner as the device 7 except that the electron-transport layer 914 was formed by depositing 2mDBTBPDBq-II by evaporation to a thickness of 10 nm over the buffer layer 920 and then depositing NBPhen by evaporation to a thickness of 20 nm.

The structures of the devices 1 to 8 are listed in the following table.

TABLE 1

| | Thickness | Device 1 | Device 2 | Device 3 | Device 4 | Device 5 | Device 6 | Device 7 | Device 8 |
|---|---|---|---|---|---|---|---|---|---|
| Second electrode | 10 nm | Ag:Mg (1:1.01) | | | | | | | |
| Electron-injection layer | 1 nm | LiF | | | | | | | |
| Electron-transport layer | — | NBPhen | | | | | | | |
| | | 10 nm | 20 nm | 10 nm | 20 nm | 10 nm | 20 nm | 10 nm | 20 nm |
| | 10 nm | 2mDBTBPDBq-II | | | | | | | |
| Buffer layer | 15 nm | PPDN | | | | | | | |
| Active layer | 60 nm | EtHex-PTCDI | | | | Rubrene:EtHex-PTCDI (0.7:0.3) | | Rubrene:EtHex-PTCDI (0.5:0.5) | |
| | | 18 nm | | 30 nm | | | | | |
| | | Rubrene | | | | | | | |
| | | 42 nm | | 30 nm | | | | | |

TABLE 1-continued

| | Thickness | Device 1 | Device 2 | Device 3 | Device 4 | Device 5 | Device 6 | Device 7 | Device 8 |
|---|---|---|---|---|---|---|---|---|---|
| Hole-transport layer | 40 nm | BBABnf | | | | | | | |
| Hole-injection layer | 11 nm | BBABnf:OCHD-003 (1:0.1) | | | | | | | |
| First electrode | 100 nm | ITSO | | | | | | | |
| Reflective film | 100 nm | APC | | | | | | | |

Furthermore, the LUMO levels of the materials used for the active layers, the buffer layers, and the electron-transport layers of the devices 1 to 8 are listed in the following table. The LUMO levels were obtained by cyclic voltammetry (CV) measurement. An electrochemical analyzer (ALS model 600A or 600C, produced by BAS Inc.) was used for the measurement.

TABLE 2

| | LUMO level |
|---|---|
| EtHex-PTCDI | −4.1 eV |
| PPDN | −3.8 eV |
| 2mDBTBPDBq-II | −2.94 eV |

Next, various kinds of measurements were performed on the devices 1 to 8 fabricated by the above fabrication methods.

<Spectral Sensitivity>

Figure 18:
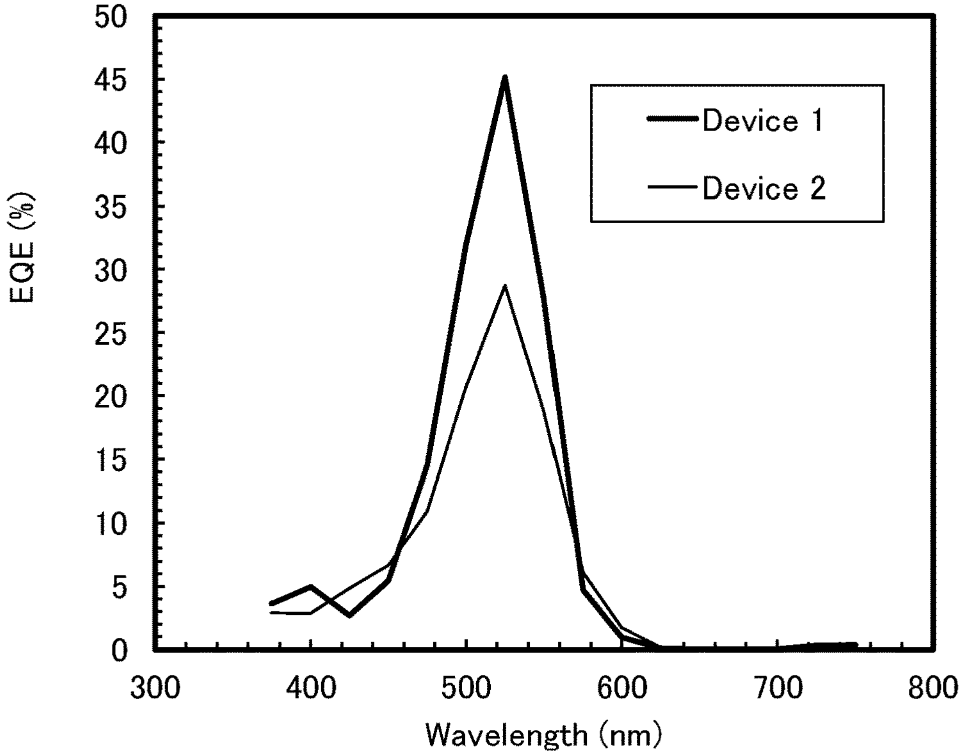
FIG. 18 shows the spectral sensitivities of the devices 1 and 2.
Figure 21:
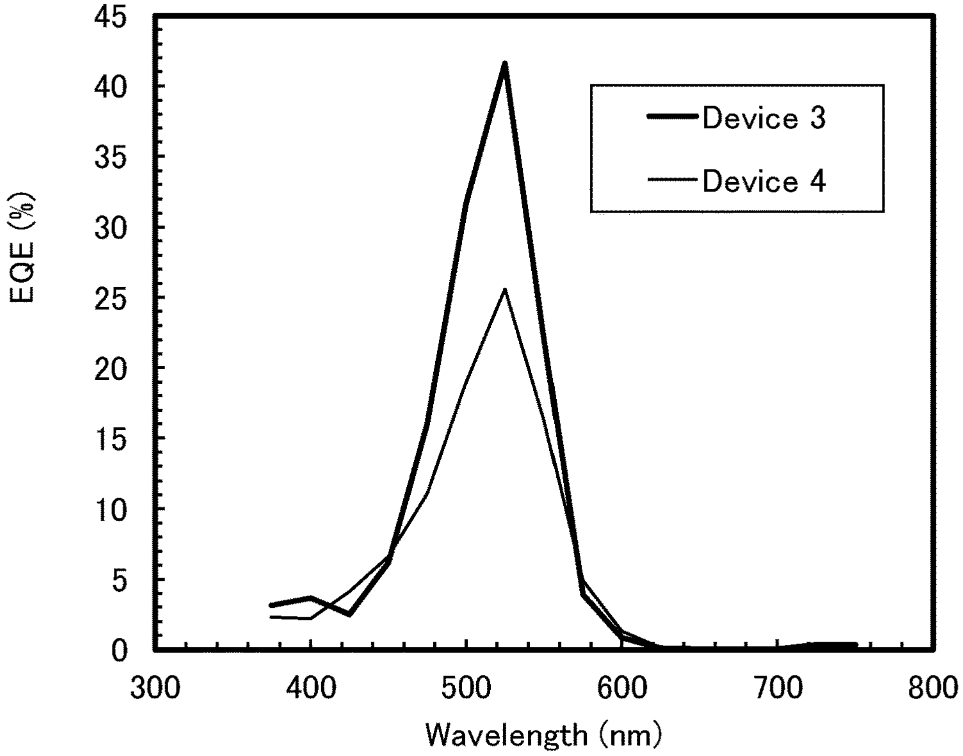
FIG. 21 shows the spectral sensitivities of the devices 3 and 4.
Figure 24:
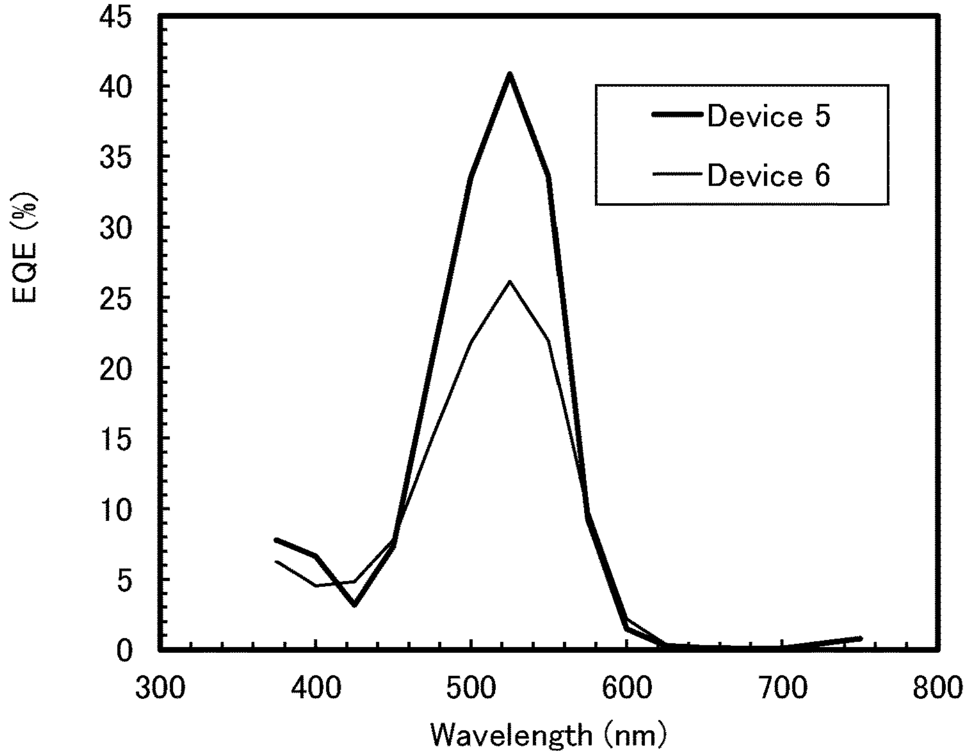
FIG. 24 shows the spectral sensitivities of the devices 5 and 6.
Figure 27:
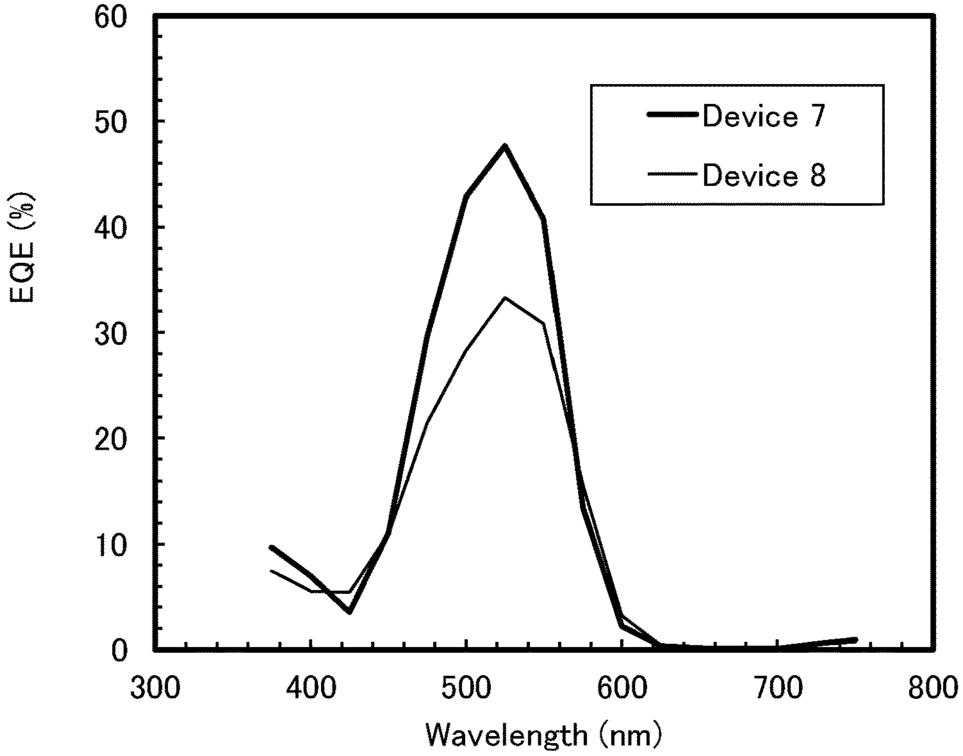
FIG. 27 shows the spectral sensitivities of the devices 7 and 8.

FIG. 18 shows wavelength dependence of the external quantum efficiency (EQE) of the devices 1 and 2, FIG. 21 shows wavelength dependence of EQE of the devices 3 and 4, FIG. 24 shows wavelength dependence of EQE of the devices 5 and 6, and FIG. 27 shows wavelength dependence of EQE of the devices 7 and 8. EQE was measured at an irradiance of 12.5 $\mu W/cm^2$ at different voltages and wavelengths. In FIGS. 18, 21, 24, and 27, the horizontal axis represents wavelength $\lambda$ and the vertical axis represents EQE. As shown in FIGS. 18, 21, 24, and 27, it was found that the devices 1 to 8 each had high light-receiving sensitivity to visible light.

<Current Density-Voltage Characteristics>

Figure 19:
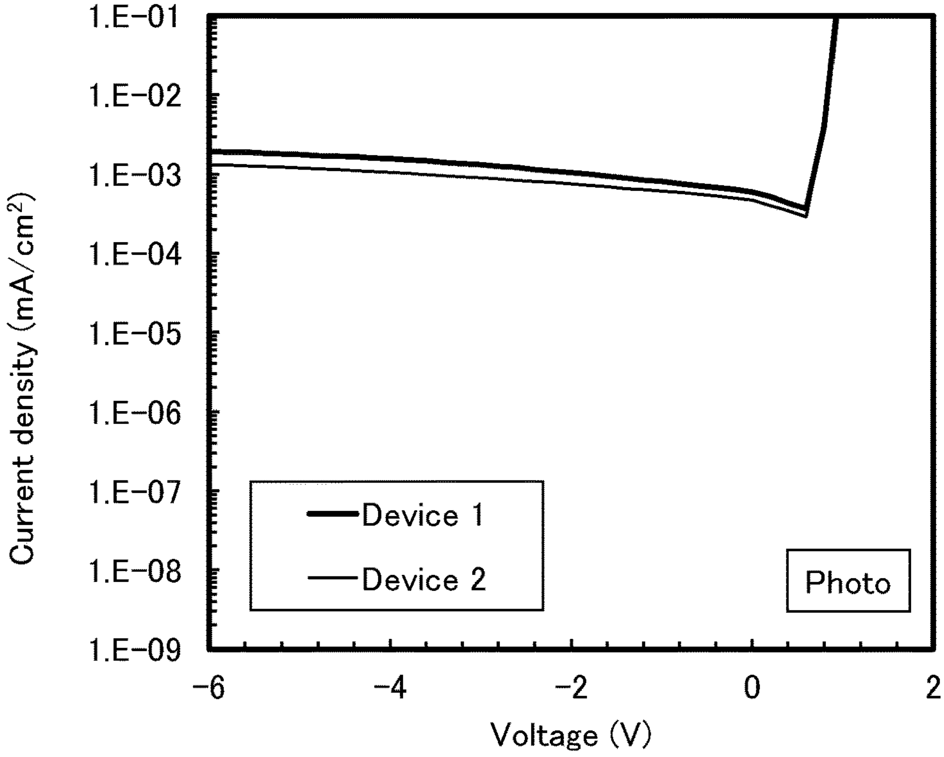
FIG. 19 shows the voltage-current density characteristics of the devices 1 and 2 in the state of being irradiated with light.
Figure 20:
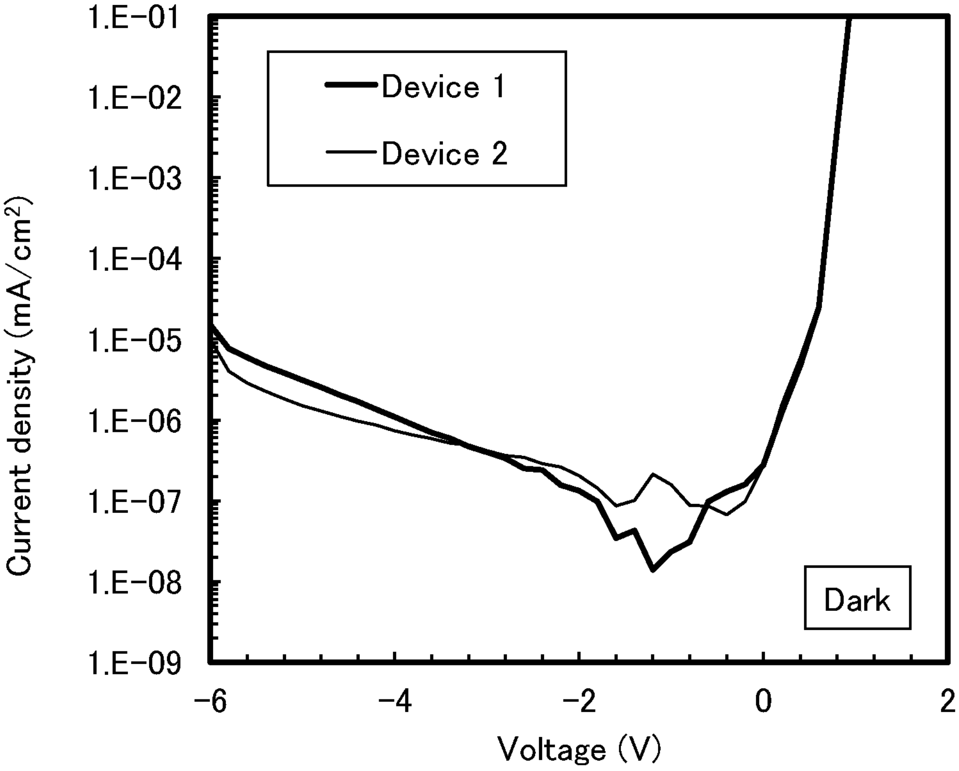
FIG. 20 shows the voltage-current density characteristics of the devices 1 and 2 in a dark state.
Figure 22:
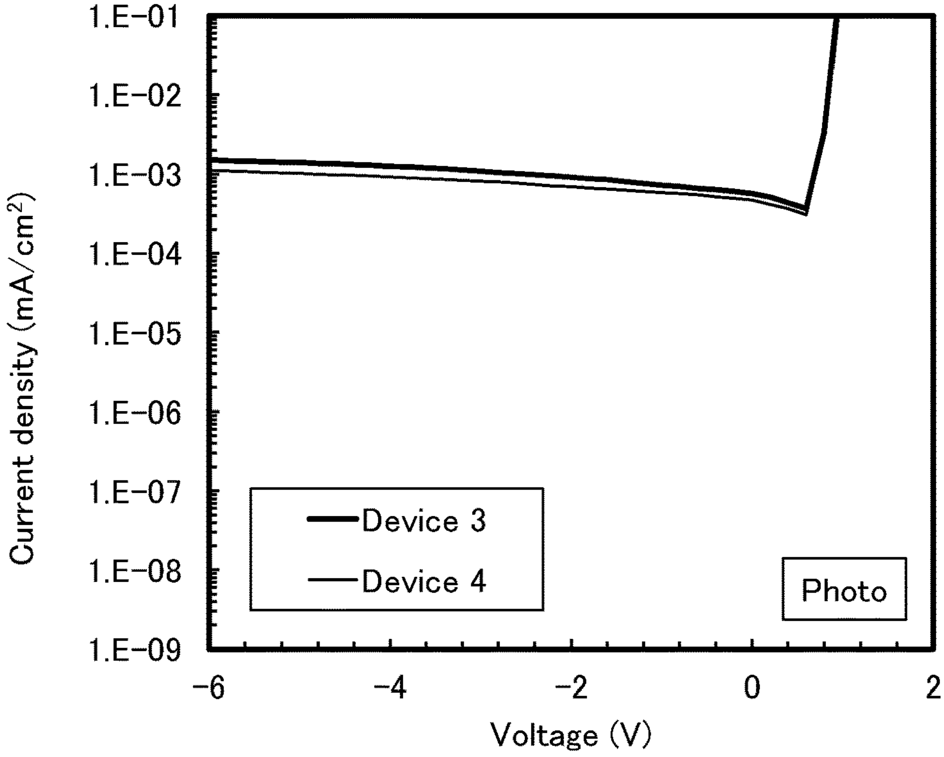
FIG. 22 shows the voltage-current density characteristics of the devices 3 and 4 in the state of being irradiated with light.
Figure 23:
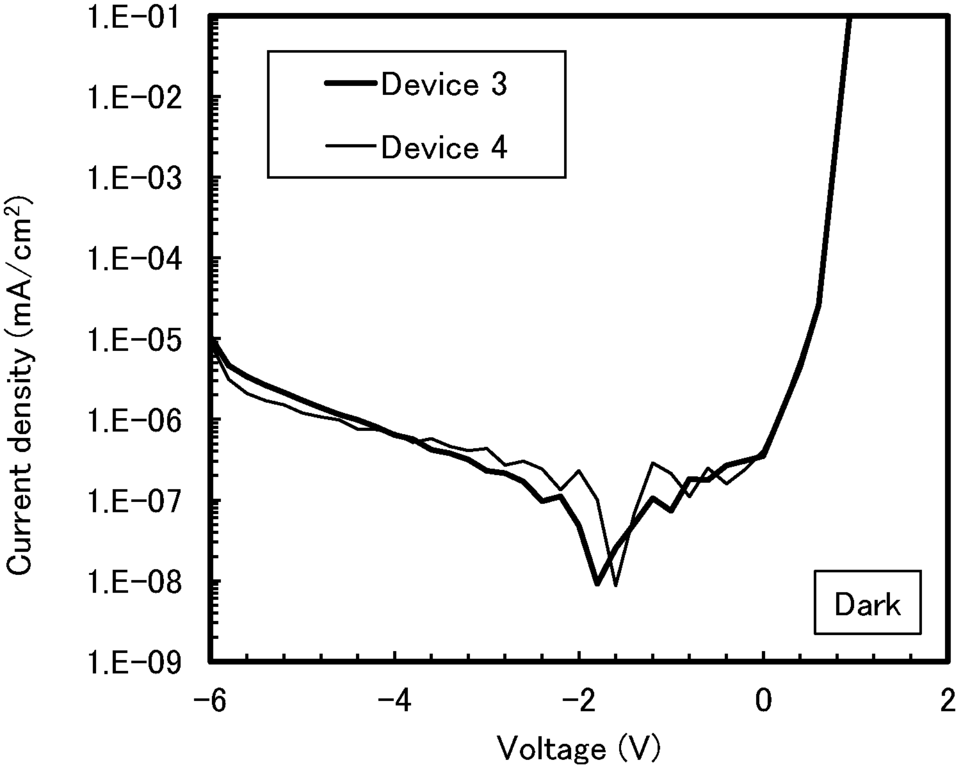
FIG. 23 shows the voltage-current density characteristics of the devices 3 and 4 in a dark state.
Figure 25:
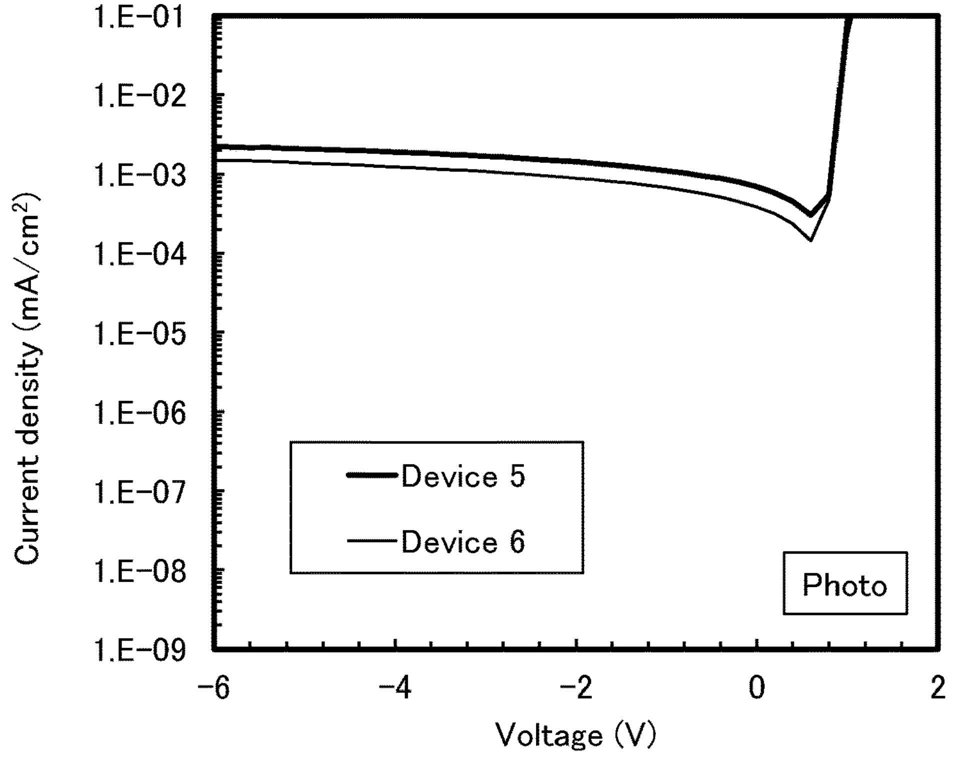
FIG. 25 shows the voltage-current density characteristics of the devices 5 and 6 in the state of being irradiated with light.
Figure 26:
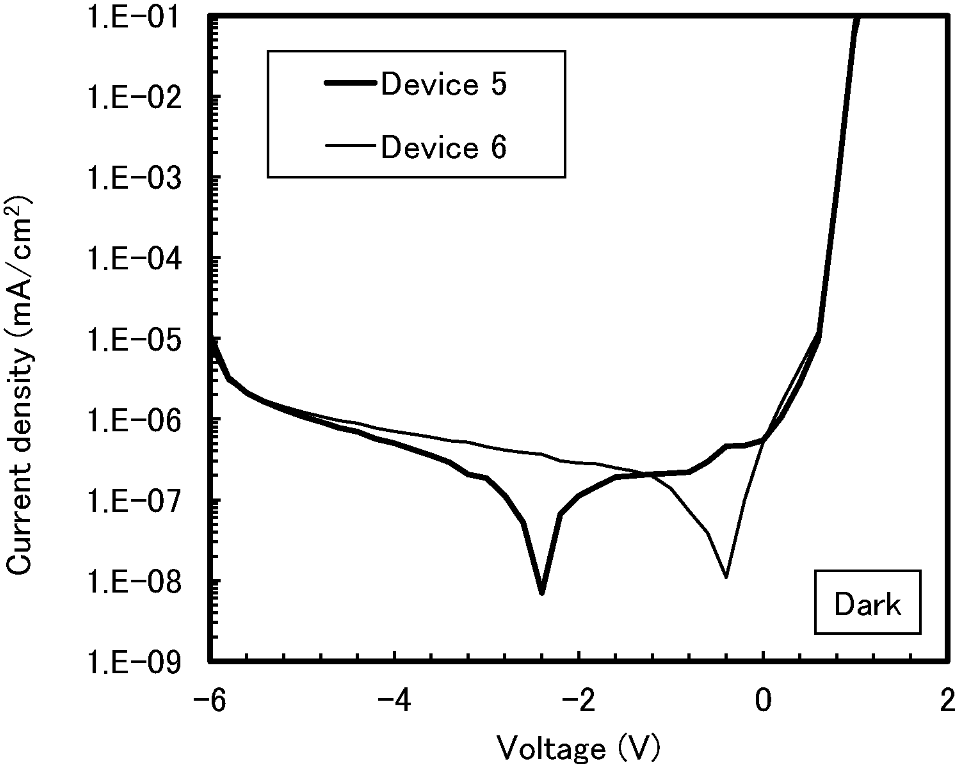
FIG. 26 shows the voltage-current density characteristics of the devices 5 and 6 in a dark state.
Figure 28:
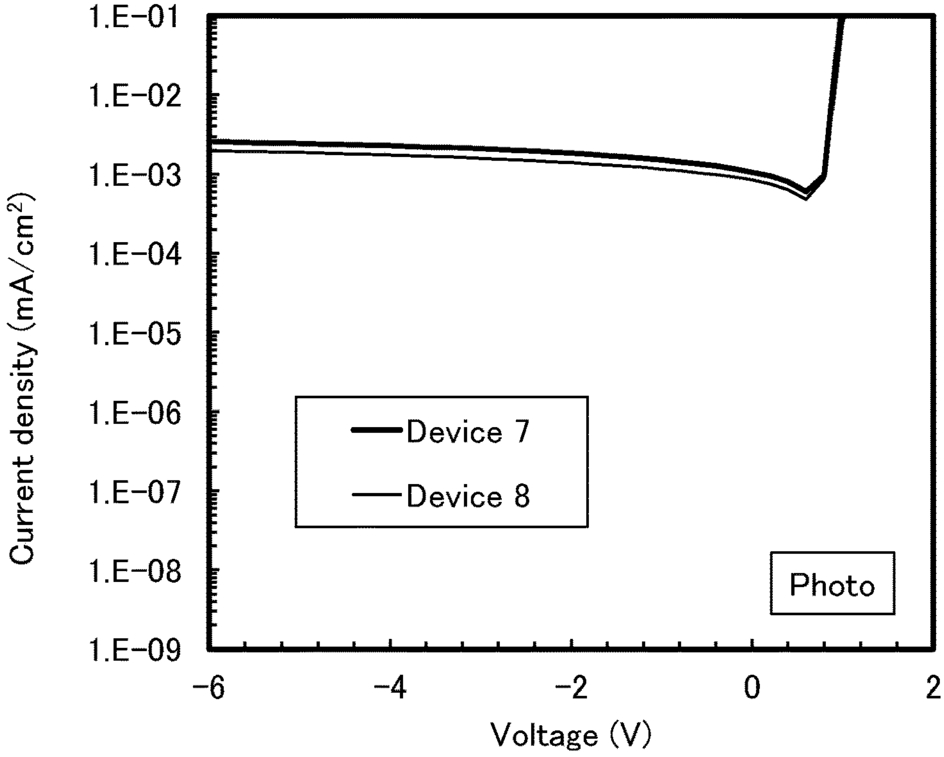
FIG. 28 shows the voltage-current density characteristics of the devices 7 and 8 in the state of being irradiated with light.
Figure 29:
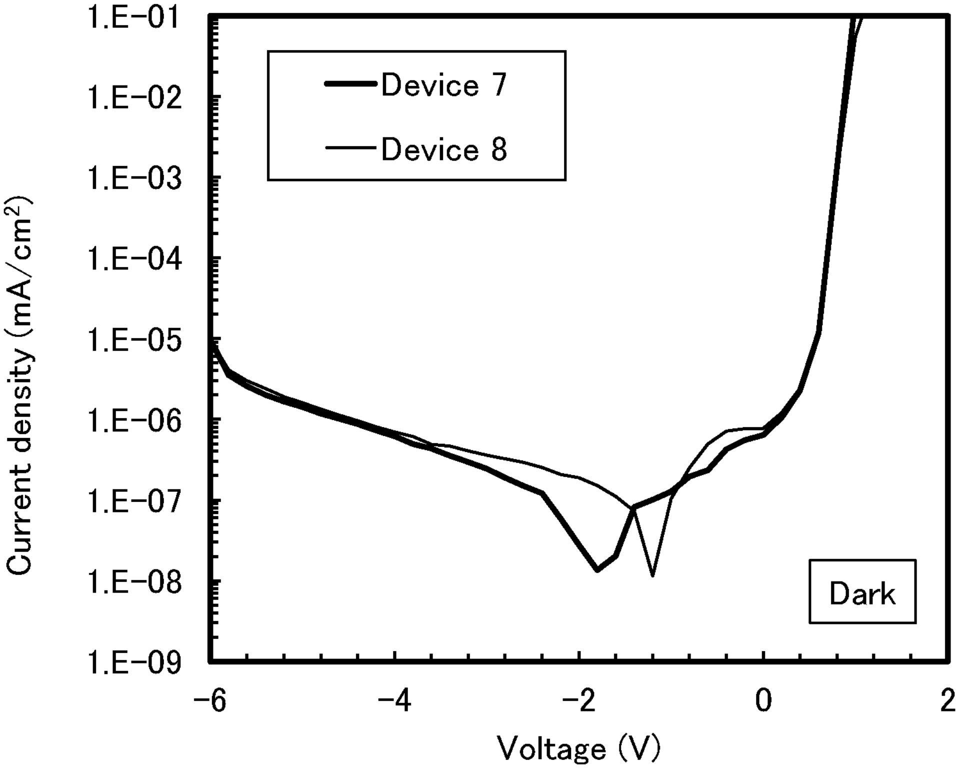
FIG. 29 shows the voltage-current density characteristics of the devices 7 and 8 in a dark state.

FIGS. 19 and 20 show the current density-voltage characteristics of the devices 1 and 2, FIGS. 22 and 23 show the current density-voltage characteristics of the devices 3 and 4, FIGS. 25 and 26 show the current density-voltage characteristics of the devices 5 and 6, and FIGS. 28 and 29 show the current density-voltage characteristics of the devices 7 and 8. The measurement was performed under each of the following conditions: in a state where irradiation with monochromatic light having a wavelength $\lambda$ of 550 nm is performed at an irradiance of 12.5 $\mu W/cm^2$ (denoted by Photo) and in a dark state (denoted by Dark). In each of FIGS. 19, 20, 22, 23, 25, 26, 28, and 29, the horizontal axis represents voltage V and the vertical axis represents current density.

It was found from FIGS. 19, 20, 22, 23, 25, 26, 28, and 29 that the currents in the devices 1 to 8 were amplified by light irradiation. Furthermore, current amplification at the time of light irradiation was found to be caused at low voltage, showing favorable current saturation characteristics. In addition, it was found that the devices 1 to 8 each had a small amount of dark current.

This application is based on Japanese Patent Application Serial No. 2021-105667 filed with Japan Patent Office on Jun. 25, 2021 and Japanese Patent Application Serial No. 2021-105668 filed with Japan Patent Office on Jun. 25, 2021, the entire contents of which are hereby incorporated by reference.

What is claimed is:

1. A light-receiving device comprising:
a light-receiving layer between a pair of electrodes,
wherein the light-receiving layer comprises an active layer, a buffer layer, and an electron-transport layer,
wherein the buffer layer is between the active layer and the electron-transport layer and is in contact with the active layer,
wherein the active layer comprises a first organic compound,
wherein the buffer layer comprises a second organic compound,
wherein the electron-transport layer comprises a third organic compound, and
wherein a LUMO level of the second organic compound is higher than a LUMO level of the first organic compound and is lower than a LUMO level of the third organic compound.

2. The light-receiving device according to claim 1,
wherein a difference between the LUMO level of the second organic compound and the LUMO level of the first organic compound is less than or equal to 0.5 eV.

3. The light-receiving device according to claim 1,
wherein a difference between the LUMO level of the second organic compound and the LUMO level of the third organic compound is less than or equal to 1.0 eV.

4. The light-receiving device according to claim 1,
wherein the LUMO level of the second organic compound is higher than or equal to −4.5 eV and lower than or equal to −3.0 eV.

5. A light-emitting and light-receiving apparatus comprising:
the light-receiving device according to claim 1; and
a light-emitting device.

6. The light-receiving device according to claim 1,
wherein the second organic compound is a heteroaromatic compound comprising an electron-withdrawing group.

7. The light-receiving device according to claim 6,
wherein the second organic compound comprises a plurality of cyano groups.

8. The light-receiving device according to claim 6,
wherein the heteroaromatic compound comprises a fused heteroaromatic ring.

9. The light-receiving device according to claim 1,
wherein the third organic compound is a T-electron deficient heteroaromatic compound.

10. The light-receiving device according to claim 1,
wherein the third organic compound is one of a metal complex comprising a quinoline skeleton, a metal complex comprising a benzoquinoline skeleton, a metal complex comprising an oxazole skeleton, a metal complex comprising a thiazole skeleton, an oxadiazole derivative, a triazole derivative, an imidazole derivative, an oxazole derivative, a thiazole derivative, a phenanthroline derivative, a quinoline derivative comprising a quinoline ligand, a benzoquinoline derivative, a quinoxaline derivative, a dibenzoquinoxaline derivative, a pyridine derivative, a bipyridine derivative, and a pyrimidine derivative.

11. The light-receiving device according to claim 1, wherein the third organic compound is a compound comprising a triazine ring.

12. The light-receiving device according to claim 1, wherein the third organic compound is an organic compound represented by a general formula (Ge-1):

(Ge-1)

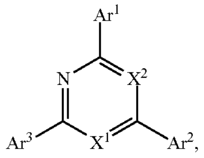

wherein $Ar^1$ to $Ar^3$ each independently represent one of hydrogen, a substituted or unsubstituted aryl group having 6 to 30 carbon atoms, and a substituted or unsubstituted heteroaryl group having 2 to 30 carbon atoms, and wherein $X^1$ and $X^2$ each independently represent one of carbon and nitrogen, and in the case where one or both of $X^1$ and $X^2$ is carbon, the carbon is bonded to one of hydrogen, a substituted or unsubstituted aryl group having 6 to 30 carbon atoms, a substituted or unsubstituted heteroaryl group having 2 to 30 carbon atoms, a substituted or unsubstituted alkyl group having 1 to 20 carbon atoms, and a substituted or unsubstituted cycloalkyl group having 1 to 20 carbon atoms.

* * * * *